US012793775B2

(12) United States Patent
Maekura et al.

(10) Patent No.: US 12,793,775 B2
(45) Date of Patent: Nov. 10, 2026

(54) THREE-DIMENSIONAL MEMORY DEVICES WITH LATERAL BLOCK ISOLATION STRUCTURES AND METHODS OF FORMING THE SAME

(71) Applicant: Sandisk Technologies, Inc., Milpitas, CA (US)

(72) Inventors: Takayuki Maekura, Yokkaichi (JP); Takaaki Iwai, Nagoya (JP); Hiroyuki Ogawa, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 514 days.

(21) Appl. No.: 18/354,325

(22) Filed: Jul. 18, 2023

(65) Prior Publication Data

US 2024/0194262 A1 Jun. 13, 2024

Related U.S. Application Data

(60) Provisional application No. 63/386,824, filed on Dec. 9, 2022.

(51) Int. Cl.
*G11C 16/04* (2006.01)
*H10B 41/10* (2023.01)
(Continued)

(52) U.S. Cl.
CPC ......... *G11C 16/0483* (2013.01); *H10B 41/10* (2023.02); *H10B 41/27* (2023.02);
(Continued)

(58) Field of Classification Search
CPC ........ H10B 41/27; H10B 41/10; H10B 41/35; H10B 41/50; H10B 43/27; H10B 43/10; H10B 43/35; H10B 43/50; H10B 80/00
See application file for complete search history.

(56) References Cited

U.S. PATENT DOCUMENTS 9,601,502 B2 3/2017 Sano et al.
9,960,181 B1 5/2018 Cui et al.
(Continued)

OTHER PUBLICATIONS

Invitation to Pay Additional Fees and, Where Applicable, Protest Fee of the International Searching Authority for International Patent Application No. PCT/US2023/036278, mailed Feb. 8, 2024, 5 pages.

(Continued)

*Primary Examiner* — Jose R Diaz
(74) *Attorney, Agent, or Firm* — THE MARBURY LAW GROUP PLLC

(57) ABSTRACT

A three-dimensional memory device includes alternating stacks of insulating strips and electrically conductive strips, backside trenches located between neighboring pairs of alternating stacks, memory openings vertically extending through the alternating stacks, and memory opening fill structures located within the memory openings. In some embodiments, dielectric etch stop structures may be located within or outside the backside trenches such that each of the dielectric etch stop structures includes a respective pair of dielectric sidewalls that are located within a pair of length-wise sidewalls of the respective one of the backside trenches. In some other embodiments, a dielectric isolation structure can laterally contact each of the insulating strips within the alternating stacks. Laterally insulated contact via structures can be provided to provide electrical contact to a respective one of the electrically conductive strips.

12 Claims, 123 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10W 20/41*** | (2026.01) |
| ***H10W 20/42*** | (2026.01) |

(52) U.S. Cl.
CPC ............ *H10B 41/35* (2023.02); *H10B 43/10* (2023.02); *H10B 43/27* (2023.02); *H10B 43/35* (2023.02); *H10W 20/42* (2026.01); *H10W 20/435* (2026.01)

(56) References Cited

U.S. PATENT DOCUMENTS

| | | | | |
|---|---|---|---|---|
| 10,290,648 | B1 | 5/2019 | Zhou et al. | |
| 10,854,513 | B2 | 12/2020 | Kawasaki et al. | |
| 10,903,237 | B1 | 1/2021 | Hosoda et al. | |
| 11,398,497 | B2 | 7/2022 | Kajiwara et al. | |
| 11,450,679 | B2 | 9/2022 | Tanaka et al. | |
| 11,450,685 | B2 | 9/2022 | Yoshida | |
| 11,488,975 | B2 | 11/2022 | Totoki et al. | |
| 11,495,612 | B2 | 11/2022 | Tanaka et al. | |
| 11,532,570 | B2 | 12/2022 | Mizuno et al. | |
| 12,408,335 | B2 | 9/2025 | Sano et al. | |
| 12,505,880 | B2 | 12/2025 | Lai et al. | |
| 2017/0047334 | A1 | 2/2017 | Lu et al. | |
| 2019/0096808 | A1 | 3/2019 | Tsutsumi et al. | |
| 2019/0341399 | A1 | 11/2019 | Tao et al. | |
| 2020/0227318 | A1 | 7/2020 | Kawasaki et al. | |
| 2020/0335518 | A1* | 10/2020 | Cui ........................ | H10B 41/10 |
| 2021/0028111 | A1 | 1/2021 | Kai et al. | |
| 2021/0126008 | A1 | 4/2021 | Tanabe et al. | |
| 2021/0358936 | A1 | 11/2021 | Takuma et al. | |
| 2021/0358937 | A1 | 11/2021 | Yamaguchi et al. | |
| 2021/0358941 | A1 | 11/2021 | Kajiwara et al. | |
| 2022/0005818 | A1 | 1/2022 | Tanaka et al. | |
| 2022/0005824 | A1 | 1/2022 | Tanaka et al. | |
| 2022/0223614 | A1 | 7/2022 | Takuma et al. | |
| 2022/0254733 | A1 | 8/2022 | Mizuno et al. | |
| 2022/0406379 | A1 | 12/2022 | Takeguchi et al. | |
| 2022/0406720 | A1 | 12/2022 | Hinoue et al. | |
| 2022/0406793 | A1 | 12/2022 | Takeguchi et al. | |
| 2023/0038557 | A1 | 2/2023 | Ogawa et al. | |
| 2023/0041950 | A1 | 2/2023 | Chibvongodze et al. | |
| 2023/0045001 | A1 | 2/2023 | Ogawa et al. | |
| 2024/0194263 | A1 | 6/2024 | Tobioka | |
| 2024/0196612 | A1 | 6/2024 | Tobioka et al. | |
| 2024/0213147 | A1 | 6/2024 | Hosoda et al. | |
| 2024/0315040 | A1 | 9/2024 | Tobioka et al. | |
| 2024/0431107 | A1 | 12/2024 | Kim | |
| 2025/0071999 | A1 | 2/2025 | Yang | |
| 2025/0081453 | A1 | 3/2025 | Sanada et al. | |
| 2025/0081458 | A1 | 3/2025 | Matsuno et al. | |
| 2025/0113485 | A1 | 4/2025 | Muranaga et al. | |
| 2025/0234545 | A1 | 7/2025 | Tsutsumi et al. | |
| 2026/0006802 | A1 | 1/2026 | Mushiga et al. | |
| 2026/0107468 | A1 | 4/2026 | Baik et al. | |

OTHER PUBLICATIONS

ISR—Notification of Transmittal of The International Search Report and Written Opinion of the International Searching Authority for International Patent Application No. PCT/US2023/036278, mailed Mar. 11, 2024, 14 pages.
Endoh et al., "Novel Ultra High-Density Memory with a Stacked-Surrounding Gate Transistor (S-SGT) Structured Cell," IEDM Proc. (2001) 33-36.
U.S. Appl. No. 17/556,298, filed Dec. 20, 2021, SanDisk Technologies LLC.
U.S. Appl. No. 17/663,951, filed May 18, 2022, SanDisk Technologies LLC.
U.S. Appl. No. 17/684,922, filed Mar. 2, 2022, SanDisk Technologies LLC.
U.S. Appl. No. 17/804,184, filed May 26, 2022, SanDisk Technologies LLC.
U.S. Appl. No. 17/806,390, filed Jun. 10, 2022, SanDisk Technologies LLC.
U.S. Appl. No. 17/806,579, filed Jun. 13, 2022, SanDisk Technologies LLC.
U.S. Appl. No. 17/807,804, filed Jun. 20, 2022, SanDisk Technologies LLC.
U.S. Appl. No. 17/934,676, filed Sep. 23, 2022, SanDisk Technologies LLC.
U.S. Appl. No. 17/934,685, filed Sep. 23, 2022, SanDisk Technologies LLC.
U.S. Appl. No. 18/062,807, filed Dec. 7, 2022, SanDisk Technologies LLC.
U.S. Appl. No. 18/352,726, filed Jul. 14, 2023, SanDisk Technologies LLC.
U.S. Appl. No. 18/352,752, filed Jul. 14, 2023, SanDisk Technologies LLC.
U.S. Appl. No. 18/353,577, filed Jul. 17, 2023, SanDisk Technologies LLC.
IPRP—WO—Notification Concerning Transmittal of International Preliminary Report On Patentability and Written Opinion of the International Searching Authority for International Patent Application No. PCT/US2023/036278, mailed Jun. 19, 2025, 8 pages.
Tobioka, A. et al., "Three-Dimensional Memory Devices With Lateral Block Isolation Structures And Methods Of Forming The Same," U.S. Appl. No. 18/354,283, filed Jul. 18, 2023.
Kubo, T. et al., "Three-Dimensional Memory Devices With Lateral Block Isolation Structures And Methods Of Forming The Same," U.S. Appl. No. 18/493,020, filed Oct. 24, 2023.
USPTO Office Communication, Non-Final Office Action for U.S. Appl. No. 18/493,020, mailed May 11, 2026, 31 pages.
USPTO Office Communication, Notice of Allowance and Fee(s) Due for U.S. Appl. No. 18/354,283, mailed Mar. 10, 2026, 28 pages.

* cited by examiner

THREE-DIMENSIONAL MEMORY DEVICES WITH LATERAL BLOCK ISOLATION STRUCTURES AND METHODS OF FORMING THE SAME

FIELD

The present disclosure relates generally to the field of semiconductor devices, and particularly to a three-dimensional memory device including inter-block word line lateral isolation structures for stairless layer contact via structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers; arrays of memory openings vertically extending through the alternating stack; memory opening fill structures located in the memory openings, wherein each of the memory opening fill structures comprises a vertical semiconductor channel and a respective vertical stack of memory elements located at levels of the electrically conductive strips; backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within, or outside, a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane.

According to another aspect of the present disclosure, a method comprises: forming a vertically alternating sequence of insulating layers and sacrificial material layers over a substrate, wherein the sacrificial material layers comprise a dielectric material; forming backside trenches laterally extending along a first horizontal direction through the vertically alternating sequence, wherein the backside trenches are laterally spaced apart along a second horizontal direction, and strip portions of the vertically alternating sequence located between neighboring pairs of the backside trenches are interconnected to each other through a connection portion of the vertically alternating sequence that is connected to each of the strip portions of the vertically alternating sequence; forming at least one dielectric etch stop structures prior to or after the forming of the backside trenches such that the at least one dielectric etch stop structure vertically extends at least from a first horizontal plane including a bottommost surfaces of the vertically alternating sequence and at least to a second horizontal plane including a topmost surface of the vertically alternating sequence, and the at least one dielectric etch stop structure comprises pairs of dielectric sidewalls that are located within a respective one of the backside trenches; forming backside recesses by performing an isotropic etch process that removes portions of the sacrificial material layers that are proximal to the backside trenches selective to materials of the insulating layers and the dielectric etch stop structures, wherein remaining portions of the sacrificial material layers after the isotropic etch process comprise dielectric connection plates that contact each of the dielectric etch stop structures; and forming electrically conductive strips in the backside recesses.

According to yet another aspect of the present disclosure, a three-dimensional memory device is provided, which comprises: alternating stacks of insulating strips and electrically conductive strips that alternate along a vertical direction, wherein each of the alternating stacks laterally extends along a first horizontal direction, and the alternating stacks are laterally spaced apart from each other along a second horizontal direction by backside trenches; arrays of memory openings vertically extending through the alternating stacks; memory opening fill structures located in the memory openings, wherein each of the memory opening fill structures comprises a vertical semiconductor channel and a respective vertical stack of memory elements located at levels of the electrically conductive strips; a vertically alternating sequence of insulating plates and dielectric material plates that is laterally spaced apart from the alternating stacks along the first horizontal direction, wherein each of the insulating plates is located at a same level as, has a same thickness as, and has a same material composition as, a respective subset of the insulating strips within the alternating stacks; and a dielectric isolation structure laterally contacting each of the insulating strips within the alternating stacks and each insulating plate and each dielectric material plate within the vertically alternating sequence and laterally extending along the second horizontal direction.

According to still another aspect of the present disclosure, a method comprises: forming a vertically alternating sequence of insulating layers and sacrificial material layers over a substrate, wherein the sacrificial material layers comprise a dielectric material; forming backside trenches and an isolation trench through the vertically alternating sequence, wherein the backside trenches laterally extend along the first horizontal direction and are laterally spaced apart along a second horizontal direction, and the isolation trench laterally extends along the second horizontal direction and is laterally spaced from the backside trenches along the first horizontal direction; forming an isolation cavity by laterally expanding the isolation trench, wherein alternating stacks of insulating strips and sacrificial material strips are formed, wherein the insulating strips are portions of the insulating layers that are located between a respective neighboring pair of backside trenches, wherein the sacrificial material strips are discrete remaining portions of the sacrificial material layers, and wherein each of the sacrificial material strips is laterally spaced apart from all other sacrificial material strips located at a same vertical level by a combination of the backside trenches and the isolation cavity; forming a dielectric isolation structure in the isolation cavity; and replacing the sacrificial material strips with electrically conductive strips, to form alternating stacks of a respective subset of the insulating strips and a respective subset of the electrically conductive strips.

BRIEF DESCRIPTION OF THE DRAWINGS

FIG. 38B is a horizontal cross-sectional view of the second exemplary structure along the horizontal plane HP2 of FIG. 38A.

FIG. 39A is a vertical cross-sectional view of the third exemplary structure after formation of backside trenches according to the third embodiment of the present disclosure.

FIG. 39B is a top-down view of the third exemplary structure of FIG. 39A. The hinged vertical plane A-A' is a plane of the vertical cross-sectional view of FIG. 39A.

FIG. 40A is a vertical cross-sectional view of the third exemplary structure after formation of sacrificial backside trench fill structures according to the third embodiment of the present disclosure.

FIG. 40B is a top-down view of the third exemplary structure of FIG. 40A. The hinged vertical plane A-A' is a plane of the vertical cross-sectional view of FIG. 40A.

FIG. 41A is a vertical cross-sectional view of the third exemplary structure after formation of a finned trench according to the third embodiment of the present disclosure.

FIG. 41B is a top-down view of the third exemplary structure of FIG. 41A. The hinged vertical plane A-A' is a plane of the vertical cross-sectional view of FIG. 41A.

FIG. 42A is a vertical cross-sectional view of the third exemplary structure after formation of a finned dielectric isolation structure according to the third embodiment of the present disclosure.

FIG. 42B is a top-down view of the third exemplary structure of FIG. 42A. The hinged vertical plane A-A' is a plane of the vertical cross-sectional view of FIG. 42A.

FIG. 43A is a vertical cross-sectional view of the third exemplary structure after removal of sacrificial backside trench fill structures according to the third embodiment of the present disclosure.

FIG. 43B is a top-down view of the third exemplary structure of FIG. 43A. The hinged vertical plane A-A' is a plane of the vertical cross-sectional view of FIG. 43A.

FIG. 44A is a vertical cross-sectional view of the third exemplary structure after formation of backside recesses according to the third embodiment of the present disclosure.

Figure 44A:
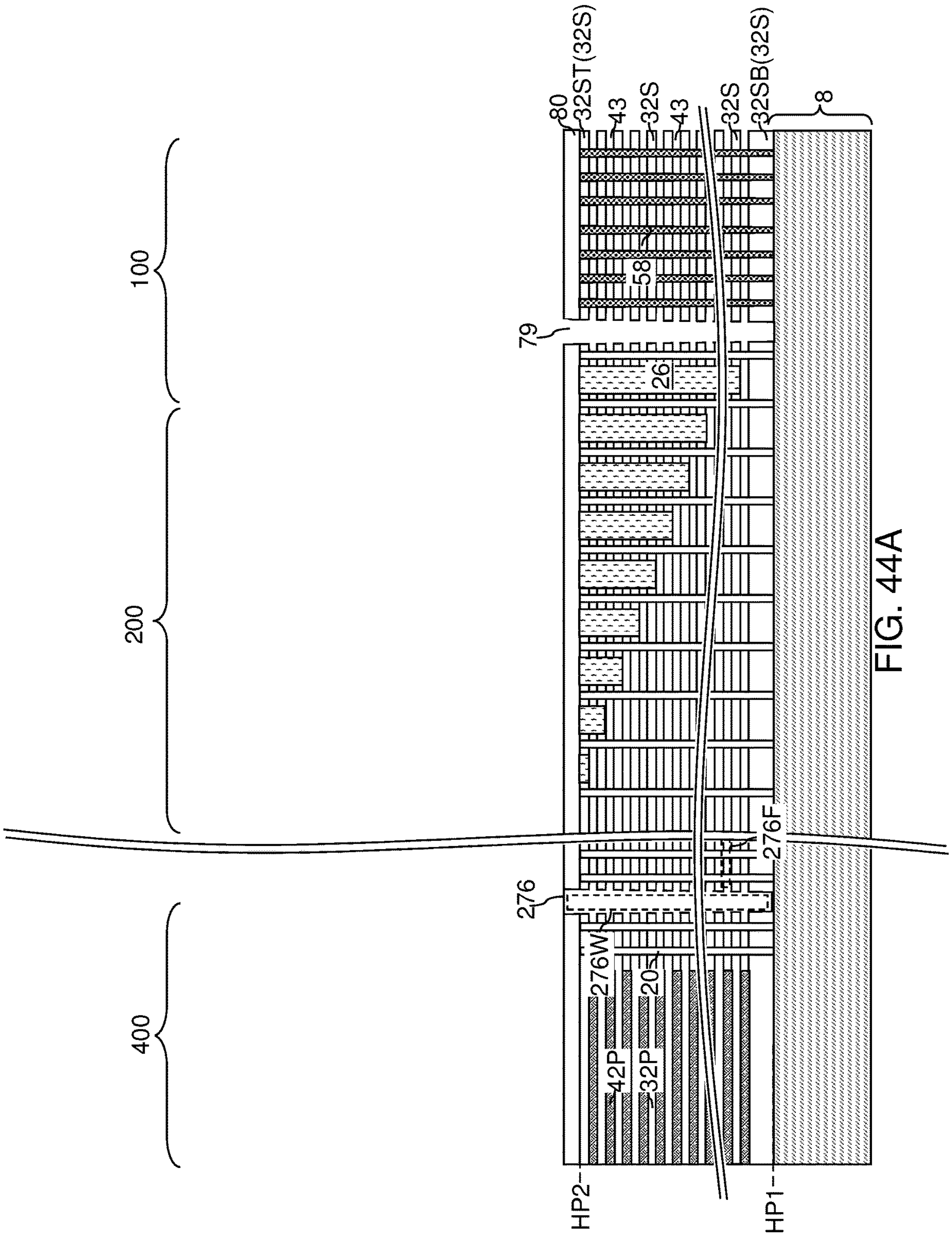
Figure 44B:
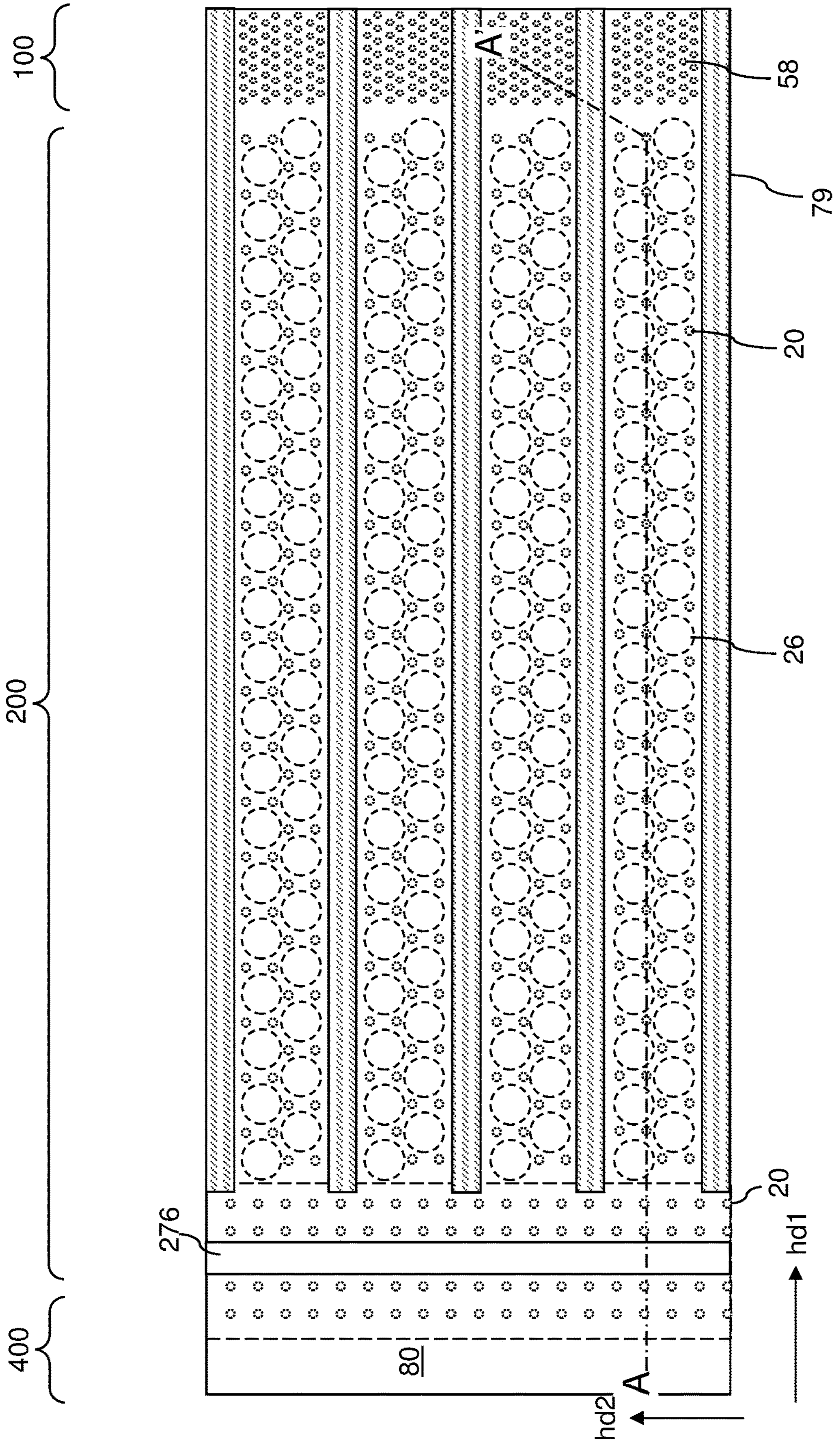

FIG. 44B is a top-down view of the third exemplary structure of FIG. 44A. The hinged vertical plane A-A' is a plane of the vertical cross-sectional view of FIG. 44A.

Figure 45A:
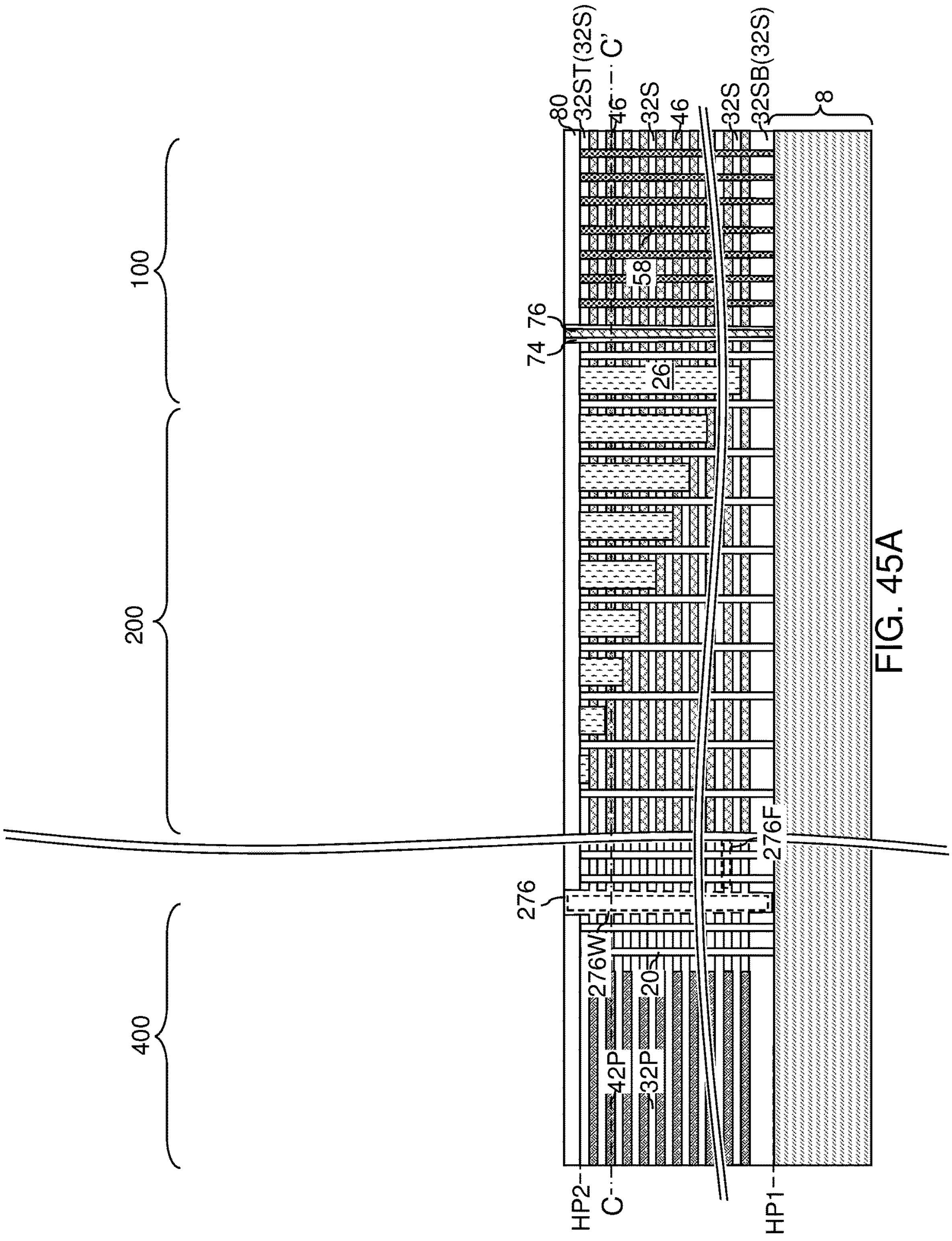

FIG. 45A is a vertical cross-sectional view of the third exemplary structure after formation of electrically conductive layers and backside trench fill structures according to the third embodiment of the present disclosure.

Figure 45B:
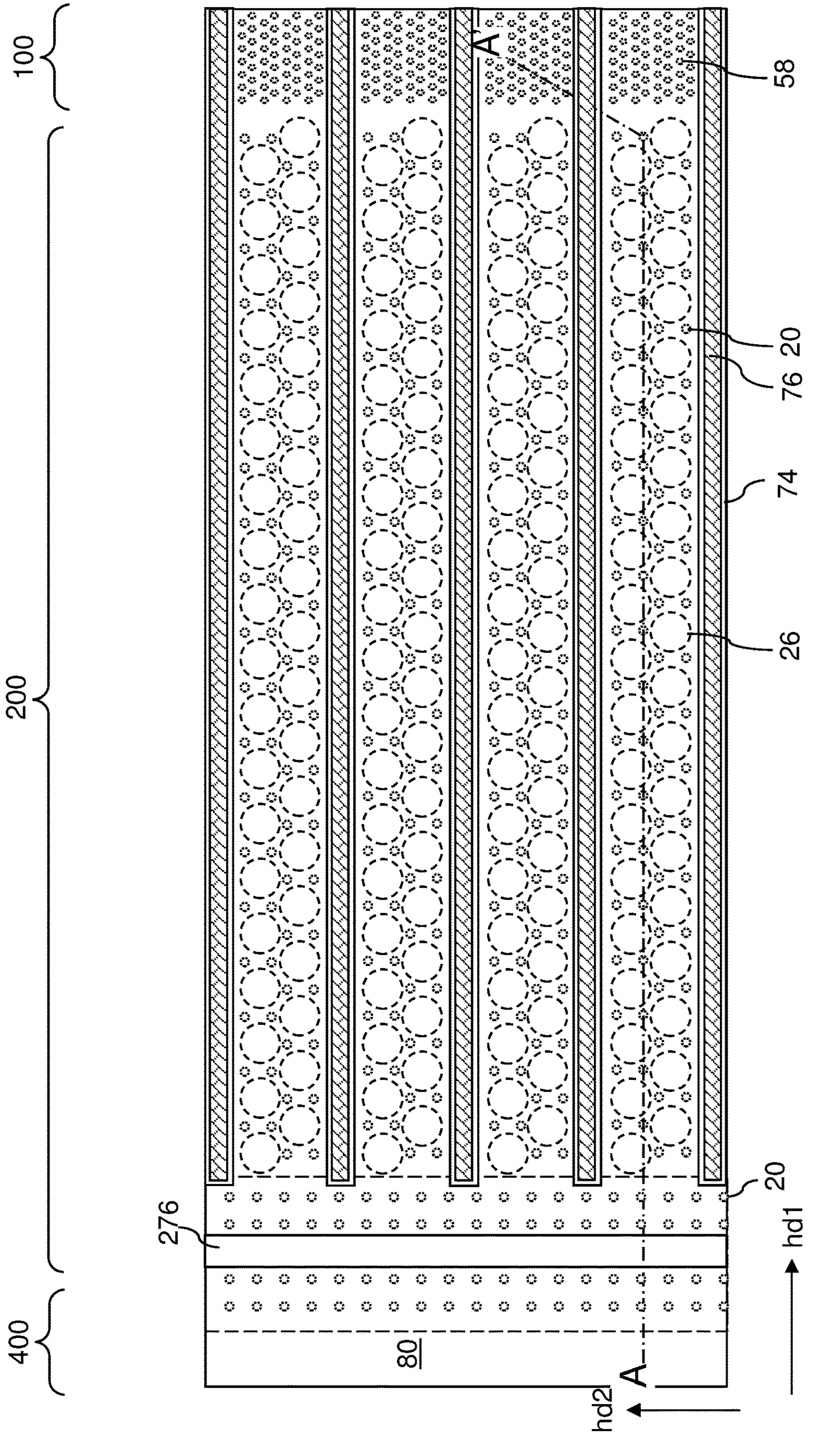

FIG. 45B is a top-down view of the third exemplary structure of FIG. 45A. The hinged vertical plane A-A' is a plane of the vertical cross-sectional view of FIG. 45A.

Figure 45C:
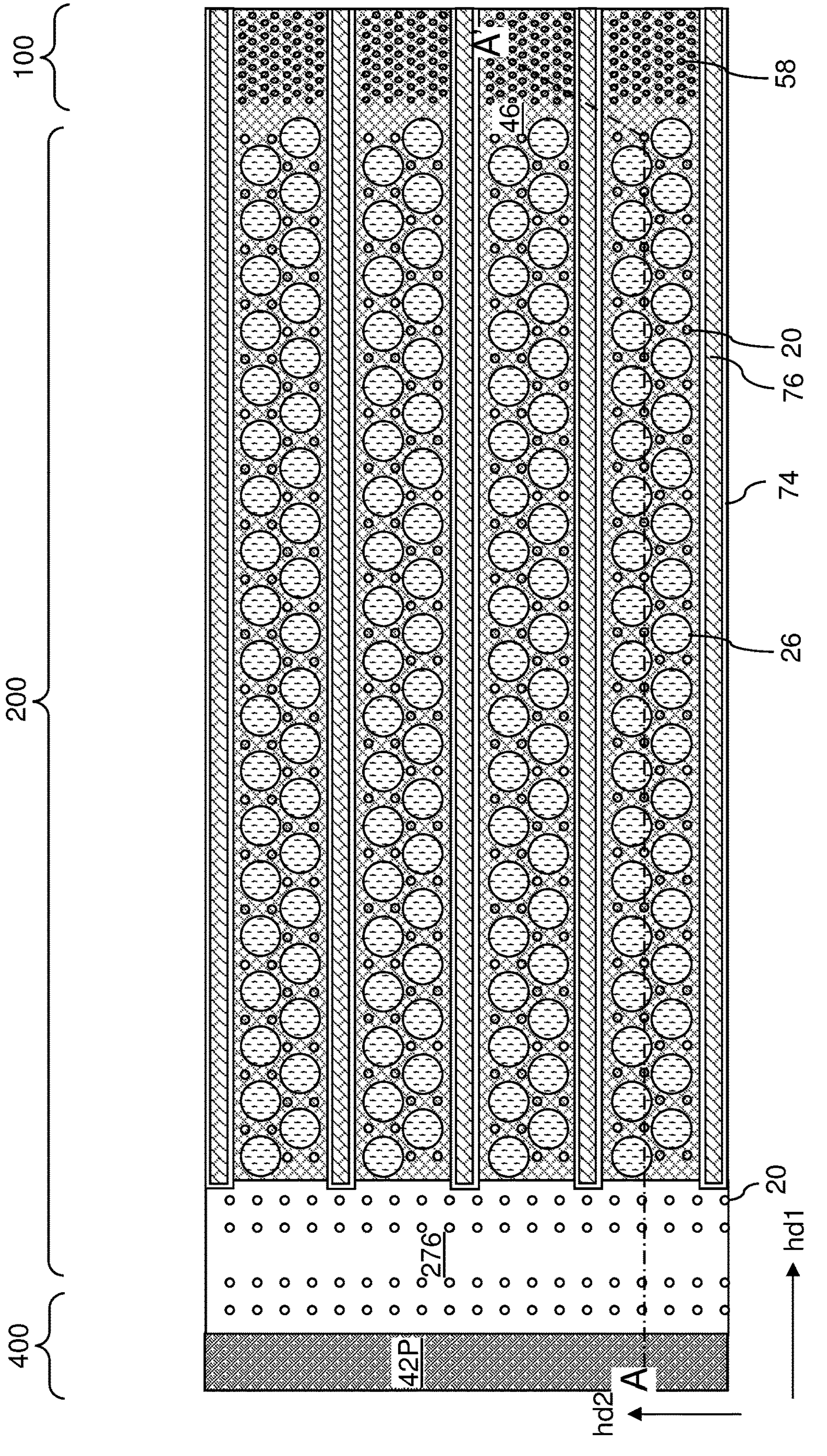

FIG. 45C is a horizontal cross-sectional view of the third exemplary structure along the horizontal plane C-C' of FIG. 45A.

Figure 46A:
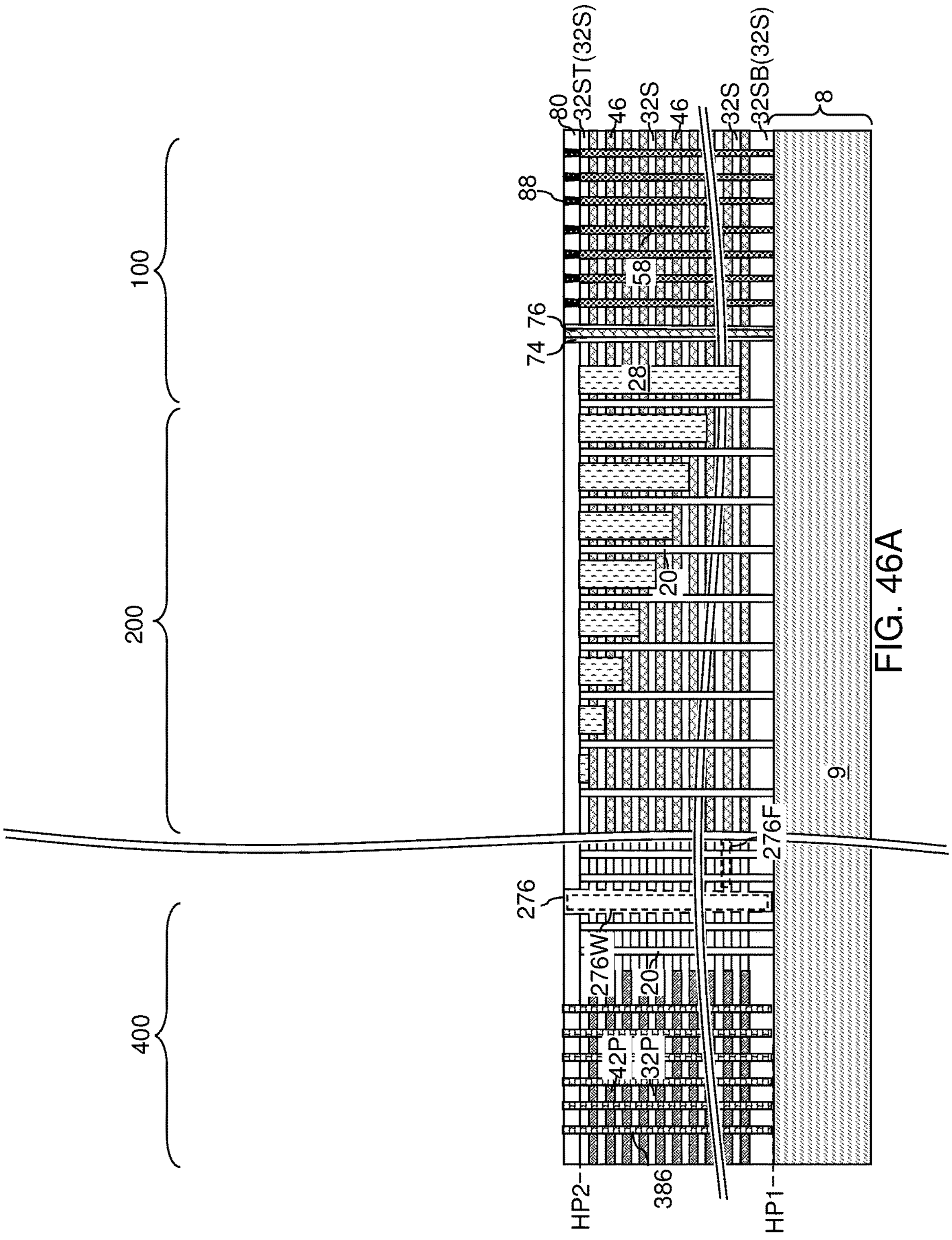

FIG. 46A is a vertical cross-sectional view of the third exemplary structure after formation of drain contact via structures according to the third embodiment of the present disclosure.

Figure 46B:
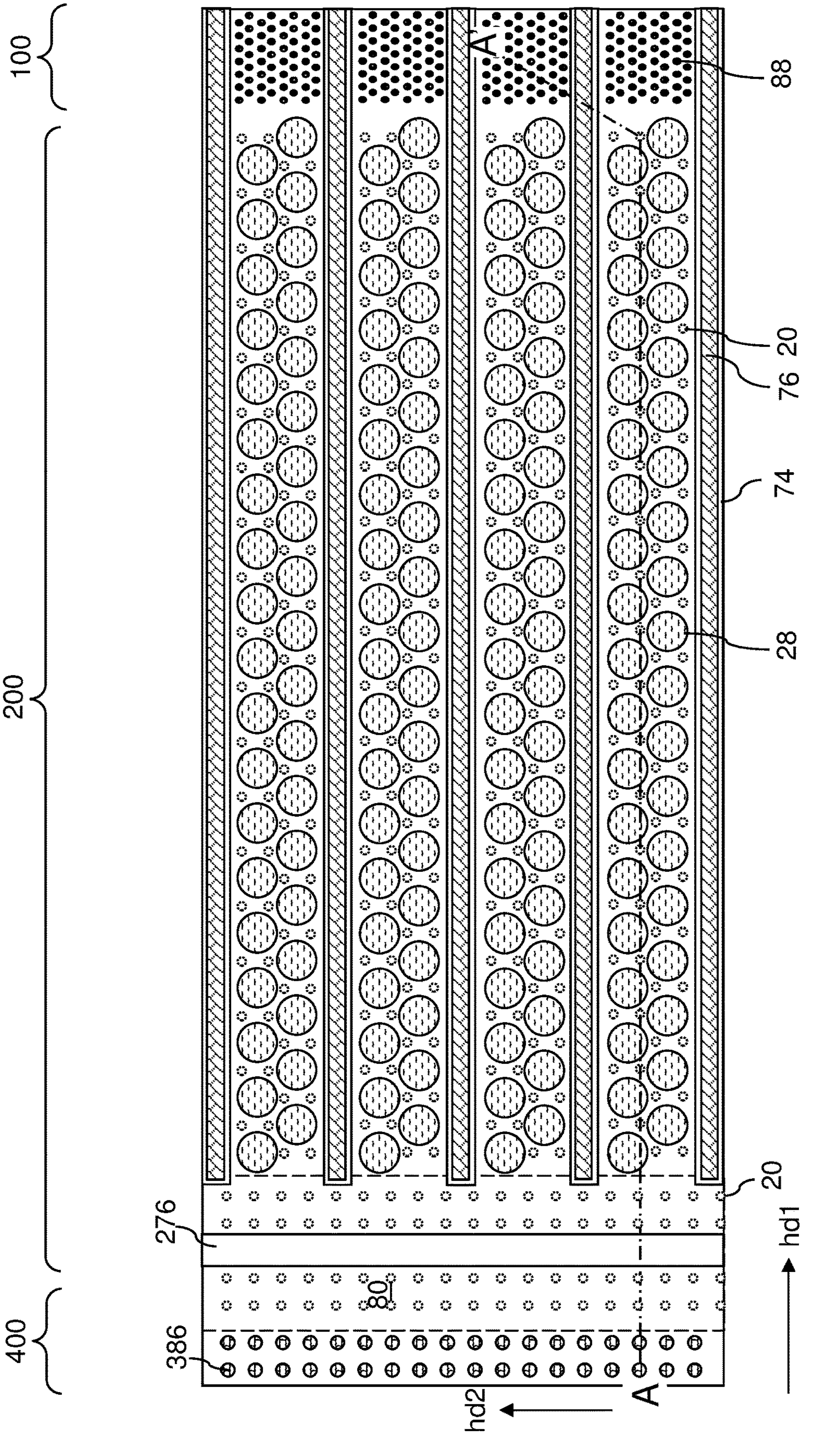

FIG. 46B is a top-down view of the third exemplary structure of FIG. 46A.

Figure 47:
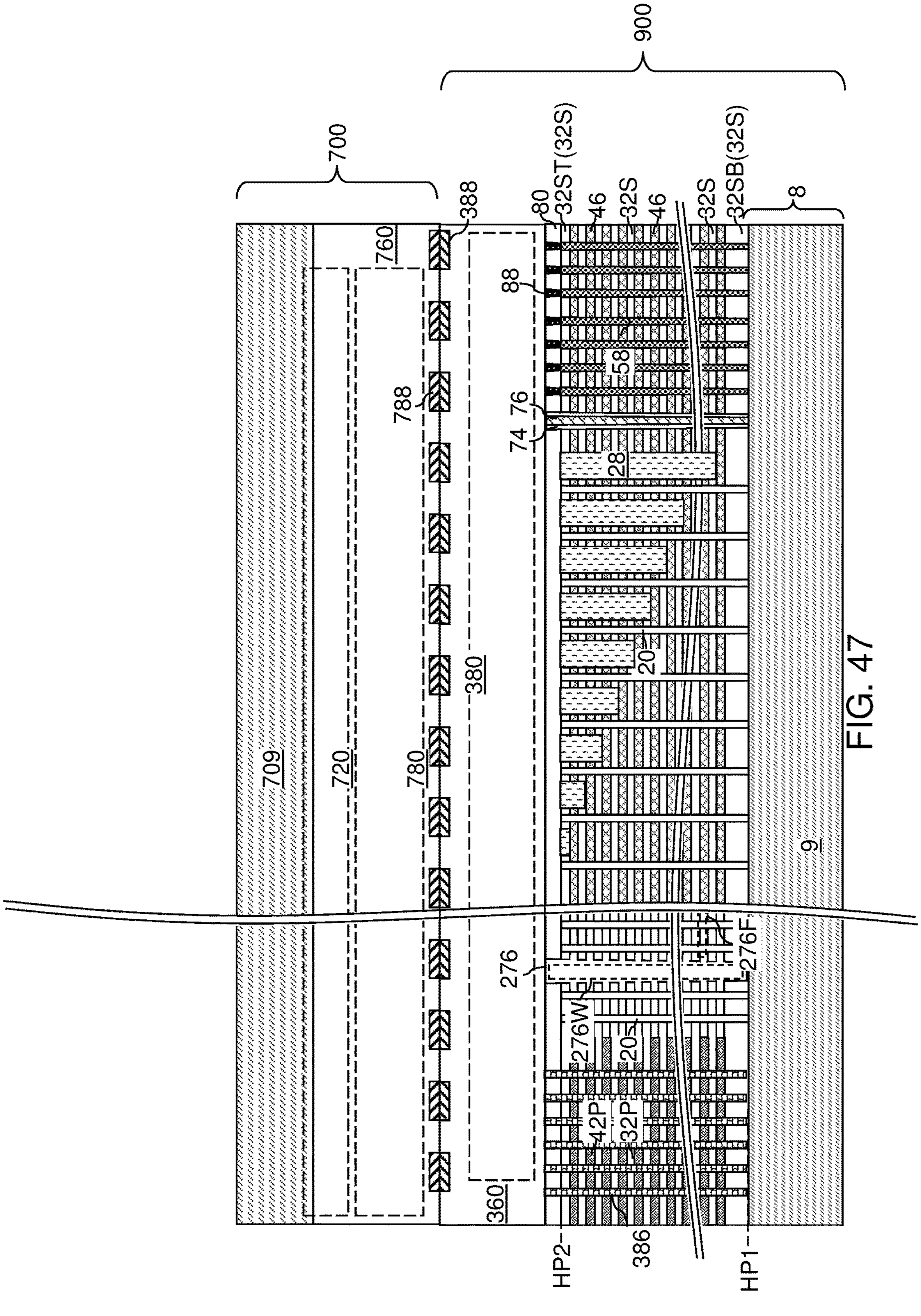

FIG. 47 is a vertical cross-sectional view of the third exemplary structure after attaching a logic die to a memory die according to third embodiment of the present disclosure.

Figure 48A:
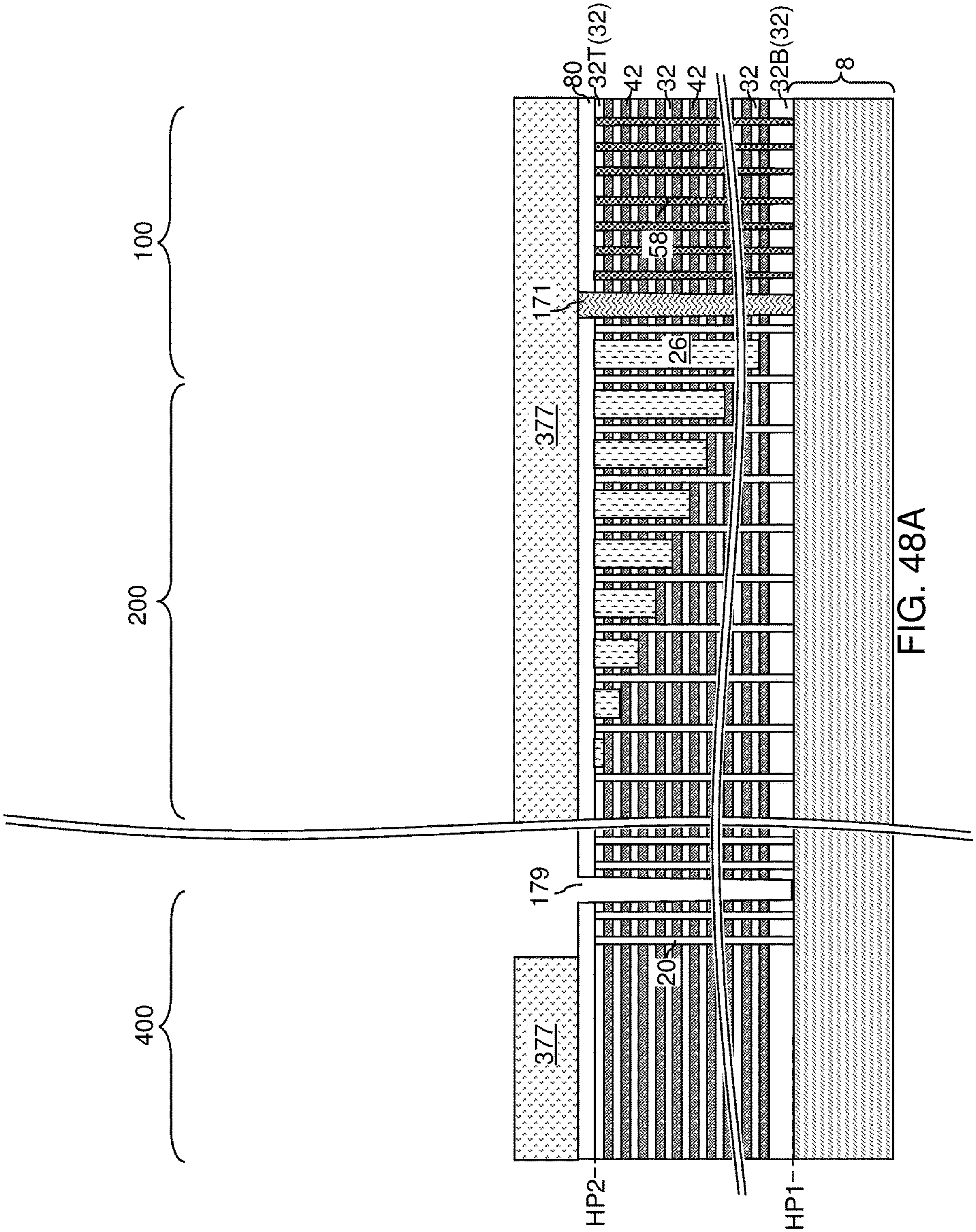

FIG. 48A is a vertical cross-sectional view of a fourth exemplary structure after formation of a patterned photoresist layer and removal of an unmasked sacrificial backside trench fill structure according to a fourth embodiment of the present disclosure.

Figure 48B:
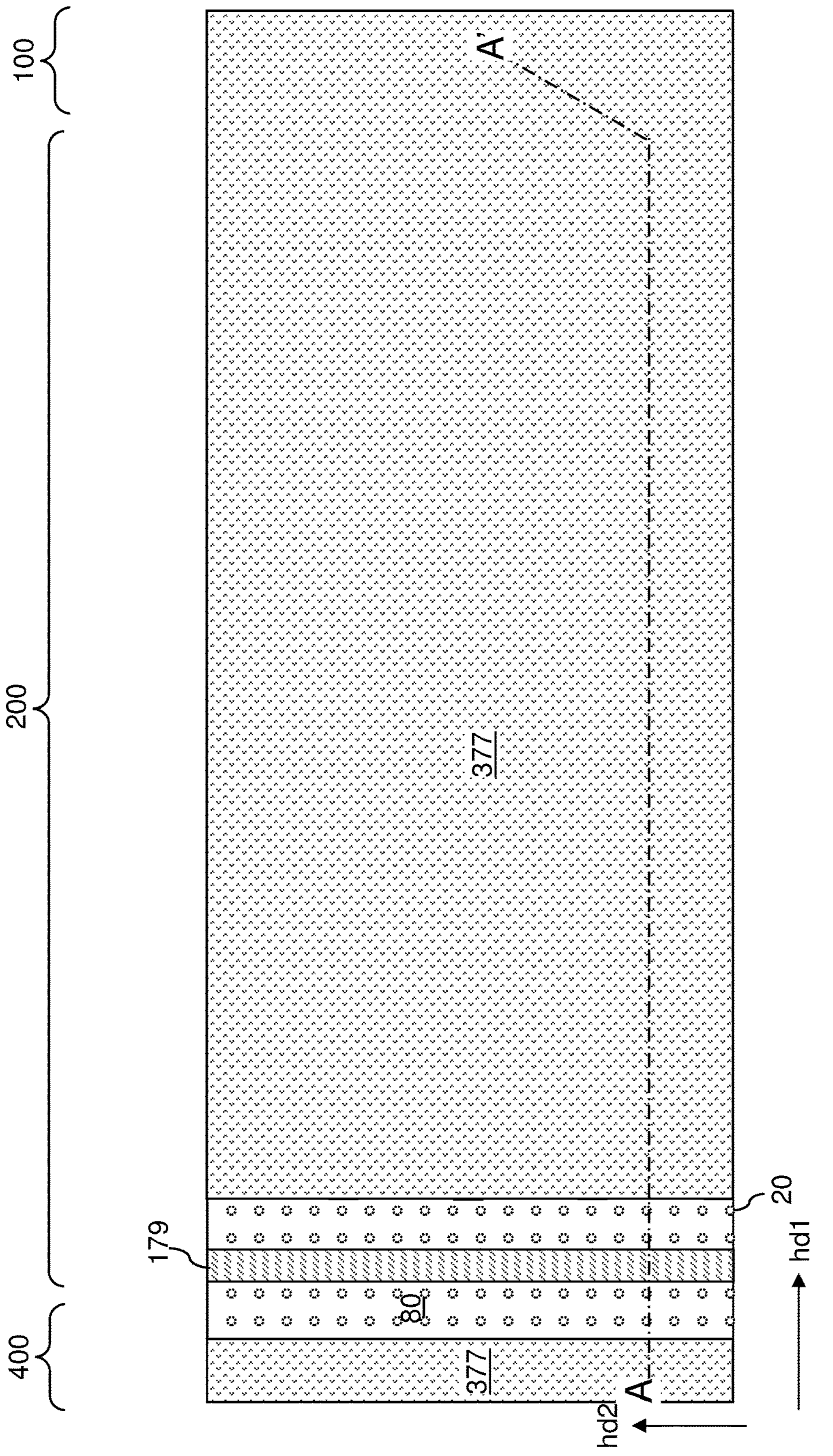

FIG. 48B is a top-down view of the fourth exemplary structure of FIG. 48A. The hinged vertical plane A-A' is a plane of the vertical cross-sectional view of FIG. 48A.

Figure 49A:
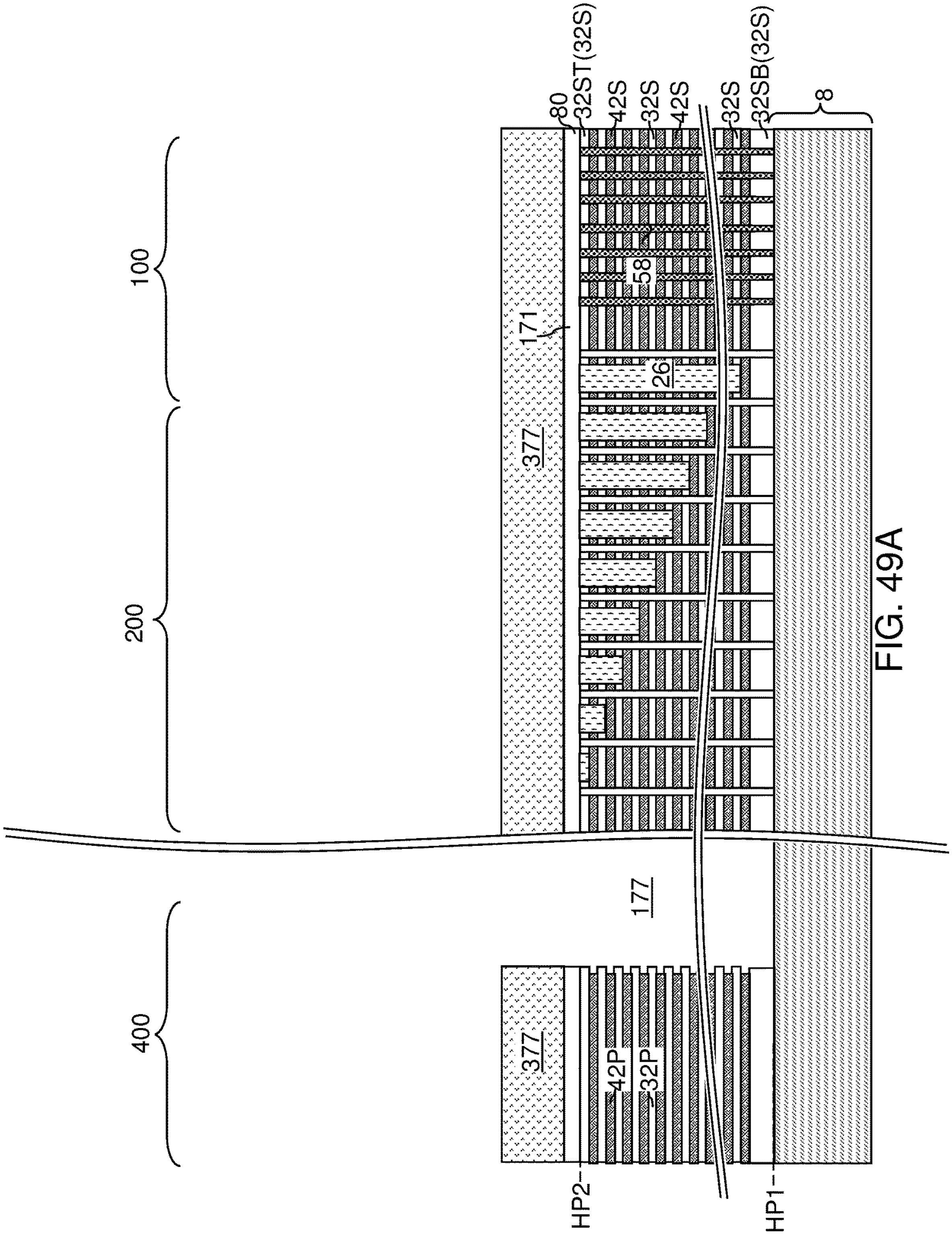

FIG. 49A is a vertical cross-sectional view of the fourth exemplary structure after formation of an isolation trench according to the fourth embodiment of the present disclosure.

Figure 49B:
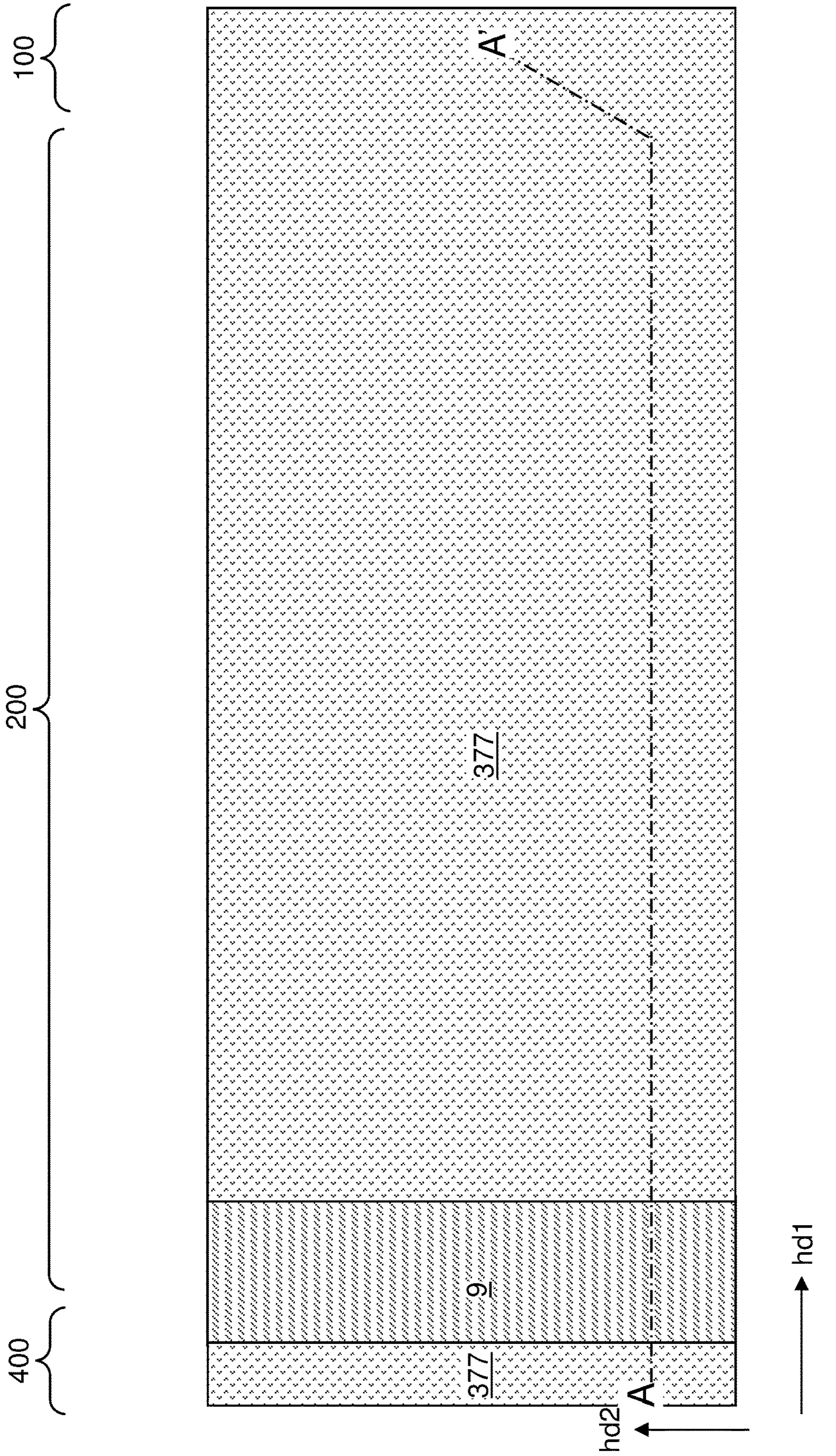

FIG. 49B is a top-down view of the fourth exemplary structure of FIG. 49A. The hinged vertical plane A-A' is a plane of the vertical cross-sectional view of FIG. 49A.

Figure 50A:
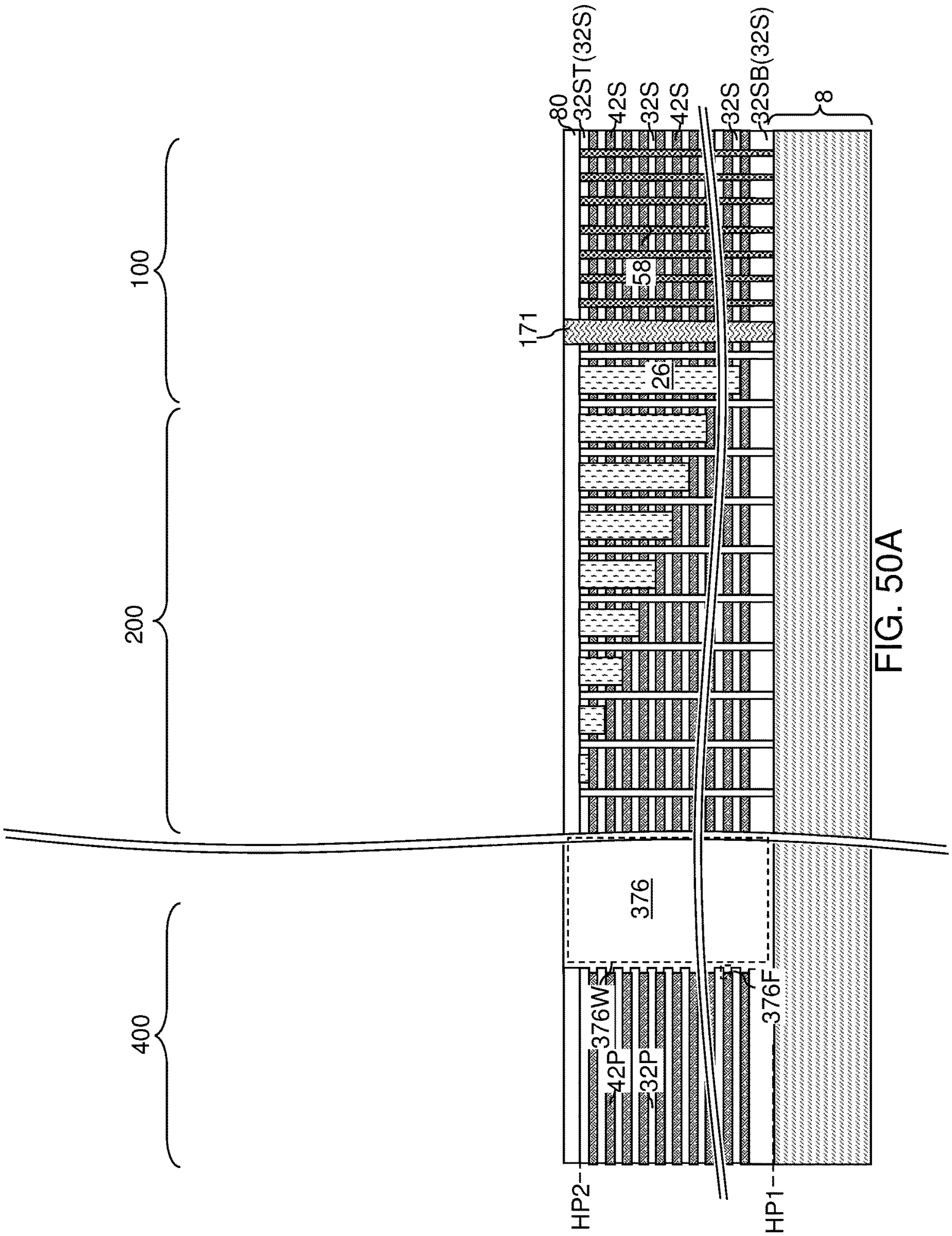

FIG. 50A is a vertical cross-sectional view of the fourth exemplary structure after formation of a dielectric isolation structure according to the fourth embodiment of the present disclosure.

Figure 50B:
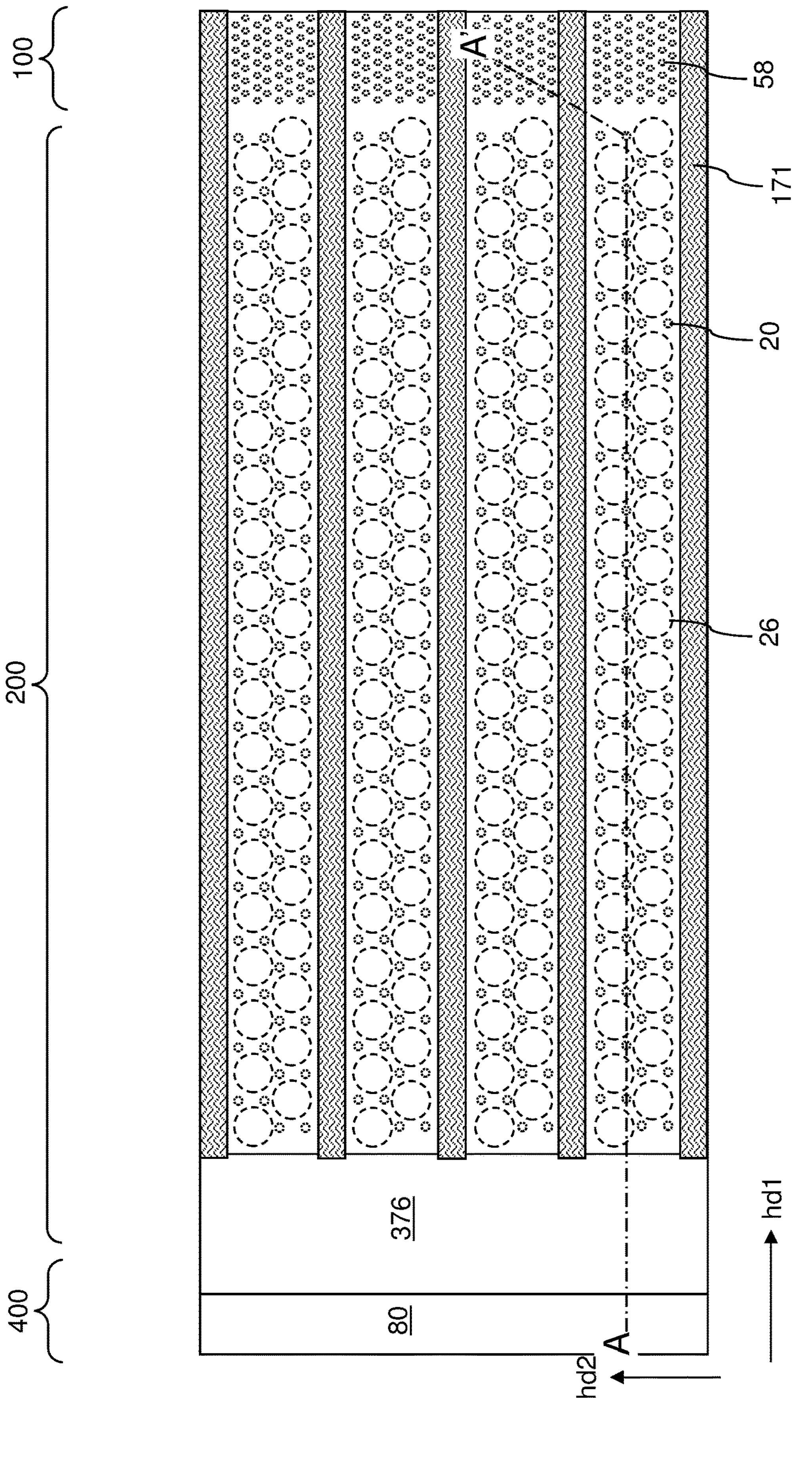

FIG. 50B is a top-down view of the fourth exemplary structure of FIG. 50A. The hinged vertical plane A-A' is a plane of the vertical cross-sectional view of FIG. 50A.

Figure 51A:
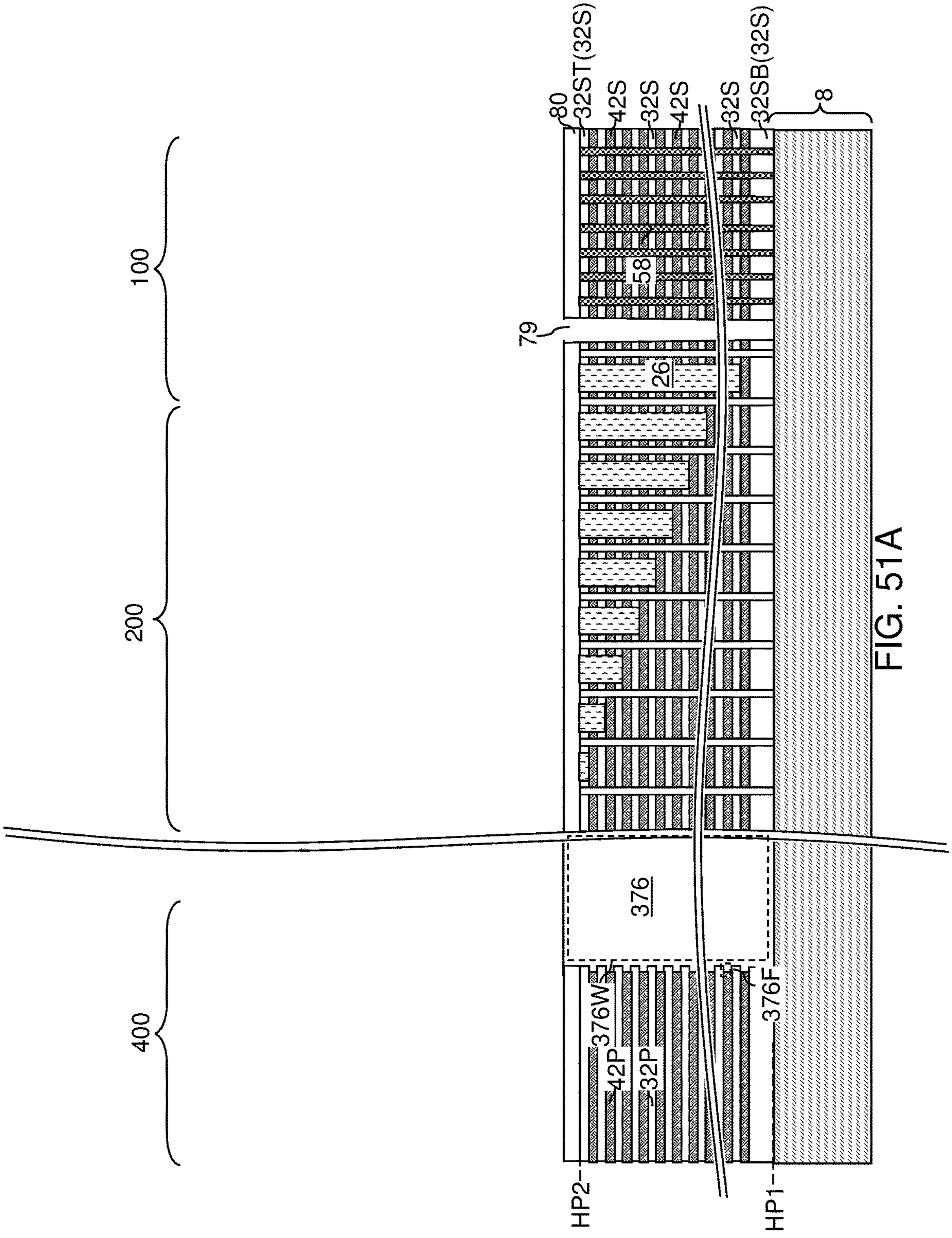

FIG. 51A is a vertical cross-sectional view of the fourth exemplary structure after removal of sacrificial backside trench fill structures according to the fourth embodiment of the present disclosure.

Figure 51B:
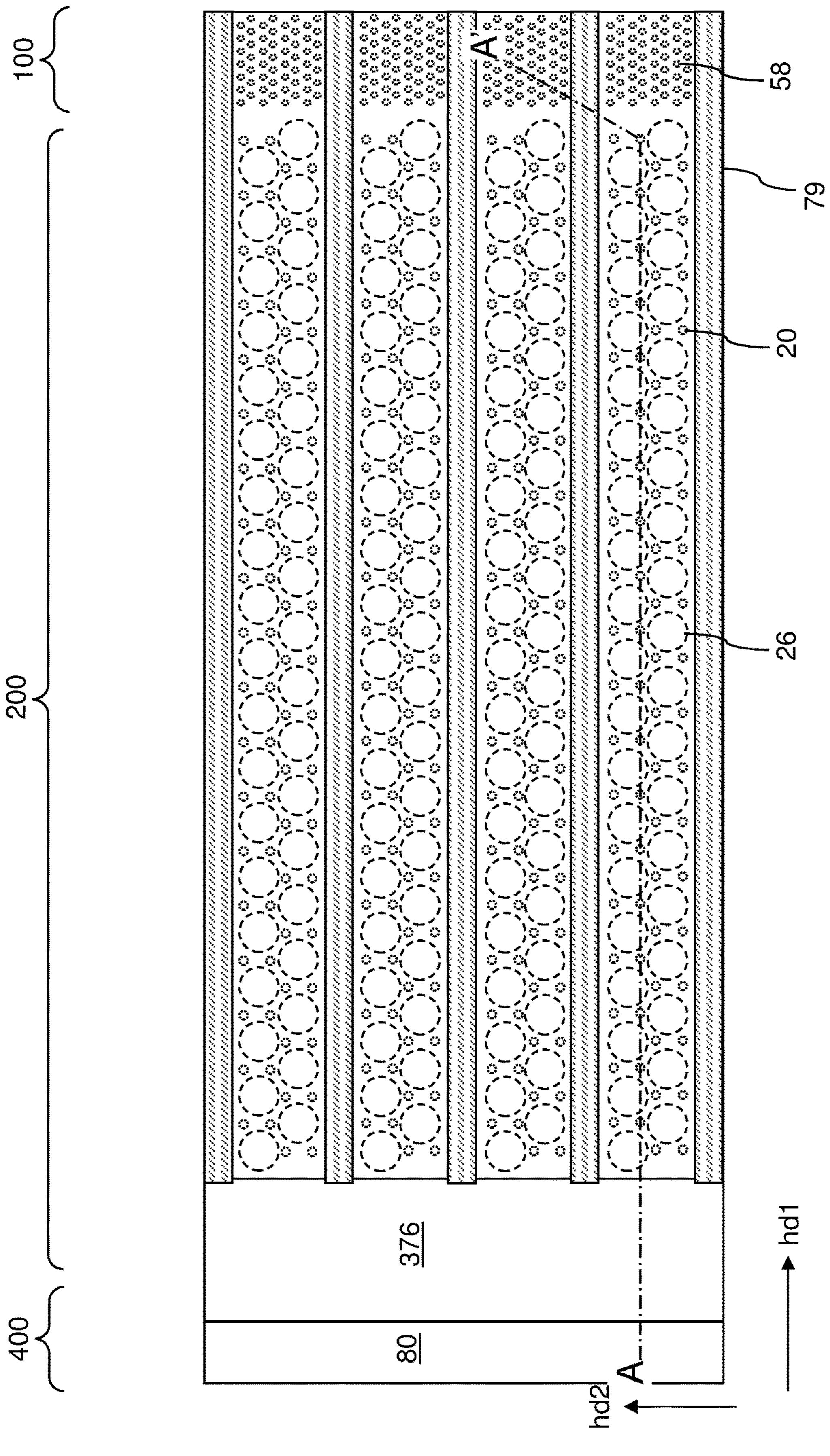

FIG. 51B is a top-down view of the fourth exemplary structure of FIG. 51A. The hinged vertical plane A-A' is a plane of the vertical cross-sectional view of FIG. 51A.

Figure 52A:
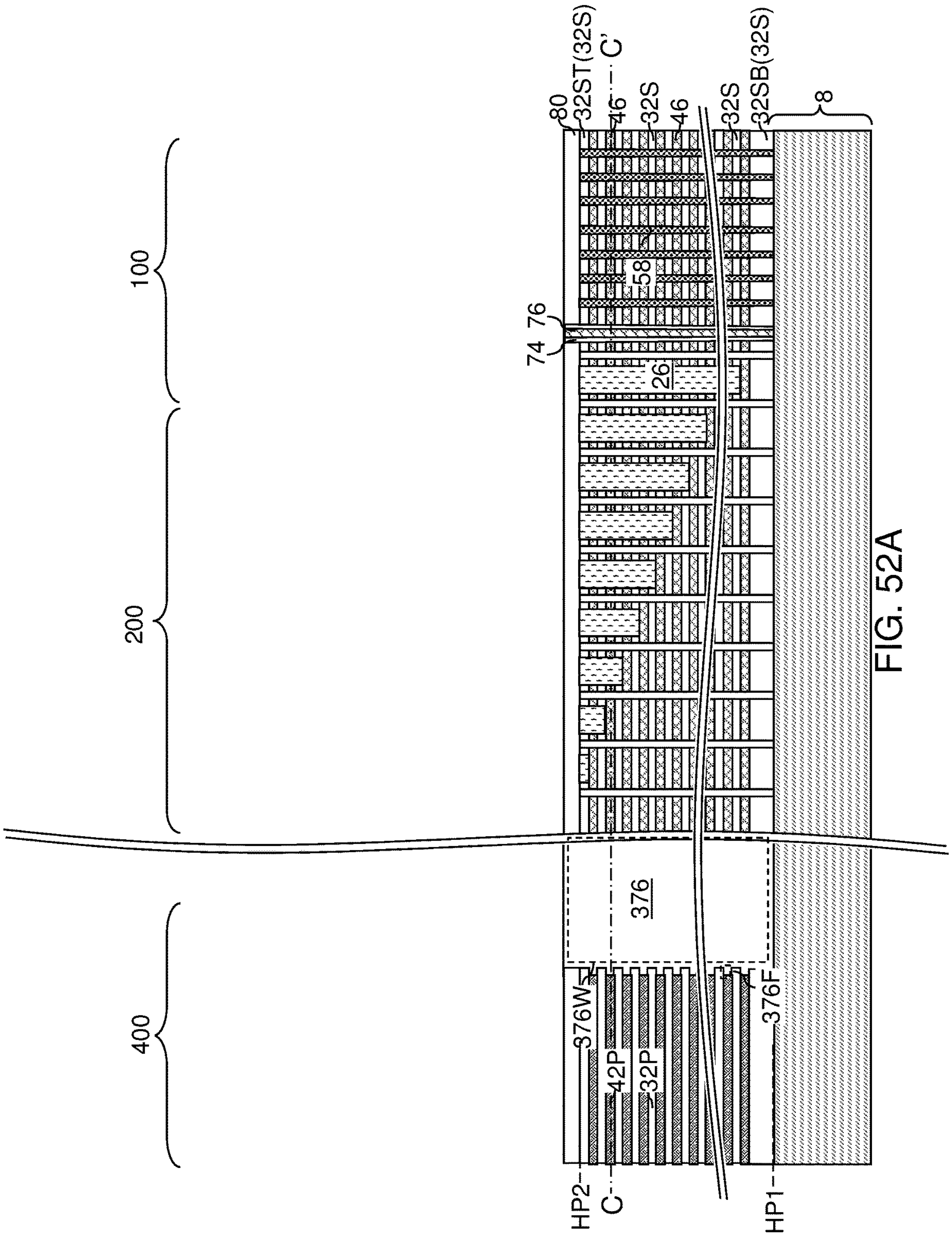

FIG. 52A is a vertical cross-sectional view of the fourth exemplary structure after formation of electrically conductive layers and backside trench fill structures according to the fourth embodiment of the present disclosure.

Figure 52B:
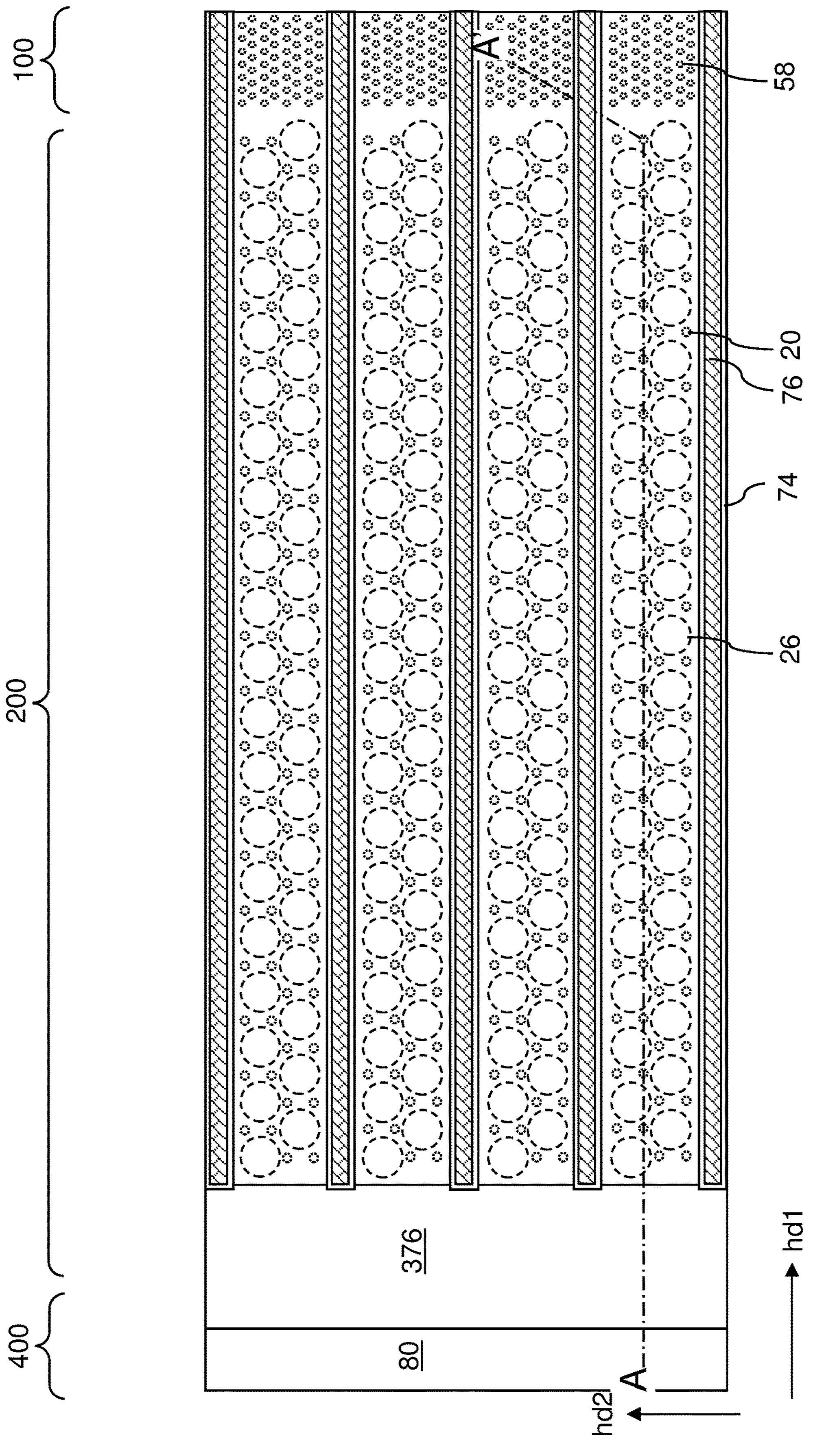

FIG. 52B is a top-down view of the fourth exemplary structure of FIG. 52A. The hinged vertical plane A-A' is a plane of the vertical cross-sectional view of FIG. 52A.

Figure 52C:
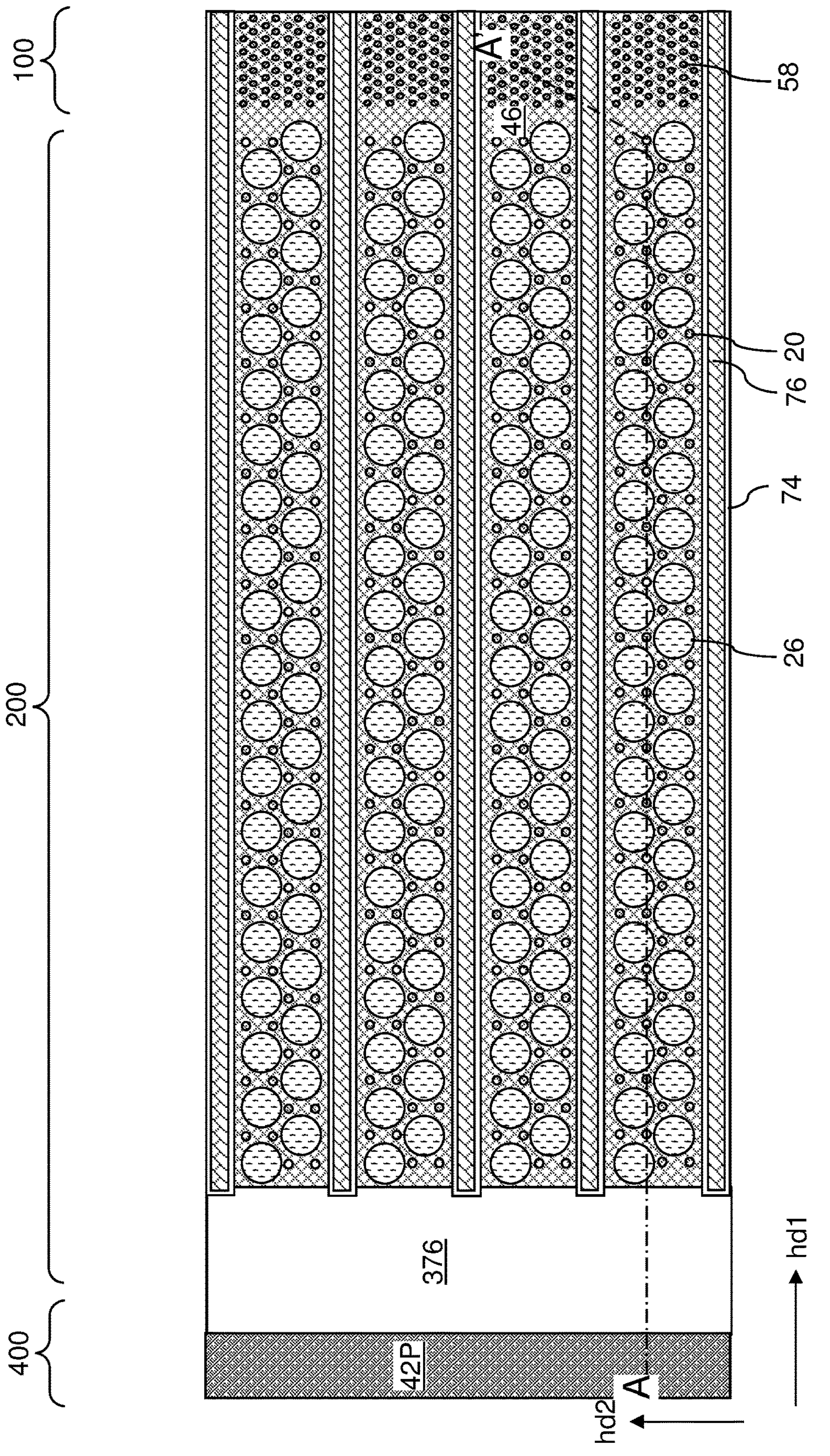

FIG. 52C is a horizontal cross-sectional view of the fourth exemplary structure along the horizontal plane C-C' of FIG. 52A.

Figure 53A:
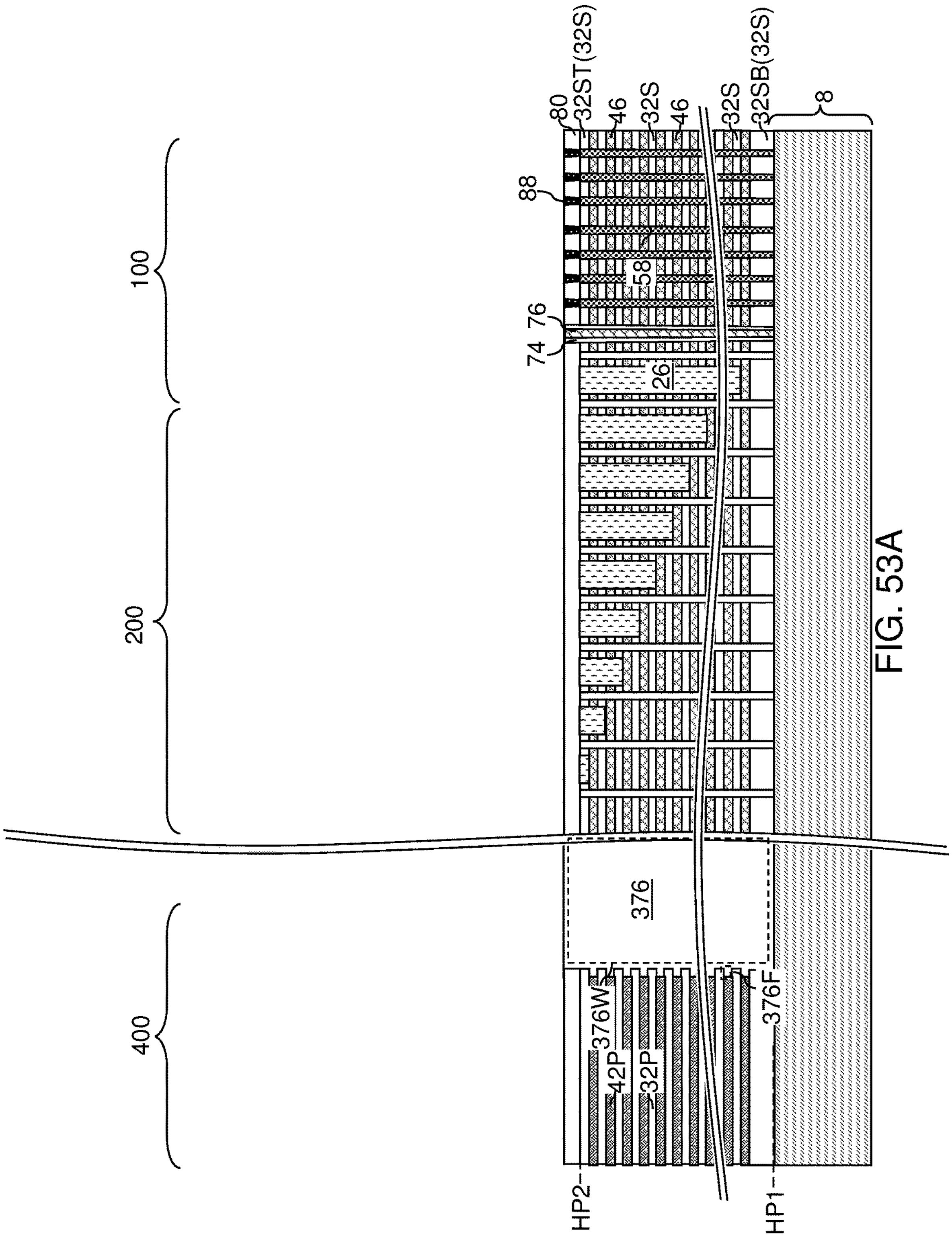

FIG. 53A is a vertical cross-sectional view of the fourth exemplary structure after formation of drain contact via structures according to the fourth embodiment of the present disclosure.

Figure 53B:
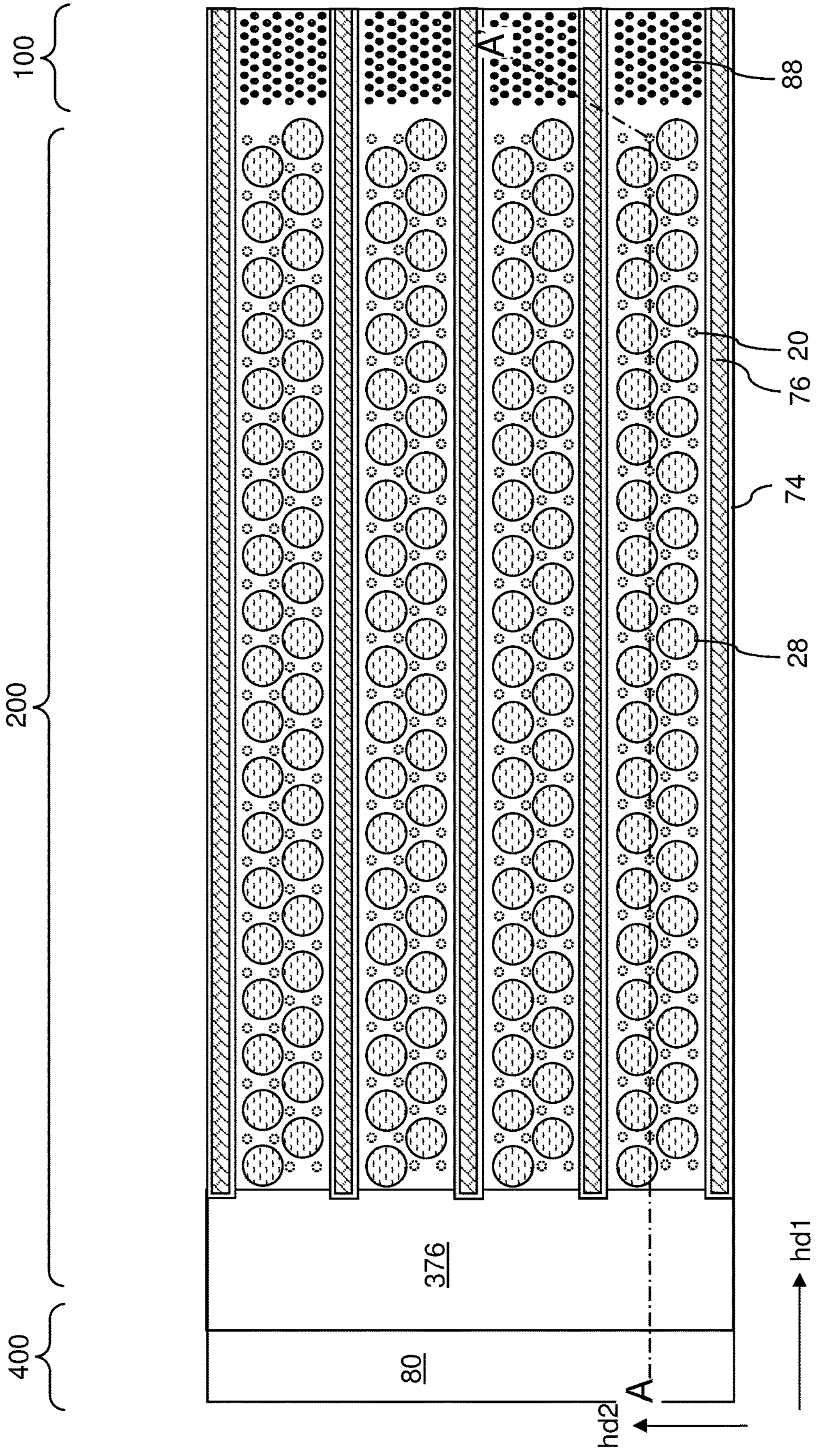

FIG. 53B is a top-down view of the fourth exemplary structure of FIG. 53A.

Figure 54:
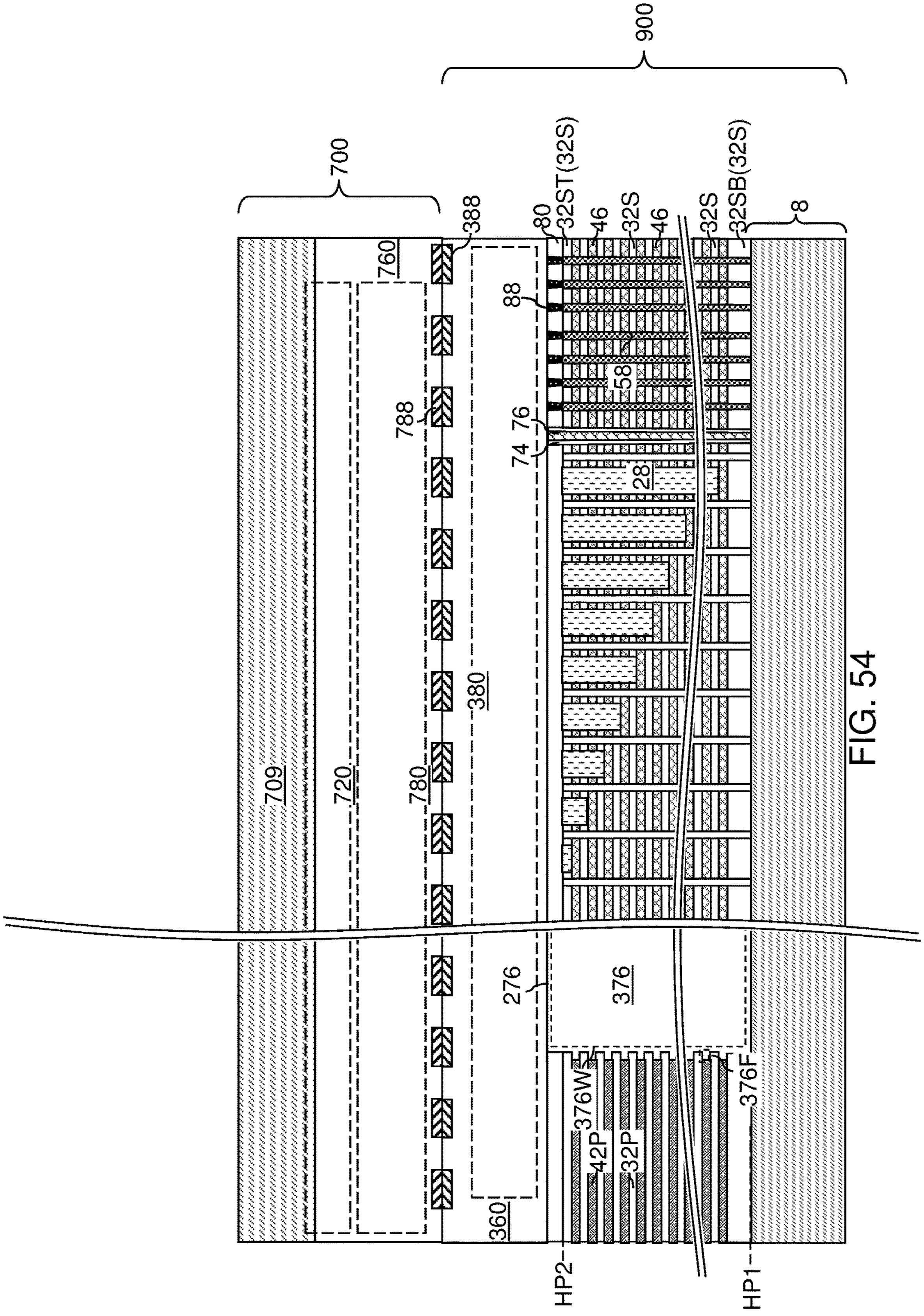

FIG. 54 is a vertical cross-sectional view of the fourth exemplary structure after attaching a logic die to a memory die according to the fourth embodiment of the present disclosure.

DETAILED DESCRIPTION

As discussed above, the embodiments of the present disclosure are directed to a three-dimensional memory device including inter-block word line lateral isolation structures for stairless layer contact via structures and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many a number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1A:
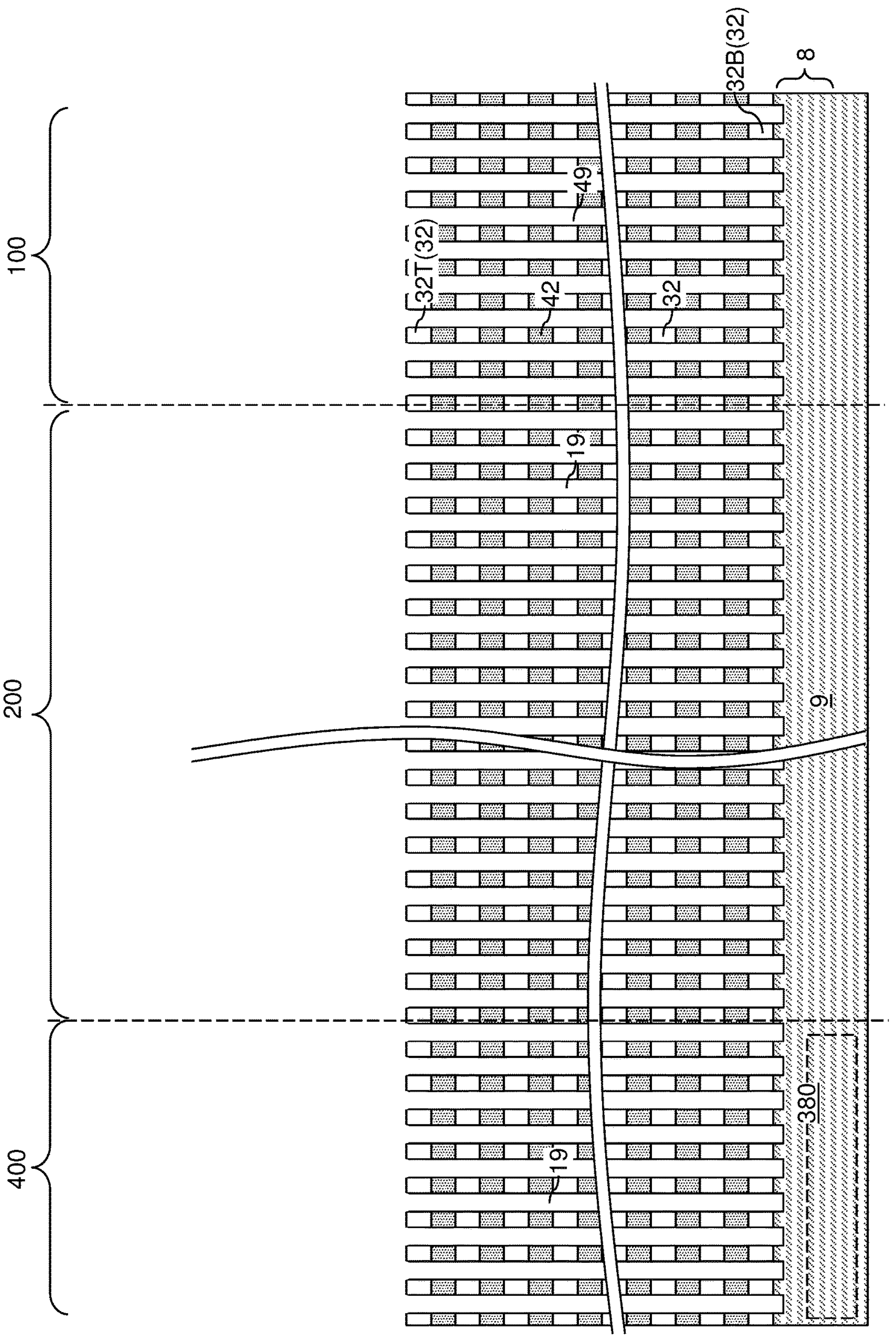
FIG. 1A is a vertical cross-sectional view of the first exemplary structure after formation of an alternating stack of insulating layers and sacrificial material layers, memory openings, and support openings according to the first embodiment of the present disclosure.
Figure 1B:
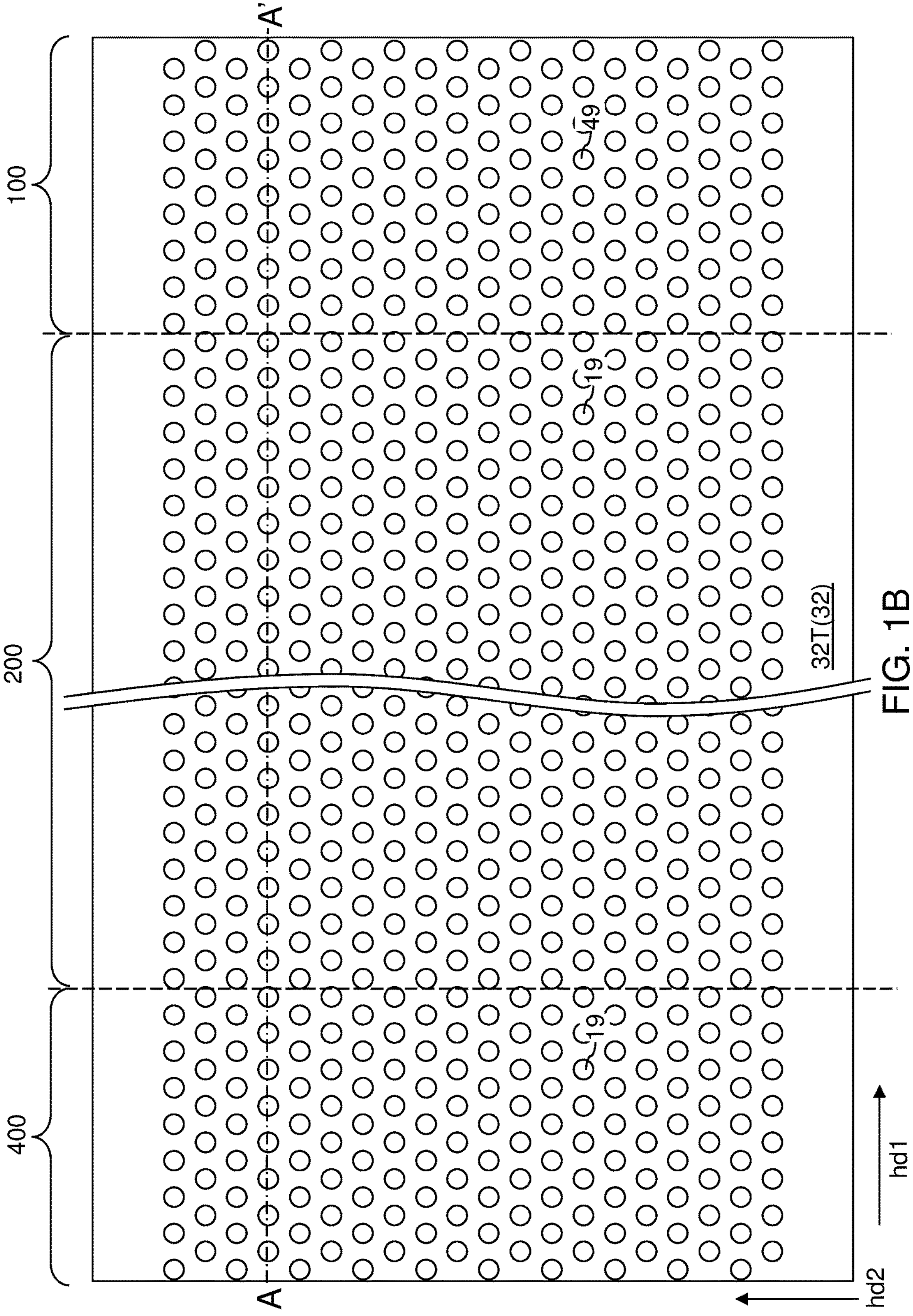
FIG. 1B is a top-down view of the first exemplary structure of FIG. 1A. The vertical plane A-A' is the vertical cross-sectional plane of FIG. 1A.

Referring to FIGS. 1A and 1B, a first exemplary structure according to a first embodiment of the present disclosure includes a substrate 8. The substrate 8 may be a carrier substrate that is subsequently removed. The substrate 8 may comprise a semiconductor material (e.g., a silicon wafer), an insulating material, a conductive material, or a combination thereof. The substrate 8 comprises a material that can provide structural support to material portions that are subsequently formed thereupon. The substrate 8 comprises a substrate material layer 9 at least at an upper portion thereof. In one embodiment, the substrate material layer 9 may be a semiconductor material layer, such as a silicon layer or a doped well in a silicon wafer. In another embodiment, the substrate material layer 9 may be an insulating layer, such as silicon oxide. Optionally, lower metal interconnect structures 480 may be located below the insulating substrate material layer 9 or may be embedded in the insulating substrate material layer 9.

The first exemplary structure comprises a memory array region 100 in which a three-dimensional memory array is subsequently formed, a contact region 200 in which layer contact via structures are subsequently formed, and a connection region 400 in which connection via structures are subsequently formed.

An alternating stack of insulating layers 32 and sacrificial material layers 42 can be formed over the substrate 8. The alternating stack of insulating layers 32 and sacrificial material layers 42 is a vertically alternating sequence of the insulating layers 32 and the sacrificial material layers 42 that alternate along the vertical direction. Each insulating layer 32 can include an insulating material, and each sacrificial material layer 42 can include a sacrificial material. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The sacrificial material of the sacrificial material layers 42 comprises a material can be removed selective to the material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise a dielectric material, a semiconductor material, or a conductive material. The material of the sacrificial material layers 42 can be subsequently replaced with electrically conductive electrodes which can function, for example, as control gate electrodes of a vertical NAND device. In one embodiment, the sacrificial material layers 42 can be material layers that comprise silicon nitride.

In one embodiment, the insulating layers 32 can include silicon oxide, and sacrificial material layers can include silicon nitride sacrificial material layers. The insulating layers 32 can be deposited, for example, by chemical vapor deposition (CVD). For example, if silicon oxide is employed for the insulating layers 32, tetraethylorthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of a insulating layer 32 and a sacrificial material layer 42 can be in a range from 2 to 1,024, and typically from 8 to 256, although a greater number of repetitions can also be employed. In one embodiment, each sacrificial material layer 42 in the vertically alternating sequence (32, 42) can have a uniform thickness that is substantially invariant within each respective sacrificial material layer 42. The bottommost layer among the insulating layers 32 is herein referred to as a bottommost insulating layer 32B. The topmost layer among the insulating layers 32 is herein referred to as a topmost insulating layer 32T.

A lithographic material stack (not shown) including at least a photoresist layer can be formed over the topmost insulating layer 32T, and can be lithographically patterned to form openings therein. The openings include a first set of openings formed over memory array region 100 and a second set of openings formed over the contact region 200 and the connection region 400. The pattern in the lithographic material stack can be transferred through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed in the memory array region 100. The support openings 19 are formed in the contact region 200 and in the connection region 400.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the substrate material layer 9. In one embodiment, an overetch into the substrate material layer 9 may be optionally performed after the top surface of the substrate material layer 9 is physically exposed at a bottom of each memory opening 49 and each support opening 19. The overetch may be performed prior to, or after, removal of the lithographic material stack. In other words, the recessed surfaces of the substrate material layer 9 may be vertically offset from the un-recessed top surfaces of the substrate material layer 9 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the substrate material layer 9.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 200 and in connection region 400.

Figure 2A:
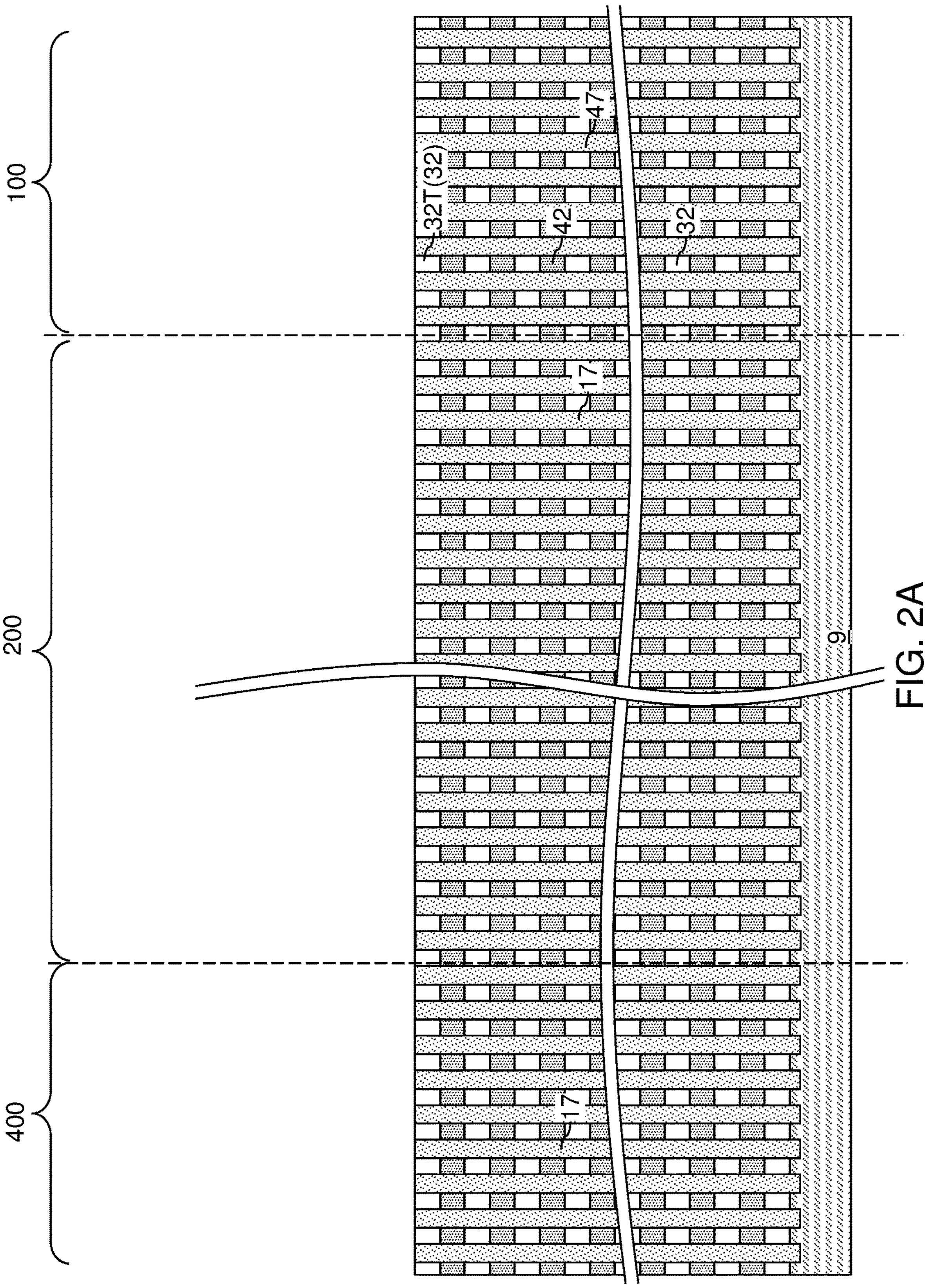
FIG. 2A is a vertical cross-sectional view of the first exemplary structure after formation of sacrificial memory opening fill structures and sacrificial support opening fill structures according to the first embodiment of the present disclosure.
Figure 2B:
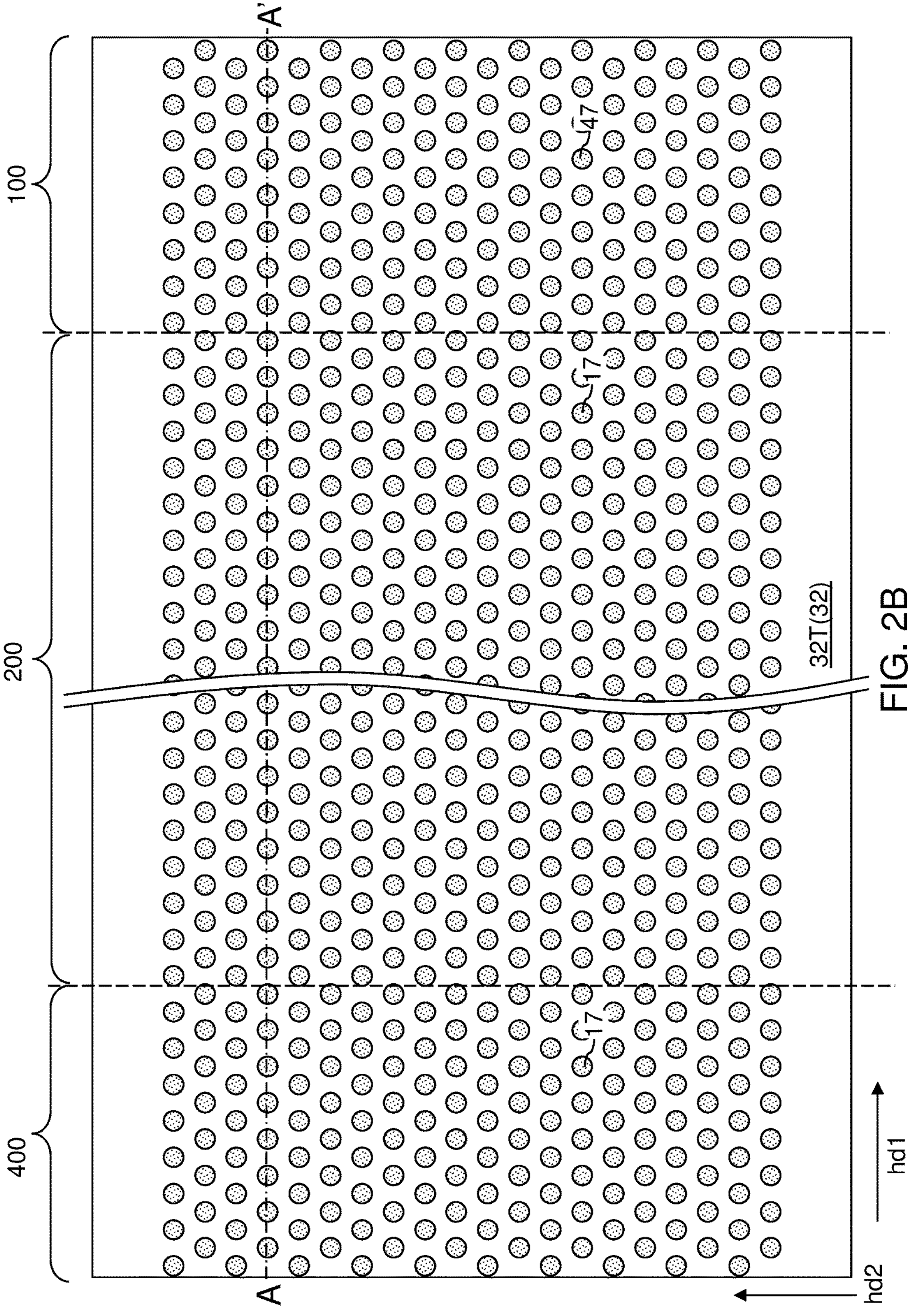
FIG. 2B is a top-down view of the first exemplary structure of FIG. 2A. The vertical plane A-A' is the vertical cross-sectional plane of FIG. 2A.

Referring to FIGS. 2A and 2B, a sacrificial fill material can be deposited in the memory openings 49 and the support openings 19. The sacrificial fill material may be any material that may be removed selective to the materials of the insulating layers 32, the sacrificial material layers 42, and the substrate material layer 9. For example, the sacrificial fill material may comprise a carbon-based material such as amorphous carbon or diamond-like carbon, a semiconductor material such as a silicon-germanium alloy, polysilicon or amorphous silicon, or a dielectric material such as borosilicate glass or organosilicate glass. Optionally, a thin etch stop liner (not shown) may be employed to facilitate subsequent selective removal of the sacrificial fill material. Excess portions of the sacrificial fill material may be removed from above the horizontal plane including the top surface of the topmost insulating layer 32T. Each remaining portion of the sacrificial fill material filling a memory opening 49 constitutes a sacrificial memory opening fill structure 47. Each remaining portion of the sacrificial fill material filling a support opening 19 constitutes a sacrificial support opening fill structure 17.

Figure 3:
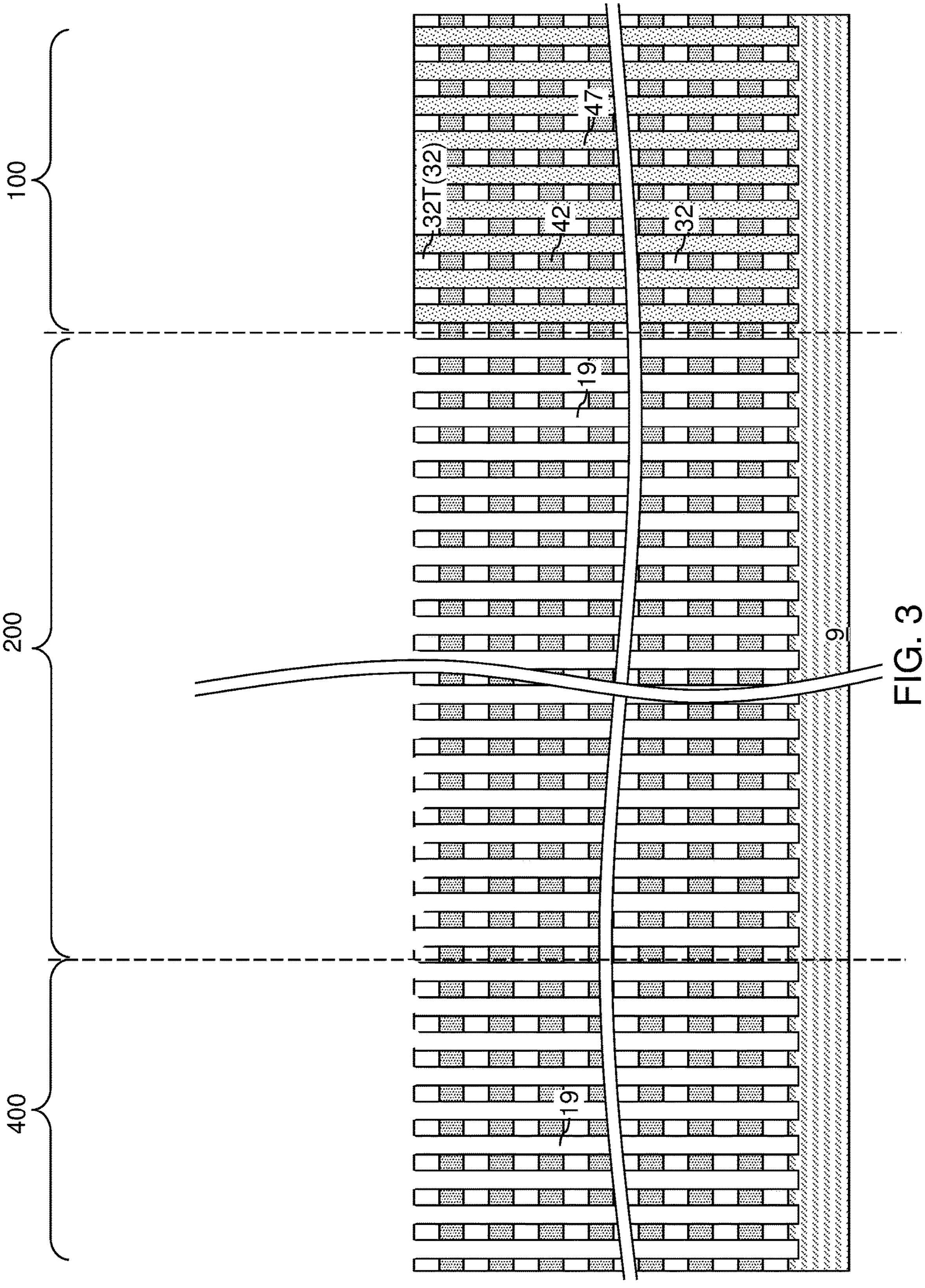
FIG. 3 is a vertical cross-sectional view of the first exemplary structure after removal of sacrificial support opening fill structures according to the first embodiment of the present disclosure.

Referring to FIG. 3, a photoresist layer (not shown) can be applied over the exemplary structure, and can be lithographically patterned to cover the memory array region 100 while not covering the contact region 200 and the connection region 400. The sacrificial support opening fill structures 17 can be removed by removing the sacrificial fill material within the areas that are not covered by the photoresist layer. The sacrificial fill material may be removed, for example, by ashing or by performing an etch process such as a wet etch process. Cavities are formed in the support openings 19. The photoresist layer can be removed, for example, by ashing.

Figure 4:
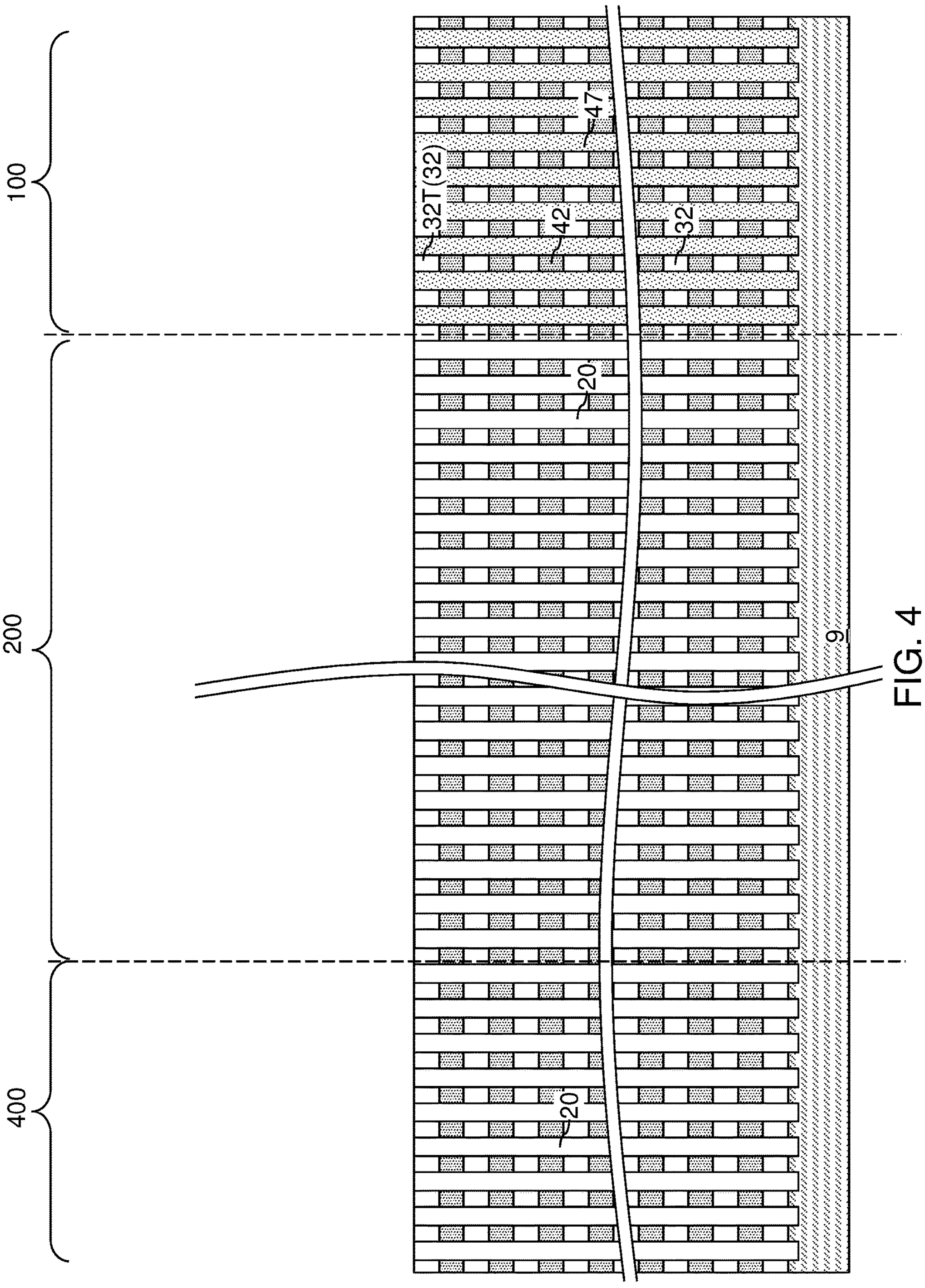
FIG. 4 is a vertical cross-sectional view of the first exemplary structure after formation of support pillar structures according to the first embodiment of the present disclosure.

Referring to FIG. 4, a dielectric fill material such as undoped silicate glass (i.e., silicon oxide) or a doped silicate glass can be deposited in the support openings 19 employing a conformal deposition process such as a chemical vapor deposition process. Portions of the dielectric fill material that overlie the topmost insulating layer 32T may be removed, for example, by chemical mechanical polishing or by an etch back process, such as a wet etch process employing dilute hydrofluoric acid. Remaining portions of the dielectric fill material that fill the support openings 19 comprise support pillar structures 20, which are dielectric pillar structures that provide structural support to the exemplary structure during a subsequent processing step in which the sacrificial material layers 42 are removed.

Figure 5:
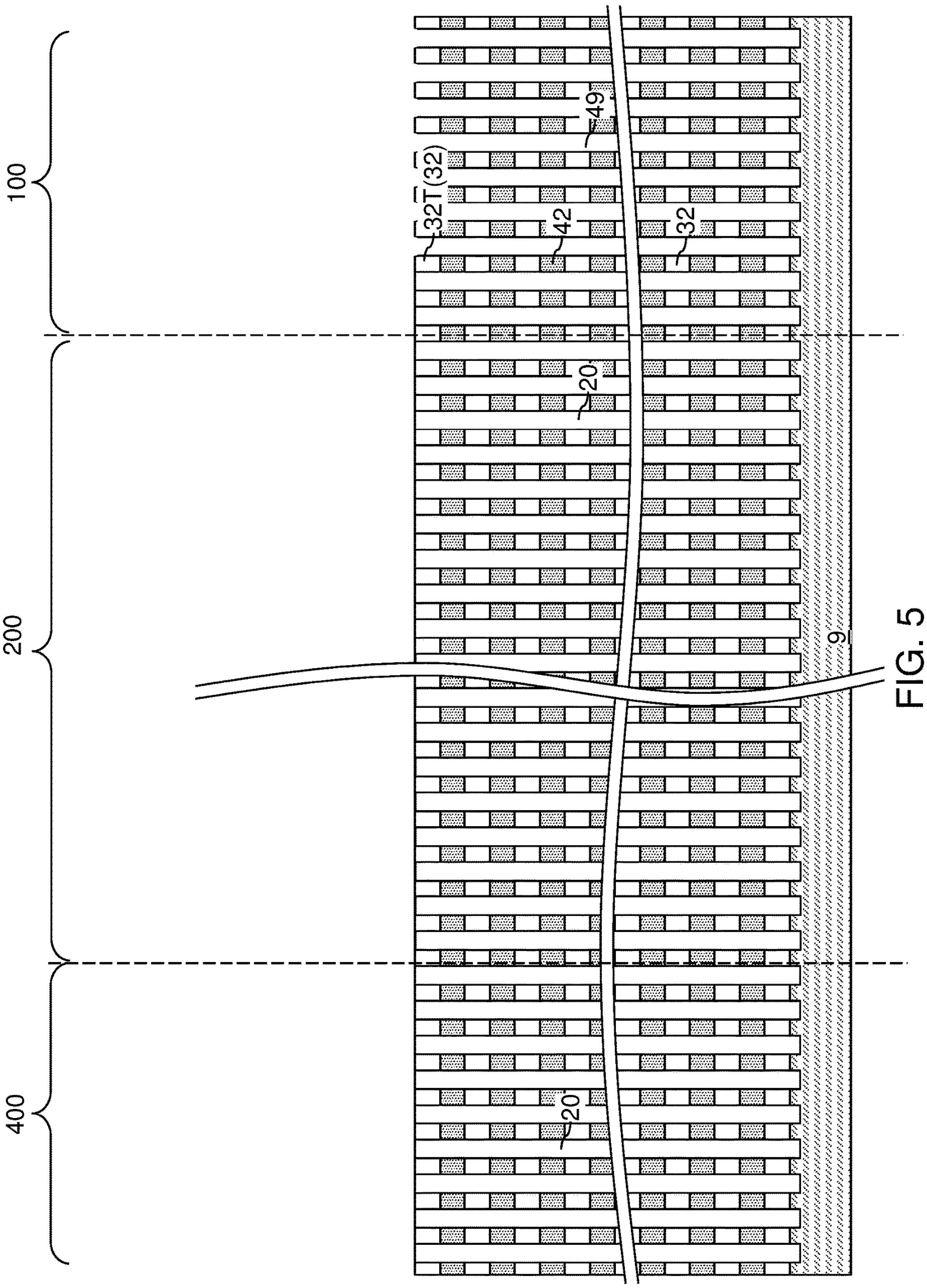
FIG. 5 is a vertical cross-sectional view of the first exemplary structure after removal of sacrificial support opening fill structures according to the first embodiment of the present disclosure.

Referring to FIG. 5, the sacrificial fill material of the sacrificial memory opening fill structures 47 can be removed selective to the materials of the insulating layers 32, the sacrificial material layers 42, the semiconductor material layer 10, and the support pillar structures 20. The sacrificial memory opening fill structures 47 may be removed by ashing or by performing an etch process such as a wet etch process. Cavities are formed in volumes from the which the sacrificial memory opening fill structures 47 are removed.

FIGS. 6A-6H is a vertical cross-sectional view of a memory opening during formation of a memory opening fill structure 58. The same structural change occurs simultaneously in each of the other memory openings 49, Referring to FIG. 6A, a memory opening 49 in the exemplary device structure of FIG. 5 is illustrated. The memory opening 49 extends through the topmost insulating layer 32 (32T), the alternating stack (32, 42), and optionally into an upper portion of the substrate material layer 9. The recess depth of the bottom surface of each memory opening with respect to the top surface of the substrate material layer 9 can be in a range from 0 nm to 30 nm, although greater recess depths can also be employed. Optionally, the sacrificial material layers 42 can be laterally recessed partially to form lateral recesses (not shown), for example, by an isotropic etch.

Figure 6A:
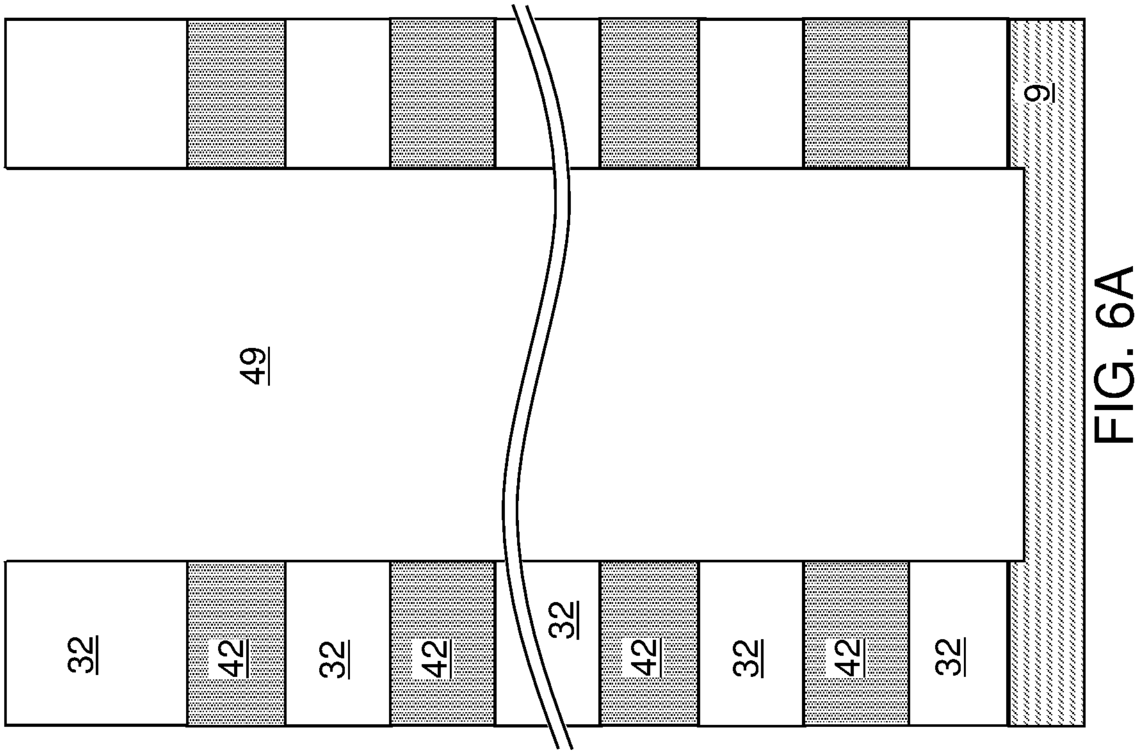
FIGS. 6A-6H is a vertical cross-sectional view of a memory opening during formation of a memory opening fill structure.
Figure 6B:
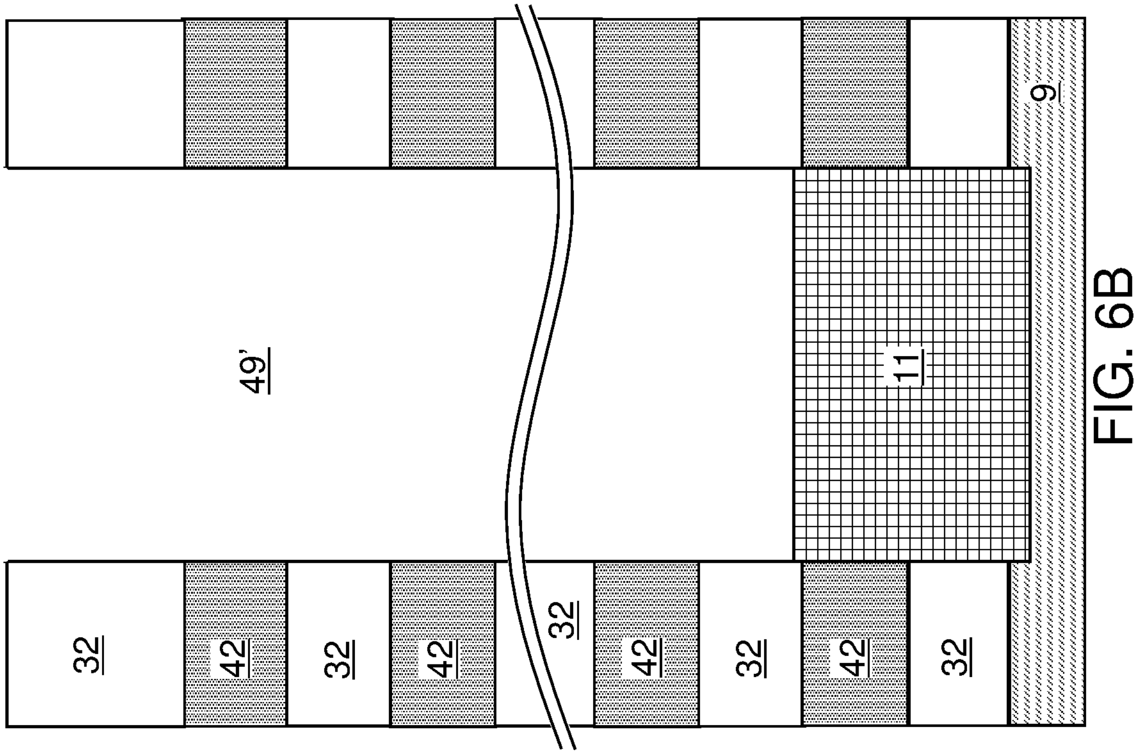

Referring to FIG. 6B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material (e.g., single crystal silicon) in epitaxial alignment with the single crystalline substrate material layer 9. In one embodiment, the pedestal channel portion 11 can be doped with electrical dopants of the same conductivity type as the substrate material layer 9. In one embodiment, the top surface of each pedestal channel portion 11 can be formed above a horizontal plane including the top surface of at least one bottommost sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in or above the substrate material layer 9 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the substrate material layer 9 that the pedestal channel portion contacts.

Figure 6D:
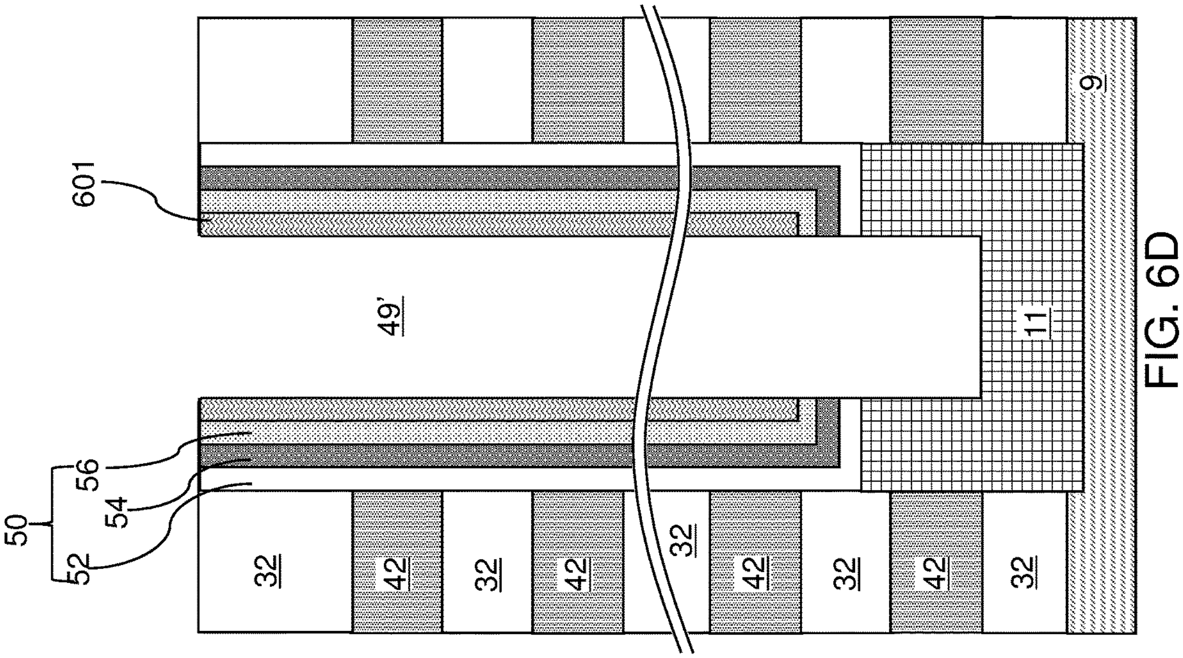
Figure 6C:
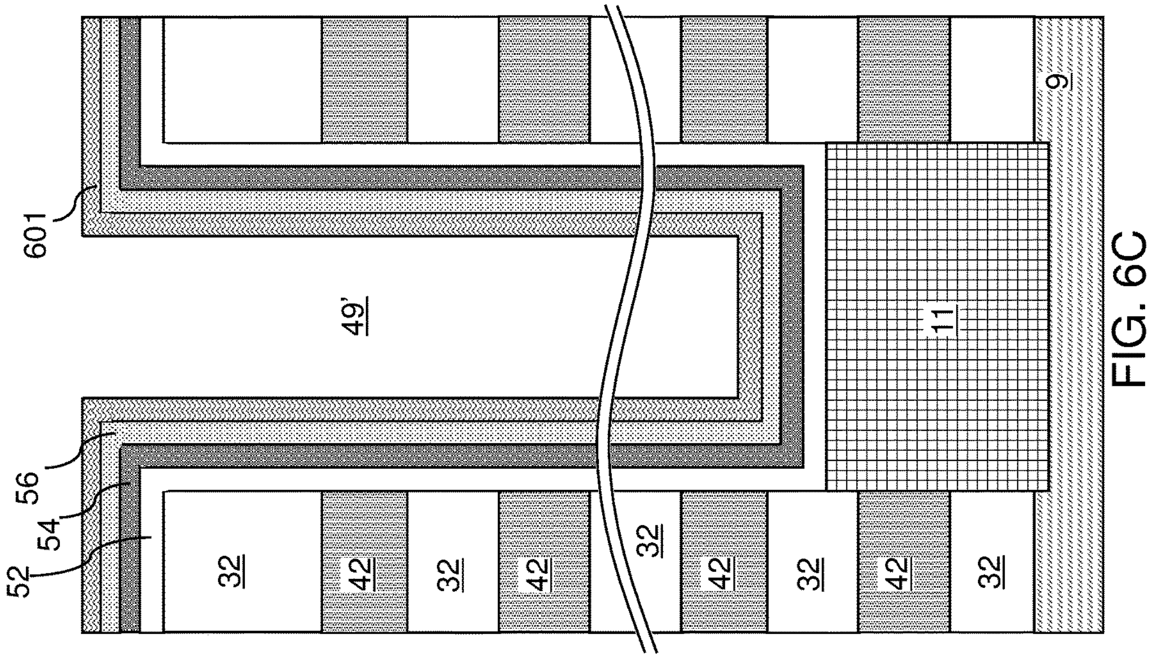

Referring to FIG. 6C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer 54 may comprise any memory material that can store a data bit. The data bit may be stored in the form of electrical charges trapped therein, in the form of a resistive state of a material due to changes in the material phase, resistivity or ferroelectric property. In one embodiment, the memory material layer 54 may comprise a charge storage layer. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the memory material layer 54 is illustrated as a single continuous layer, embodiments are expressly contemplated herein in which the memory material layer 54 is replaced with a plurality of discrete memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. In one embodiment, the dielectric material liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed. Alternatively, a different type of dielectric material layer may be employed as the dielectric material liner 56.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6D, the optional sacrificial cover material layer 601, the dielectric material liner 56, the memory material layer 54, and the blocking dielectric layer 52 overlying the topmost insulating layer 32 (32T) are sequentially anisotropically etched employing at least one anisotropic etch process. The portions of the sacrificial cover material layer 601, the dielectric material liner 56, the memory material layer 54, and the blocking dielectric layer 52 located above the top surface of the topmost insulating layer 32 (32T) can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the substrate material layer 9 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the substrate material layer 9 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. Optionally, the sacrificial cover material layer 601 can be subsequently removed selective to the material of the dielectric material liner 56. If the sacrificial cover material layer 601 includes amorphous silicon, then a wet etch process employing hot trimethyl-2 hydroxyethyl ammonium hydroxide (“hot TMY”) or tetramethyl ammonium hydroxide (TMAH) can be performed to remove the sacrificial cover material layer 601.

Figure 6F:
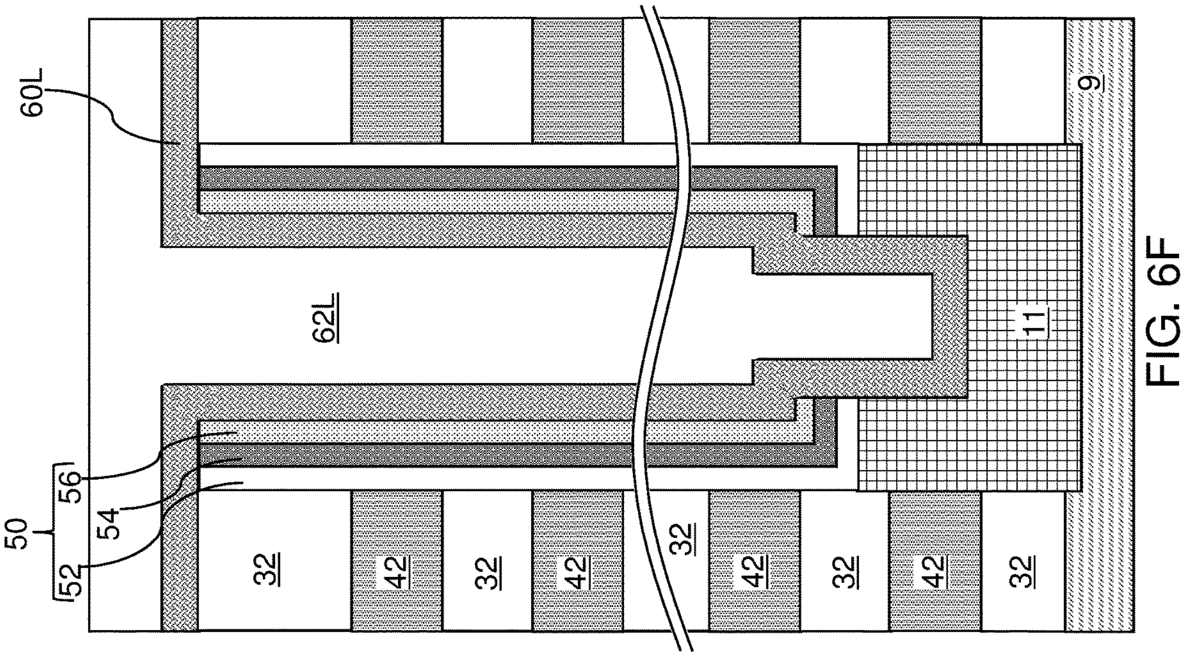
Figure 6E:
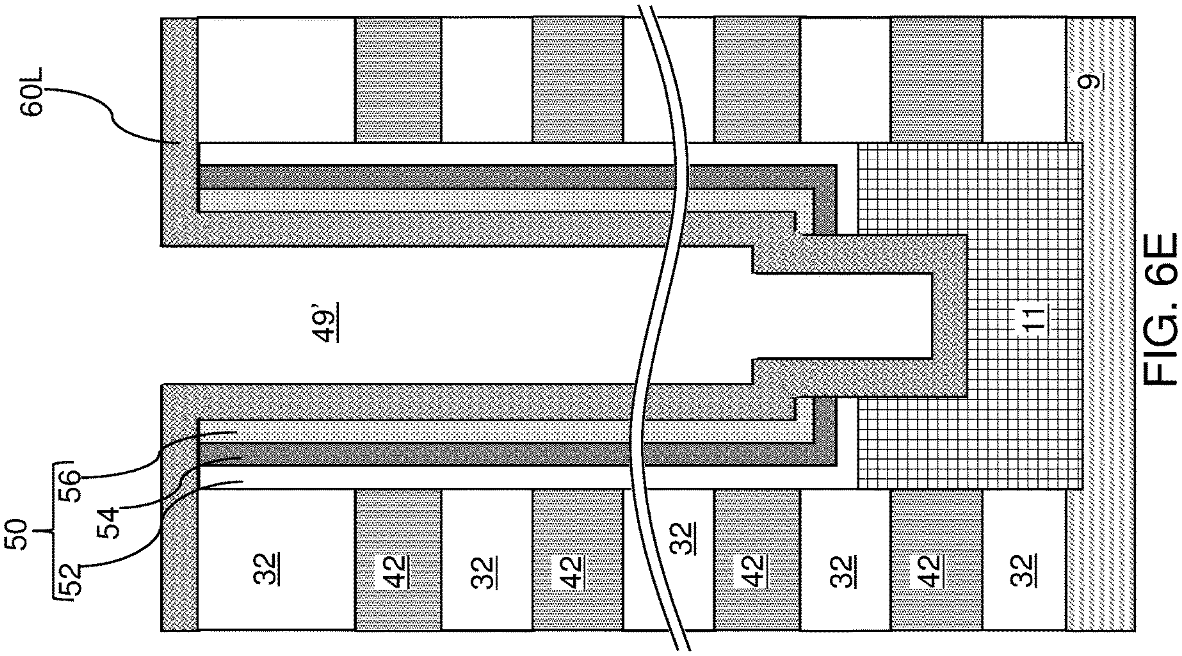

Referring to FIG. 6E, a semiconductor channel layer 60L can be deposited directly on the semiconductor surface of the pedestal channel portion 11 or the substrate material layer 9 if the pedestal channel portion 11 is omitted, and directly on the dielectric material liner 56 (or on the silicon sacrificial cover material layer 601 if still present). The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the semiconductor channel layer 60L includes amorphous silicon or polysilicon. The semiconductor channel layer 60L can have a doping of a first conductivity type, which is the same as the conductivity type of the substrate material layer 9 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 6F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 6H:
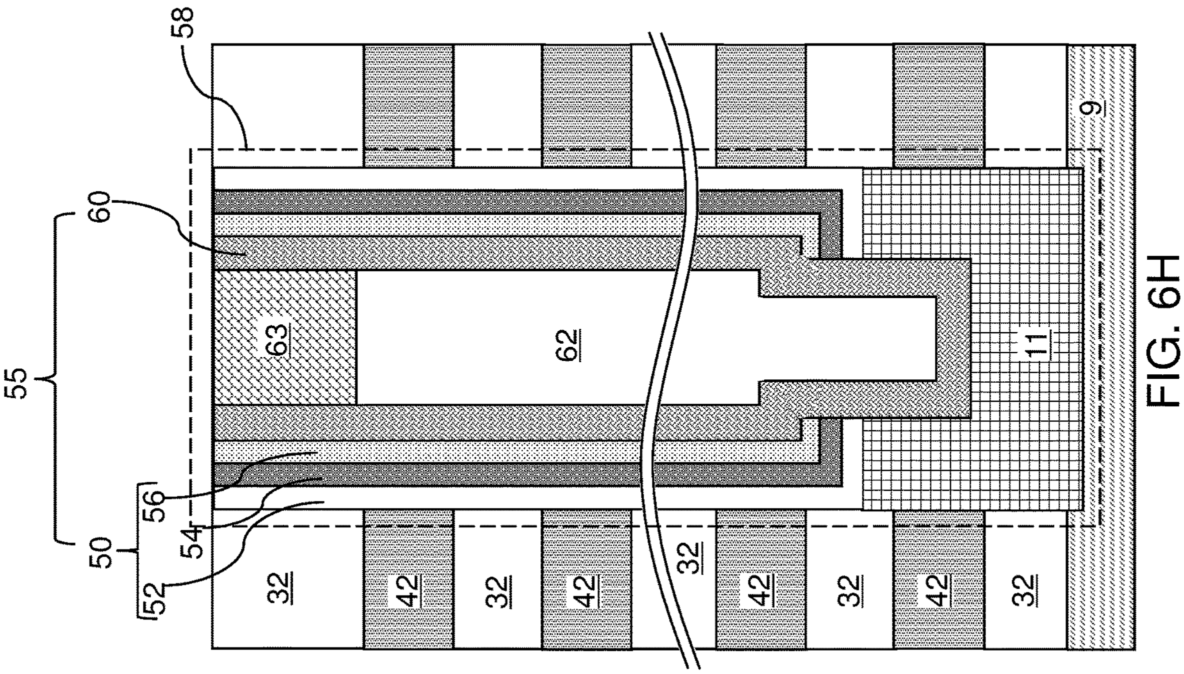
Figure 6G:
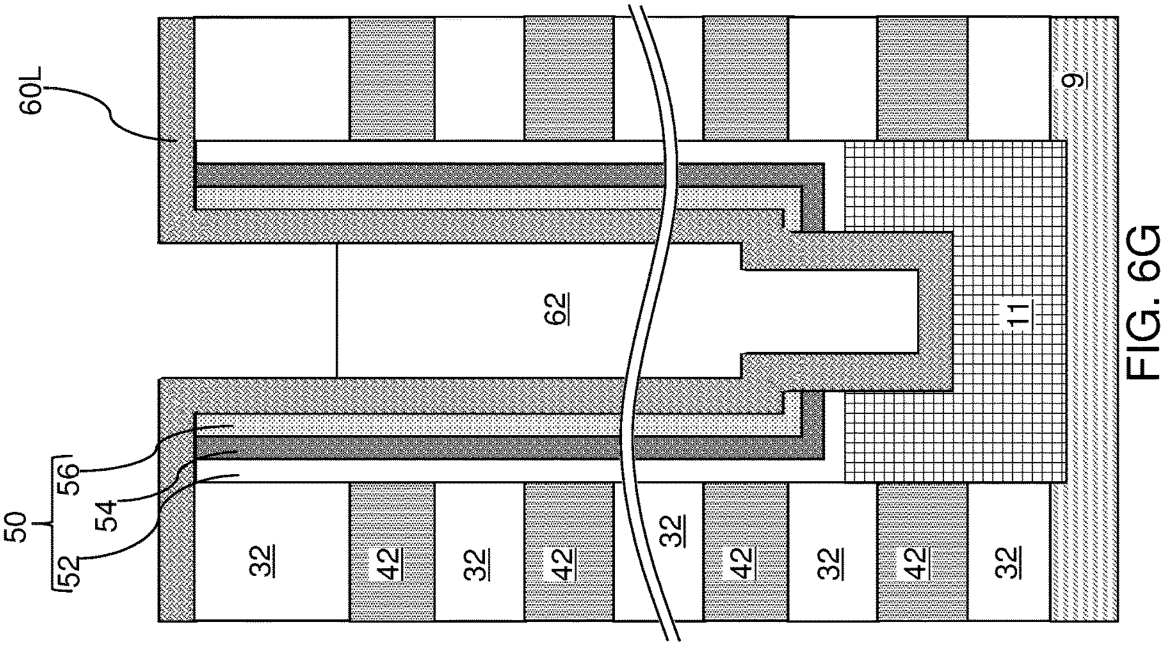

Referring to FIG. 6G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32 (32T). Each remaining portion of the dielectric core layer 62L constitutes a dielectric core 62.

Referring to FIG. 6H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32 (32T), for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

Each adjoining set of a blocking dielectric layer 52, a memory material layer 54, and a dielectric material liner 56 collectively constitute a memory film 50, which can store electrical charges or electrical polarization with a macroscopic retention time. As used herein, a macroscopic retention time refers to a retention time suitable for operation of a memory device as a permanent memory device such as a retention time in excess of 24 hours. In some embodiments, a blocking dielectric layer 52 may not be present in the memory film 50 at this step, and a backside blocking dielectric layer may be subsequently formed after formation of backside recesses.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42.

Figure 7A:
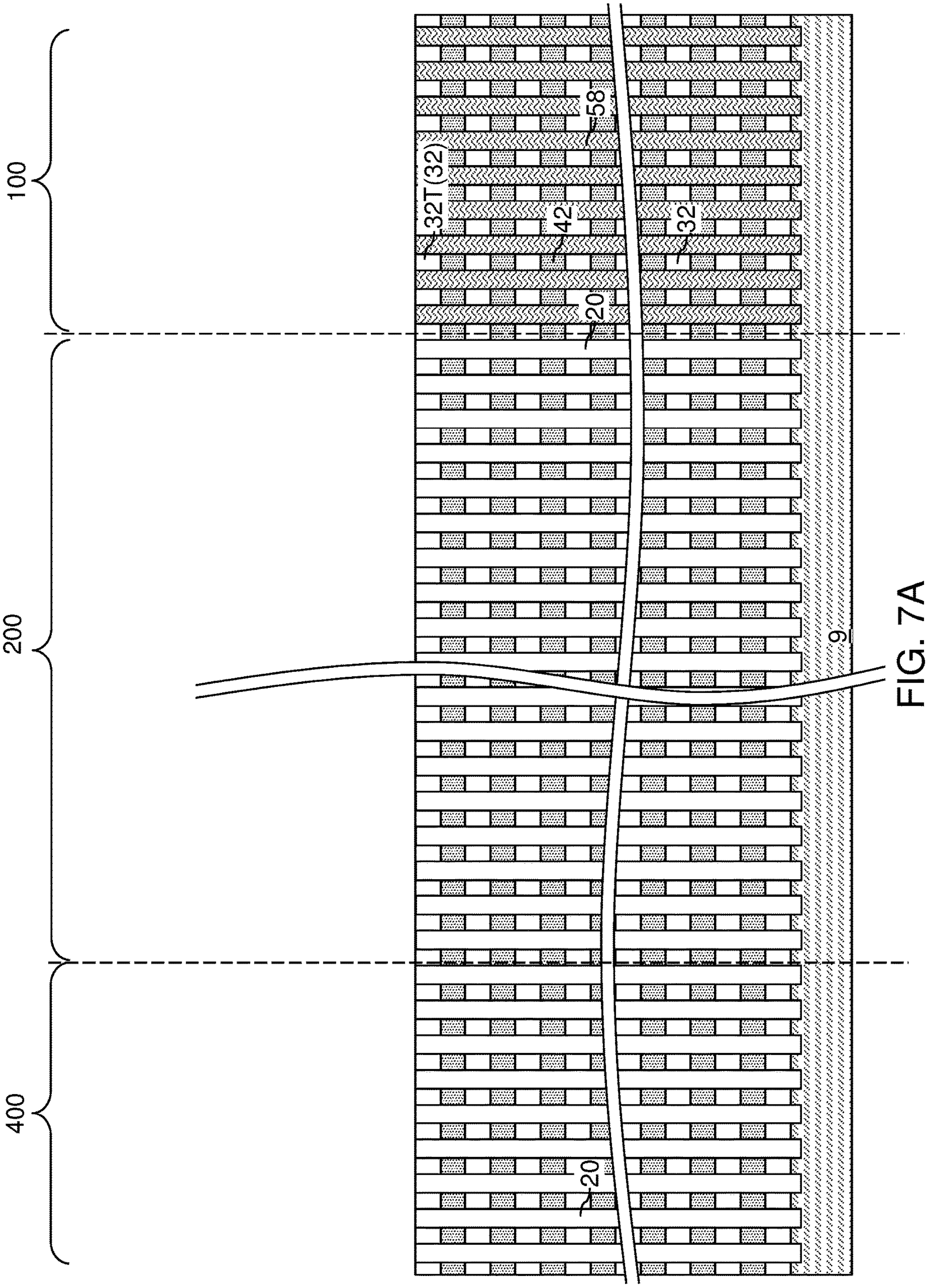
FIG. 7A is a vertical cross-sectional view of the first exemplary structure after formation of memory opening fill structures according to the first embodiment of the present disclosure.
Figure 7B:
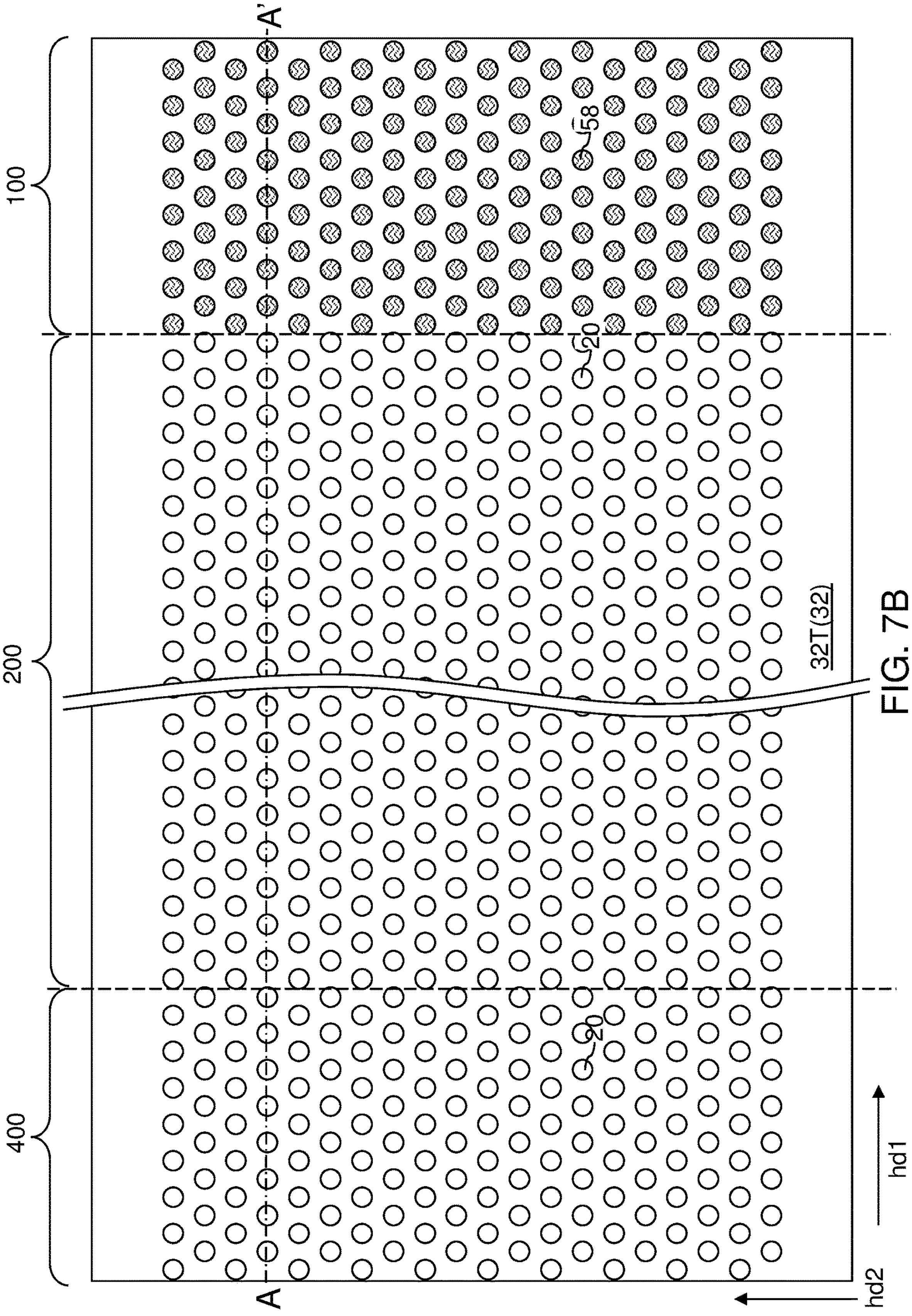
FIG. 7B is a top-down view of the first exemplary structure of FIG. 7A. The vertical plane A-A' is the vertical cross-sectional plane of FIG. 7A.

Referring to FIGS. 7A and 7B, the exemplary structure is illustrated after formation of memory opening fill structures 58 and support pillar structures 20 within the memory openings 49 and the support openings 19, respectively. An instance of a memory opening fill structure 58 can be formed within each memory opening 49 of the structure of FIG. 5. An instance of the support pillar structure 20 can be formed within each support opening 19 of the structure of FIG. 5. Alternative memory stack structures including different layer stacks or structures for the memory film 50 and/or for the vertical semiconductor channel 60 may be used instead.

Figure 7C:
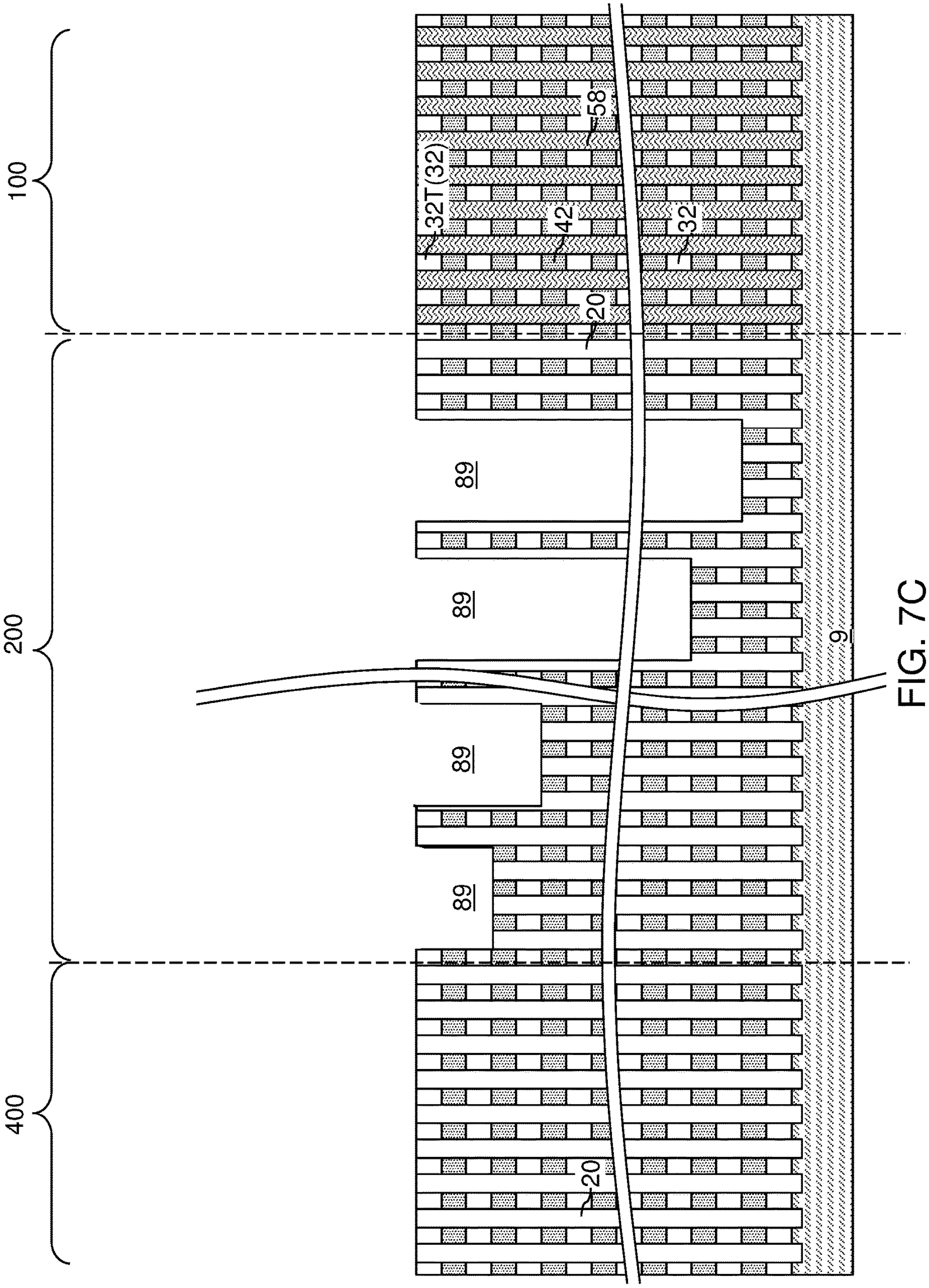
FIG. 7C is a vertical cross-sectional view of the first exemplary structure after formation of contact via cavities according to the first embodiment of the present disclosure.

Referring to FIG. 7C, contact via cavities 89 having different depths can be formed in the contact region 200. Each of the contact via cavities 89 vertically extends through a respective subset of the layers within the alternating stack (32, 42), and has a respective bottom surface that includes a segment of a respective sacrificial material layer 42. Generally, support pillar structures 20 located within the areas of the contact via cavities 89 can be collaterally recessed during formation of the contact via cavities 89. In one embodiment, a predominant fraction of each support pillar structure 20 located within the areas of the contact via cavities 89 has a recessed surface that are coplanar with, or are substantially coplanar with, a physically exposed segment of a sacrificial material layer 42 that underlies the respective contact via cavity 89.

In one embodiment, each sacrificial material layer 42 that is subsequently replaced with a word-line-level electrically conductive layer (i.e., word line) can be physically exposed to at least one contact via cavity 89. In other words, the contact via cavities 89 can be formed such that each of the sacrificial material layers 42 that are subsequently replaced with a respective word-line-level electrically conductive layer is physically exposed to a set of at least one contact via cavity 89 within the contact region. In one embodiment, one or more topmost sacrificial material layers 42 are subsequently replaced with a drain-select-level electrically conductive layers (i.e., drain select gate electrode), and each of the sacrificial material layers 42 other than the topmost sacrificial material layers 42 may comprise a respective surface segment that is physically exposed underneath a respective one of the contact via cavities 89. Contact via cavities may also be formed to levels of the source select gate electrodes located below the word-line-levels.

Generally, the contact via cavities 89 can be formed using any suitable methods. For illustrative purposes, one embodiment method of forming the contact via cavities 89 is described below.

In one embodiment, a sacrificial etch mask layer (not shown) may be formed over the alternating stack (32, 42). The sacrificial etch mask layer may comprise any etch mask material that can withstand ashing processes that are subsequently employed to remove patterned photoresist material layers. For example, the sacrificial etch mask layer may comprise a dielectric metal oxide material, a metallic material, or a carbon-based material. A high-fidelity photoresist material, such as a deep ultraviolet (DUV) photoresist material, can be applied over the sacrificial etch mask layer, and can be patterned to form openings that define the areas of all contact via cavities 89 to be subsequently formed. An anisotropic etch process can be performed to form openings through the sacrificial etch mask layer. An array of openings are formed through the sacrificial etch mask layer. The high-fidelity photoresist material can be subsequently removed.

A series of block-level photoresist materials, such as mid-ultraviolet (MUV) photoresist materials in combination with a series of anisotropic etch processes can be subsequently employed to sequentially cover a respective subset of the openings in the sacrificial etch mask layer and to extend the pattern of the openings in the sacrificial etch mask layer through a respective number of stacks of an insulating layer 32 and a sacrificial material layer 42. For example, about one half of all of the openings through the sacrificial etch mask layer can be covered by a first block-level photoresist layer, and one insulating layer 32 and one sacrificial material layer 42 can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The first block-level photoresist layer can be subsequently removed. About one half of all of the openings through the sacrificial etch mask layer can be covered by a second block-level photoresist layer. About one half of the unmasked openings are among the openings previously covered by the first block-level photoresist layer, and the remainder of the unmasked openings are among the openings previously masked by the first block-level photoresist layer. Two pairs of an insulating layer 32 and a sacrificial material layer 42 (i.e., two insulating layers 32 and two sacrificial material layers 42) can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The second block-level photoresist layer can be subsequently removed. The above scheme can be repeated up to the N-th block-level photoresist layer and an N-th anisotropic etch process etching $2^{(N-1)}$ pairs of an insulating layer 32 and a sacrificial material layer 42 are employed. A terminal anisotropic etch process may be performed in the absence of any block-level photoresist layer, for example, to etch through unmasked portions of a respective set of two insulating layers 32 and a sacrificial material layer 42 that underlies any opening through the sacrificial etch mask layer.

Contact via cavities 89 having $2^N$ different depths can be formed in the contact region 200. In an illustrative example, if N is 8, the total number of sacrificial material layers 42 may be $2^8$+M, which corresponds to 256 word-line-level sacrificial material layers and M source- and drain-select-level sacrificial material layers. While the present disclosure is described for a case in which M is 2, embodiments are expressly contemplated herein in which M may be in integer greater than 2. The sacrificial etch mask layer can be subsequently removed, for example, by ashing or by performing an etch process that removes the material of the sacrificial etch mask layer selective to the materials of the alternating stack (32, 42).

Figure 7D:
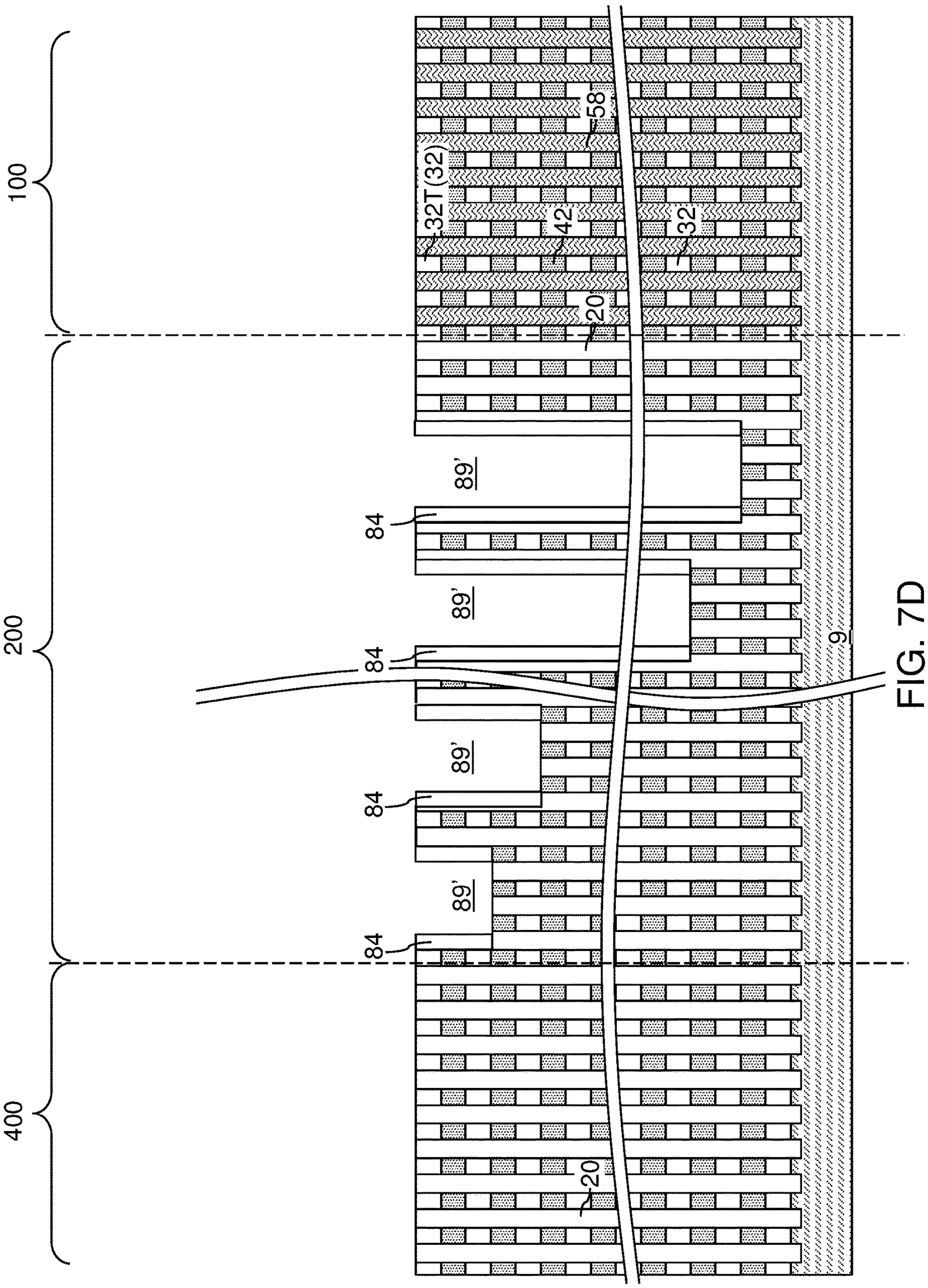
FIG. 7D is a vertical cross-sectional view of the first exemplary structure after formation of tubular insulating spacers according to the first embodiment of the present disclosure.

Referring to FIG. 7D, an insulating material layer may be conformally deposited over the physically exposed surfaces of the contact via cavities 89 and over the alternating stack (32, 42). The insulating material layer includes an insulating material such as undoped silicate glass (i.e., silicon oxide) or a doped silicate glass. The thickness of the insulating material layer may be in a range from 10 nm to 100 nm, although lesser and greater thicknesses may also be employed. In one embodiment, an anisotropic etch process (i.e., a sidewall spacer etch process) can be performed to remove horizontally-extending portions of the insulating material layer at the bottom of each contact via cavity 89 and from above the alternating stack (32, 42). Each remaining portion of the insulating material layer comprises an insulating spacer having a tubular configuration, and is herein referred to as a tubular insulating spacer 84. A void 89' is present within each unfilled volume of the contact via cavities 89. Alternatively, the anisotropic etch process may be performed at a later step after removal of a sacrificial fill material from the voids 89' and replacement of the sacrificial material layers 42 with electrically conductive layers.

Figure 7E:
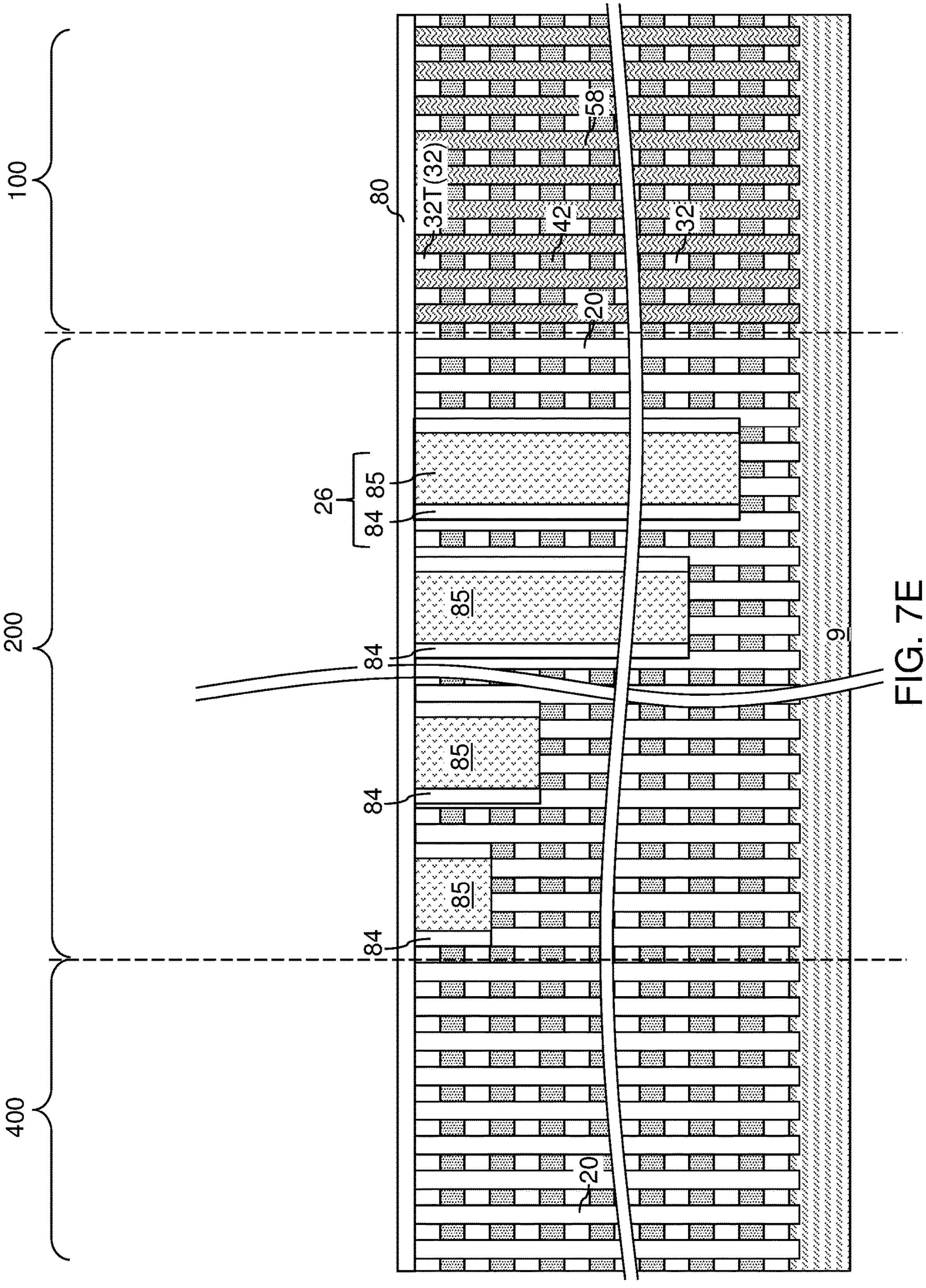
FIG. 7E is a vertical cross-sectional view of the first exemplary structure after formation of sacrificial via structures according to the first embodiment of the present disclosure.

Referring to FIG. 7E, a sacrificial fill material can be deposited in the voids 89' within the contact via cavities 89. The sacrificial fill material comprises a material that can be subsequently removed selective to materials of the tubular insulating spacers 84, the insulating layers 32, and the support pillar structures 20. For example, the sacrificial fill material may comprise a carbon-based material such as amorphous carbon or diamond-like carbon, a semiconductor material such as amorphous silicon, polysilicon, or a silicon-germanium alloy, or a dielectric material such as borosilicate glass or organosilicate glass. Excess portions of the sacrificial fill material may be removed from above the horizontal plane including the top surface of the alternating stack employing a planarization process. The planarization process may comprise a recess etch process or a chemical mechanical polishing process. Each remaining portion of the sacrificial fill material constitutes a sacrificial via structure 85.

Each contiguous combination of a tubular insulating spacer 84 and a sacrificial via structure 85 is herein referred to as an in-process layer contact assemblies 26. These assemblies 26 are formed in the contact region 200 through a respective subset of layers within the alternating stack (32, 42) and directly on a top surface of a respective one of the sacrificial material layers 42 within the alternating stack (32, 42). Each of the in-process layer contact assemblies 26 comprises a respective tubular insulating spacer 84 and a respective sacrificial via structure 85.

Generally, the memory stack structures 55 are located within a memory array region 100, and the in-process layer contact assemblies 26 are located in a contact region 200 that is laterally offset from the memory array region 100. In one embodiment, the contact region 200 may be free of any memory stack structures 55. Instead, support pillar structures 20 comprising, and/or consisting essentially of, a dielectric material can be located within the contact region 200. The support pillar structures 20 can contact a substrate 8 including the substrate material layer 9, and can extend through at least a bottommost insulating layer 32B within the alternating stack (32, 42). In one embodiment, a subset of the support pillar structures 20 may have a topmost recessed surface that contacts a bottom surface of a respective one of the in-process layer contact assemblies 26. In the subsequent figures, the support pillar structures 20 are omitted for clarity.

Still referring to FIG. 7E, a contact-level dielectric layer 80 may be formed above the alternating stack (32, 42) and the in-process layer contact assemblies 26 by conformal or non-conformal deposition of a dielectric material. The contact-level dielectric layer 80 comprises a dielectric material such as undoped silicate glass or a doped silicate glass. The thickness of the contact-level dielectric layer 80 may be in a range from 50 nm to 600 nm, such as from 100 nm to 300 nm, although lesser and greater thicknesses may also be employed.

Referring to FIGS. 8A-8E, a photoresist layer (not shown) can be applied over the contact-level dielectric layer 80, and is lithographically patterned to form elongated openings in areas between clusters of memory opening fill structures 58. The pattern in the photoresist layer can be transferred through the contact-level dielectric layer 80 and the alternating stack (32, 42) employing an anisotropic etch to form backside trenches 79. The backside trenches 79 vertically extend from the top surface of the contact-level dielectric layer 80 to the top surface of the substrate 8. The backside trenches 79 laterally extend along the first horizontal direction hd1 between neighboring arrays of memory opening fill structures 58 and between neighboring arrays of in-process layer contact assemblies 26. In one embodiment, the backside trenches 79 may laterally extend through the memory array region 100 and the contact region 200.

In one embodiment, the backside trenches 79 can laterally extend along the first horizontal direction (e.g., word line direction) hd1 and can be laterally spaced apart from each other along the second horizontal direction (e.g., bit line direction) hd2 that is perpendicular to the first horizontal direction hd1. The memory opening fill structures 58 can be arranged in rows that extend along the first horizontal direction hd1. Multiple rows of memory opening fill structures 58 can be located between each neighboring pair of backside trenches 79 in a respective memory block. Thus, the backside trenches separate adjacent memory blocks along the bit line direction hd2. The photoresist layer can be removed, for example, by ashing.

Figure 8A:
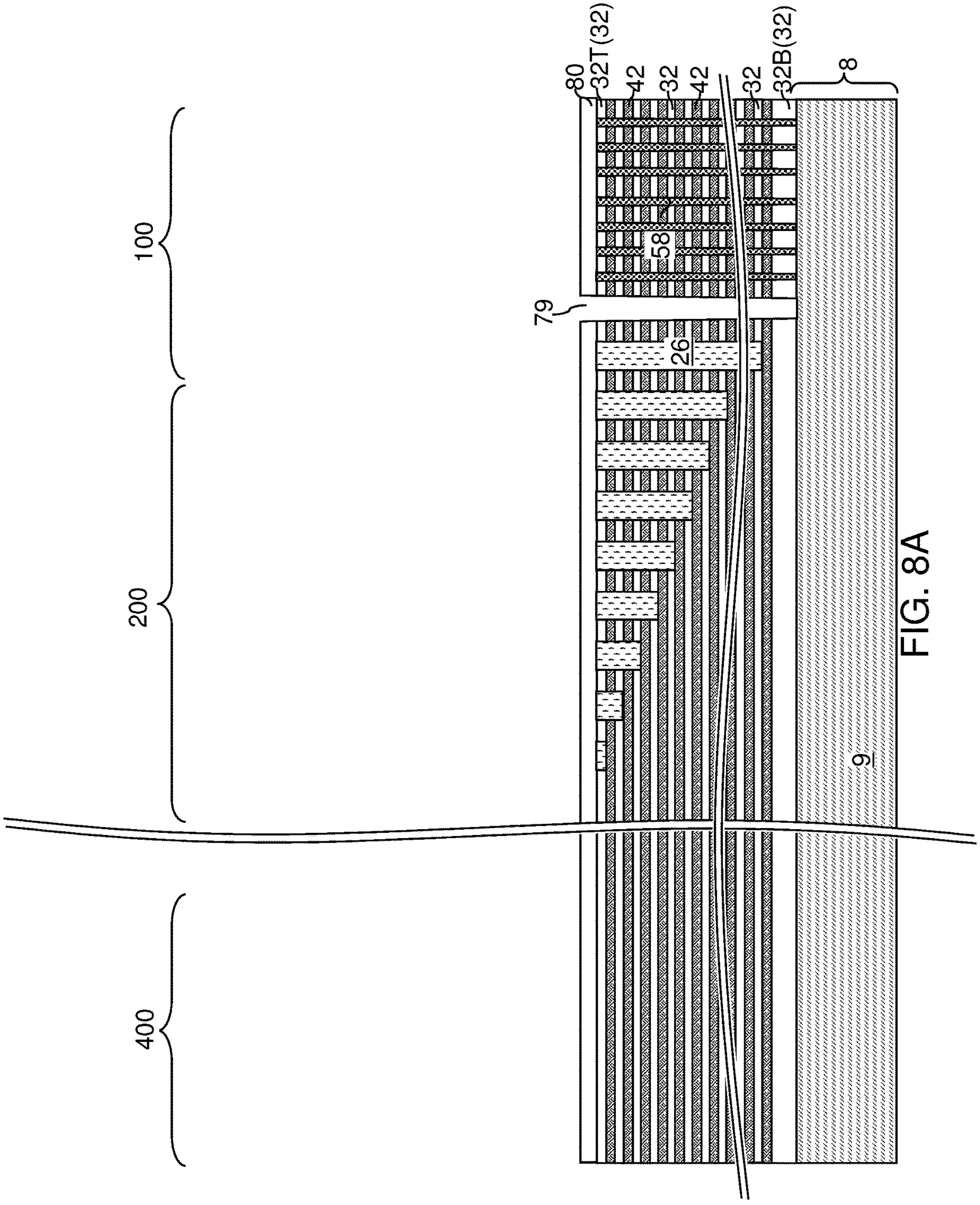
FIG. 8A is a vertical cross-sectional view of the first exemplary structure after formation of backside trenches according to the first embodiment of the present disclosure.
Figure 8B:
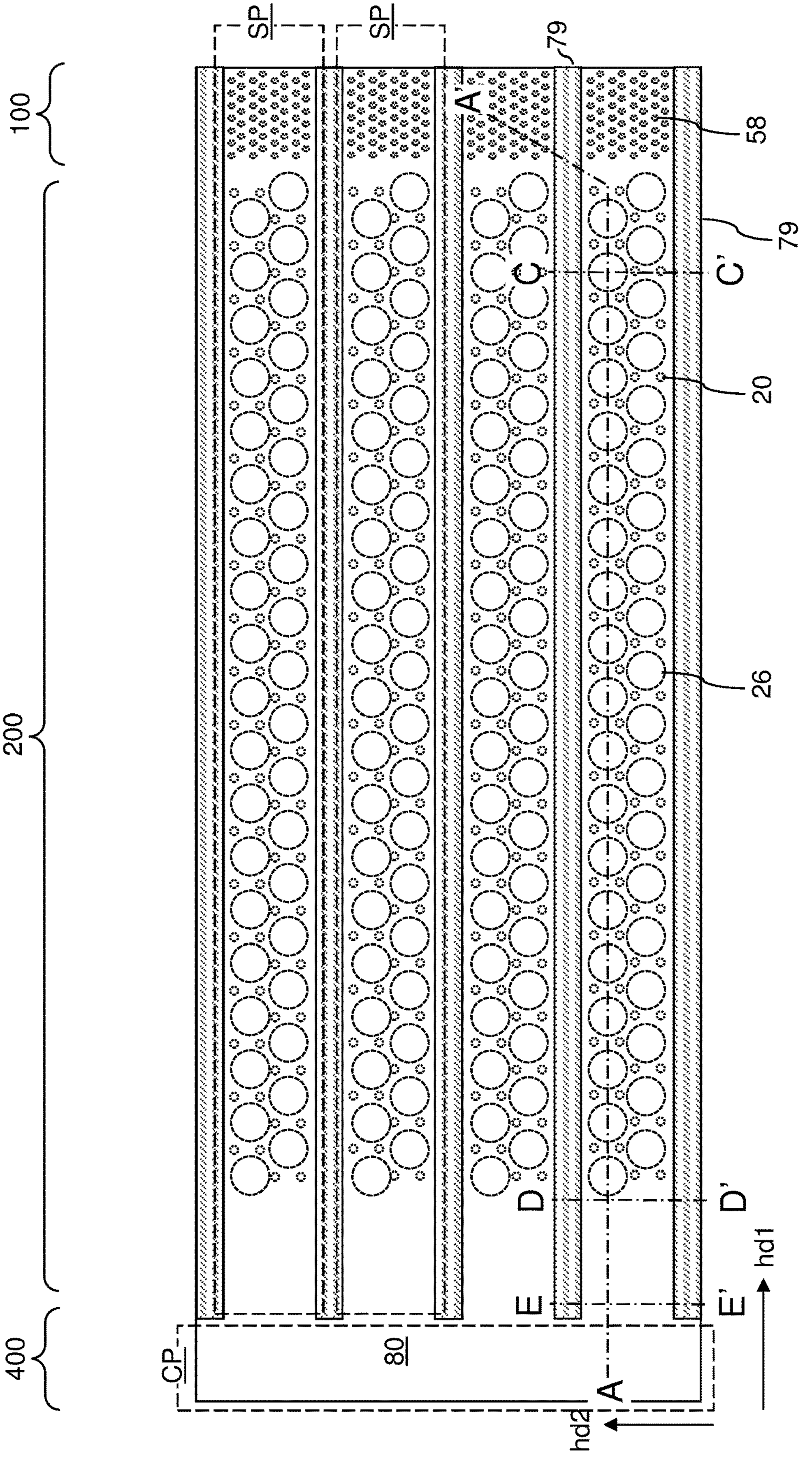
FIG. 8B is a top-down view of the first exemplary structure of FIG. 8A. The hinged vertical plane A-A' is a plane of the vertical cross-sectional view of FIG. 8A.
Figure 8E:
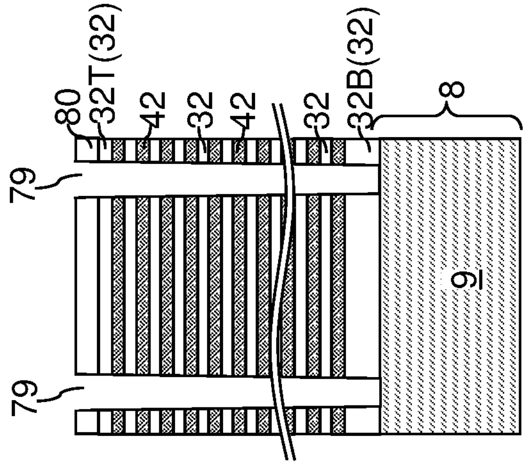
FIG. 8E is a vertical cross-sectional view of the first exemplary structure along the vertical plane E-E' of FIG. 8B.
Figure 8D:
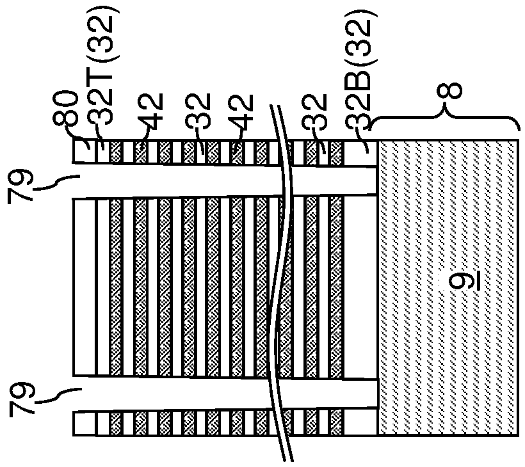
FIG. 8D is a vertical cross-sectional view of the first exemplary structure along the vertical plane D-D' of FIG. 8B.
Figure 8C:
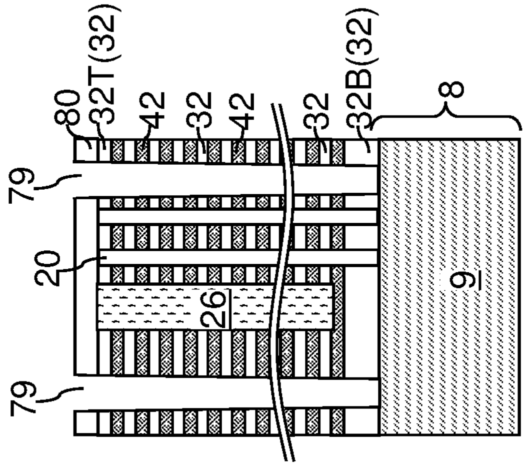
FIG. 8C is a vertical cross-sectional view of the first exemplary structure along the vertical plane C-C' of FIG. 8B.
Figure 9A:
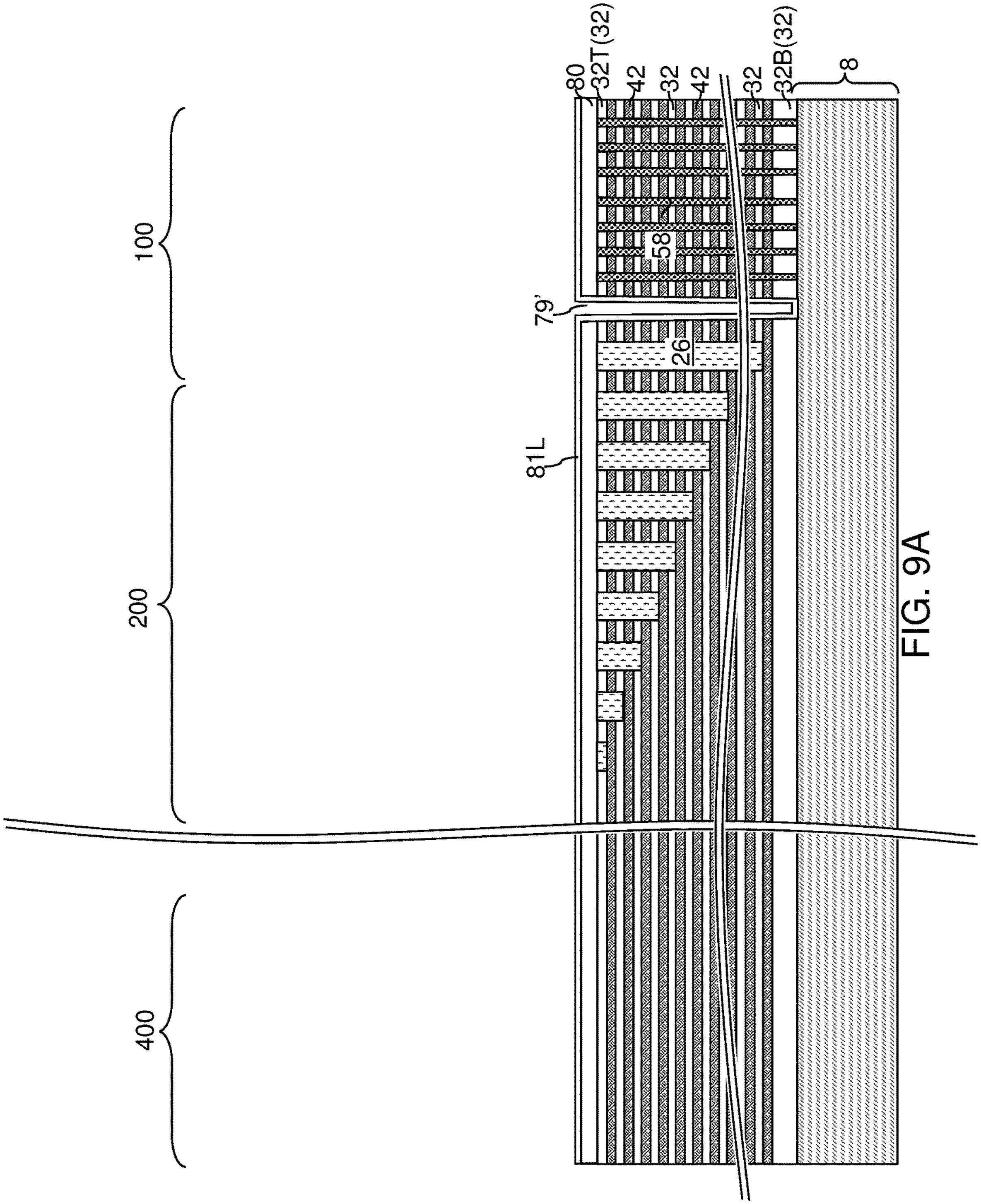
FIG. 9A is a vertical cross-sectional view of the first exemplary structure after formation of a conformal etch mask material layer according to the first embodiment of the present disclosure.
Figure 9B:
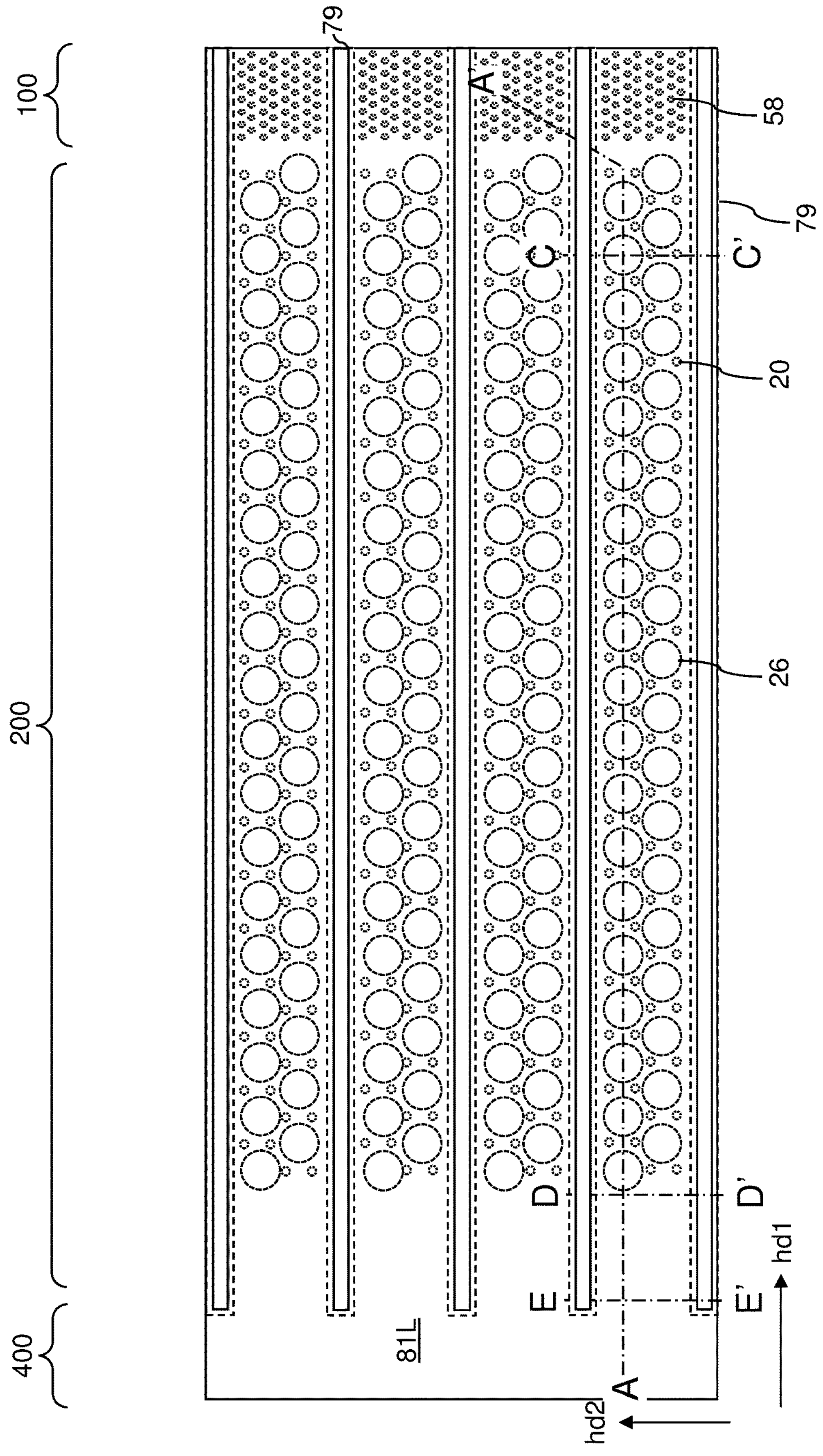
FIG. 9B is a top-down view of the first exemplary structure of FIG. 9A. The hinged vertical plane A-A' is a plane of the vertical cross-sectional view of FIG. 9A.
Figure 9C:
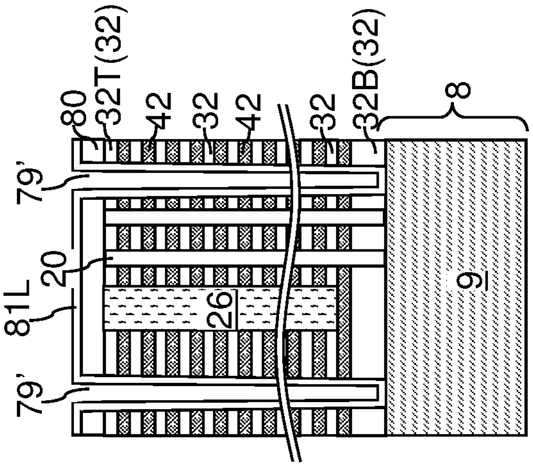
FIG. 9C is a vertical cross-sectional view of the first exemplary structure along the vertical plane C-C' of FIG. 9B.
Figure 9D:
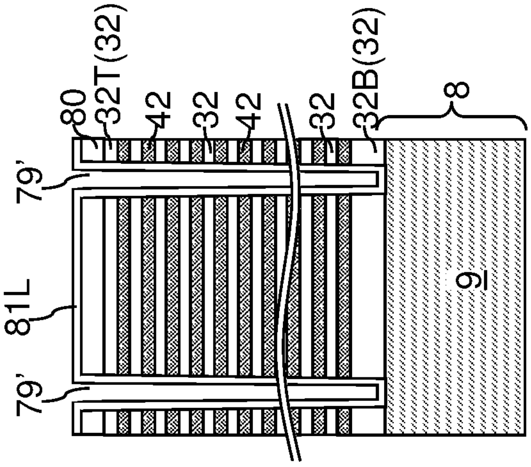
FIG. 9D is a vertical cross-sectional view of the first exemplary structure along the vertical plane D-D' of FIG. 9B.
Figure 9E:
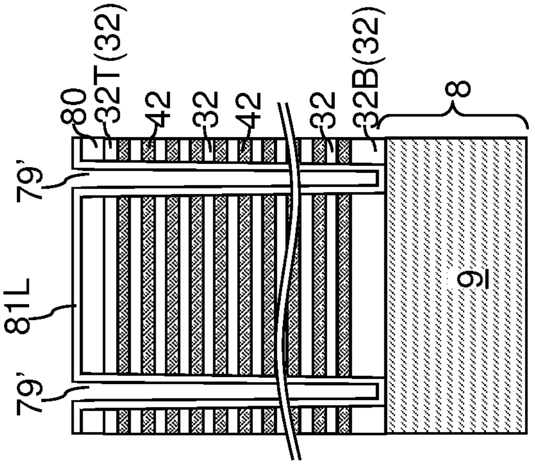
FIG. 9E is a vertical cross-sectional view of the first exemplary structure along the vertical plane E-E' of FIG. 9B.
Figure 10A:
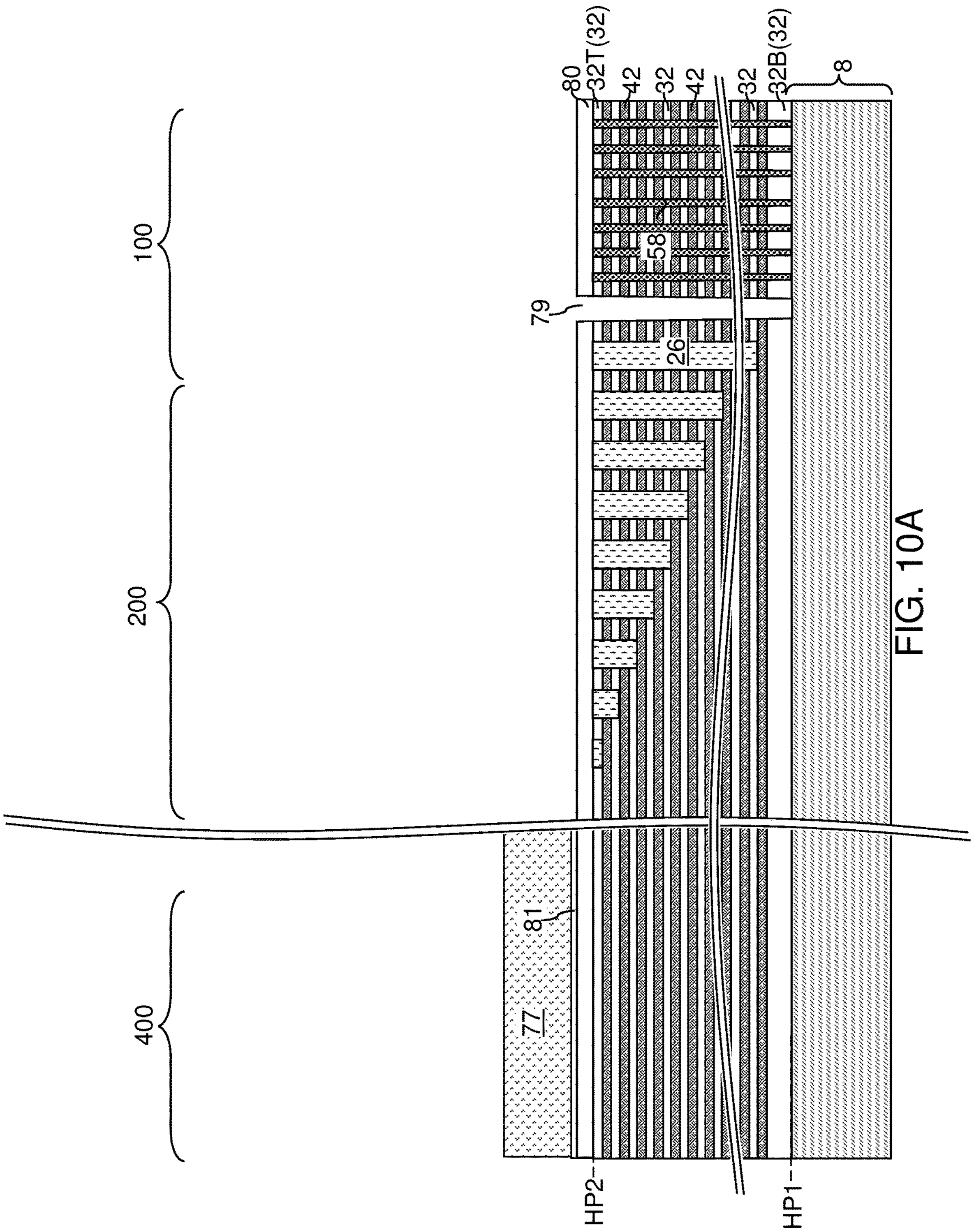
FIG. 10A is a vertical cross-sectional view of the first exemplary structure after patterning the conformal etch mask material layer according to the first embodiment of the present disclosure.
Figure 10B:
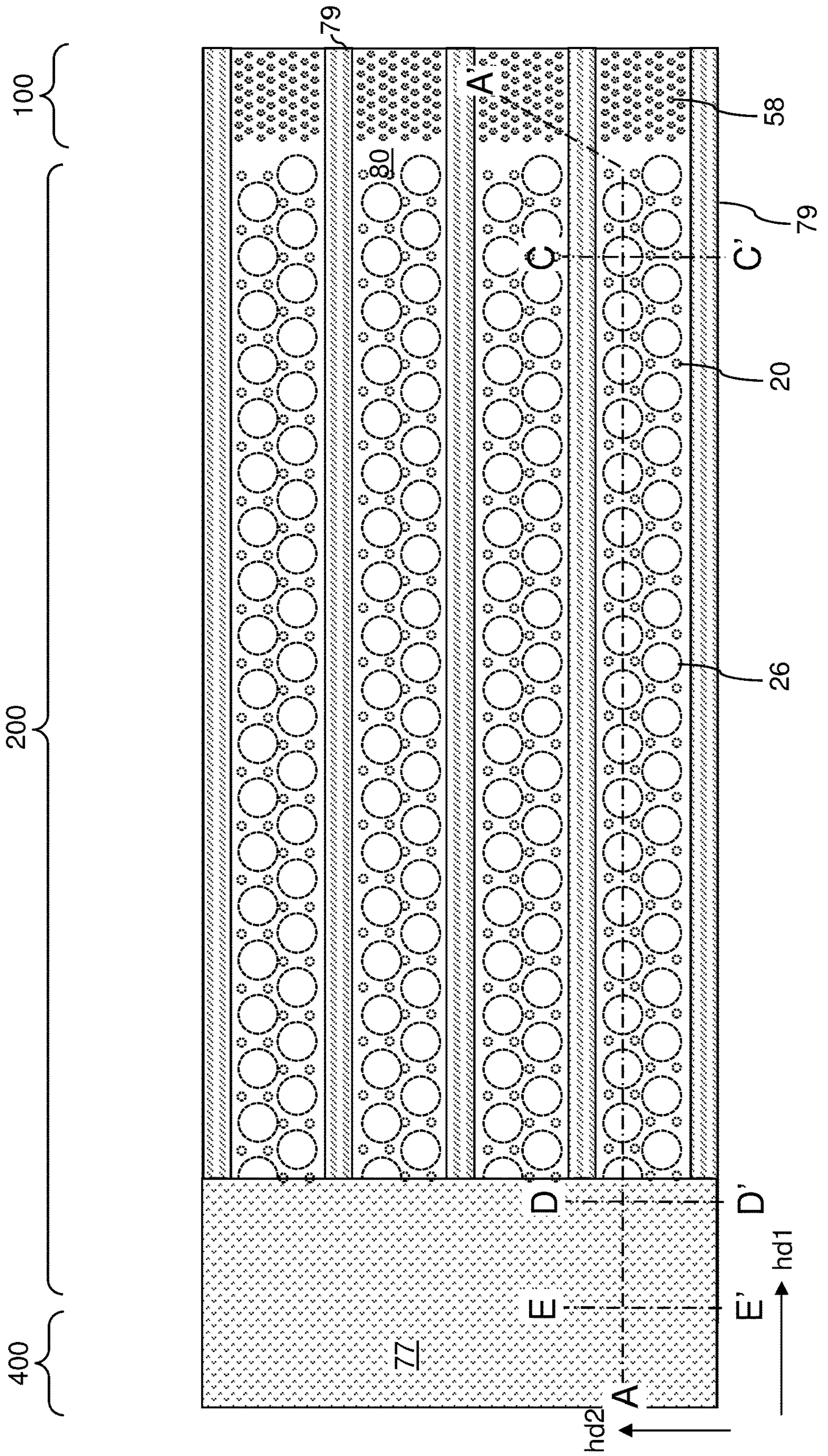
FIG. 10B is a top-down view of the first exemplary structure of FIG. 10A. The hinged vertical plane A-A' is a plane of the vertical cross-sectional view of FIG. 10A.
Figure 10C:
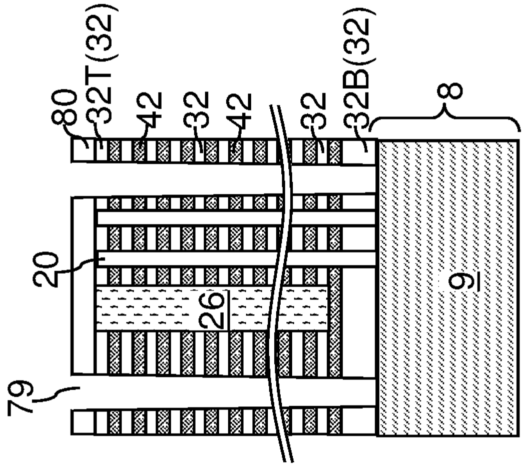
FIG. 10C is a vertical cross-sectional view of the first exemplary structure along the vertical plane C-C' of FIG. 10B.
Figure 10D:
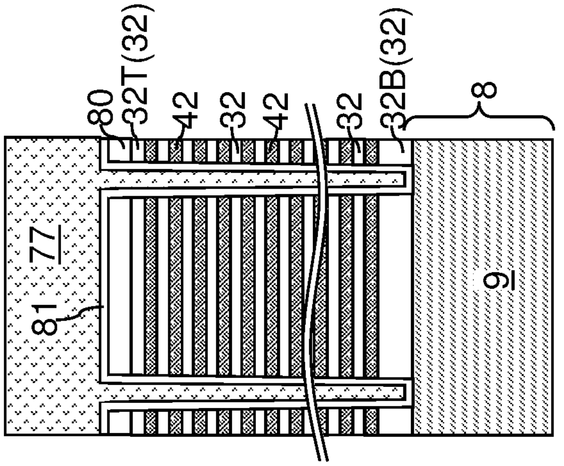
FIG. 10D is a vertical cross-sectional view of the first exemplary structure along the vertical plane D-D' of FIG. 10B.
Figure 10E:
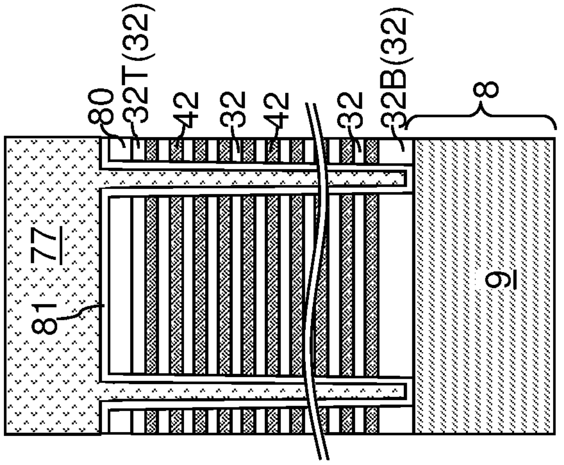
FIG. 10E is a vertical cross-sectional view of the first exemplary structure along the vertical plane E-E' of FIG. 10B.
Figure 11A:
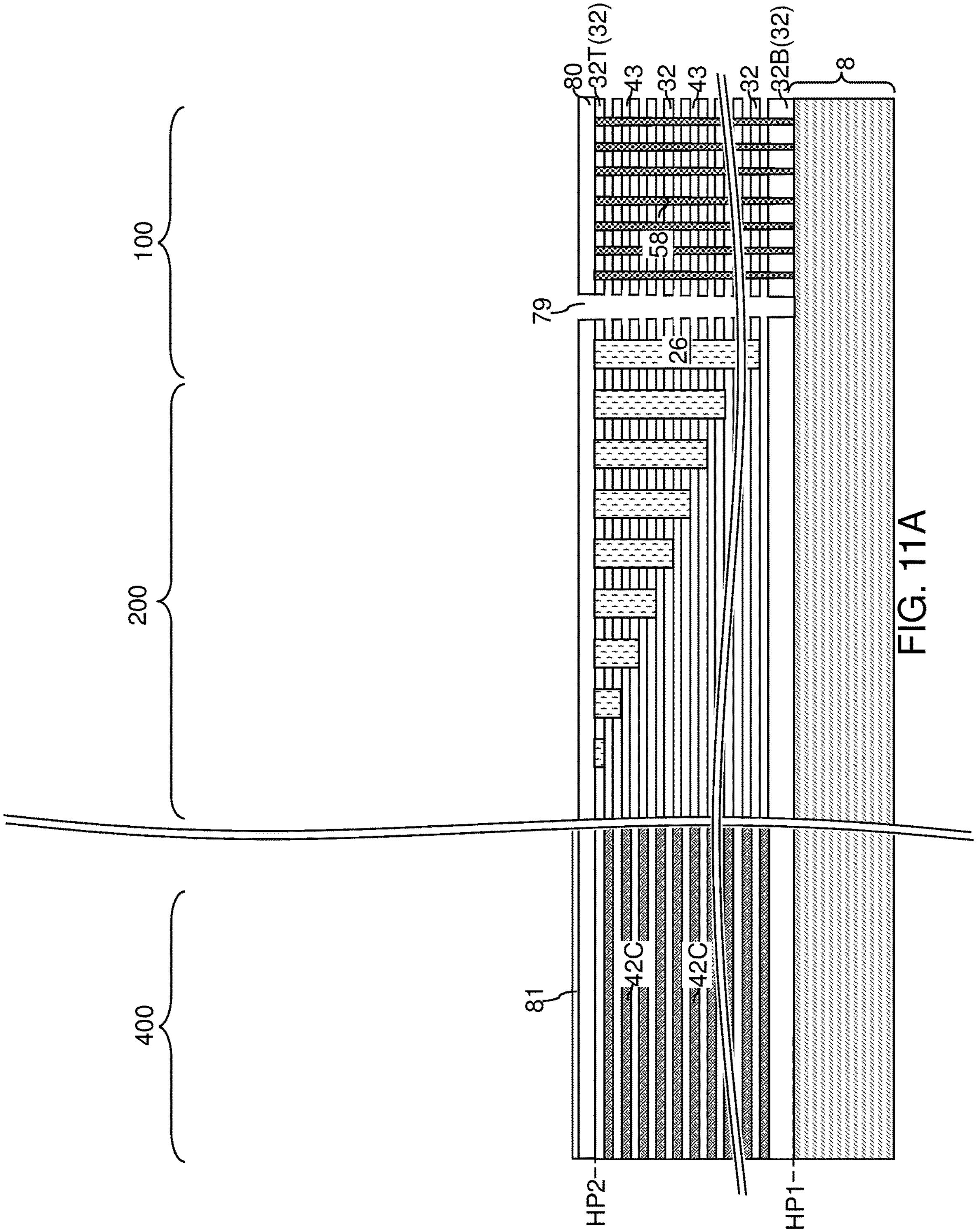
FIG. 11A is a vertical cross-sectional view of the first exemplary structure after formation of backside recesses according to the first embodiment of the present disclosure.
Figure 11B:
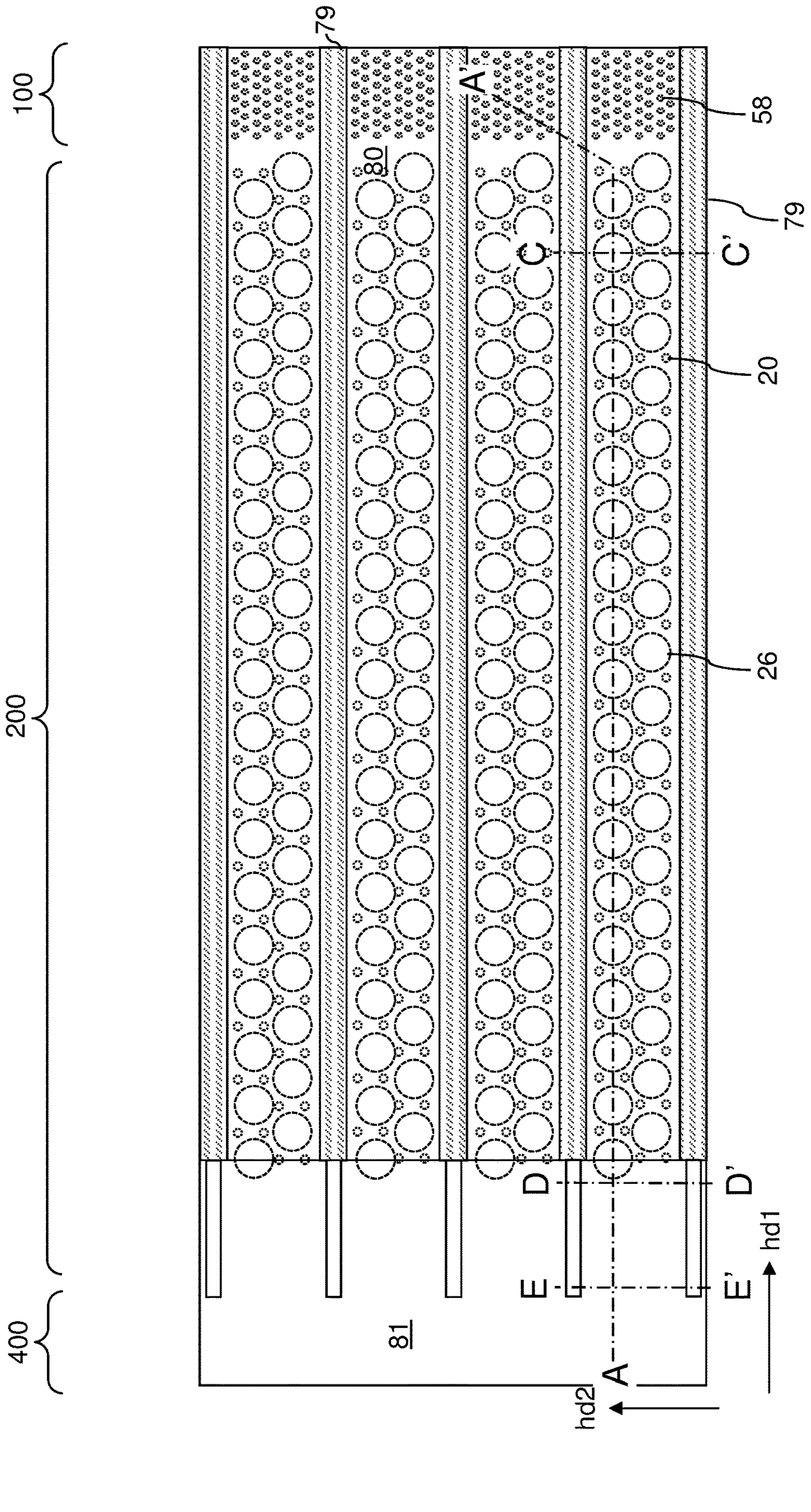
FIG. 11B is a top-down view of the first exemplary structure of FIG. 11A. The hinged vertical plane A-A' is a plane of the vertical cross-sectional view of FIG. 11A.
Figure 11E:
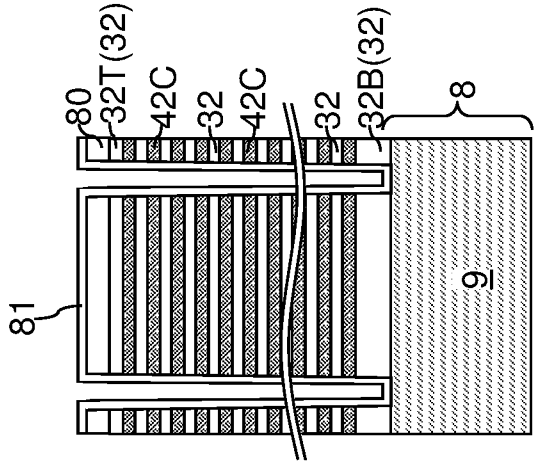
FIG. 11E is a vertical cross-sectional view of the first exemplary structure along the vertical plane E-E' of FIG. 11B.
Figure 11D:
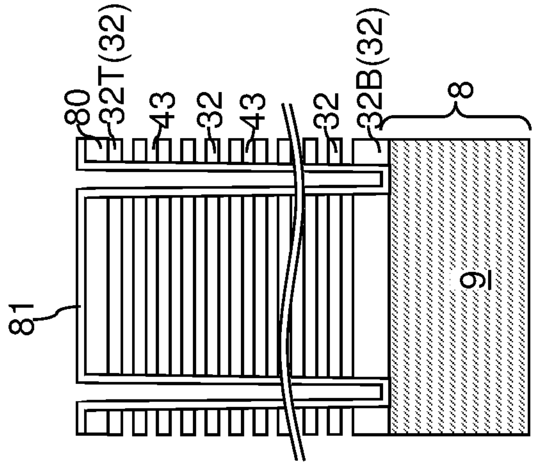
FIG. 11D is a vertical cross-sectional view of the first exemplary structure along the vertical plane D-D' of FIG. 11B.
Figure 11C:
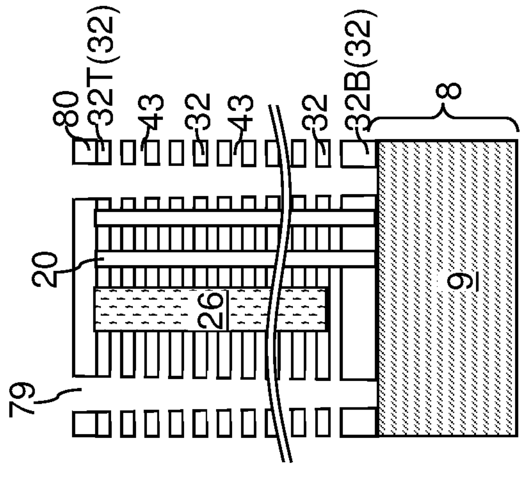
FIG. 11C is a vertical cross-sectional view of the first exemplary structure along the vertical plane C-C' of FIG. 11B.

Generally, backside trenches 79 laterally extending along the first horizontal direction hd1 can be formed through the vertically alternating sequence of insulating layers 32 and sacrificial material layers 42. The backside trenches 79 are laterally spaced apart along the second horizontal direction hd2. As shown in FIG. 8B, strip portions SP of the vertically alternating sequence located between neighboring pairs of the backside trenches 79 can be interconnected with each other in the connection region 400 through a connection portion CP of the vertically alternating sequence that is connected to each of the strip portion SP of the vertically alternating sequence. Thus, the adjacent memory blocks which are separated along the bit line direction hd2 are still connected to each other through the connection portion CP located in the connection region 400.

Referring to FIGS. 9A-9E, a dielectric material that is different from the material of the sacrificial material layers 42 can be conformally deposited in peripheral portions of the backside trenches 79 and over the contact-level dielectric layer 80 to form a conformal dielectric material layer, which is subsequently employed as an etch mask structure. The conformal dielectric material layer is herein referred to as a conformal etch mask material layer 81L. The confocal etch mask material layer 81L comprises a dielectric material such as silicon oxide, and may have a thickness in a range from 5 nm to 100 nm, such as from 10 nm to 50 nm, although lesser and greater thicknesses may also be employed. The conformal etch mask material layer 81L can be formed by a conformal deposition process such as a chemical vapor deposition process. The conformal etch mask material layer 81L can cover all surfaces of the backside trenches 79.

Referring to FIGS. 10A-10E, a photoresist layer 77 can be applied over the conformal etch mask material layer 81L, and can be lithographically patterned to cover end portions of the backside trenches 79 that extend into the connection portion CP in the connection region 400 without covering a predominant portion of each of the backside trenches 79 in the contact region 200 and the memory array region 100. In one embodiment, the patterned photoresist layer 77 may cover the area of the connection region 400 and the area of a peripheral portion of the contact region 200 is proximal to the connection region 400 without covering the area of the memory array region 100 and without covering the area a portion of the contact region 200 that is not proximal to the connection region 400. In one embodiment, the patterned photoresist layer 77 may have a straight edge that laterally extends along the second horizontal direction hd2 and straddles each lengthwise sidewall of the backside trenches 79 in proximity to a boundary between the contact region 200 and the connection region 400 (e.g., the boundary of the connection portion CP).

The conformal etch stop material layer 81L can be patterned by etching portions of the conformal etch stop material layer 81L that are not covered by the patterned photoresist layer 77. A wet or dry etch process can be performed to remove portions of the conformal etch stop material layer 81L that are not covered by the patterned photoresist layer 77. A remaining portion of the conformal etch stop material layer 81L that remains in the connection region 400 (e.g., in the connection portion CP) constitutes a dielectric etch stop structure 81. The dielectric etch stop structure 81 covers and contacts an end portion of each lengthwise sidewall of the backside trenches 79, and a widthwise sidewall of each of the backside trenches 79. Thus, each backside trench 79 has an end portion in the connection portion CP that is masked by the dielectric etch stop structure 81.

The dielectric etch stop structure 81 vertically extends at least from a first horizontal plane HP1 including a bottom-most surfaces of the vertically alternating sequence of insulating layers 32 and sacrificial material layers 42 and at least to a second horizontal plane HP2 including a topmost surface of the vertically alternating sequence (32, 42). The dielectric etch stop structure 81 comprises pairs of dielectric sidewalls that are located within a respective one of the backside trenches 79. The dielectric etch stop structure 81 comprises portions that are located within a respective one of the backside trenches 79. A subset of dielectric sidewalls of the dielectric etch stop structure 81 laterally extends along the first horizontal direction hd1 and vertically extends at least from the first horizontal plane HP1 and at least to the second horizontal plane HP2.

Referring to FIG. 11A-11E, an etchant that selectively etches the materials of the sacrificial material layers 42 with respect to the materials of the insulating layers 32 and the material of the outermost layer of the memory films 50 and the tubular insulating spacers 84 can be introduced into the backside trenches 79, for example, employing an isotropic etch process. For example, the sacrificial material layers 42 can include silicon nitride, the materials of the insulating layers 32 and the tubular insulating spacers 84 and the material of the outermost layer of the memory films 50 can include silicon oxide. Backside recesses 43 are formed in volumes from which the sacrificial material layers 42 are removed.

The isotropic etch process can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. Each of the backside recesses 43 can laterally extend substantially parallel to the top surface of the substrate 8. A backside recess 43 can be vertically bounded by a top surface of an underlying insulating layer 32 and a bottom surface of an overlying insulating layer 32. In one embodiment, each of the backside recesses 43 can have a uniform height throughout.

A plurality of backside recesses 43 is formed at each level of the sacrificial material layer 42. The plurality of backside recesses 43 are laterally spaced among one another by the backside trenches 79. Generally, the length of the laterally-extending portions of the dielectric etch stop structure 81 that are located within the backside trenches 79 and laterally extending along the first horizontal direction hd1 is greater than the etch distance of the isotropic etch process that forms the backside recesses 43. As such, each portion of the dielectric etch stop structure 81 that is located within a respective backside trench 79 is laterally contacted by a remaining portion of each of the sacrificial material layers 42. Thus, neighboring pairs of backside recesses 43 located at a same vertical level are laterally spaced apart by a combination of the backside trenches 79 and vertically-extending portions of the dielectric etch stop structure 81.

Unetched remaining portions of the sacrificial material layers 42 may remain in the connection region 400. The remaining portions of the sacrificial material layers 42 comprise dielectric material layers, and may be hereafter referred to as dielectric connection plates 42C. Each dielectric connection plate 42C can laterally contact each of the vertically-extending portions of the dielectric etch stop structure 81. The dielectric connection plates 42C and the insulating layers 32 in the connection region electrically isolated adjacent memory blocks from each other.

Generally, backside cavities are present within volumes of the backside trenches 79 that are not filled with the dielectric etch stop structure 81. Backside recesses 43 can be formed by performing an isotropic etch process that removes portions of the sacrificial material layers 42 that are proximal to the backside cavities selective to materials of the insulating layers 32 and the dielectric etch stop structure 81. Remaining portions of the sacrificial material layers 42 after the isotropic etch process comprise dielectric connection plates 42C that contact the dielectric etch stop structure 81.

Referring to FIGS. 12A-12F, an optional backside blocking dielectric layer can be optionally deposited in the backside recesses 43 and the backside trenches 79 and over the contact-level dielectric layer 80. The backside blocking dielectric layer, if employed, comprises a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The backside blocking dielectric layer is formed on the sidewalls of the backside trenches 79 and the tubular insulating spacers 84, horizontal surfaces and sidewalls of the insulating layers 32, the portions of the sidewall surfaces of the memory opening fill structures 58 that are physically exposed to the backside recesses 43. A backside cavity is present within the portion of each backside trench 79 that is not filled with the backside blocking dielectric layer.

A metallic barrier strip 46A can be deposited in the backside recesses 43, peripheral portions of the backside trenches 79, and over the contact-level dielectric layer 80. The metallic barrier strip 46A includes an electrically conductive metallic material that can function as a diffusion barrier layer and/or adhesion promotion layer for a metallic fill material to be subsequently deposited. The metallic barrier strip 46A can include a conductive metallic nitride material such as TiN, TaN, WN, or a stack thereof, or can include a conductive metallic carbide material such as TiC, TaC, WC, or a stack thereof. In one embodiment, the metallic barrier strip 46A can be deposited by a conformal deposition process such as chemical vapor deposition (CVD) or atomic layer deposition (ALD). The thickness of the metallic barrier strip 46A can be in a range from 2 nm to 8 nm, such as from 3 nm to 6 nm, although lesser and greater thicknesses can also be employed. In one embodiment, the metallic barrier strip 46A can consist essentially of a conductive metal nitride such as TiN.

A metal fill material is deposited in the plurality of backside recesses 43, on the sidewalls of the at least one the backside trench 79, and over the top surface of the contact-level dielectric layer 80 to form a metallic fill material strip 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material strip 46B can consist essentially of at least one elemental metal. The at least one elemental metal of the metallic fill material strip 46B can be selected, for example, from tungsten, cobalt, ruthenium, titanium, and tantalum. In one embodiment, the metallic fill material strip 46B can consist essentially of a single elemental metal. In one embodiment, the metallic fill material strip 46B can be deposited employing a fluorine-containing precursor gas such as $WF_6$. In one embodiment, the metallic fill material strip 46B can be a tungsten layer including a residual level of fluorine atoms as impurities. The metallic fill material strip 46B is spaced from the insulating layers 32 and the memory opening fill structures 58 by the metallic barrier strip 46A, which is a metallic barrier layer that blocks diffusion of fluorine atoms therethrough.

An etch back process can be performed to remove portions of the metallic fill material strip 46B and the metallic barrier strip 46A from inside the backside trenches 79 and from above the contact-level dielectric layer 80. The etch back process may comprise an isotropic etch process and/or an anisotropic etch process. Each combination of a remaining portion of the metallic barrier strip 46A and a remaining portion of the metallic fill material strip 46B that remain in a respective backside recess 43 constitutes an electrically conductive strip 46. The backside blocking dielectric layer may or may not remain in the backside trenches 79.

Each electrically conductive strip 46 includes a portion of the metallic barrier strip 46A and a portion of the metallic fill material strip 46B that are located between a vertically neighboring pair of dielectric material layers such as a pair of insulating layers 32. Each sacrificial material layer 42 can be replaced with an electrically conductive strip 46. Generally, an alternating stack (32, 46) of insulating layers 32 and electrically conductive strips 46 can be formed over the substrate 8.

Each contiguous combination of a dielectric connection plate 42C and a plurality of electrically conductive strips 46 that laterally extend along the first horizontal direction hd1 constitutes a composite layer (46, 42C). The plurality of electrically conductive strips 46 are laterally spaced apart along the second horizontal direction hd2 by backside trenches 79 that laterally extend along the first horizontal direction hd1. Each of the plurality of electrically conductive strips 46 has a respective sidewall adjoined to a respective sidewall surface segment of the dielectric connection plate 42C. End portions of the backside trenches 79 are laterally bounded by the dielectric connection plates 42C of the composite layers (46, 42C). Thus, the electrically conductive strips (e.g., word lines and select gate electrodes) 46 in each memory block are electrically isolated from the electrically conductive strips 46 in a laterally adjacent memory block by the respective backside trenches 79 and the dielectric connection plates 42C.

An alternating stack (32, 46) of respective portions of the insulating layers 32 and a respective subset of the electrically conductive strips 46 is formed within each memory block located between a neighboring pair of the backside trenches 79 upon formation of the electrically conductive strips 46. Each of the electrically conductive strips 46 has a respective lateral extent along the second horizontal direction hd2 that is not greater than a lateral spacing between a pair of most proximal pair of backside trenches 79. In one embodiment, the lateral extent of each of the electrically conductive strips 46 is the same as the lateral spacing between the pair of most proximal pair of backside trenches 79 throughout an entirety of each of the electrically conductive strips 46.

Portions of the dielectric etch stop structure 81 can be located within a respective one of the backside trenches 79. Each portion of the dielectric etch stop structure 81 that is located within a respective backside trench 79 comprises a respective pair of dielectric sidewalls that are located within a pair of lengthwise sidewalls of the respective backside trenches 79 (and thus, laterally extend along the first horizontal direction hd1). Such dielectric sidewalls of the portions of the dielectric etch stop structure 81 can vertically extend at least from the first horizontal plane HP1 and at least to the second horizontal plane HP2.

Generally, the dielectric etch stop structure 81 can be formed after formation of the backside trenches 79 such that each portion of the dielectric etch stop structure 81 located within a respective backside trench 79 vertically extends at least from a first horizontal plane HP1 including a bottommost surfaces of the vertically alternating sequence of the insulating layers 32 and composite layers (46, 42C) and at least to a second horizontal plane HP2 including a topmost surface of the vertically alternating sequence {32, (46, 42C)}. Each portion of the dielectric etch stop structure 81 located within a respective backside trench 79 comprises a respective pair of dielectric sidewalls that are located within a respective one of the backside trenches 79.

In one embodiment, each portion of the dielectric etch stop structure 81 located within a respective backside trench 79 comprises a respective pair of dielectric sidewalls that are located within, are in direct contact with and overlap with a pair of lengthwise sidewalls of the respective one of the backside trenches 79. Such dielectric sidewalls of the portions of the dielectric etch stop structure 81 located within a respective backside trench 79 laterally extend along the first horizontal direction hd1 and vertically extend at least from the first horizontal plane HP1 and at least to the second horizontal plane HP2.

Figure 12A:
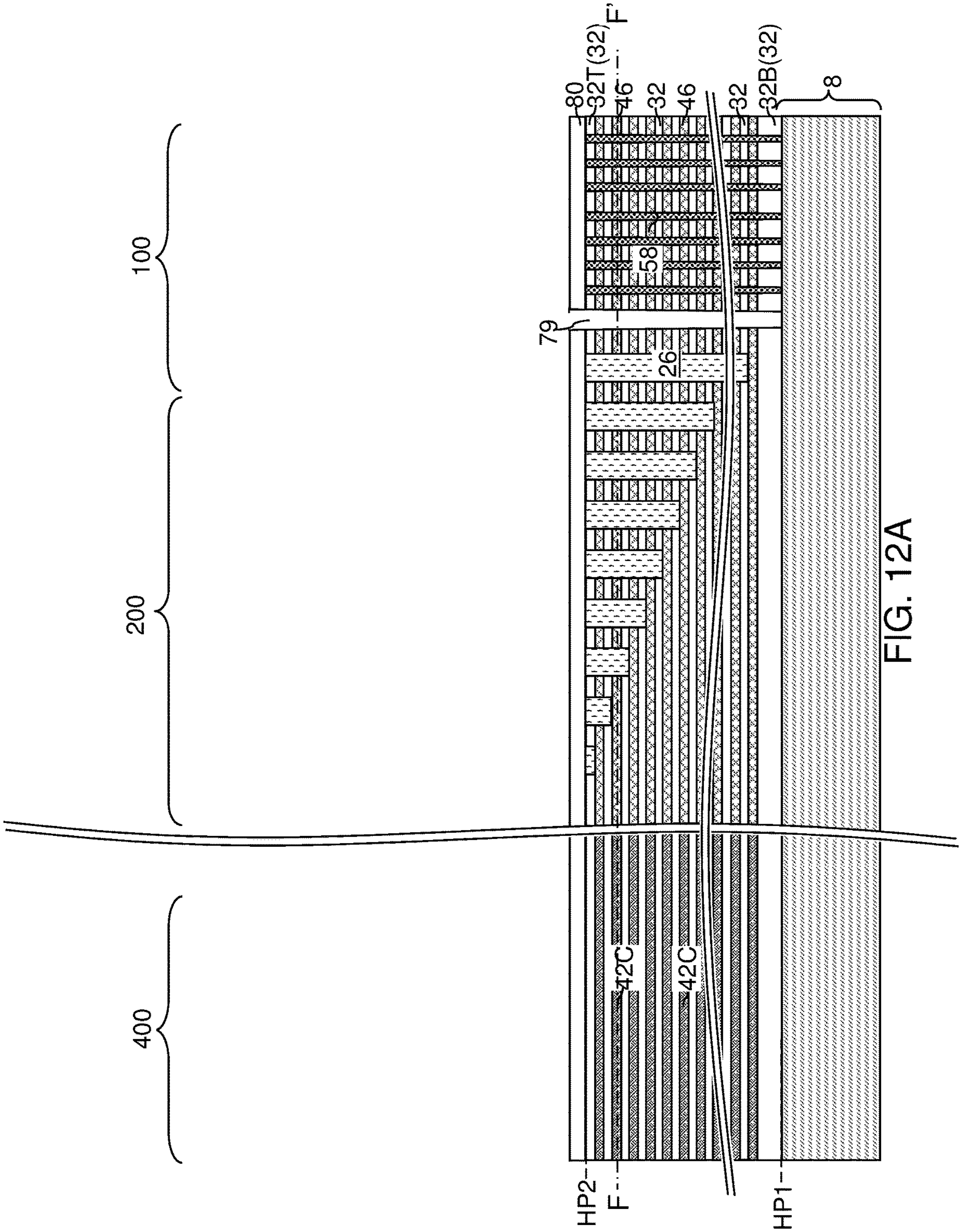
FIG. 12A is a vertical cross-sectional view of the first exemplary structure after formation of electrically conductive layers according to the first embodiment of the present disclosure.
Figure 12B:
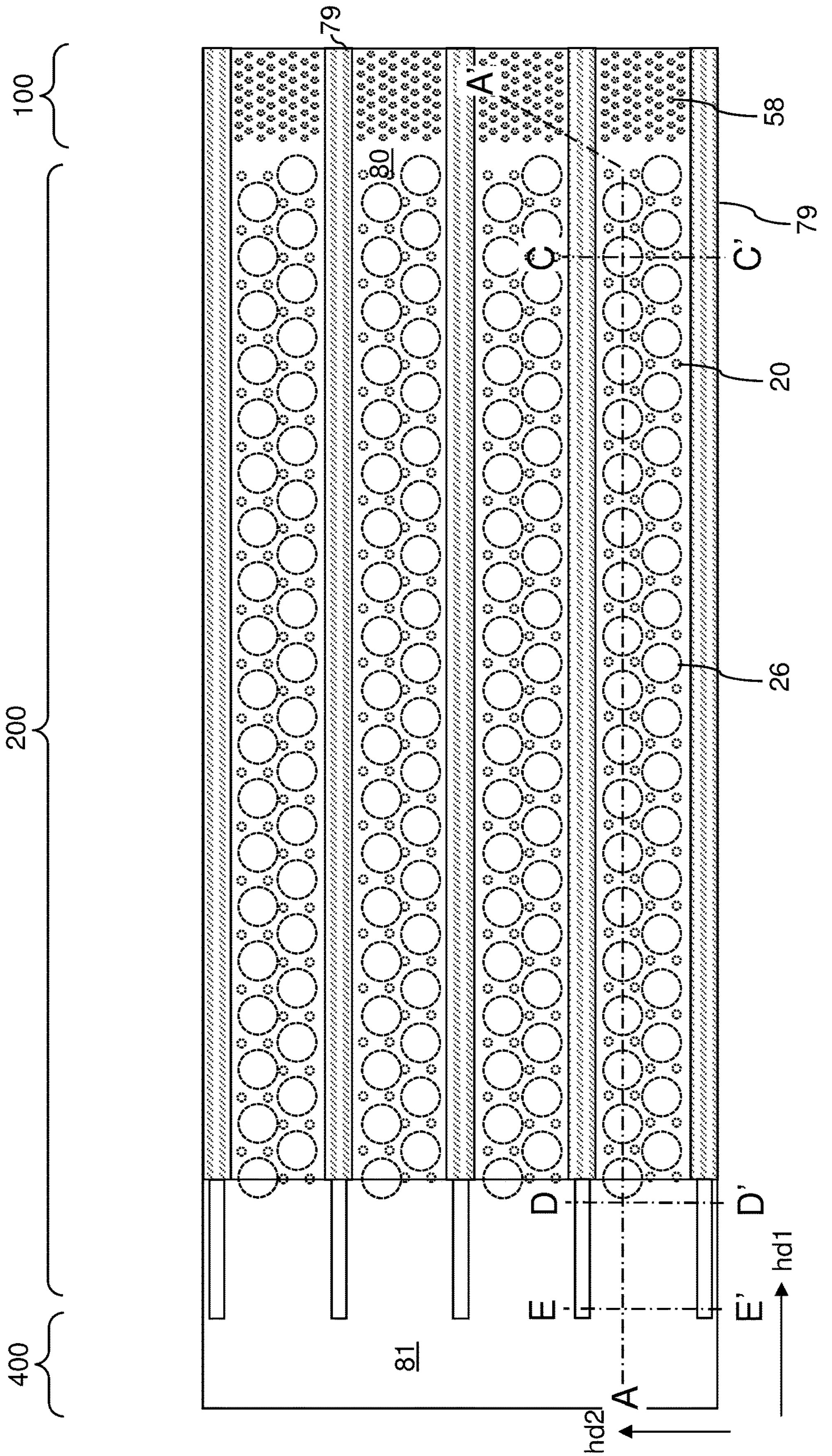
FIG. 12B is a top-down view of the first exemplary structure of FIG. 12A. The hinged vertical plane A-A' is a plane of the vertical cross-sectional view of FIG. 12A.
Figure 12E:
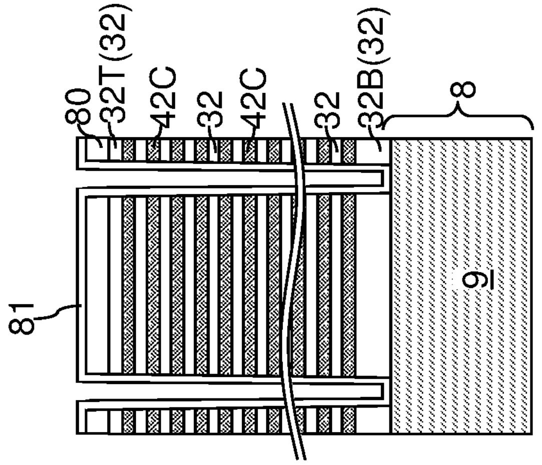
FIG. 12E is a vertical cross-sectional view of the first exemplary structure along the vertical plane E-E' of FIG. 12B.
Figure 12D:
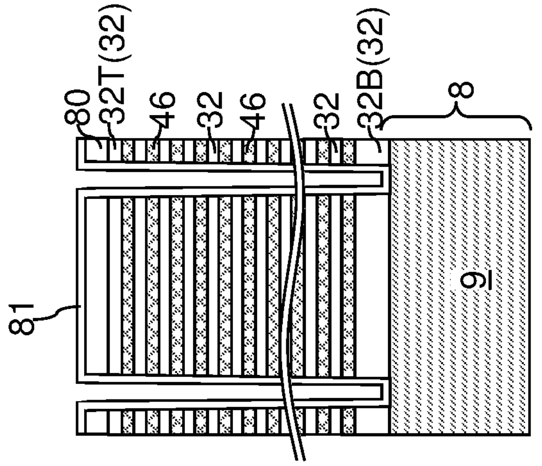
FIG. 12D is a vertical cross-sectional view of the first exemplary structure along the vertical plane D-D' of FIG. 12B.
Figure 12C:
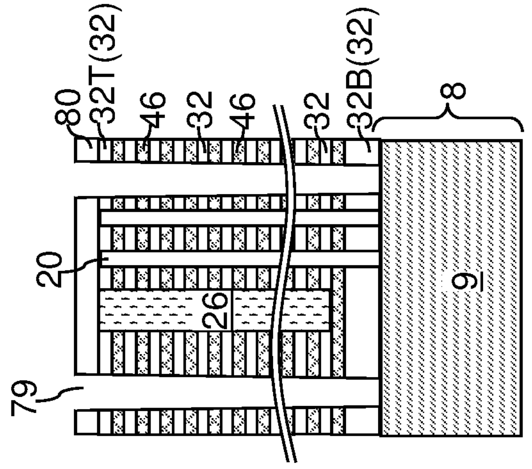
FIG. 12C is a vertical cross-sectional view of the first exemplary structure along the vertical plane C-C' of FIG. 12B.
Figure 12F:
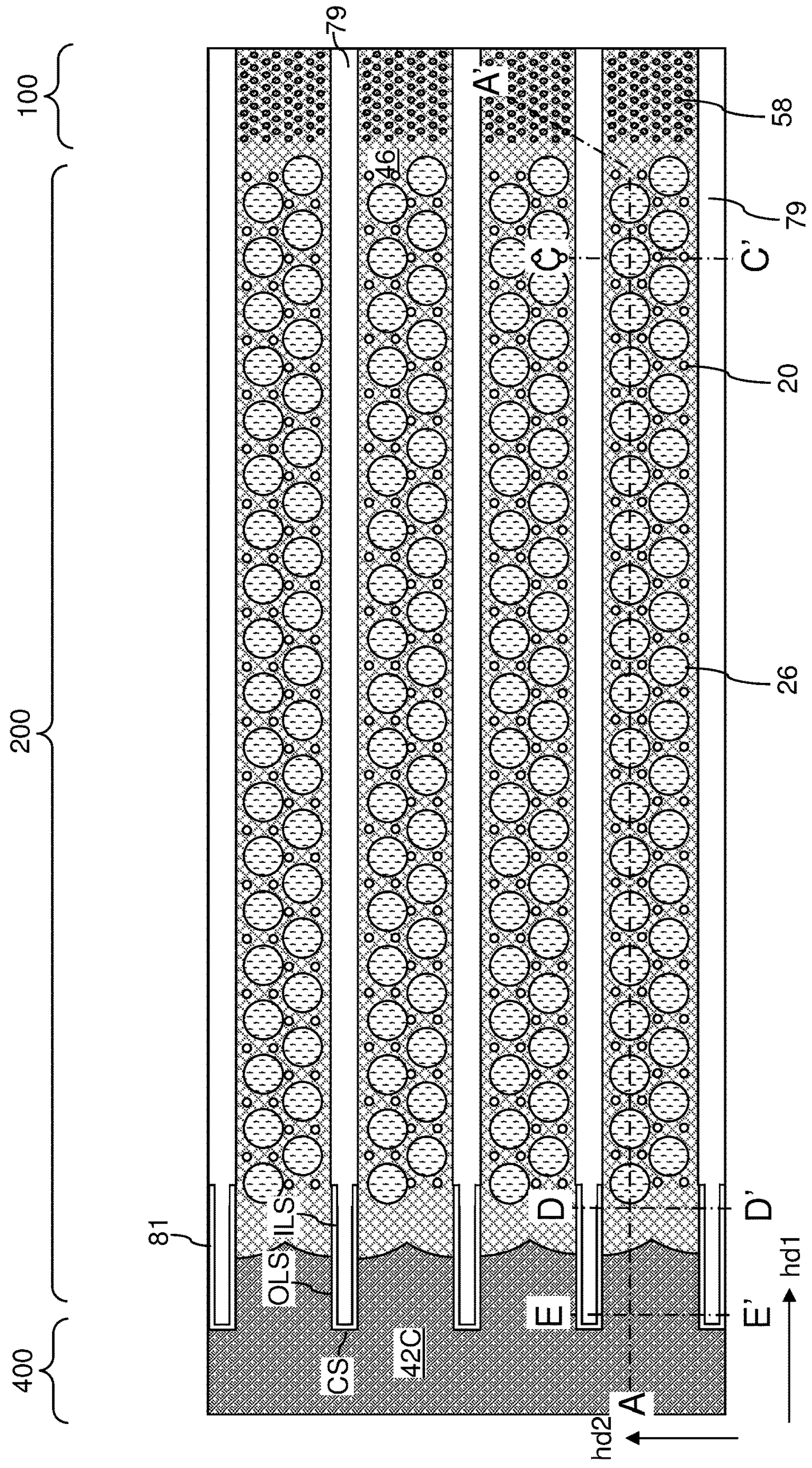
FIG. 12F is a horizontal cross-sectional view of the first exemplary structure along the horizontal plane F-F' of FIG. 12A.

As shown in FIG. 12F, each portion of the dielectric etch stop structure 81 located within a respective backside trench 79 comprises: a respective pair of inner lengthwise sidewalls ILS that are parallel to the first horizontal direction hd1 and having a first lateral spacing therebetween; a respective pair of outer lengthwise sidewalls OLS that are parallel to the first horizontal direction hd1 and having a second lateral spacing therebetween, the second lateral spacing being greater than the first lateral spacing; and a respective connection sidewall CS that connects the respective pair of outer lengthwise sidewalls OLS and contacting each of the dielectric connection plates 42C within the alternating stack (32, 42). In one embodiment, for each portion of the dielectric etch stop structure 81 that is located within a respective backside trench 79, a pair of dielectric sidewalls of the portion of the dielectric etch stop structure 81 comprises a pair of outer lengthwise sidewalls OLS that coincide with lengthwise sidewalls of the respective backside trench 79.

Referring to FIGS. 13A-13E, an insulating material layer can be formed in the backside trenches 79 and over the contact-level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74.

A backside contact via structure 76 can be formed within each backside cavity. Each backside contact via structure 76 can fill a respective cavity. Each contact via structures 76 can be formed by depositing at least one conductive material in a remaining unfilled volume (i.e., a backside cavity) of the backside trenches 79. For example, the at least one conductive material can include a conductive liner and a conductive fill material portion. The conductive liner can include a conductive metallic liner such as TiN, TaN, WN, TIC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 80 as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76. Each contiguous combination of an insulating spacer 74 and a backside contact via structure 76 constitutes a backside trench fill structure (74, 76). Generally, the backside trench fill structures (74, 76) can vertically extend at least from a first horizontal plane HP1 including bottommost surfaces of the alternating stacks {32, (46, 42C)} and at least to a second horizontal plane HP2 including topmost surfaces of the alternating stacks {32, (46, 42C)}.

In one embodiment, the planarization process may collaterally remove the horizontally-extending portion of the dielectric etch stop structure 81 that overlies the horizontal plane including the top surface of the contact-level dielectric layer 80. Upon removal of the horizontally-extending portion of the dielectric etch stop structure 81 from above the horizontal plane including the top surface of the contact-level dielectric layer 80, each remaining portion of the dielectric etch stop structure 81 can be located entirely within a respective one of the backside trenches 79. Thus, the dielectric etch stop structure 81 as formed at the processing steps described with reference to FIGS. 10A-10E is divided into a plurality of dielectric etch stop structures 81 that are located within a respective one of the backside trenches 79.

Figure 13A:
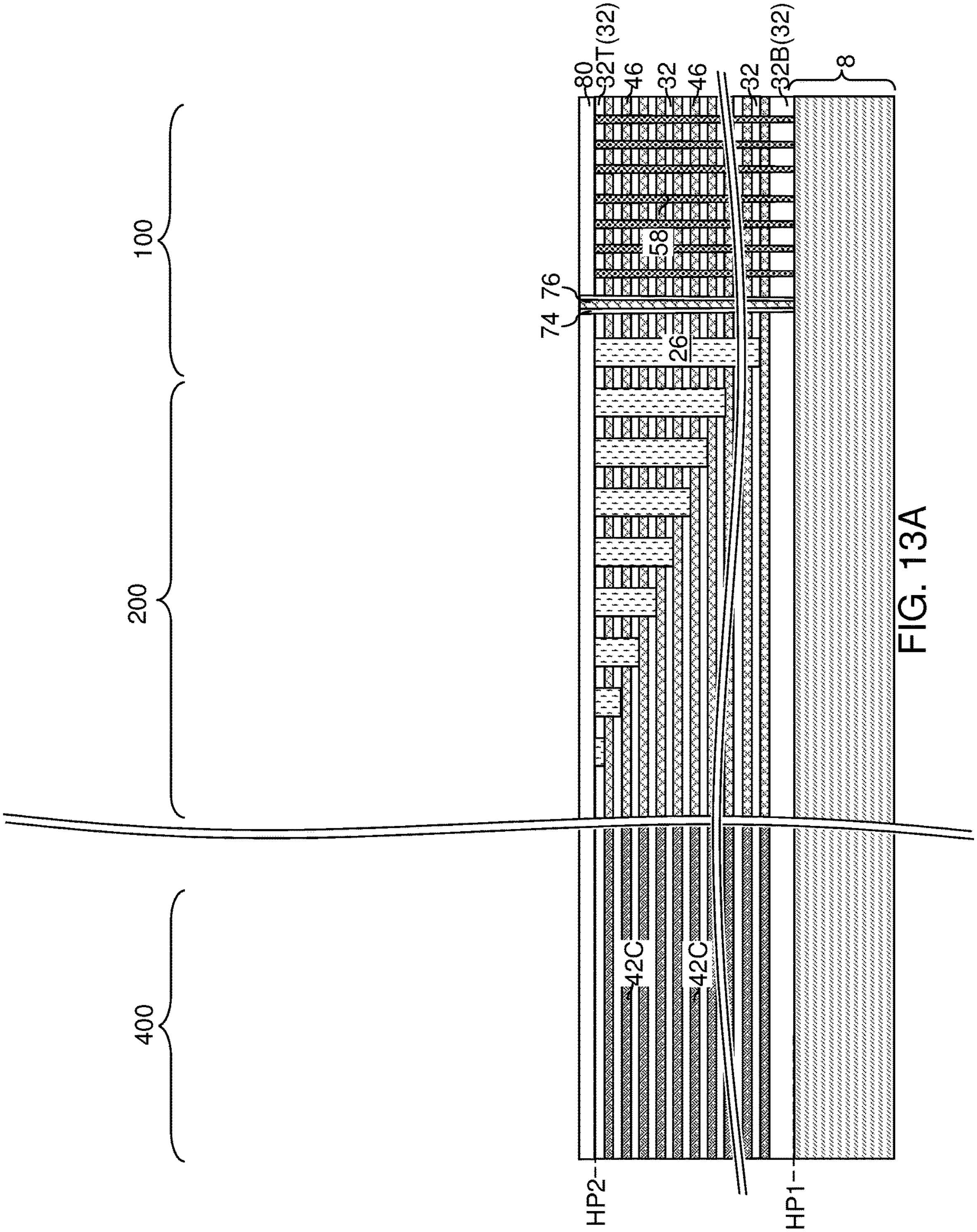
FIG. 13A is a vertical cross-sectional view of the first exemplary structure after formation of a backside trench fill structure according to the first embodiment of the present disclosure.
Figure 13B:
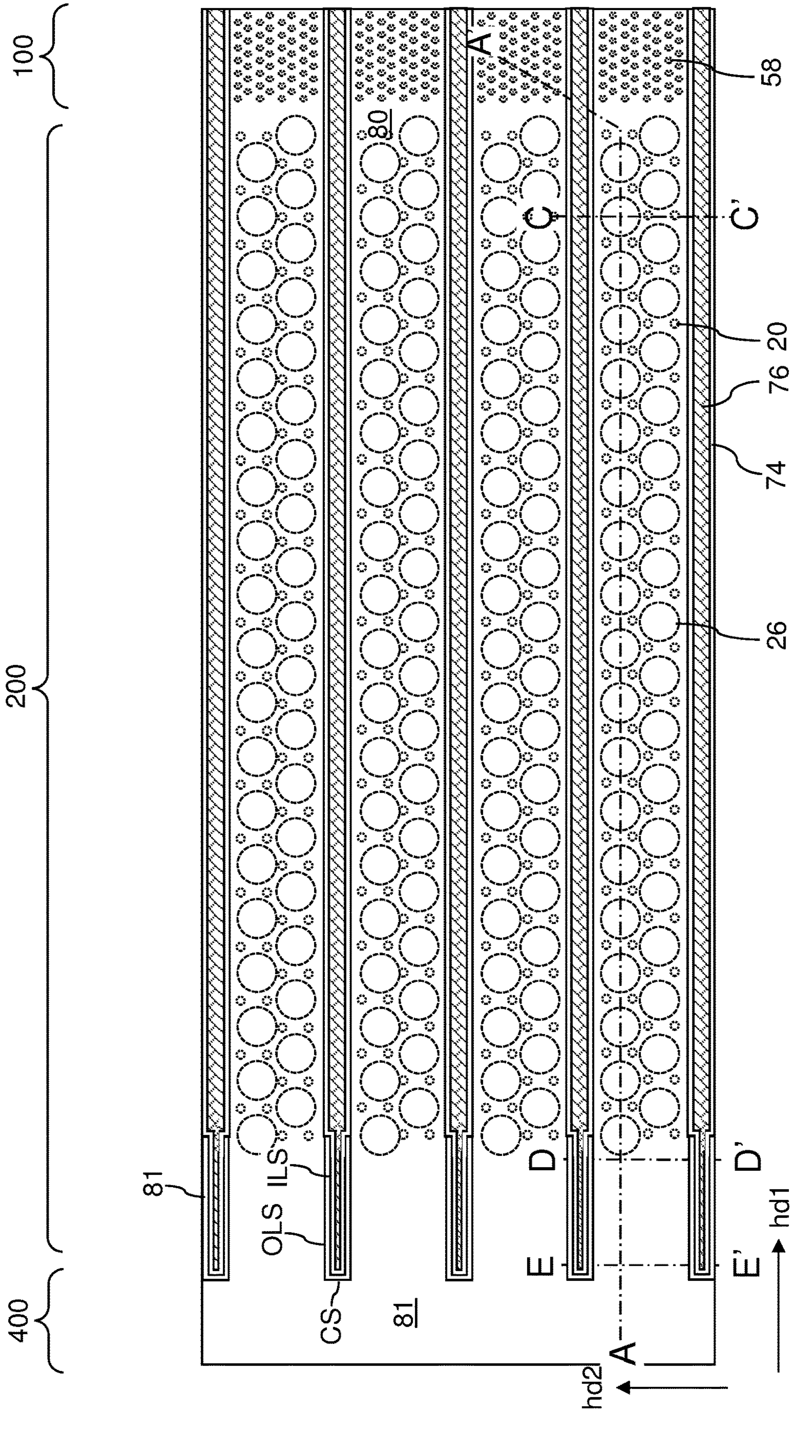
FIG. 13B is a top-down view of the first exemplary structure of FIG. 13A. The hinged vertical plane A-A' is a plane of the vertical cross-sectional view of FIG. 13A.
Figure 13E:
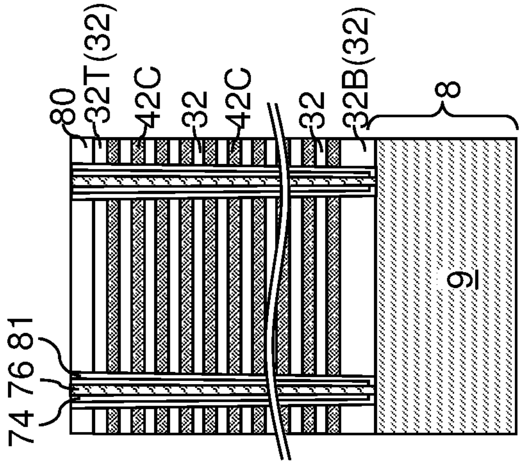
FIG. 13E is a vertical cross-sectional view of the first exemplary structure along the vertical plane E-E' of FIG. 13B.
Figure 13D:
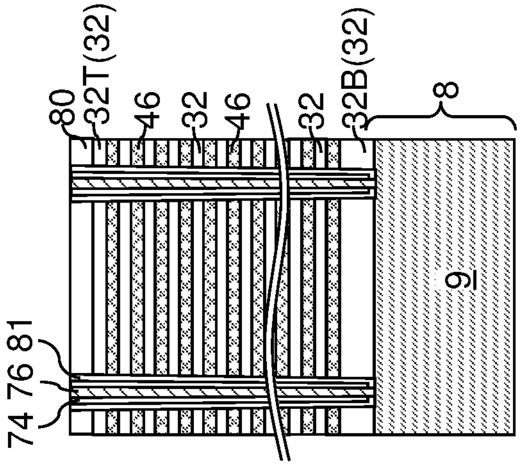
FIG. 13D is a vertical cross-sectional view of the first exemplary structure along the vertical plane D-D' of FIG. 13B.
Figure 13C:
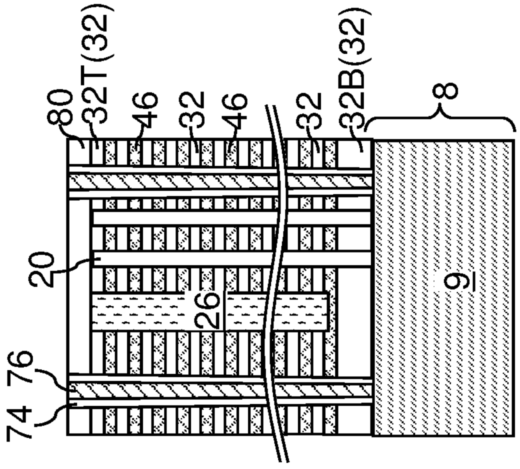
FIG. 13C is a vertical cross-sectional view of the first exemplary structure along the vertical plane C-C' of FIG. 13B.

In one embodiment shown in FIG. 13E, each of the dielectric etch stop structures 81 comprises: a respective pair of inner lengthwise sidewalls ILS that are parallel to the first horizontal direction hd1 and having a first lateral spacing therebetween; a respective pair of outer lengthwise sidewalls OLS that are parallel to the first horizontal direction hd1 and having a second lateral spacing therebetween, the second lateral spacing being greater than the first lateral spacing; and a respective connection sidewall CS that connects the respective pair of outer lengthwise sidewalls OLS and contacting each of the dielectric connection plates 42C within the alternating stack {32, (46, 42C)}. In one embodiment, for each of the dielectric etch stop structures 81, the pair of dielectric sidewalls comprises a pair of inner lengthwise sidewalls ILS.

FIGS. 14A-14D are sequential vertical cross-sectional views of the contact region during replacement of the in-process layer contact assemblies 26 with layer contact assemblies 28 according to the first embodiment of the present disclosure.

Figure 14A:
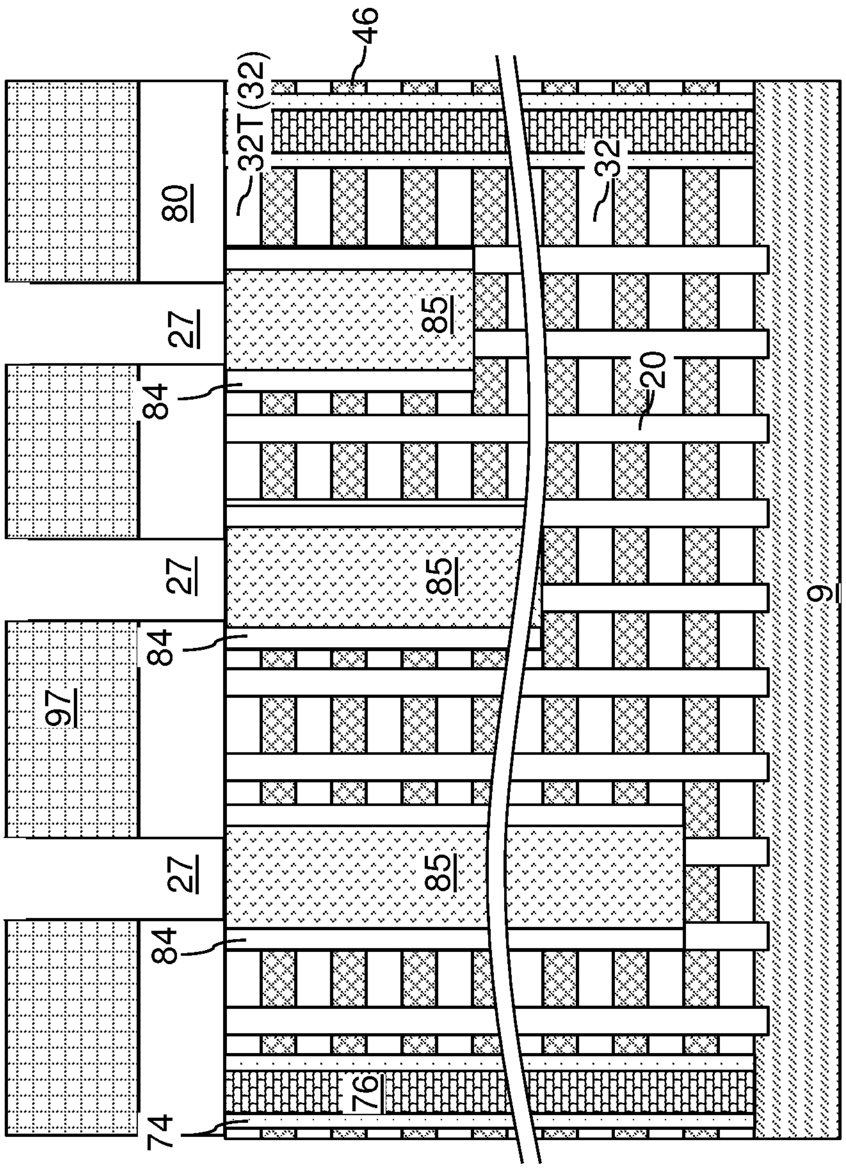
FIGS. 14A-14C are sequential vertical cross-sectional views of the contact region during replacement of the in-process layer contact assemblies with layer contact assemblies according to the first embodiment of the present disclosure.

Referring to FIG. 14A, a photoresist layer 97 can be applied over the contact-level dielectric layer 80, and can be lithographically patterned to form openings over the in-process layer contact assemblies 26. An anisotropic etch process may be performed to transfer the pattern of the openings in the photoresist layer through the contact-level dielectric layer 80. An array of openings 27 can be formed through the contact-level dielectric layer 80. A top surface of a sacrificial via structure 85 can be physically exposed at the bottom of each opening 27 through the contact-level dielectric layer 80.

Figure 14B:
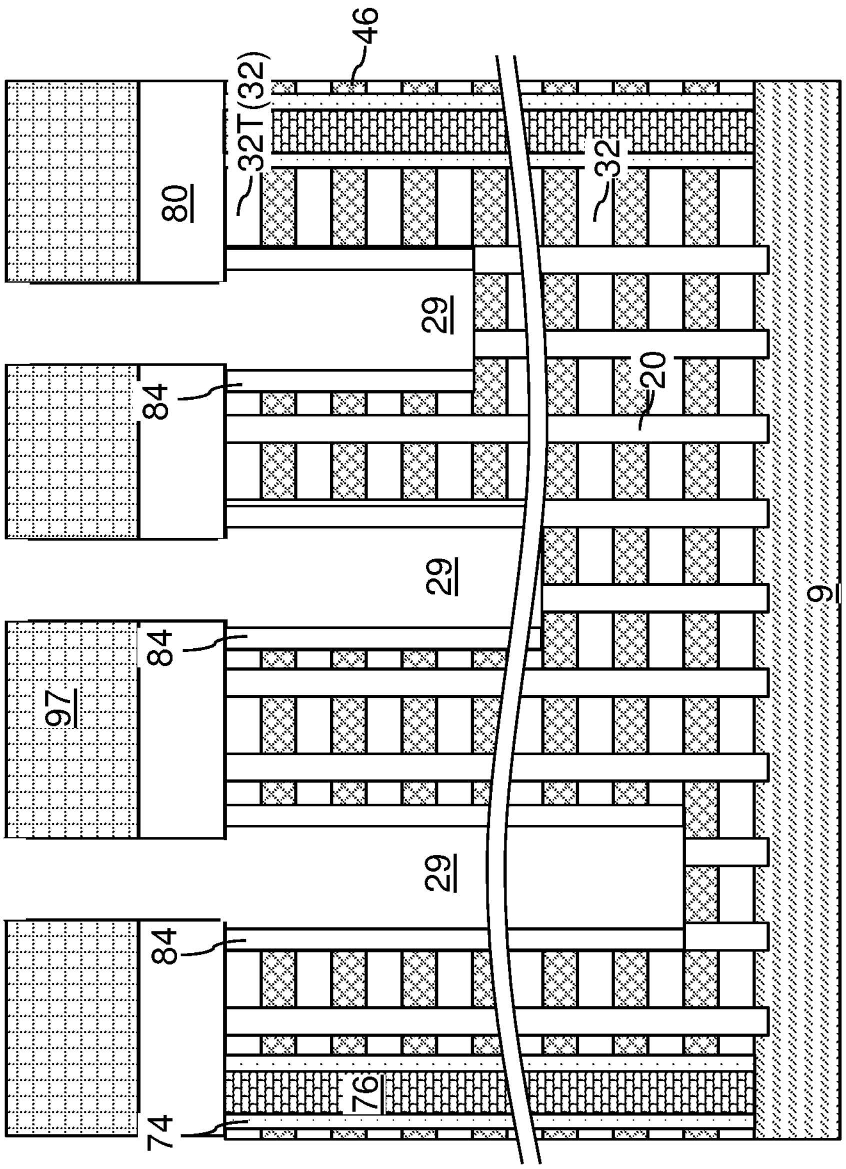

Referring to FIG. 14B, a selective etch process can be performed to remove the sacrificial via structures 85 selective to the contact-level dielectric layer 80, the insulating layers 32, the annular dielectric spacers 82, and the tubular insulating spacers 84. In an illustrative example, if the sacrificial contact opening fill structures 87 comprise silicon, then a wet etch process employing hot trimethyl-2 hydroxyethyl ammonium hydroxide ("hot TMY") or tetramethyl ammonium hydroxide (TMAH) can be employed to remove the sacrificial via structures 85. Contact openings 29 can be formed within the volumes of the contact via cavities 89.

Figure 14C:
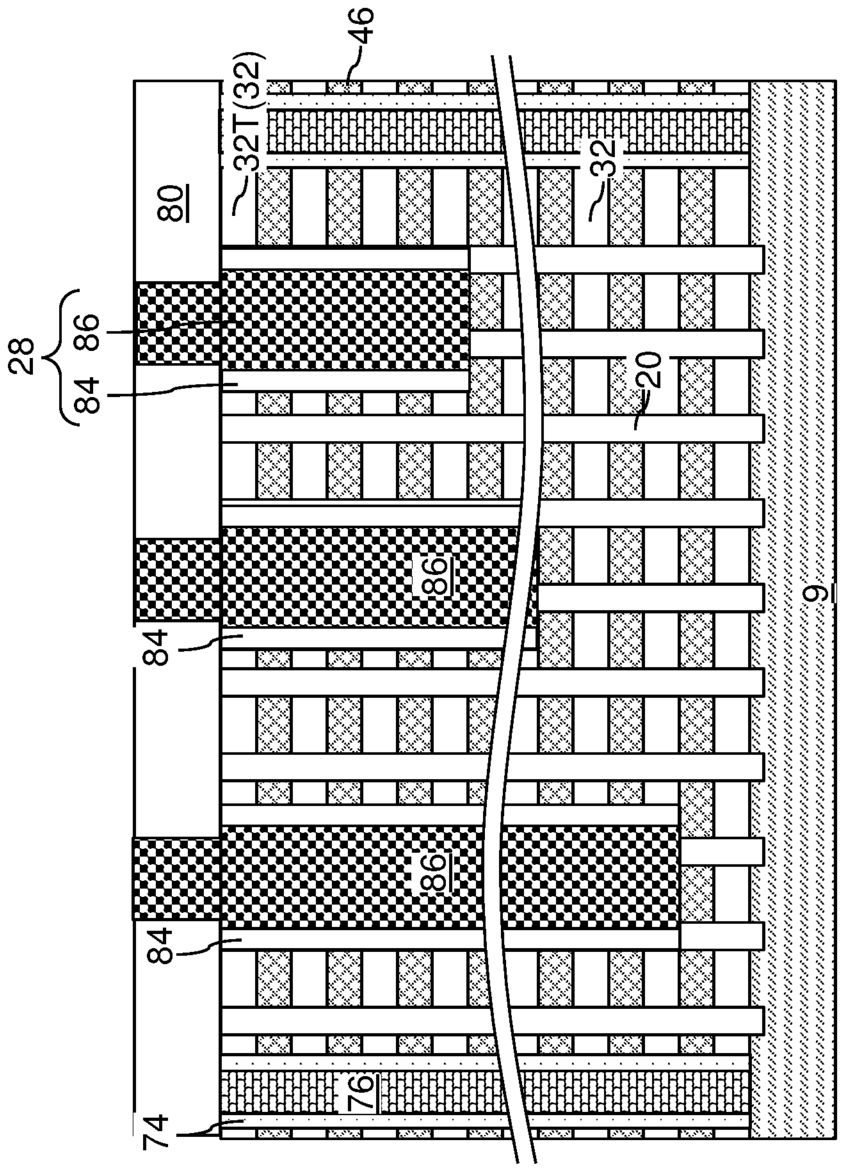

Referring to FIG. 14C, at least one conductive material can be deposited in the contact openings 29. The at least one conductive material may comprise a metallic barrier material and a metallic fill material. The metallic barrier material may comprise a metallic nitride material such as TiN, TaN, and/or WN and/or a metallic carbide material such as TIC, TaC, and/or WC. The metallic fill material may comprise W, Ti, Ta, Ru, Co, Mo, Cu, etc. The at least one conductive material may be deposited by chemical vapor deposition, physical vapor deposition, electroplating, electroless plating, or combinations thereof. Excess portions of the at least one conductive material can be removed from above the horizontal plane including the top surface of the contact-level dielectric layer 80 by performing a planarization process, which may employ a chemical mechanical polishing (CMP) process or a recess etch process. Each remaining portion of the at least one conductive material filling a respective contact opening 29 constitutes a contact via structure 86 that contacts top surface a respective electrically conductive strip 46. Each contact via structure 86 may be laterally surrounded by a respective tubular dielectric spacer 84. Each combination of a contact via structure 86 and a respective tubular dielectric spacer 84 comprises a layer contact assembly 28 (i.e., a word line or select gate electrode contact via structure.

Figure 15A:
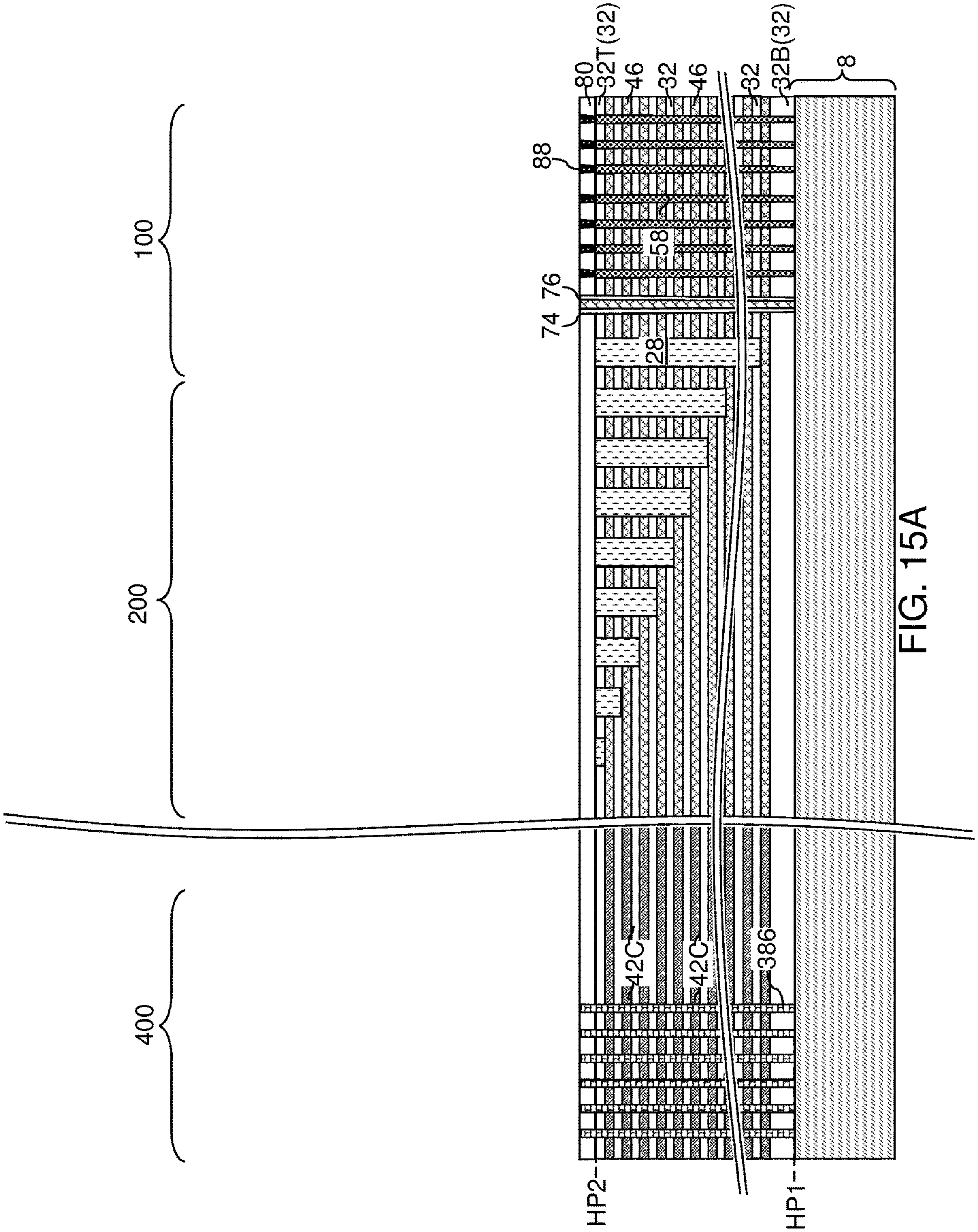
FIG. 15A is a vertical cross-sectional view of the first exemplary structure after formation of drain contact via structures according to the first embodiment of the present disclosure.
Figure 15B:
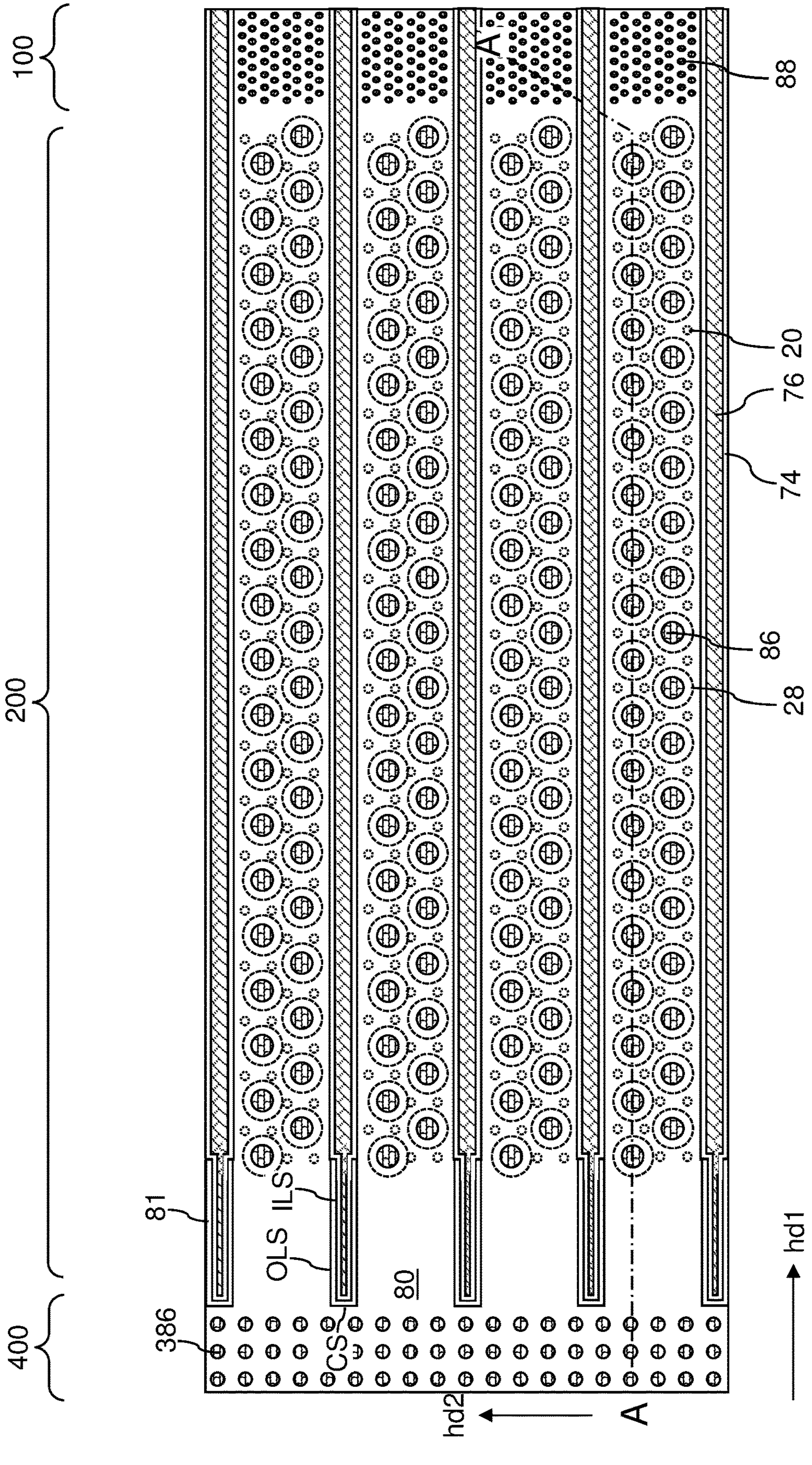
FIG. 15B is a top-down view of the first exemplary structure of FIG. 15A.

Referring to FIGS. 15A and 15B, additional conductive via structures (88, 386) can be formed. The additional conductive via structures (88, 386) may comprise, for example, drain contact via structures 88 that are formed through the contact-level dielectric layer 80 directly on a top surface of a respective one of the drain regions 63, and connection via structures 386 that may be formed in the peripheral region through as stack of dielectric material plates 42' (which are remaining portions of the sacrificial material layers 42) and through each of the insulating layers 32.

Figure 16:
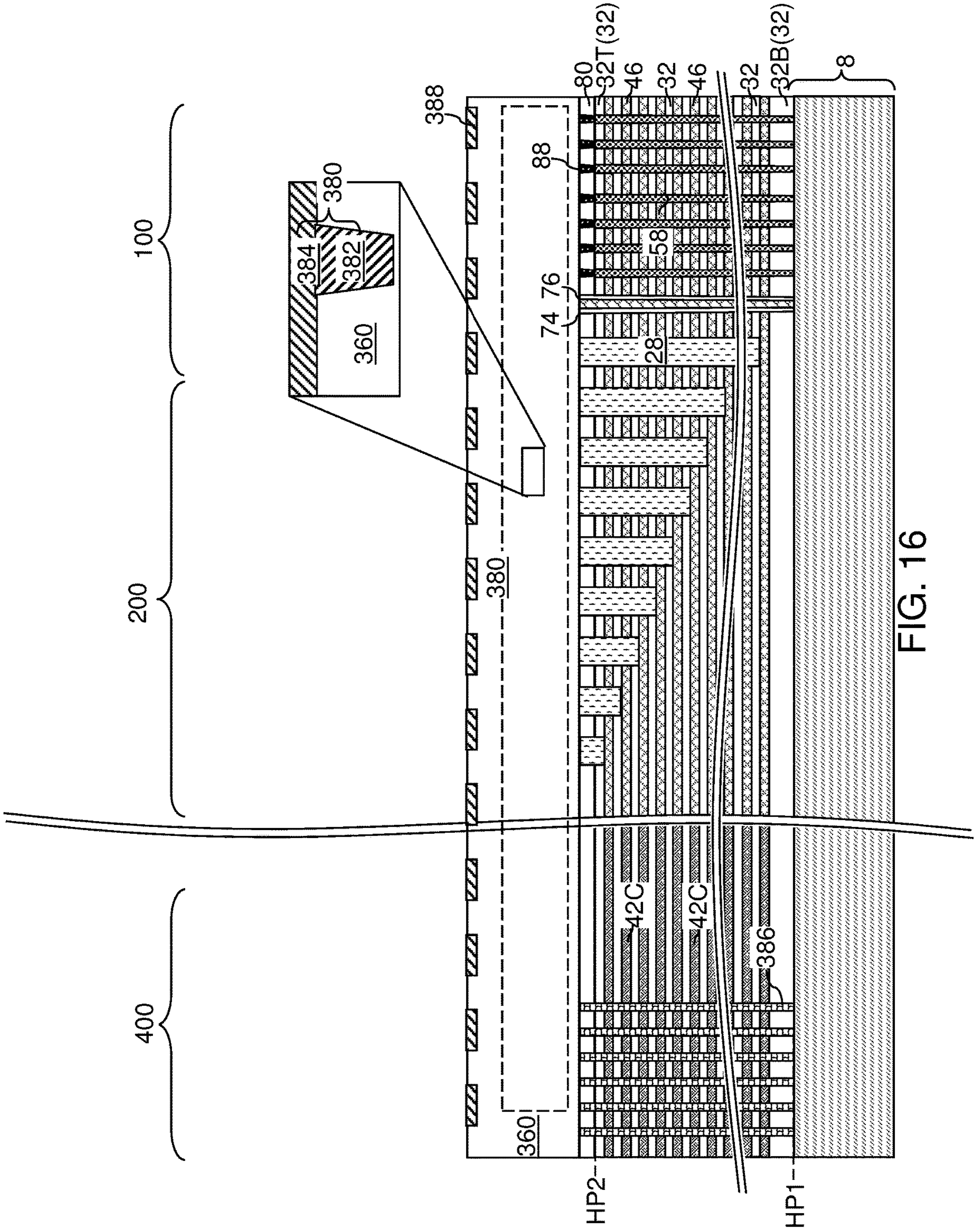
FIG. 16 is a vertical cross-sectional view of the first exemplary structure after formation of upper dielectric material layers and upper metal interconnect structures according to the first embodiment of the present disclosure.

Referring to FIG. 16, upper metal interconnect structures 380 and upper dielectric material layers 360 may be formed above the contact-level dielectric layer 80. The upper metal interconnect structures 380 overlie the alternating stack {32, (46, 42C)}, and are embedded within the upper dielectric material layers 360. The upper metal interconnect structures 380 comprise upper metal via structures 382 and upper metal line structures 384. In one embodiment, the upper metal via structures 382 may have a respective lateral extent that increases with a vertical distance upward from a topmost surface of the alternating stack {32, (46, 42C)}. The upper metal interconnect structures 380 may comprise bit lines that are electrically connected to a respective subset of the drain regions 63 through a respective subset of the drain contact via structures 88.

Memory-side bonding pads 388 may be formed within the upper dielectric material layers 360. The memory-side bonding pads 388 may be electrically connected to the upper metal interconnect structures 380.

Figure 17:
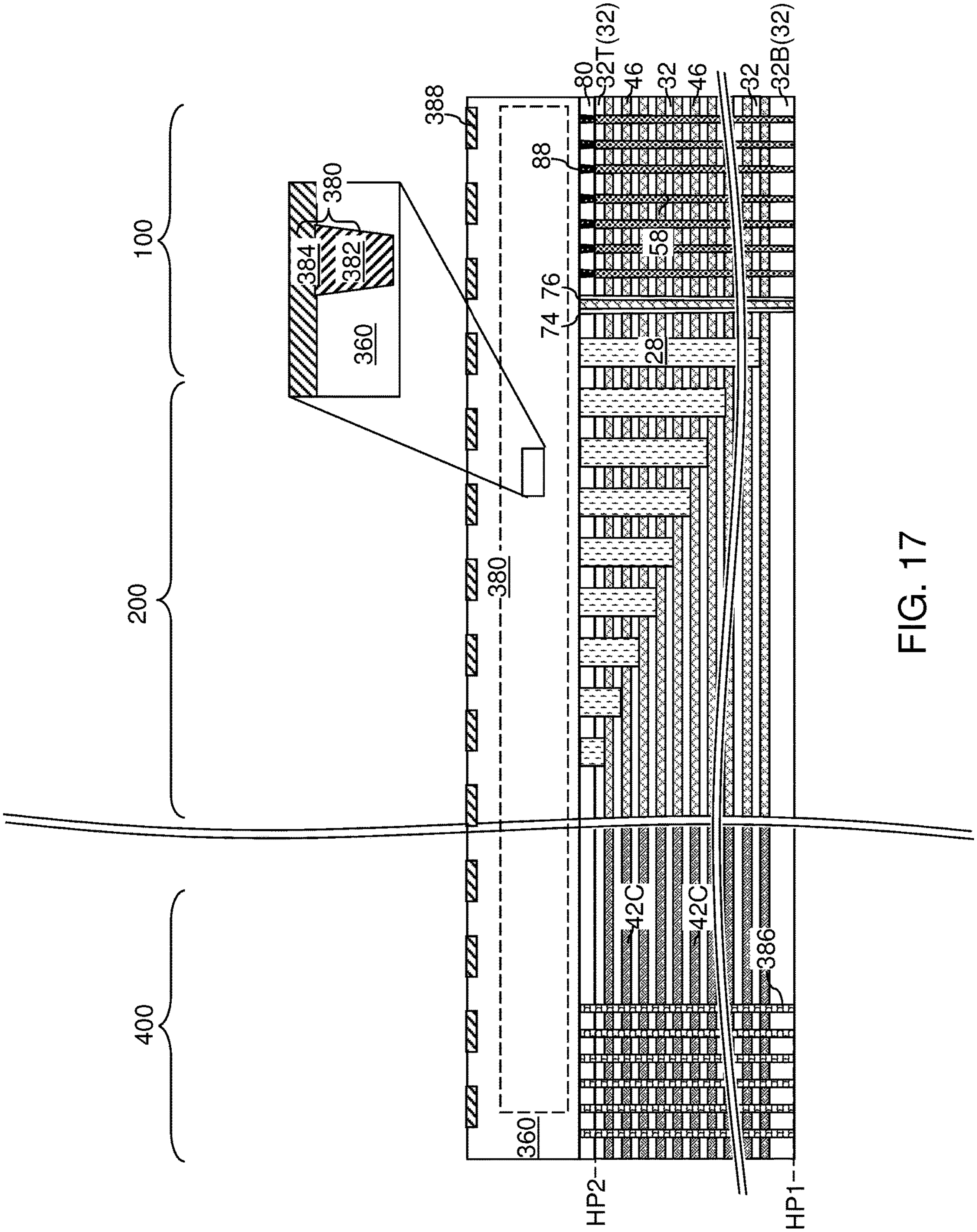
FIG. 17 is a vertical cross-sectional view of the first exemplary structure after removal of the carrier substrate according to the first embodiment of the present disclosure.

Referring to FIG. 17, if the lower metal interconnect structures 480 are not already formed between the substrate 8 and the alternating stack {32, (46, 42C)}, then the substrate 8 (which can be a carrier substrate) including the substrate material layer 9 can be removed, for example, by grinding, polishing, an anisotropic etch process, and/or an isotropic etch process. Alternatively, the substrate 8 may be removed by cleaving.

Figure 18:
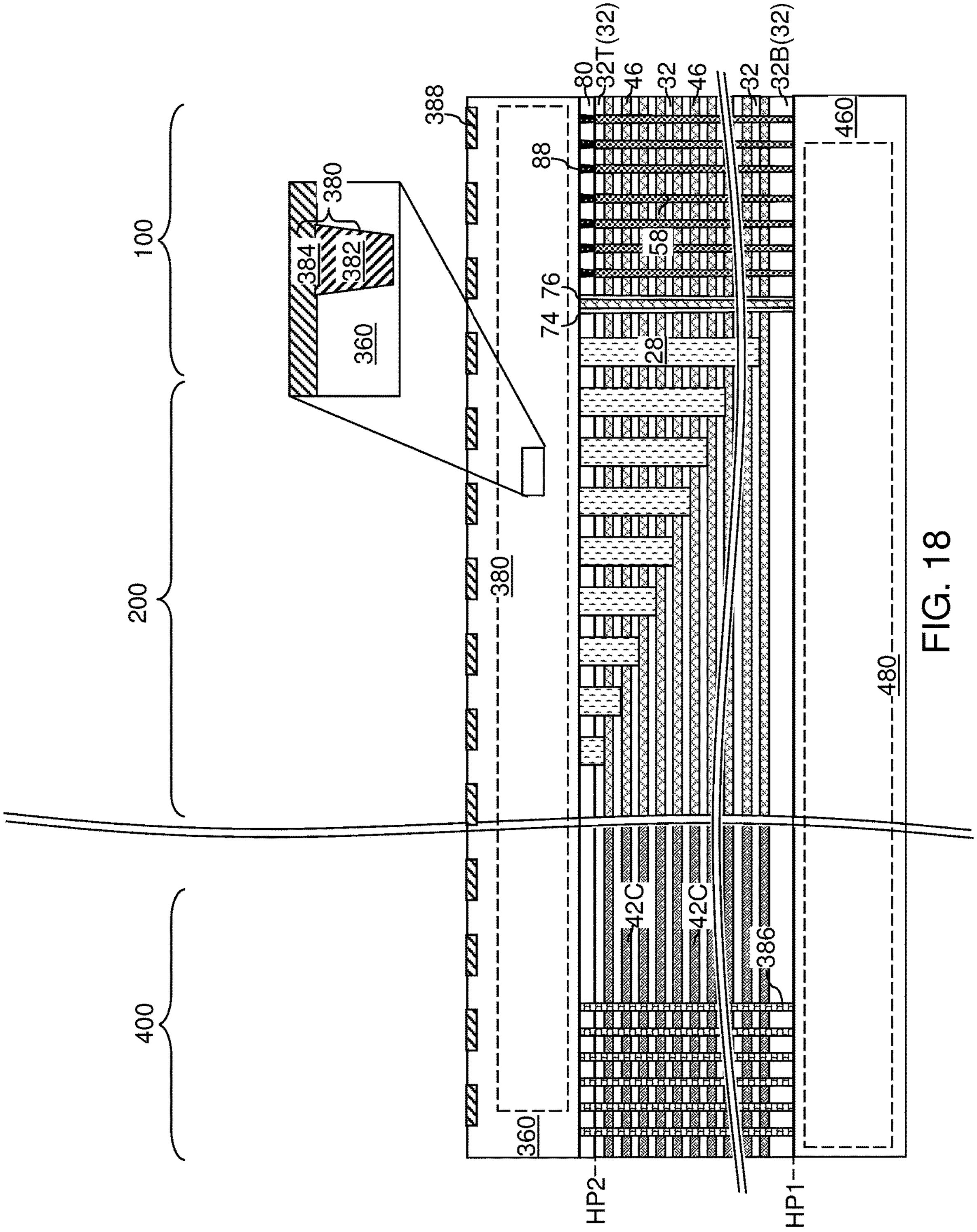
FIG. 18 is a vertical cross-sectional view of the first exemplary structure after formation of lower metal interconnect structures according to the first embodiment of the present disclosure.

Referring to FIG. 18, lower metal interconnect structures 480 and lower dielectric material strips 460 may be formed over the bottommost insulating layer 32B. The lower metal interconnect structures 480 underlie the alternating stack {32, (46, 42C)} (when viewed in an orientation in which the upper dielectric material layers 360 overlie the alternating stack {32, (46, 42C)}), and are embedded within the lower dielectric material strips 460. The lower metal interconnect structures 480 may comprise lower metal via structures 482 and lower metal line structures 484. In one embodiment, the lower metal via structures 482 may have a respective lateral extent that increases with a vertical distance downward from a bottommost surface of the alternating stack {32, (46, 42C)}.

In one embodiment, the connection via structures 386 vertically extend through the dielectric connection plates 42C within the alternating stack {32, (46, 42C)}, and provide electrical connection between a respective one of the upper metal interconnect structures 380 and a respective one of the lower metal interconnect structures 480.

Figure 19:
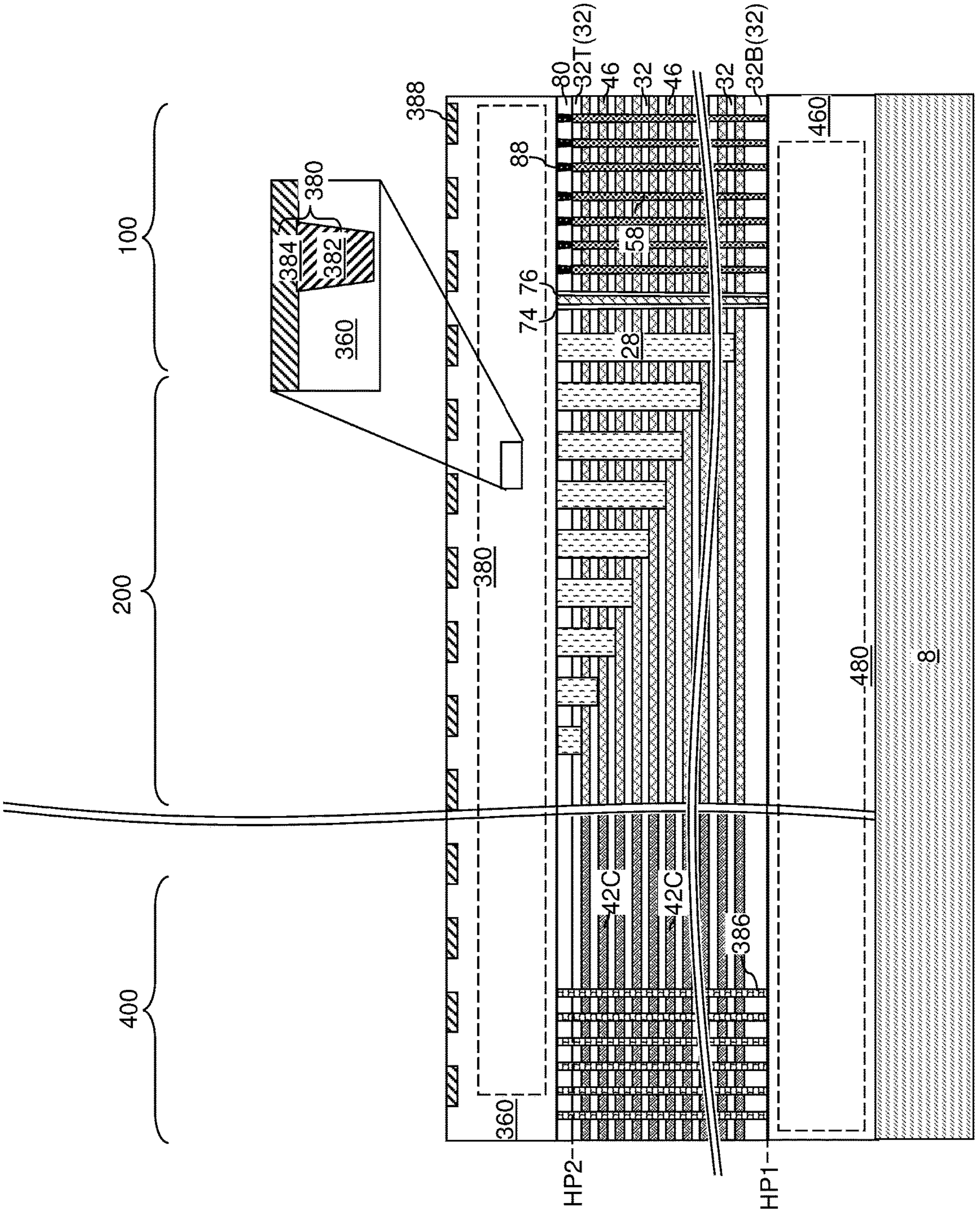
FIG. 19 is a vertical cross-sectional view of an alternative configuration of the first exemplary structure in which the substrate may be retained according to the first embodiment of the present disclosure.

Referring to FIG. 19, in an alternative configuration of the first embodiment, if the lower metal interconnect structures 480 are already formed between the substrate 8 and the alternating stack {32, (46, 42C)} as the step shown in FIG. 1A, then the substrate 8 may be retained.

Figure 20:
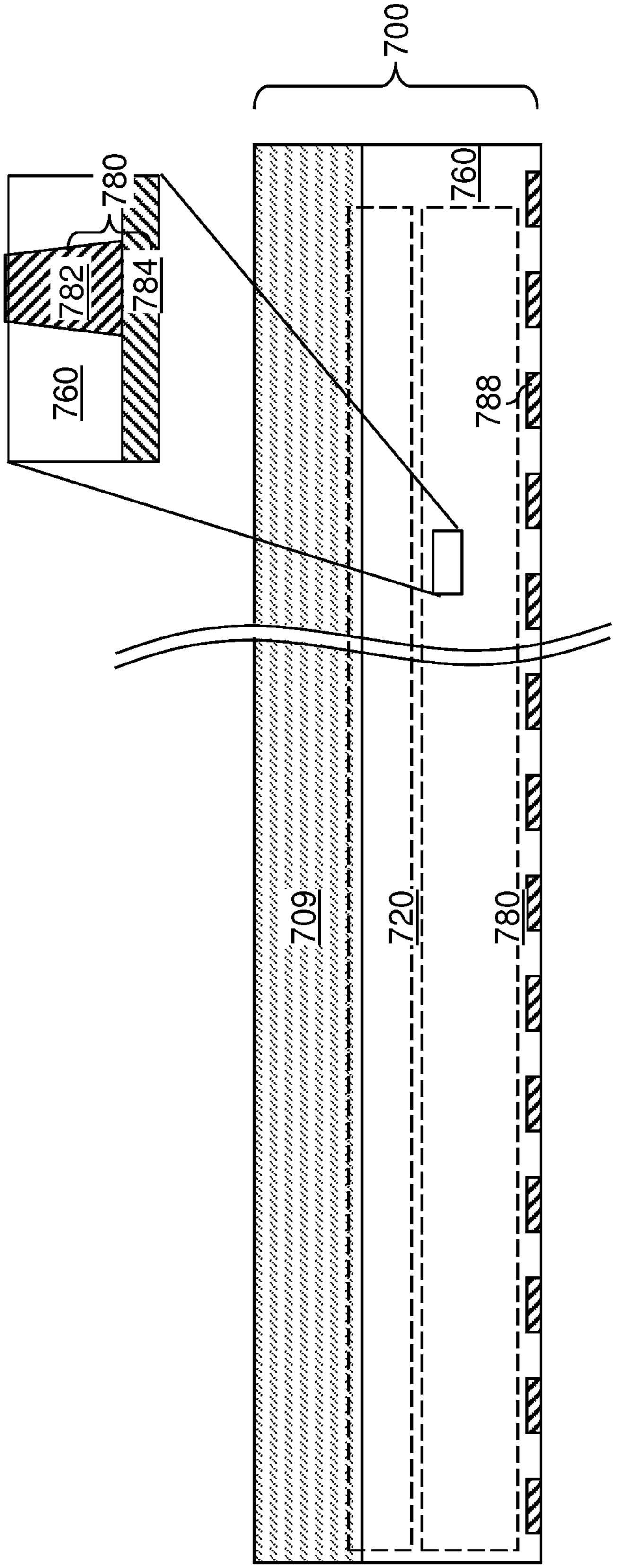
FIG. 20 is a vertical cross-sectional view of the logic die according to the first embodiment of the present disclosure.

Referring to FIG. 20, a logic die 700 can be provided. The logic die 700 comprises a logic-side substrate 709 (which may be a semiconductor substrate), logic-side semiconductor devices 720 which includes a peripheral circuitry for controlling operation of the three-dimensional memory device within the memory die 900, logic-side metal interconnect structures 780 embedded within logic-side dielectric material layers 760, and logic-side bonding pads 788 configured to mate with the memory-die bonding pads 388. The logic-side metal interconnect structures 780 may comprise logic-side metal lines 784 and logic-side metal via structures 782. The logic-side metal via structures 782 may have a respective variable lateral extent that increases with a vertical distance from a horizontal plane including an interface between the logic-side substrate 709 and the logic-side dielectric material layers 760.

Generally, the logic-side semiconductor devices 720 comprise a control circuitry configured to control operation of the vertical stack of memory elements (e.g., memory cells) within each memory opening fill structure 58 in the memory die 900. The logic-side semiconductor devices 720 may be electrically connected to the logic-side bonding pads 788 through the logic-side metal interconnect structures 780. Thus, the logic-side bonding pads 788 are electrically connected to the logic-side semiconductor devices 720 through the logic-side metal interconnect structures 780.

Figure 21:
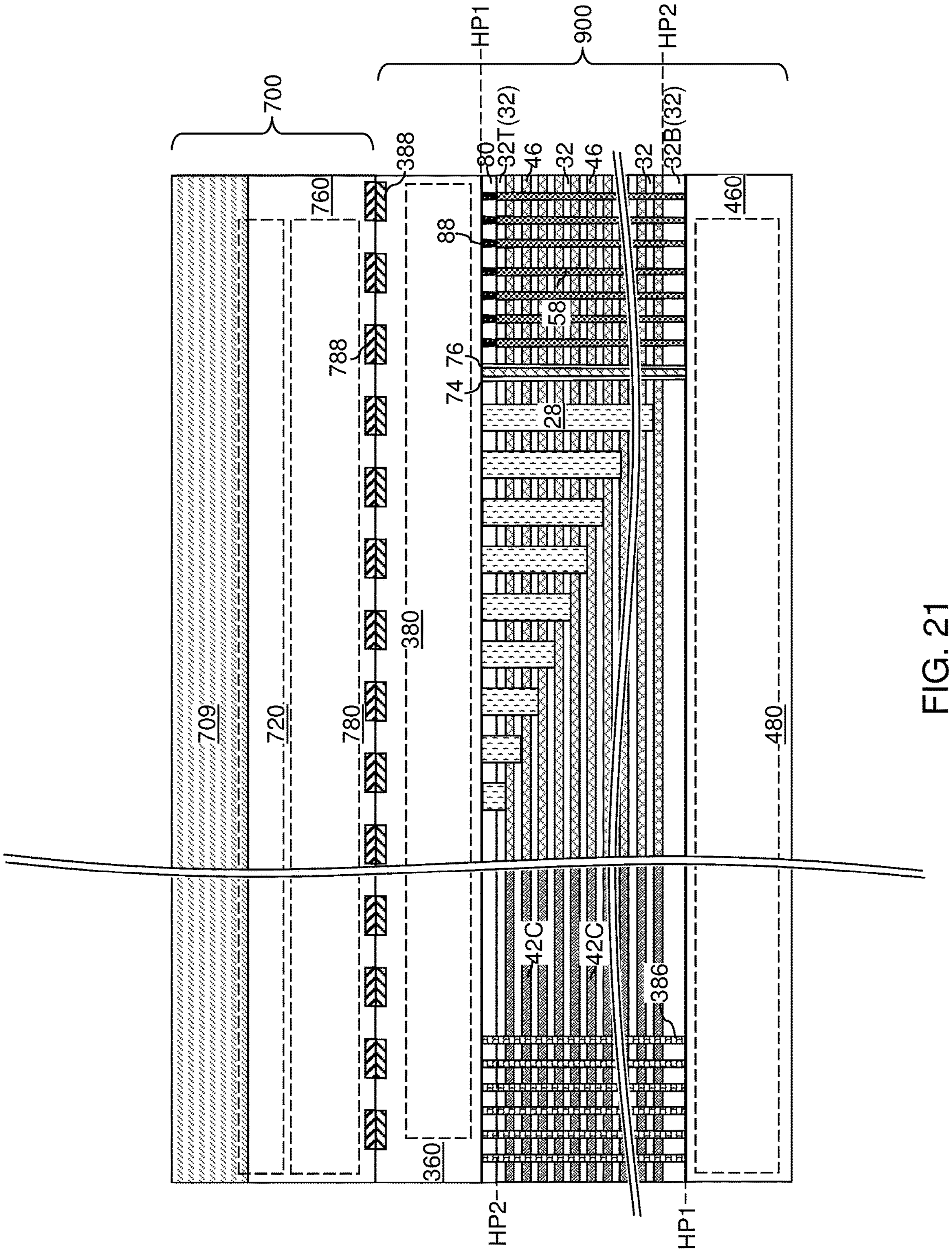
FIG. 21 is a vertical cross-sectional view of the first exemplary structure after attaching the logic die to the memory die according to the first embodiment of the present disclosure.

Referring to FIG. 21, the logic die 700 can be attached to the memory die 900, for example, by bonding the memory-side bonding pads 388 with the logic-side bonding pads 788. For example, the memory-side bonding pads 388 can be bonded with the logic-side bonding pads 788 by metal-to-metal bonding such as copper-to-copper bonding. In some embodiments, hybrid bonding may be employed, in which contacting surfaces of the upper dielectric material layers 960 and the logic-side dielectric material layers 760 are bonded through dielectric-to-dielectric bonding (such as oxide-to-oxide bonding). The substrate 8 may be either omitted or retained in the bonded assembly of the logic die 700 and the memory die 900.

Figure 22:
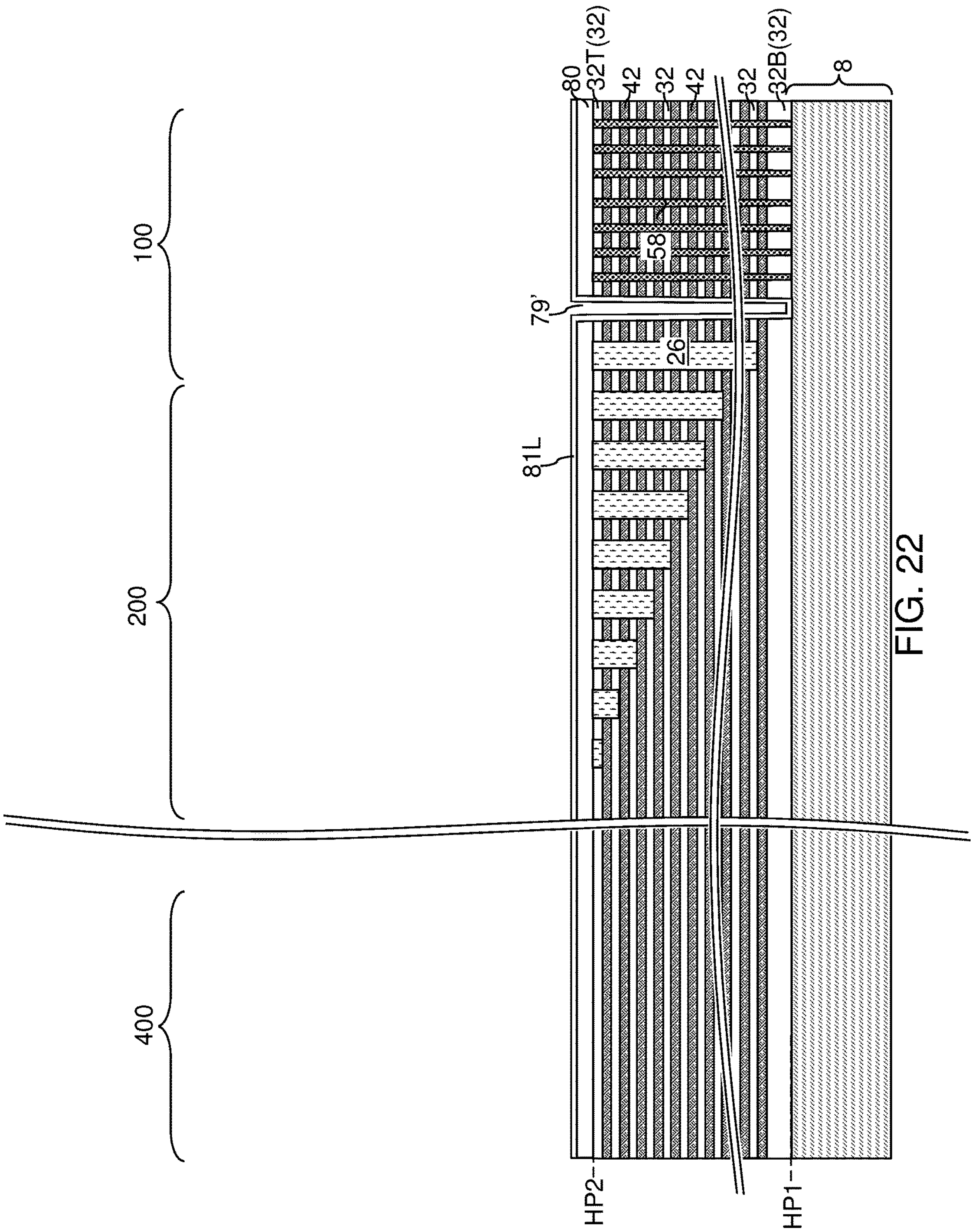
FIG. 22 is a vertical cross-sectional view of an alternative configuration of the first exemplary structure after formation of a conformal etch mask material layer according to the first embodiment of the present disclosure.
Figure 23A:
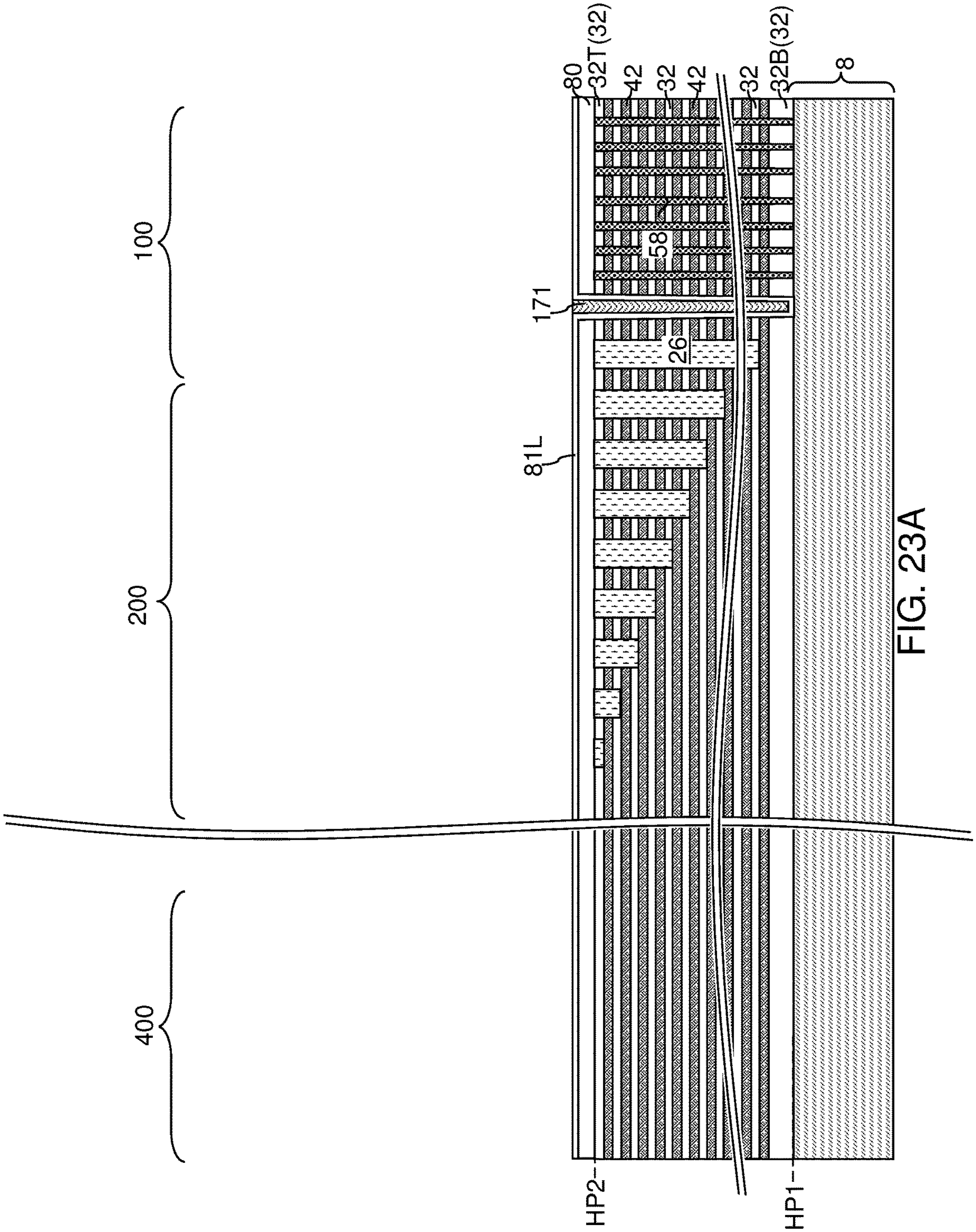
FIG. 23A is a vertical cross-sectional view of the alternative configuration of the first exemplary structure after formation of sacrificial backside trench fill structures according to the first embodiment of the present disclosure.
Figure 23B:
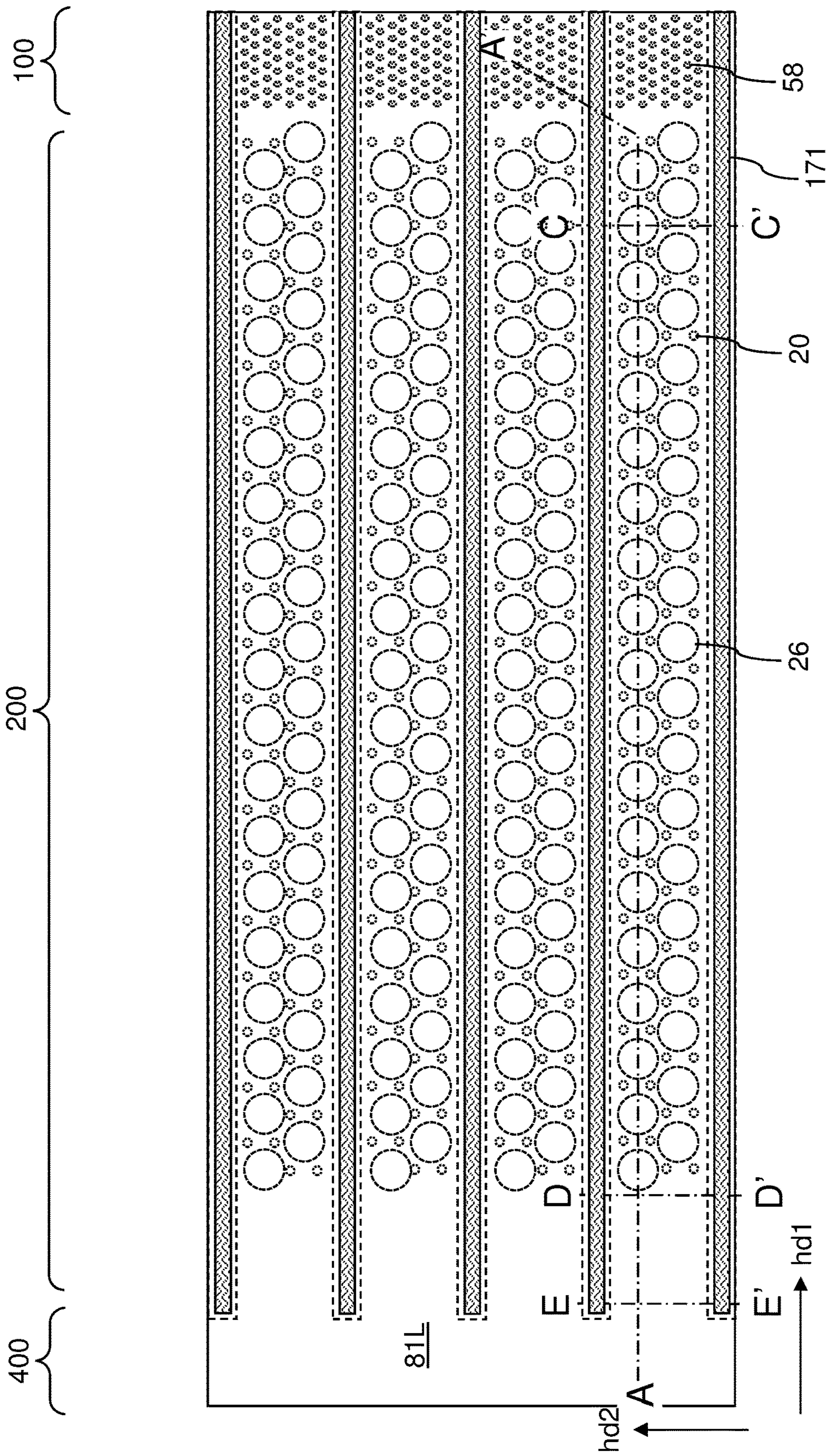
FIG. 23B is a top-down view of the first exemplary structure of FIG. 23A. The hinged vertical plane A-A' is a plane of the vertical cross-sectional view of FIG. 23A.
Figure 23E:
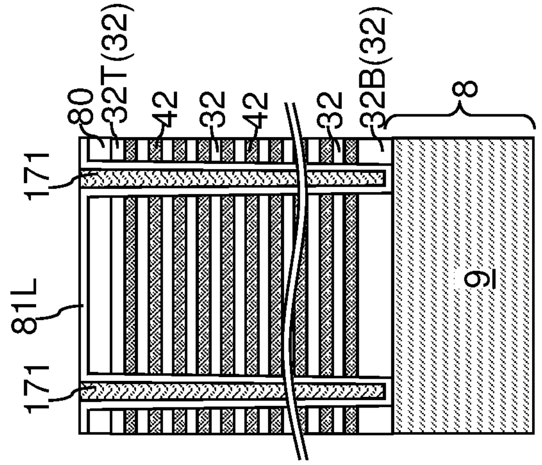
FIG. 23E is a vertical cross-sectional view of the first exemplary structure along the vertical plane E-E' of FIG. 23B.
Figure 23D:
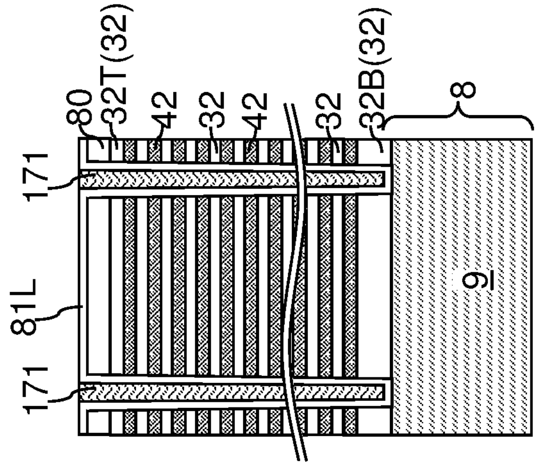
FIG. 23D is a vertical cross-sectional view of the first exemplary structure along the vertical plane D-D' of FIG. 23B.
Figure 23C:
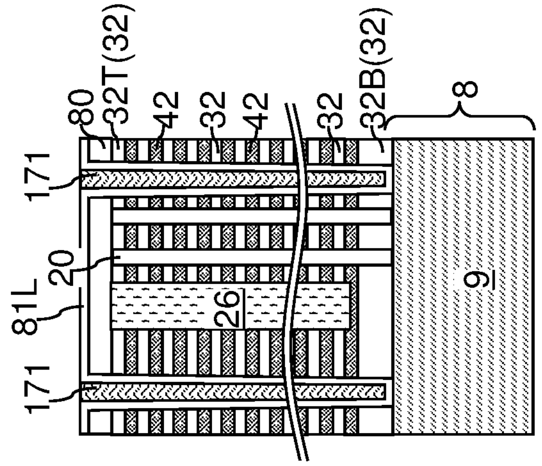
FIG. 23C is a vertical cross-sectional view of the first exemplary structure along the vertical plane C-C' of FIG. 23B.
Figure 24A:
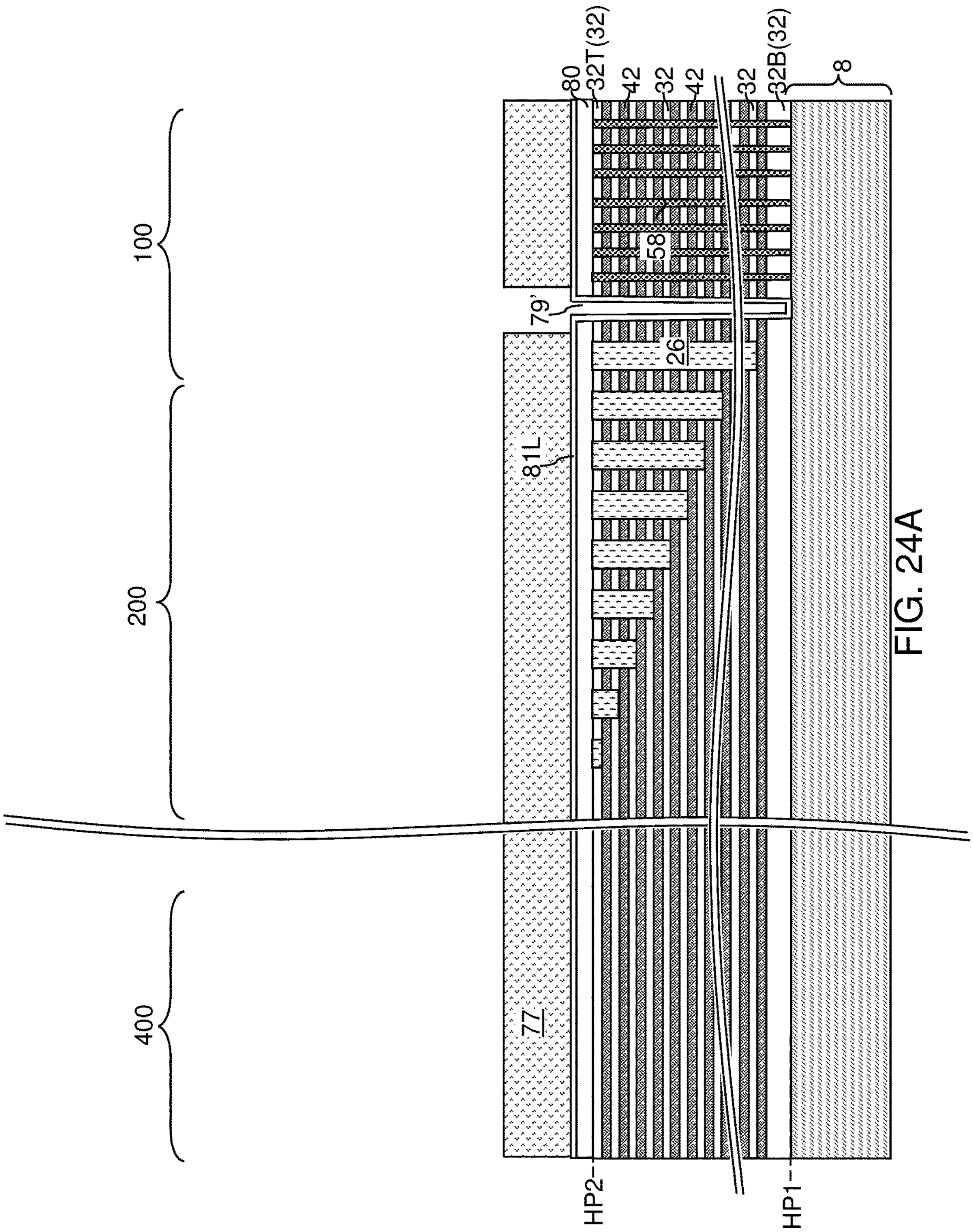
FIG. 24A is a vertical cross-sectional view of the alternative configuration of the first exemplary structure after removal of unmasked portions of the sacrificial backside trench fill structures according to the first embodiment of the present disclosure.
Figure 24B:
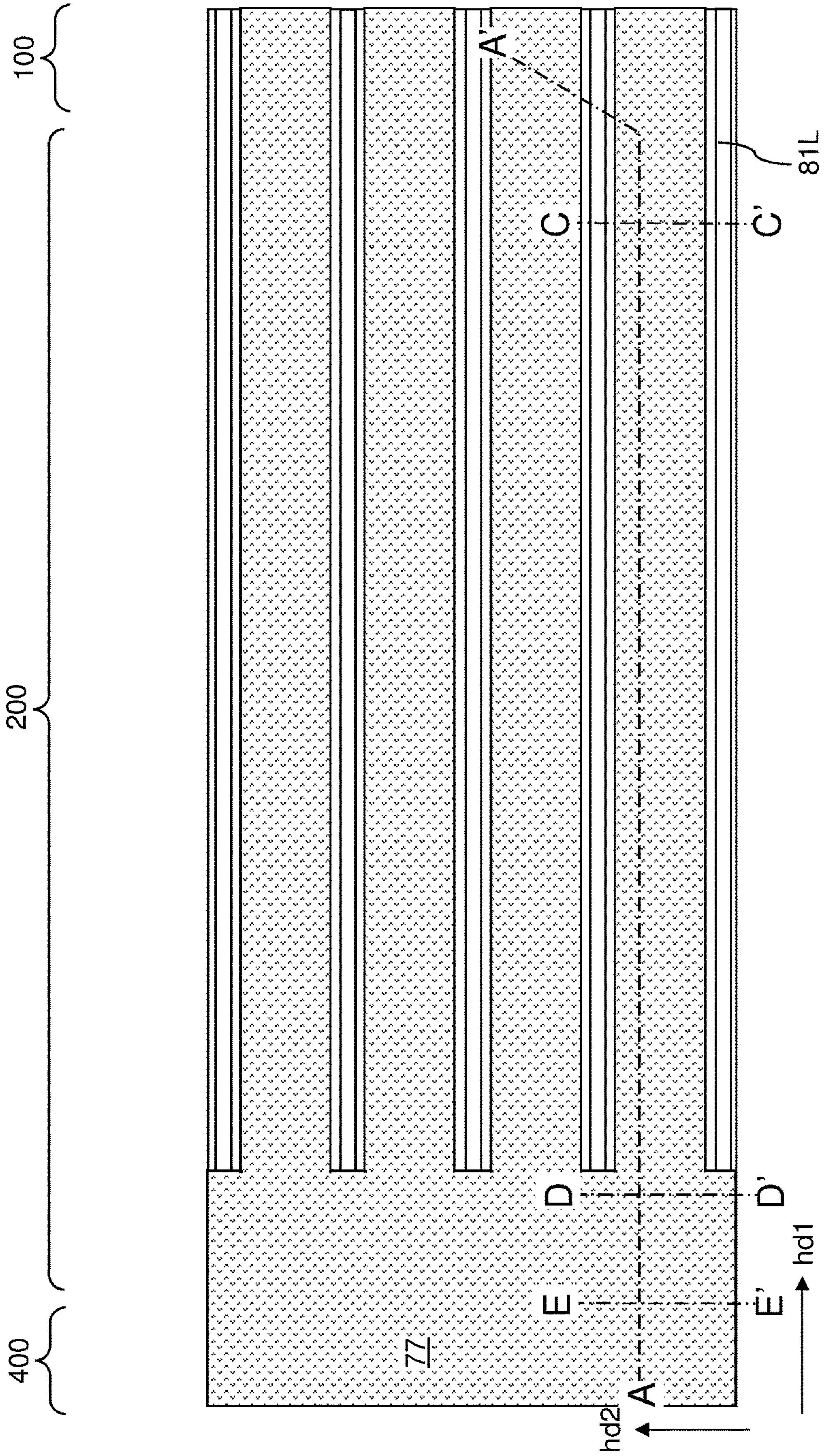
FIG. 24B is a top-down view of the first exemplary structure of FIG. 24A. The hinged vertical plane A-A' is a plane of the vertical cross-sectional view of FIG. 24A.
Figure 24E:
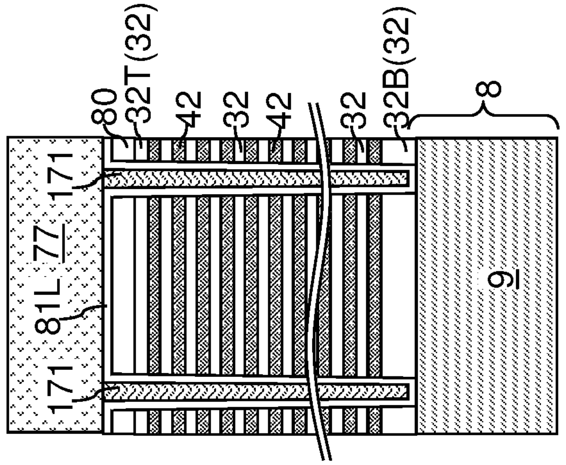
FIG. 24E is a vertical cross-sectional view of the first exemplary structure along the vertical plane E-E' of FIG. 24B.
Figure 24D:
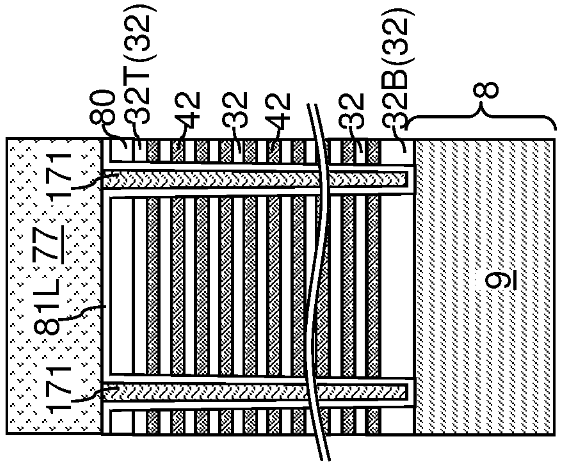
FIG. 24D is a vertical cross-sectional view of the first exemplary structure along the vertical plane D-D' of FIG. 24B.
Figure 24C:
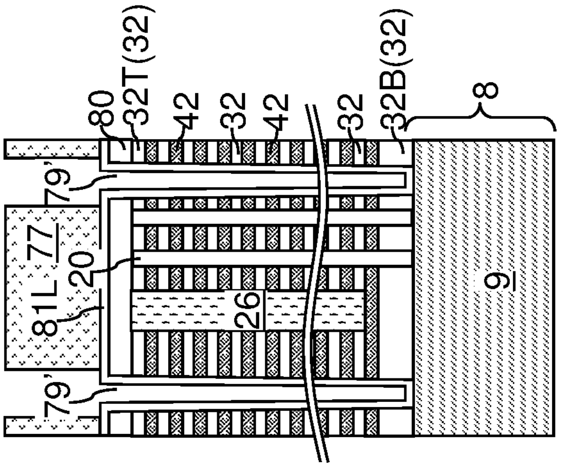
FIG. 24C is a vertical cross-sectional view of the first exemplary structure along the vertical plane C-C' of FIG. 24B.
Figure 25A:
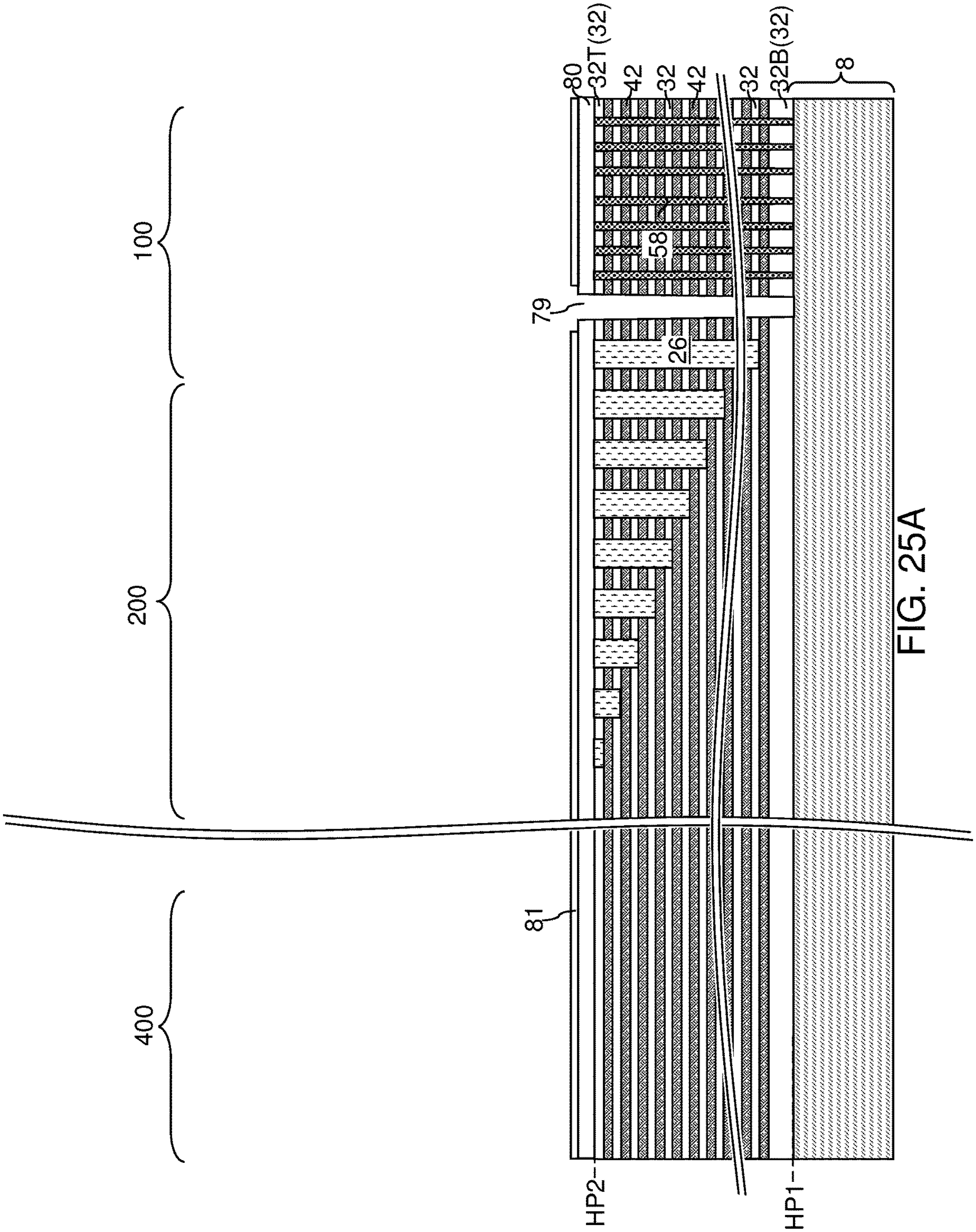
FIG. 25A is a vertical cross-sectional view of the alternative configuration of the first exemplary structure after patterning the conformal etch mask material layer according to the first embodiment of the present disclosure.
Figure 25B:
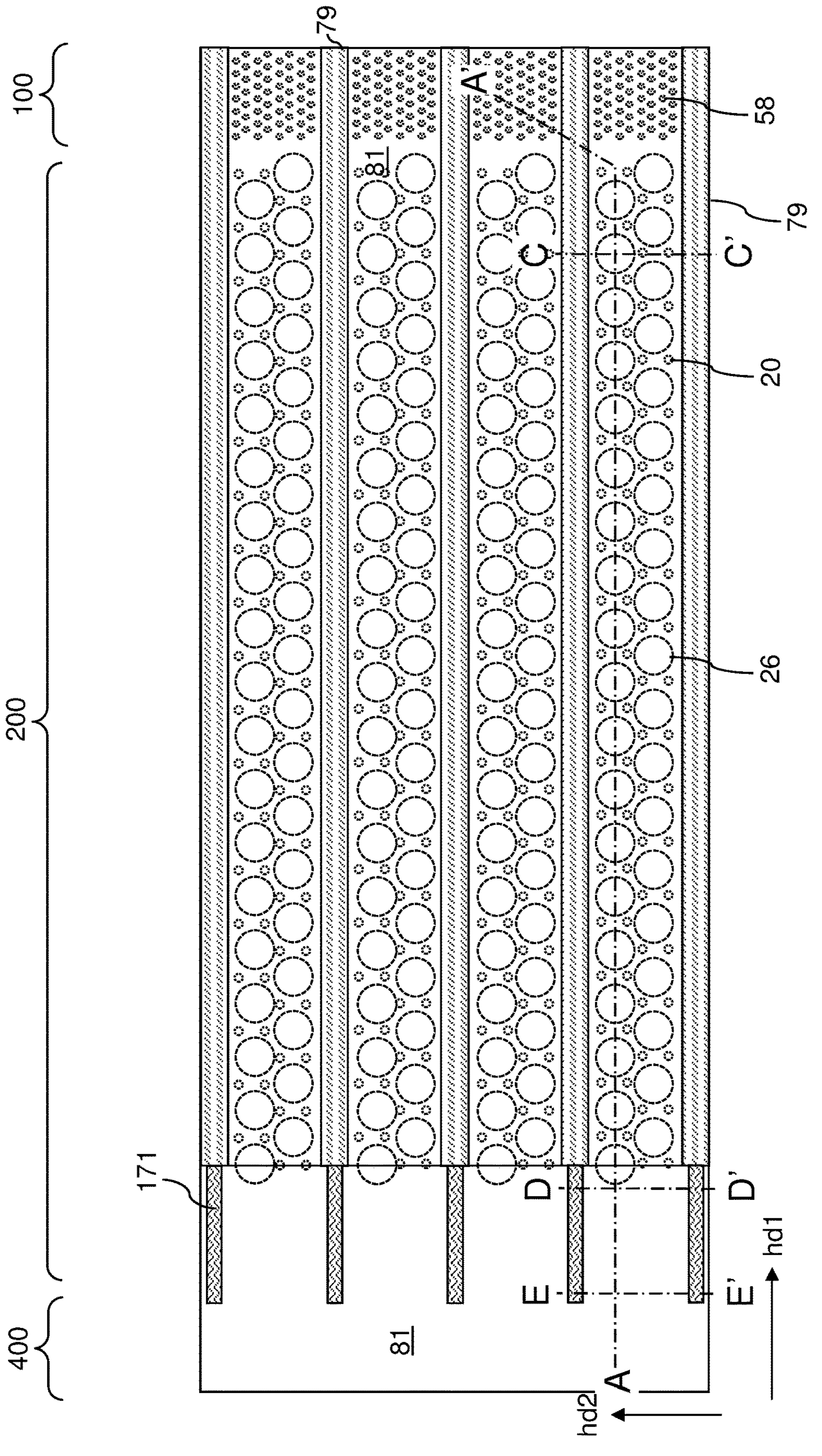
FIG. 25B is a top-down view of the first exemplary structure of FIG. 25A. The hinged vertical plane A-A' is a plane of the vertical cross-sectional view of FIG. 25A.
Figure 25E:
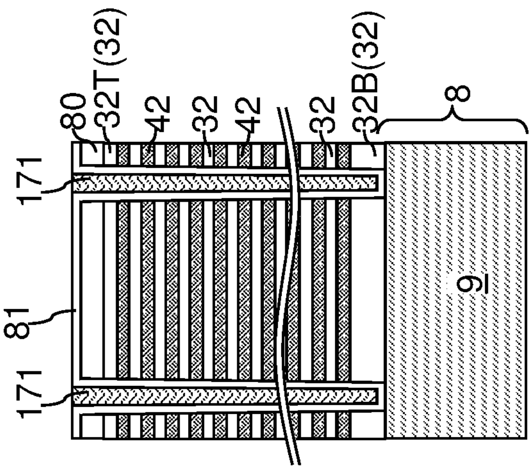
FIG. 25E is a vertical cross-sectional view of the first exemplary structure along the vertical plane E-E' of FIG. 25B.
Figure 25D:
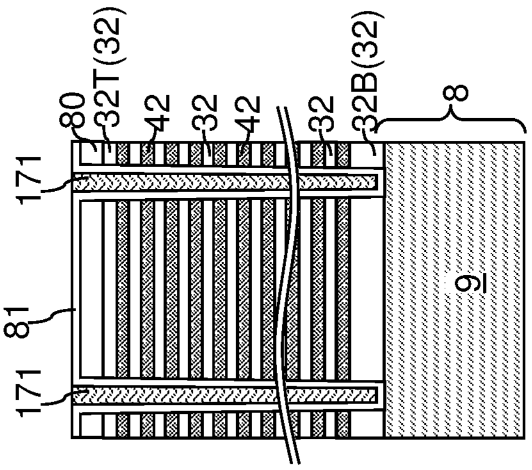
FIG. 25D is a vertical cross-sectional view of the first exemplary structure along the vertical plane D-D' of FIG. 25B.
Figure 25C:
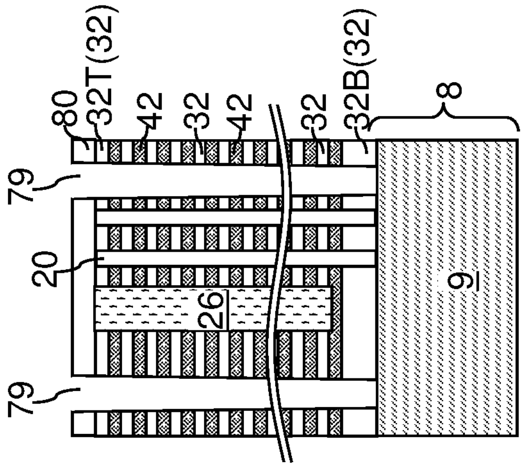
FIG. 25C is a vertical cross-sectional view of the first exemplary structure along the vertical plane C-C' of FIG. 25B.
Figure 26A:
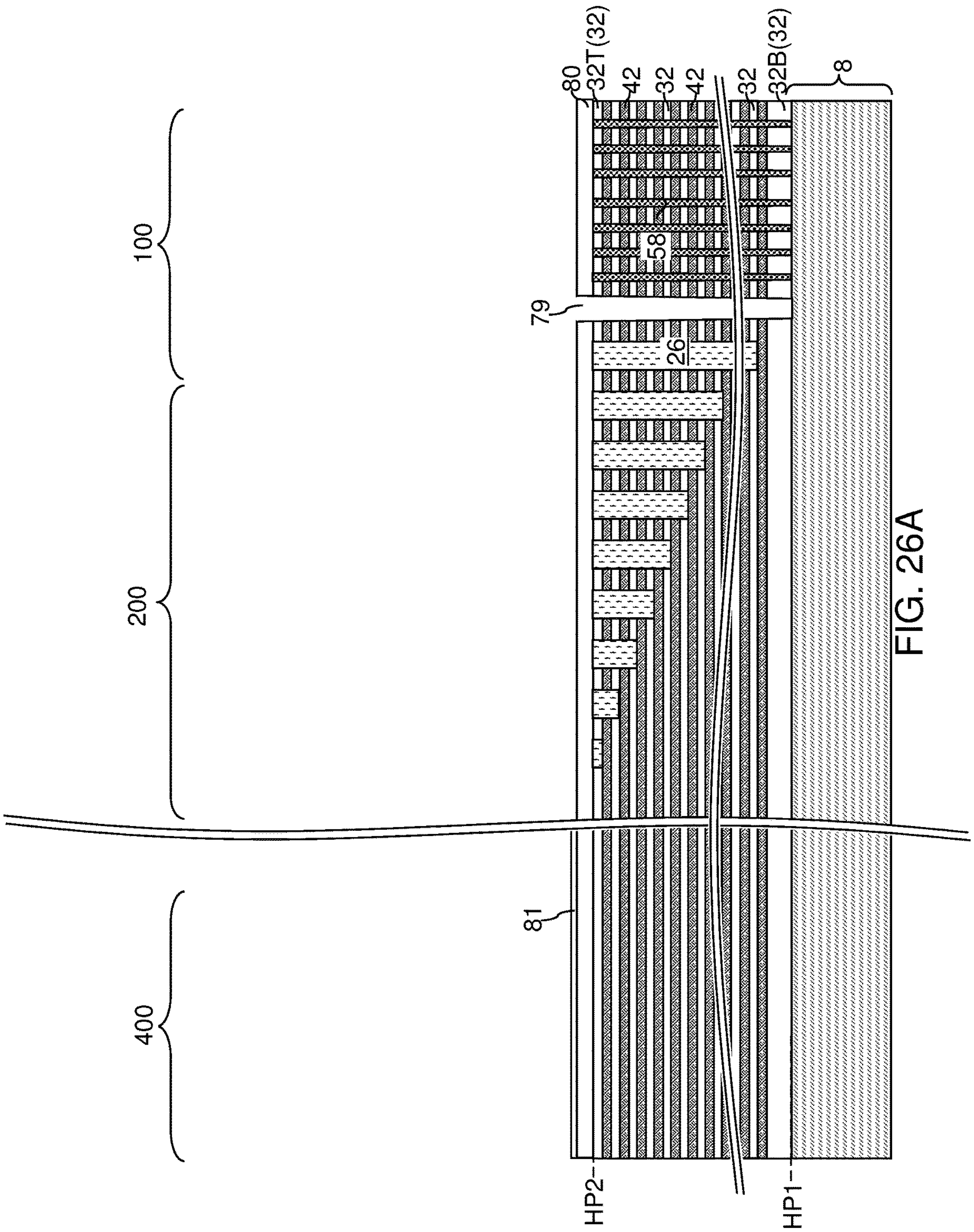
FIG. 26A is a vertical cross-sectional view of the alternative configuration of the first exemplary structure after removal of remaining portions of the sacrificial backside trench fill structures according to the first embodiment of the present disclosure.
Figure 26B:
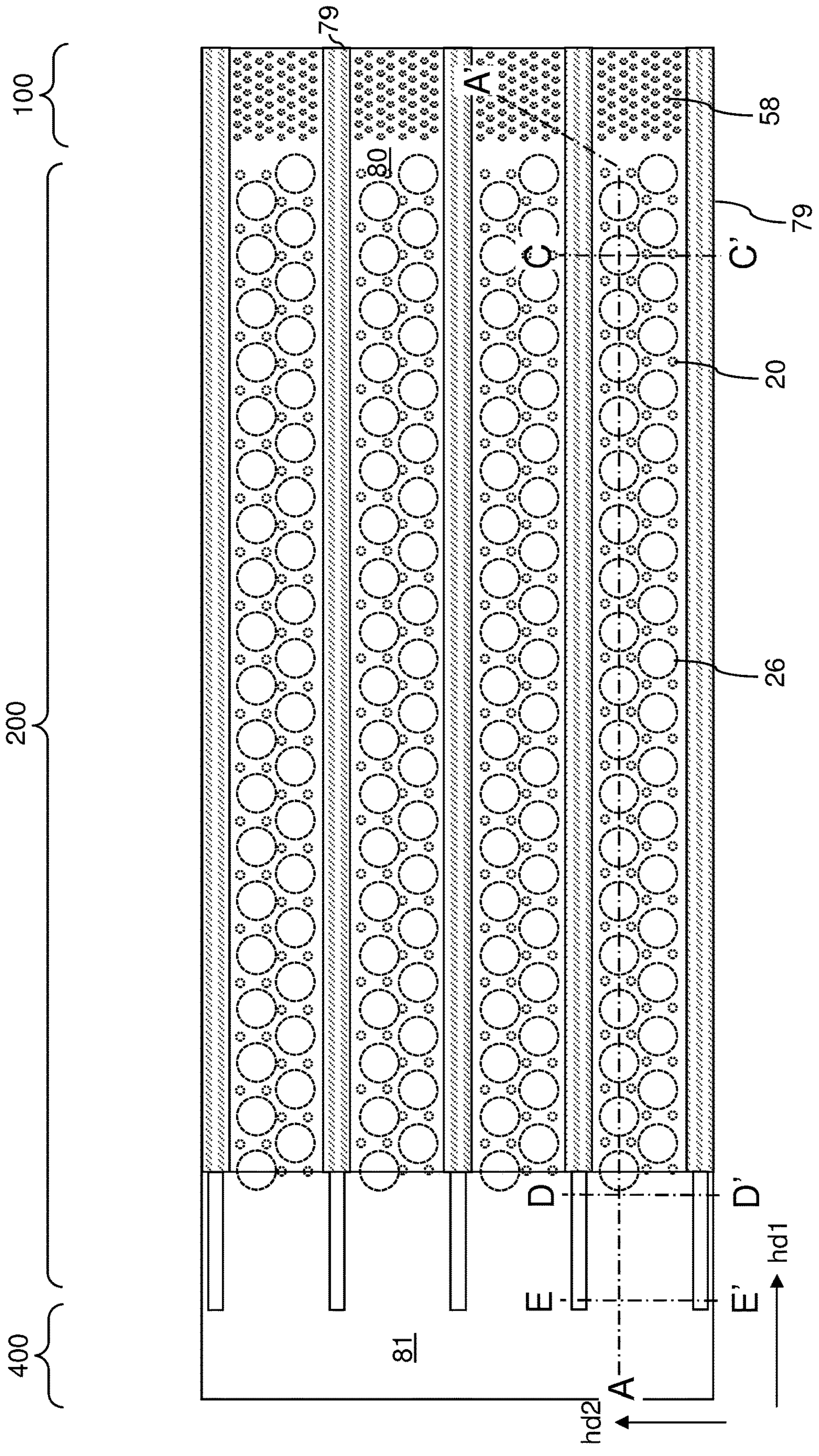
FIG. 26B is a top-down view of the first exemplary structure of FIG. 26A. The hinged vertical plane A-A' is a plane of the vertical cross-sectional view of FIG. 26A.
Figure 26C:
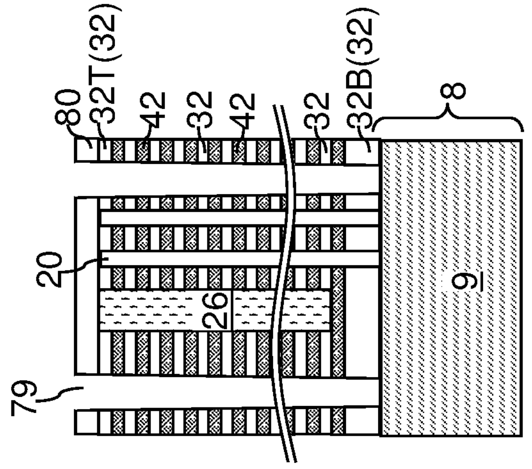
FIG. 26C is a vertical cross-sectional view of the first exemplary structure along the vertical plane C-C' of FIG. 26B.
Figure 26D:
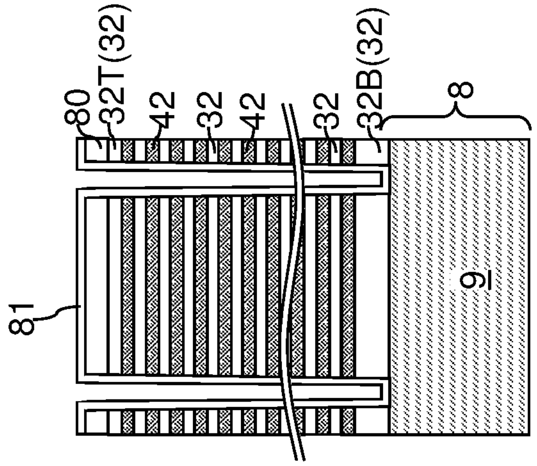
FIG. 26D is a vertical cross-sectional view of the first exemplary structure along the vertical plane D-D' of FIG. 26B.
Figure 26E:
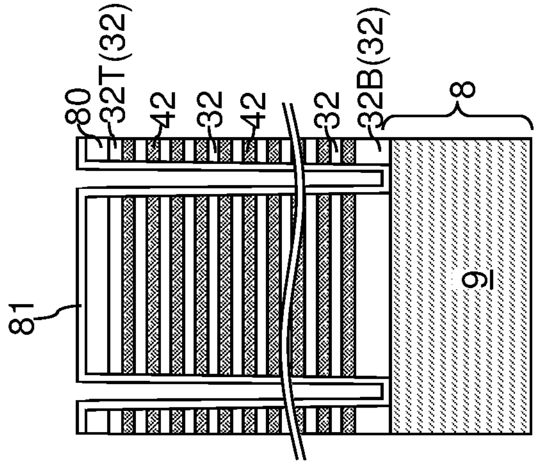
FIG. 26E is a vertical cross-sectional view of the first exemplary structure along the vertical plane E-E' of FIG. 26B.
Figure 27A:
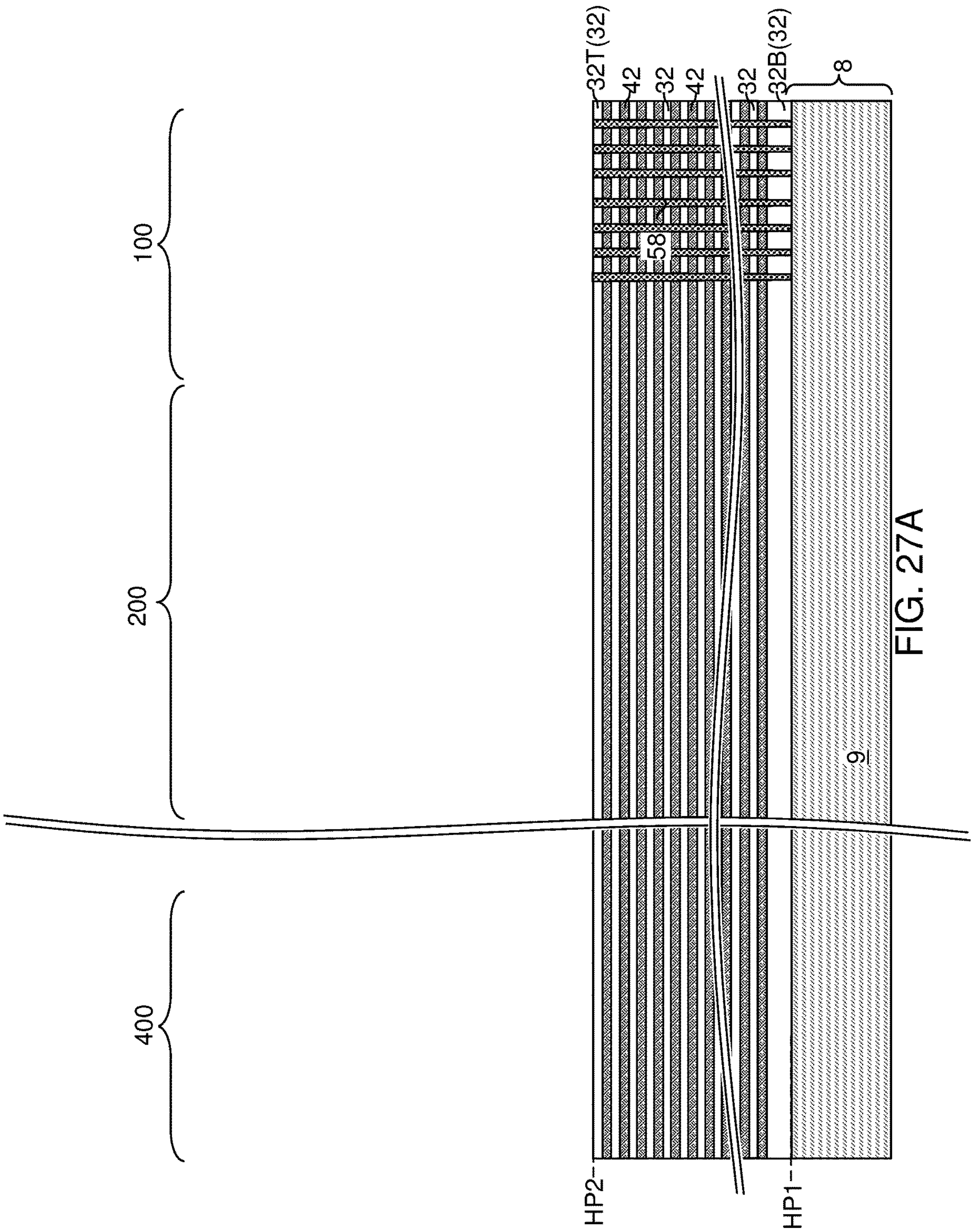
FIG. 27A is a vertical cross-sectional view of a second exemplary structure after formation of an array of dielectric isolation pillars according to the second embodiment of the present disclosure.
Figure 27B:
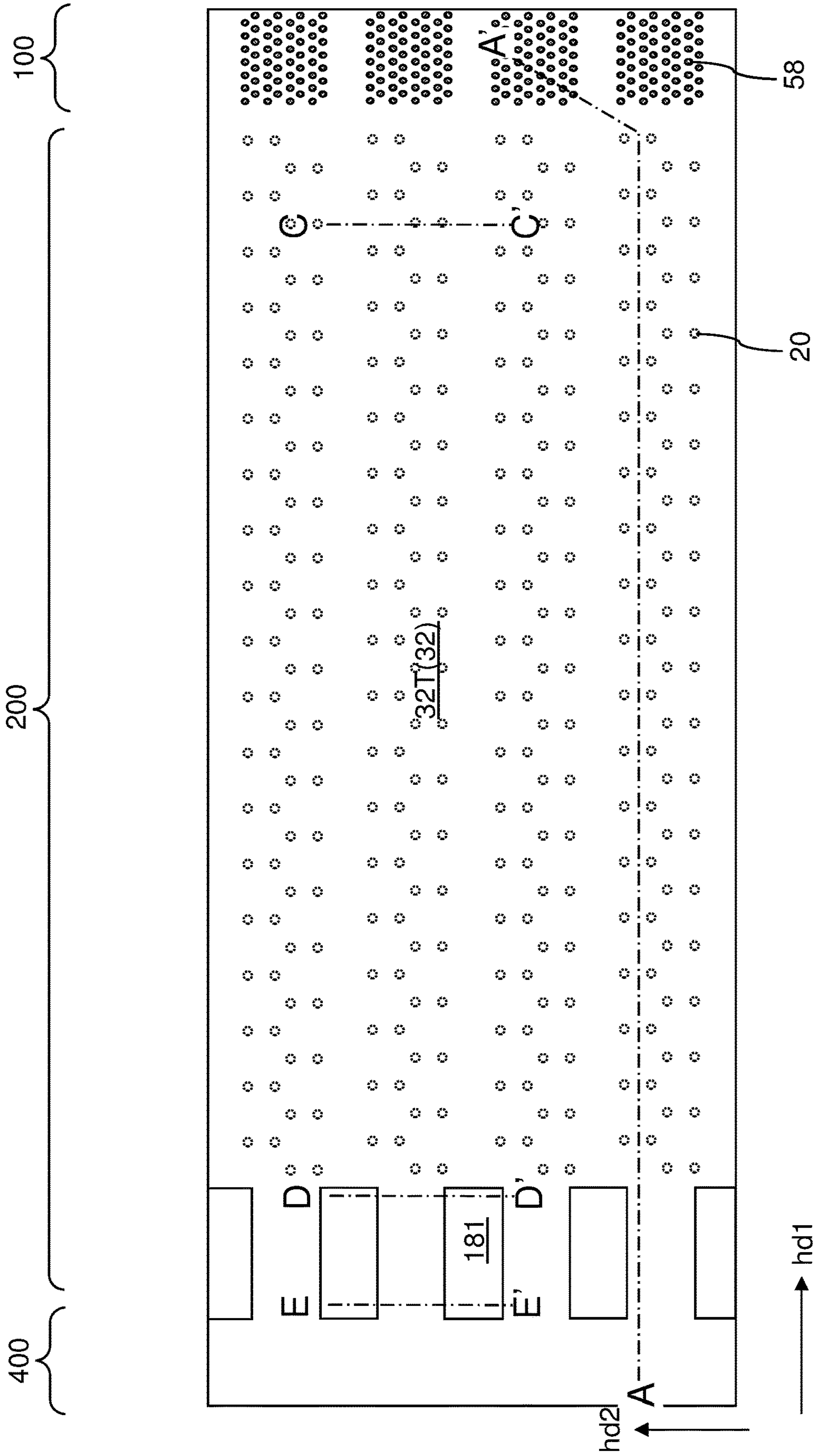
FIG. 27B is a top-down view of the second exemplary structure of FIG. 27A. The hinged vertical plane A-A' is a plane of the vertical cross-sectional view of FIG. 27A.
Figure 27E:
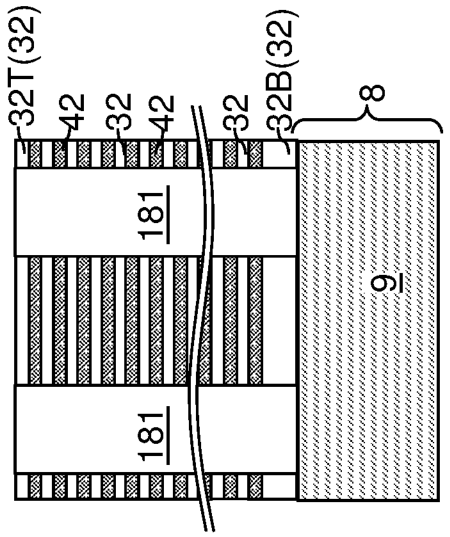
FIG. 27E is a vertical cross-sectional view of the second exemplary structure along the vertical plane E-E' of FIG. 27B.
Figure 27D:
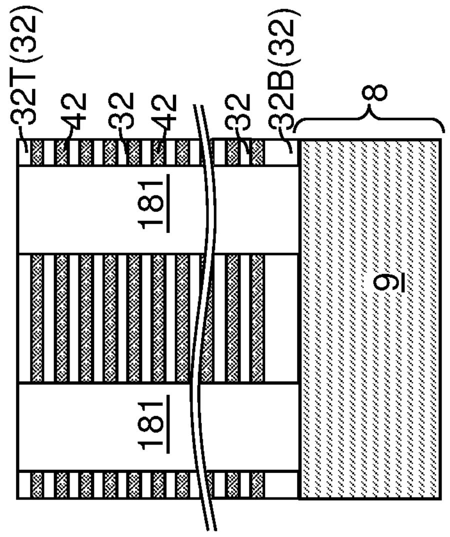
FIG. 27D is a vertical cross-sectional view of the second exemplary structure along the vertical plane D-D' of FIG. 27B.
Figure 27C:
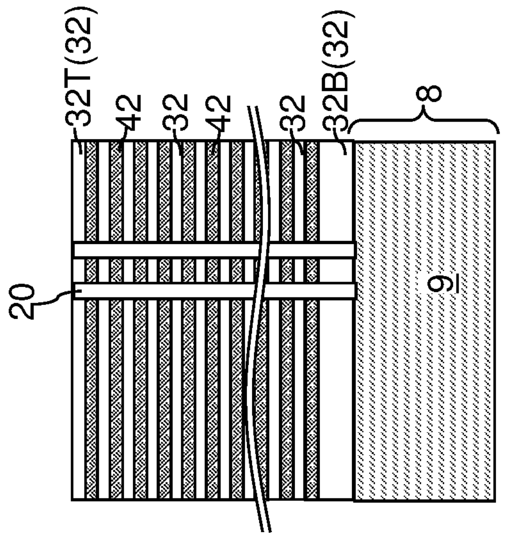
FIG. 27C is a vertical cross-sectional view of the second exemplary structure along the vertical plane C-C' of FIG. 27B.

Referring to FIG. 22, an alternative configuration of the first exemplary structure according to the first embodiment of the present disclosure is illustrated after formation of a conformal etch mask material layer 81L. The alternative configuration of the first exemplary structure may be the same as the first exemplary structure illustrated in FIGS. 9A-9E.

Referring to FIGS. 23A-23E, a sacrificial fill material can be deposited in the backside trenches 79. Excess portions of the sacrificial fill material can be removed from above the horizontal plane including the top surface of the contact-level dielectric layer 80. Each remaining portion of the sacrificial fill material located within a respective backside trench 79 comprises a sacrificial backside trench fill structure 171. Each sacrificial backside trench fill structure 171 is laterally surrounded by a respective vertically-extending portion of the conformal etch mask material layer 81L. The sacrificial backside trench fill structures 171 may comprise a semiconductor material (such as amorphous silicon), a carbon-based material (such as spin on carbon), organosilicate glass, a polymer material, or combinations thereof.

Referring to FIGS. 24A-24E, a photoresist layer 77 can be applied over the conformal etch mask material layer 81L and the sacrificial backside trench fill structures 171, and can be lithographically patterned to form elongated openings that overlie a respective one of the backside trenches 79 except end portions of the backside trenches 79 that are proximal to the connection region 400. Thus, a predominant portion of each of the sacrificial backside trench fill structures 171 can be exposed within the elongated openings in the photoresist layer 77, while end portions of the sacrificial backside trench fill structures 171 that are proximal to the connection region 400 (e.g., located in the connection portion CP) are covered by the patterned photoresist layer 77.

Unmasked portions of the sacrificial backside trench fill structures 171 can be removed by an anisotropic etch process that employs the patterned photoresist layer 77 as an etch mask. In one embodiment, the anisotropic etch process may be selective to the material of the conformal etch mask material layer 81L. Remaining portions of the sacrificial backside trench fill structures 171 are located underneath the patterned photoresist layer 77 within an end portion of a respective backside trench 79. Thus, each remaining portion of the sacrificial backside trench fill structures 171 covers end segments of a pair of lengthwise sidewalls of a respective backside trench 79 and covers an end sidewall of the respective backside trench 79. The patterned photoresist layer 77 may or may not be removed during and/or after the processing steps of FIGS. 24A-24E.

Referring to FIGS. 25A-25E, the conformal etch stop material layer 81L can be patterned by etching portions of the conformal etch stop material layer 81L that are not covered by the sacrificial backside trench fill structures 171 (or the patterned photoresist layer 77, if present). For example, a selective etch process can be performed to remove portions of the conformal etch stop material layer 81L that are not covered by the sacrificial backside trench fill structures 171 (or the patterned photoresist layer 77, if present).

In case the patterned photoresist layer 77 is present during the selective etch process, a remaining portion of the conformal etch stop material layer 81L that remains in the connection region 400 constitutes a dielectric etch stop structure 81 that includes a horizontally-extending portion that overlies the contact-level material layer 80 and a plurality of vertically-extending portions that vertically extend into end portions of the backside trenches 79. The dielectric etch stop structure 81 covers and contacts an end portion of each lengthwise sidewall of the backside trenches 79, and a widthwise sidewall of each of the backside trenches 79. Thus, each backside trench 79 comprises an end portion that is masked by the dielectric etch stop structure 81. The patterned photoresist layer 77 can be subsequently removed, for example, by ashing.

While the drawings illustrate an embodiment in which the photoresist layer 77 is removed after the isotropic etch process, embodiments are expressly contemplated herein in which the photoresist layer is removed prior to performing the selective etch process. In this case, multiple remaining portions of the conformal etch stop material layer 81L can be formed within end portions of the backside trenches 79. Each remaining portion of the conformal etch stop material layer 81L can remain in an end portion of a respective one of the backside trenches 79 that is proximal to the connection region 400. Thus, multiple dielectric etch stop structures 81 located entirely within a respective one of the backside trenches 79 can be formed. The multiple dielectric etch stop structures 81 may be substantially the same as the multiple dielectric etch stop structures 81 illustrated in FIGS. 13A-13E.

Referring to FIGS. 26A-26E, the sacrificial backside trench fill structures 171 can be removed selective to the at least one dielectric etch stop structure 81 and the alternating stack (32, 42). If the sacrificial backside trench fill structures 171 comprise a carbon material, then they can be removed together with the patterned photoresist layer 77 in a single ashing step. If the sacrificial backside trench fill structures 171 comprise a non-carbon material, then they can be removed by etching.

Subsequently, the processing steps described with reference to FIGS. 11A-21 may be performed to provide the first exemplary structure illustrated in FIG. 21.

Referring to FIGS. 27A-27E, a second exemplary structure according to the second embodiment of the present disclosure can be derived from the first exemplary structure illustrated in FIG. 7A by forming array of dielectric isolation pillars 181 through the alternating stack (32, 42). The array of dielectric isolation pillars 181 can be arranged as a one-dimensional periodic array that is arranged along the second horizontal direction hd2 at a boundary between the contact region 200 and the connection region 400. The array of dielectric isolation pillars 181 can be formed in areas in which end portions of backside trenches are to be subsequently formed in proximity to the connection region 400. The dielectric isolation pillars 181 are dielectric material portions that are subsequently employed as etch stop structures during formation of backside recesses, and as such, are herein referred to as dielectric etch stop structures 181.

The dielectric etch stop structures 181 may be formed, for example, by applying a photoresist layer over the topmost insulating layer 32T, by lithographically patterning the photoresist layer to form an array of discrete openings arranged along the second horizontal direction hd2 in proximity to a boundary between the contact region 200 and the connection region 400, by forming discrete pillar cavities through the alternating stack (32, 42) employing an anisotropic etch process, by removing the photoresist layer, and by depositing a dielectric fill material such as silicon oxide in the discrete pillar cavities. Excess portions of the dielectric fill material may be removed from above the horizontal plane including the top surface of the topmost insulating layer 32T, for example, by performing a planarization process such as a chemical mechanical polishing (CMP) process. Each portion of the dielectric fill material that fills a respective discrete pillar cavity constitutes a dielectric etch stop structure 181, which is a dielectric isolation pillar 181. Each of the dielectric etch stop structures 181 vertically extends at least from a first horizontal plane HP1 including a bottommost surfaces of the vertically alternating sequence of insulating layers 32 and sacrificial material layers 42 and at least to a second horizontal plane HP2 including a topmost surface of the vertically alternating sequence (32, 42). In one embodiment, each of the dielectric etch stop structures 181 may having straight sidewalls that vertically extend from the first horizontal plane HP1 to the second horizontal plane HP2.

Figure 28A:
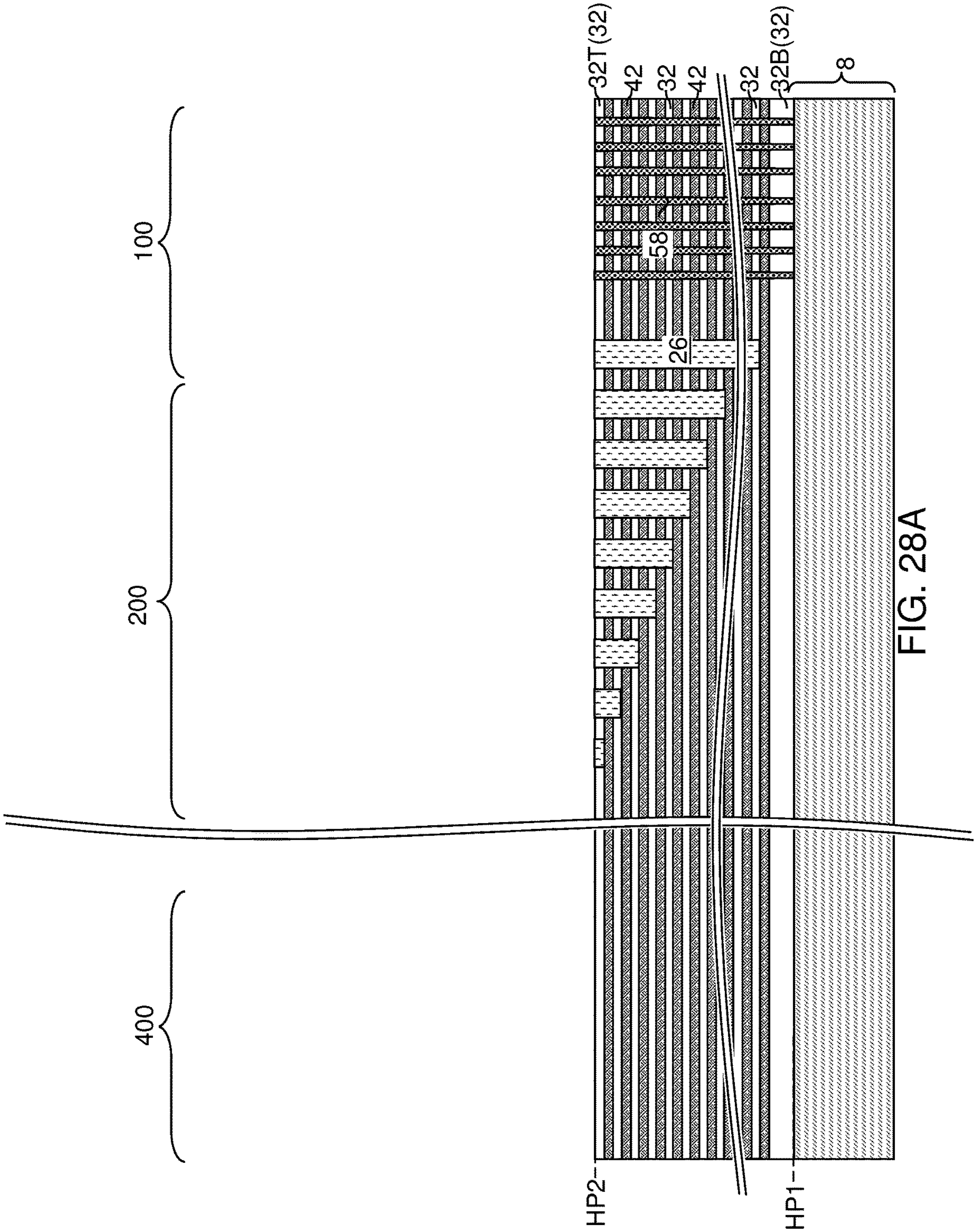
FIG. 28A is a vertical cross-sectional view of the second exemplary structure after formation of in-process contact via structures according to the second embodiment of the present disclosure.
Figure 28B:
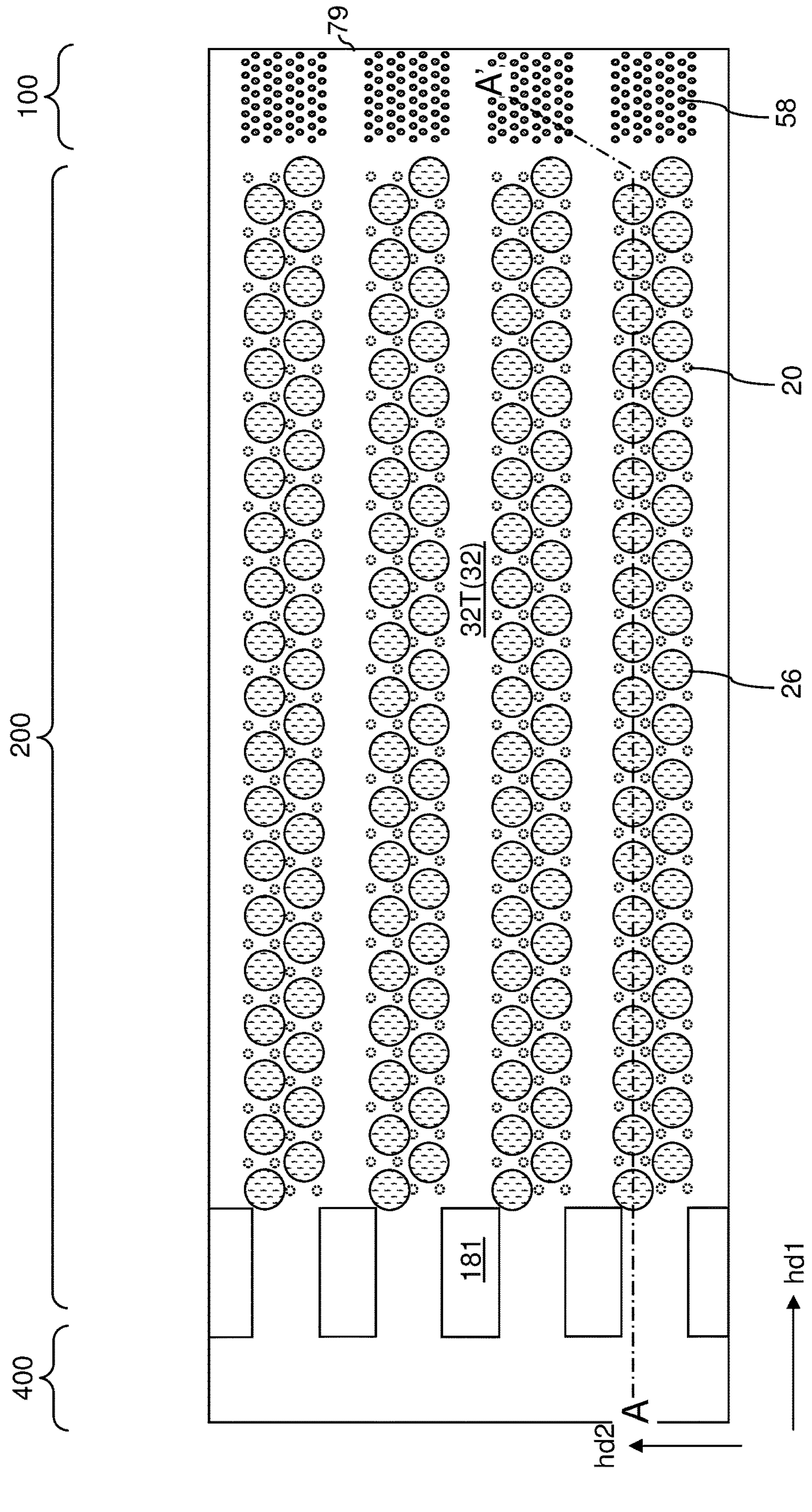
FIG. 28B is a top-down view of the second exemplary structure of FIG. 28A. The hinged vertical plane A-A' is a plane of the vertical cross-sectional view of FIG. 28A.

Referring to FIGS. 28A and 28B, the processing steps described with reference to FIGS. 7C-7E may be performed to form in-process layer contact assemblies 26 in the contact region 200.

Figure 29:
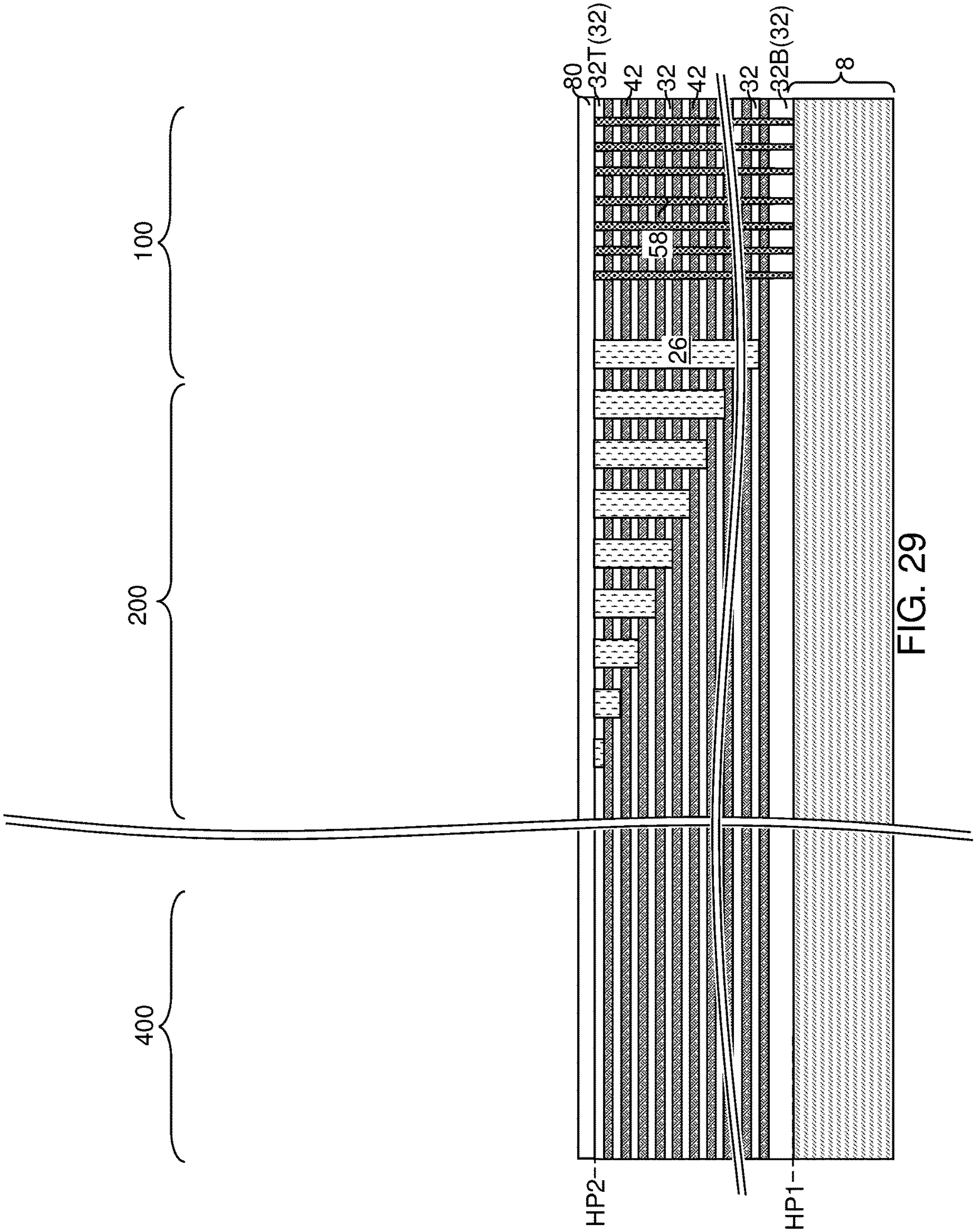
FIG. 29 is a vertical cross-sectional view of the second exemplary structure after formation of a contact-level dielectric layer according to the second embodiment of the present disclosure.

Referring to FIG. 29, the processing steps described with reference to FIG. 7E can be performed to form the contact-level dielectric layer 80.

Referring to FIGS. 30A-30E, the processing steps described with reference to FIGS. 8A-8E can be performed to form backside trenches 79 through the alternating stack (32, 42). According to an aspect of the present disclosure, each of the backside trenches 79 can cut through a peripheral portion of a respective one of the dielectric etch stop structures 181. In the second embodiment, the dielectric etch stop structures 181 can be formed prior to formation of the backside trenches 79 through the vertically alternating sequence of insulating layers 32 and sacrificial material layers 42, and each of the backside trenches 79 can cut into a peripheral portion of a respective one of the dielectric etch stop structures 181.

Figure 30A:
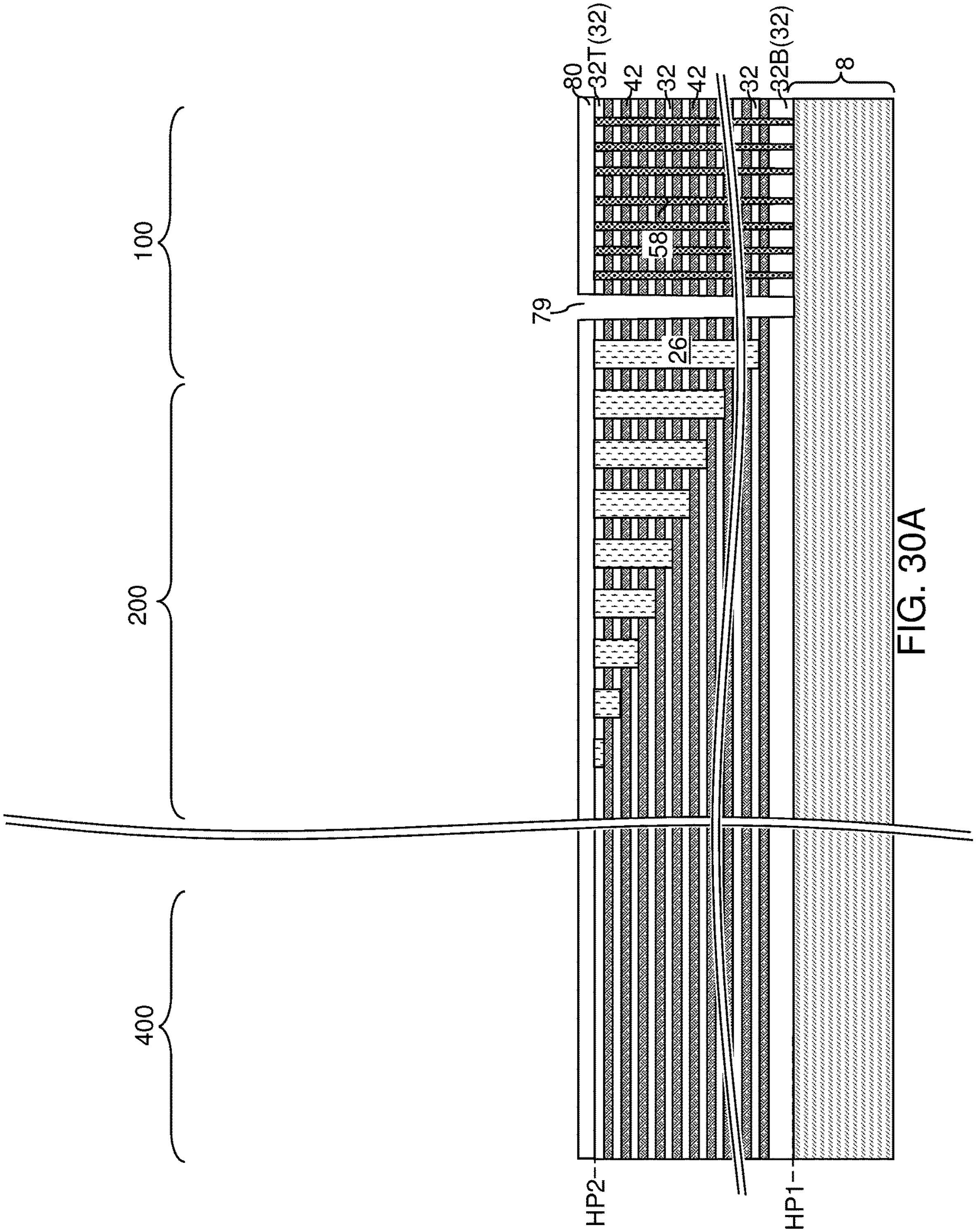
FIG. 30A is a vertical cross-sectional view of the second exemplary structure after formation of backside trenches according to the second embodiment of the present disclosure.
Figure 30B:
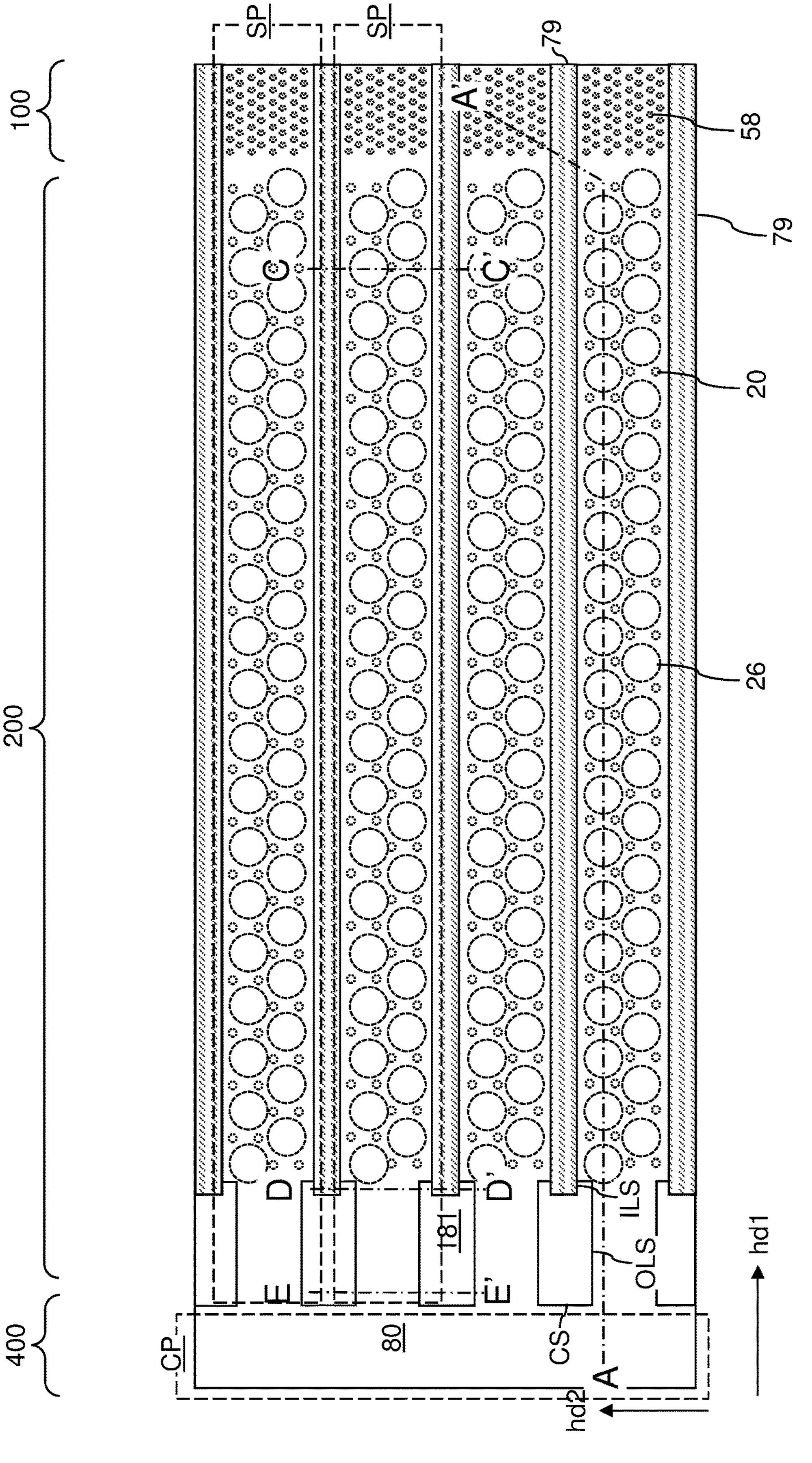
FIG. 30B is a top-down view of the second exemplary structure of FIG. 30A. The hinged vertical plane A-A' is a plane of the vertical cross-sectional view of FIG. 30A.
Figure 30E:
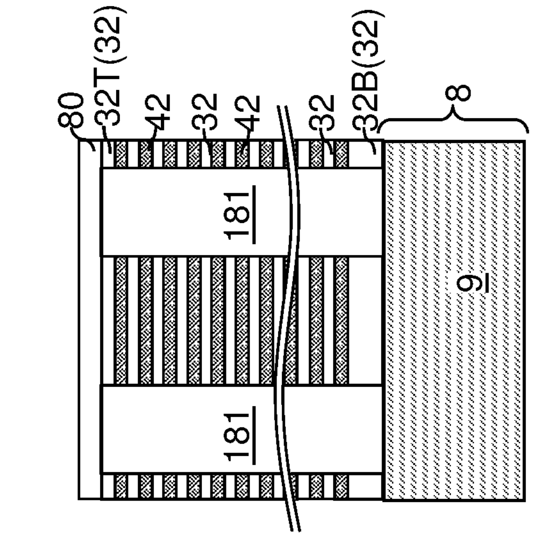
FIG. 30E is a vertical cross-sectional view of the second exemplary structure along the vertical plane E-E' of FIG. 30B.
Figure 30D:
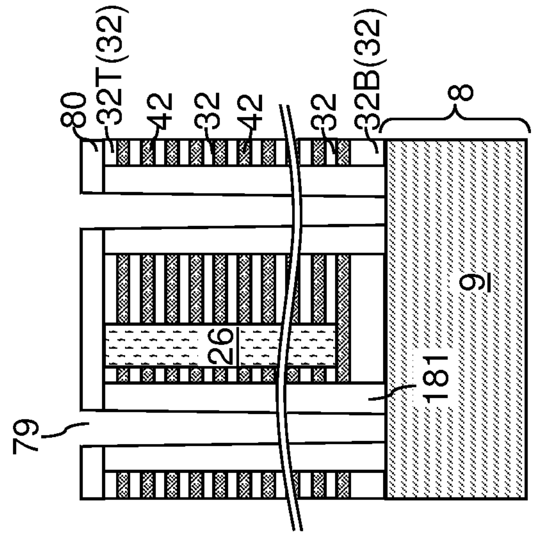
FIG. 30D is a vertical cross-sectional view of the second exemplary structure along the vertical plane D-D' of FIG. 30B.
Figure 30C:
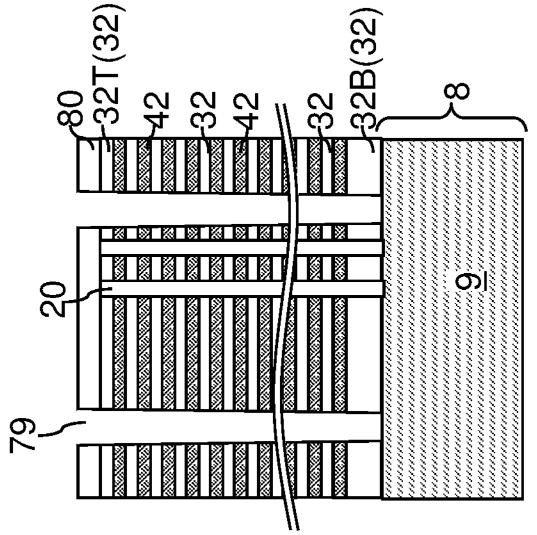
FIG. 30C is a vertical cross-sectional view of the second exemplary structure along the vertical plane C-C' of FIG. 30B.
Figure 31A:
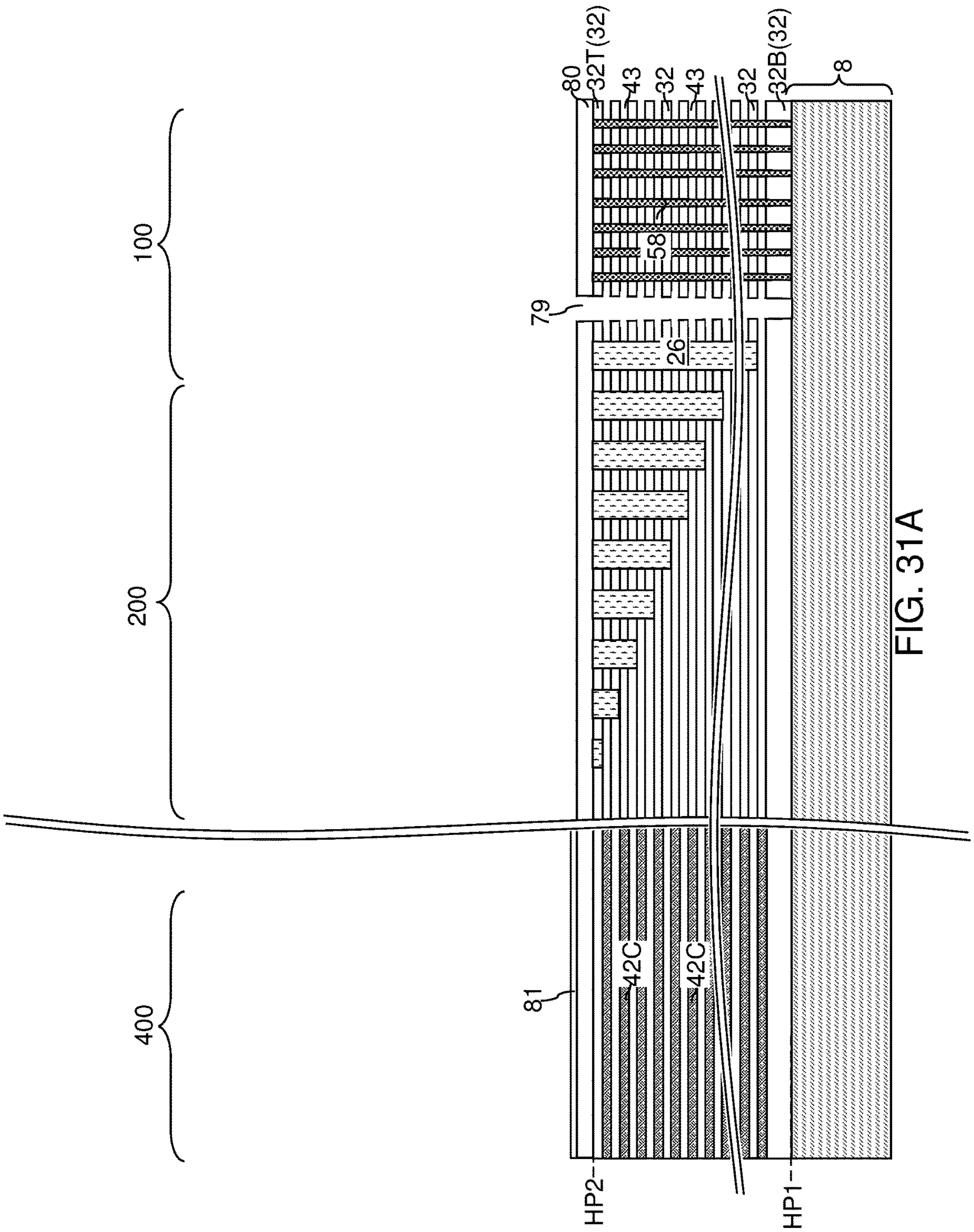
FIG. 31A is a vertical cross-sectional view of the second exemplary structure after formation of backside recesses according to the second embodiment of the present disclosure.
Figure 31B:
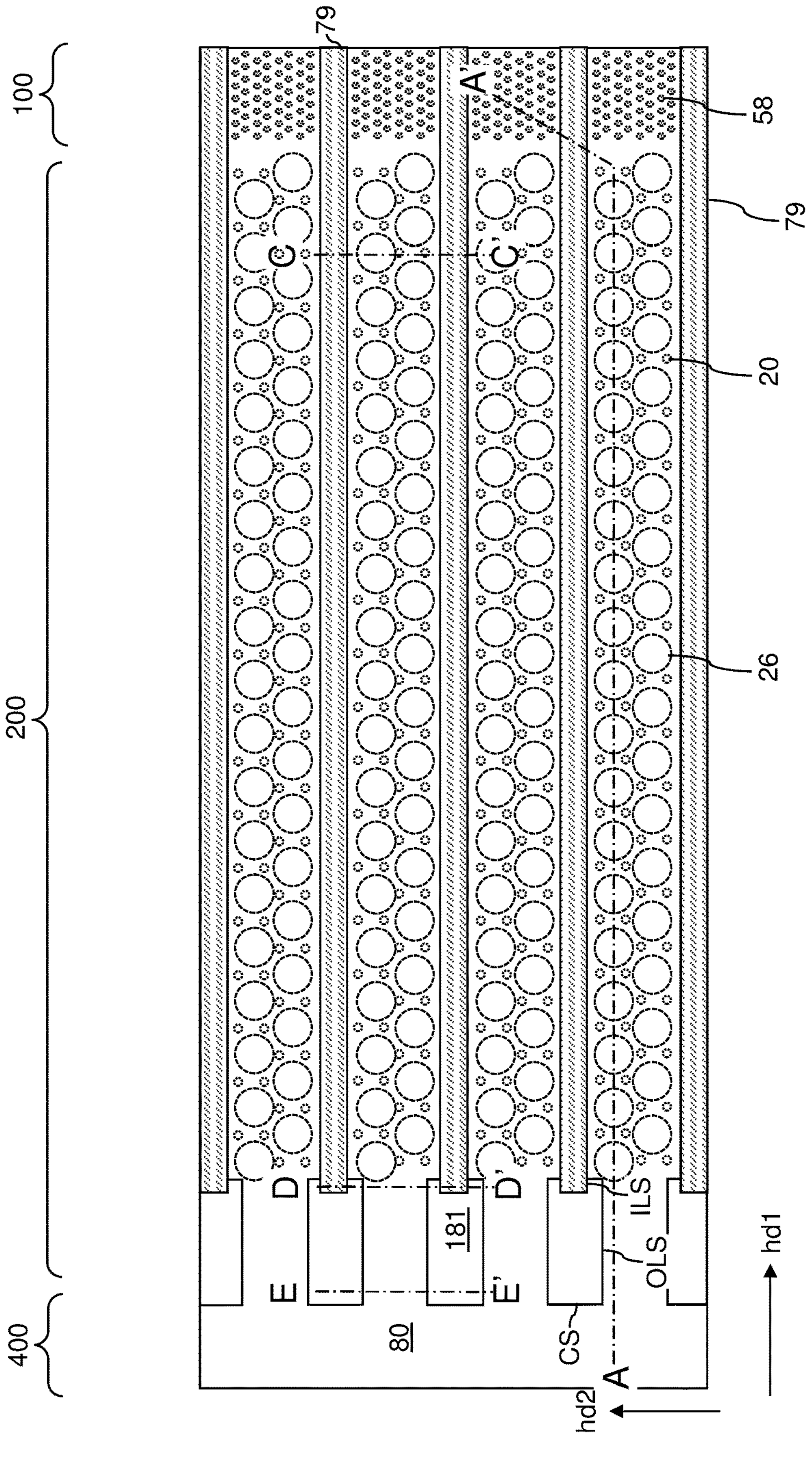
FIG. 31B is a top-down view of the second exemplary structure of FIG. 31A. The hinged vertical plane A-A' is a plane of the vertical cross-sectional view of FIG. 31A.
Figure 31C:
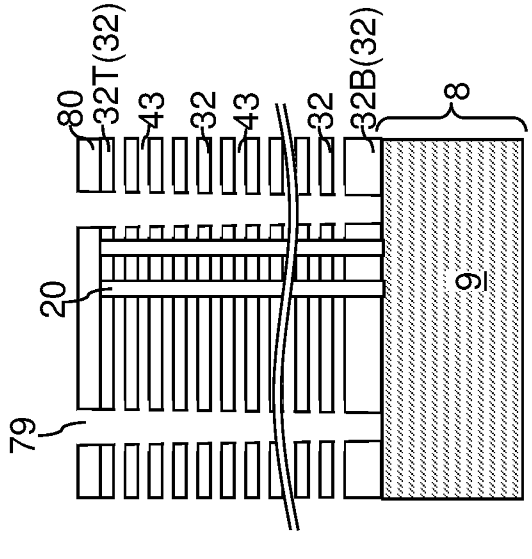
FIG. 31C is a vertical cross-sectional view of the second exemplary structure along the vertical plane C-C' of FIG. 31B.
Figure 31D:
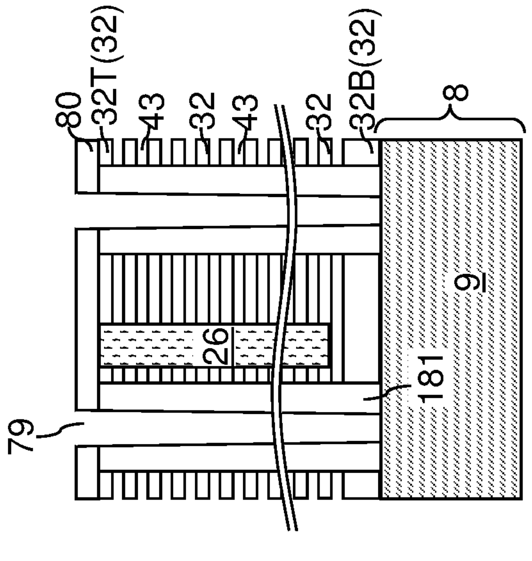
FIG. 31D is a vertical cross-sectional view of the second exemplary structure along the vertical plane D-D' of FIG. 31B.
Figure 31E:
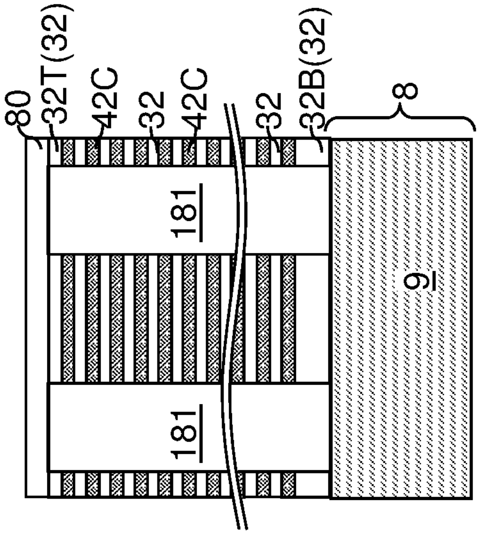
FIG. 31E is a vertical cross-sectional view of the second exemplary structure along the vertical plane E-E' of FIG. 31B.
Figure 32A:
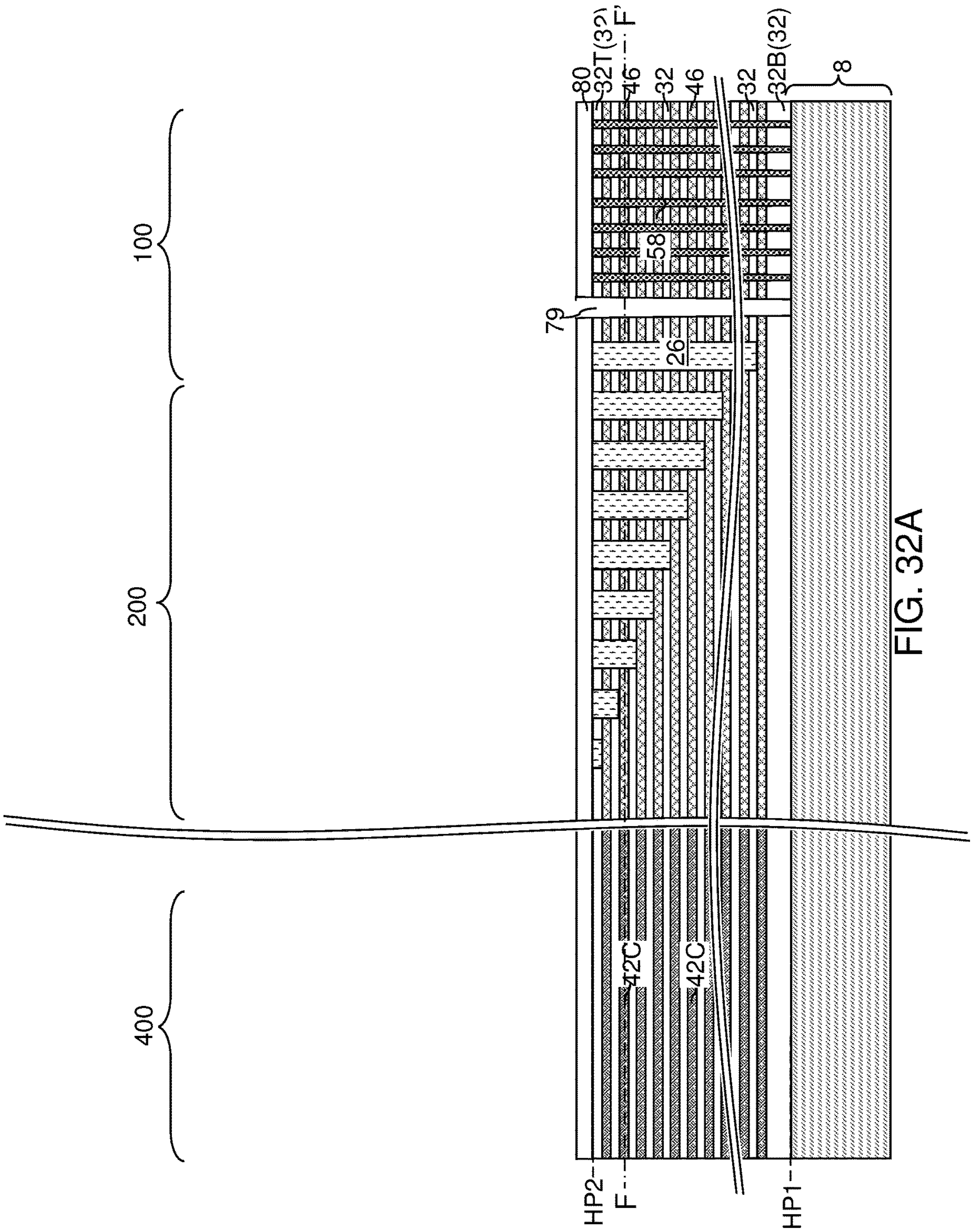
FIG. 32A is a vertical cross-sectional view of the second exemplary structure after formation of electrically conductive layers according to the second embodiment of the present disclosure.
Figure 32B:
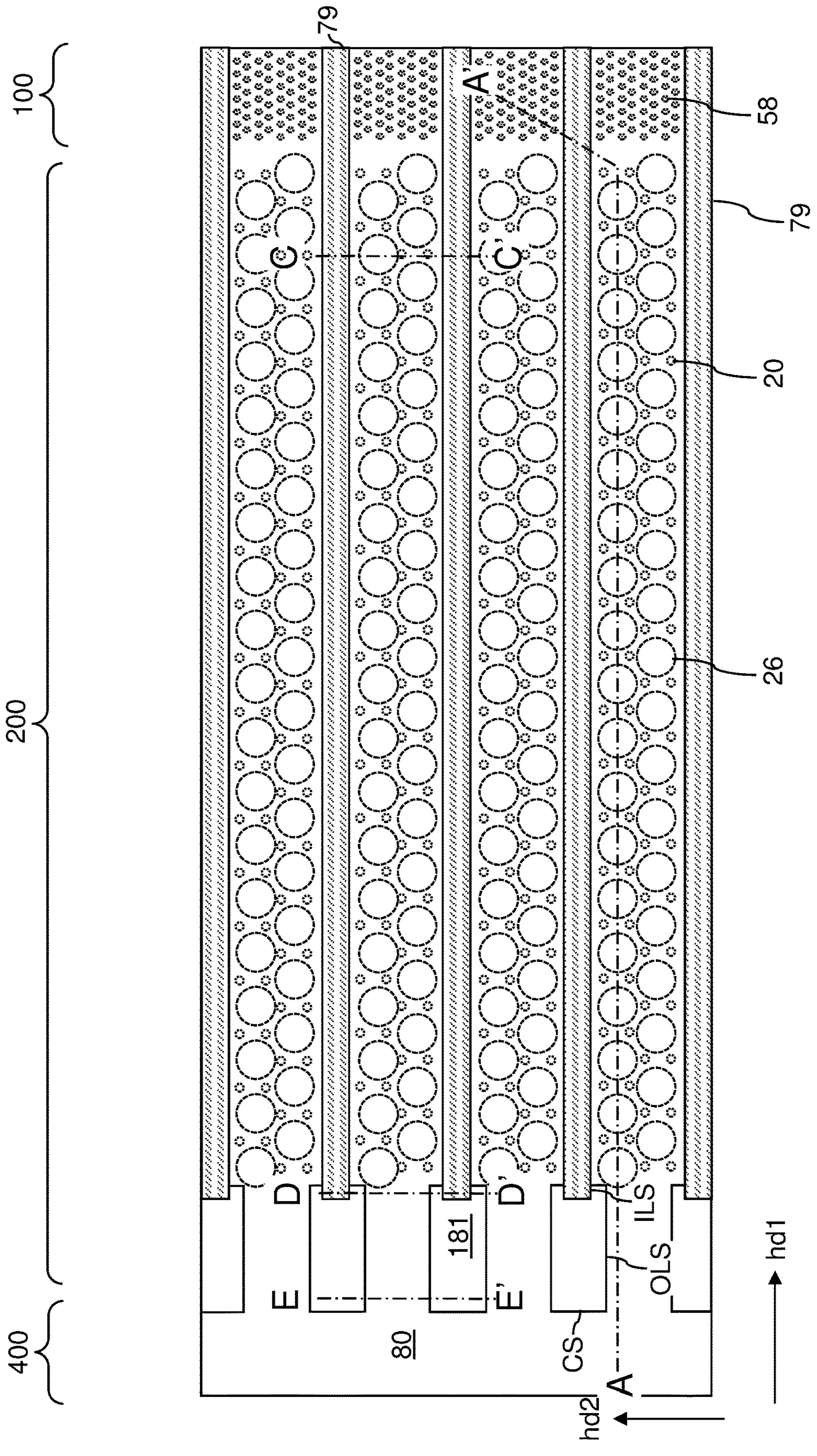
FIG. 32B is a top-down view of the second exemplary structure of FIG. 32A. The hinged vertical plane A-A' is a plane of the vertical cross-sectional view of FIG. 32A.
Figure 32E:
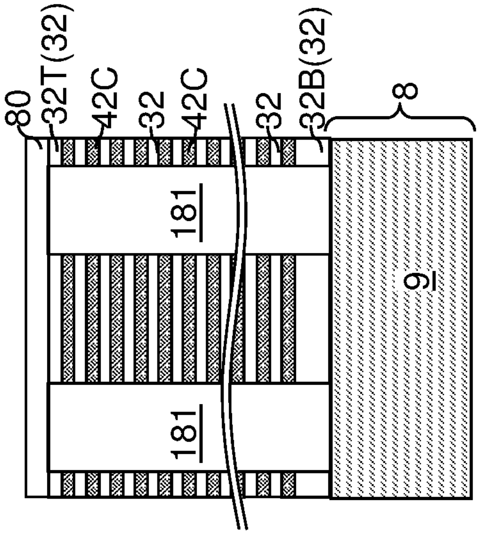
FIG. 32E is a vertical cross-sectional view of the second exemplary structure along the vertical plane E-E' of FIG. 32B.
Figure 32D:
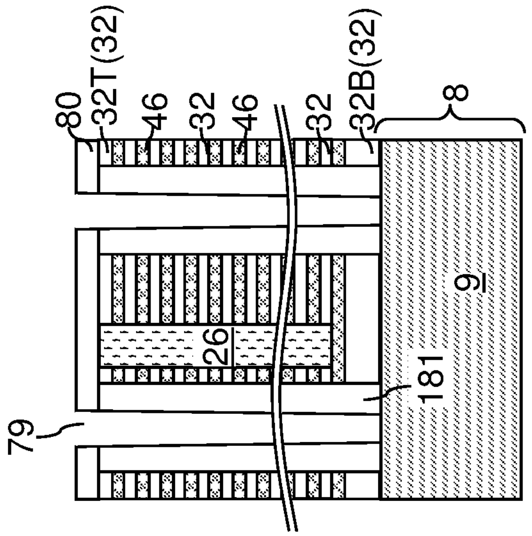
FIG. 32D is a vertical cross-sectional view of the second exemplary structure along the vertical plane D-D' of FIG. 32B.
Figure 32C:
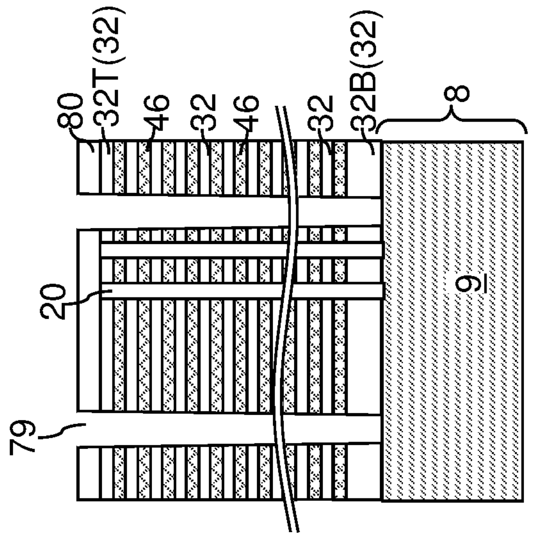
FIG. 32C is a vertical cross-sectional view of the second exemplary structure along the vertical plane C-C' of FIG. 32B.
Figure 32F:
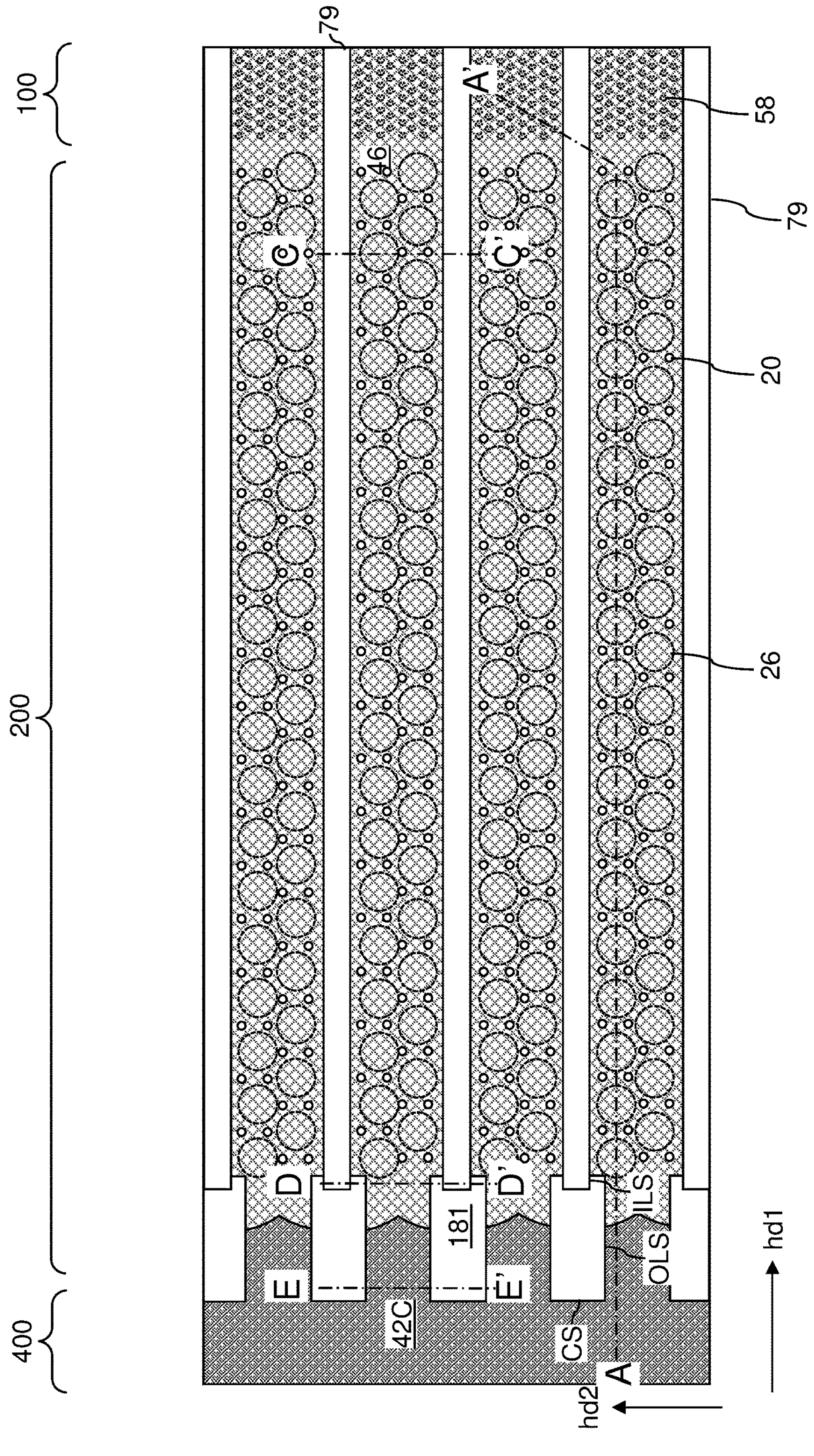
FIG. 32F is a horizontal cross-sectional view of the second exemplary structure along the horizontal plane F-F' of FIG. 32A.
Figure 33A:
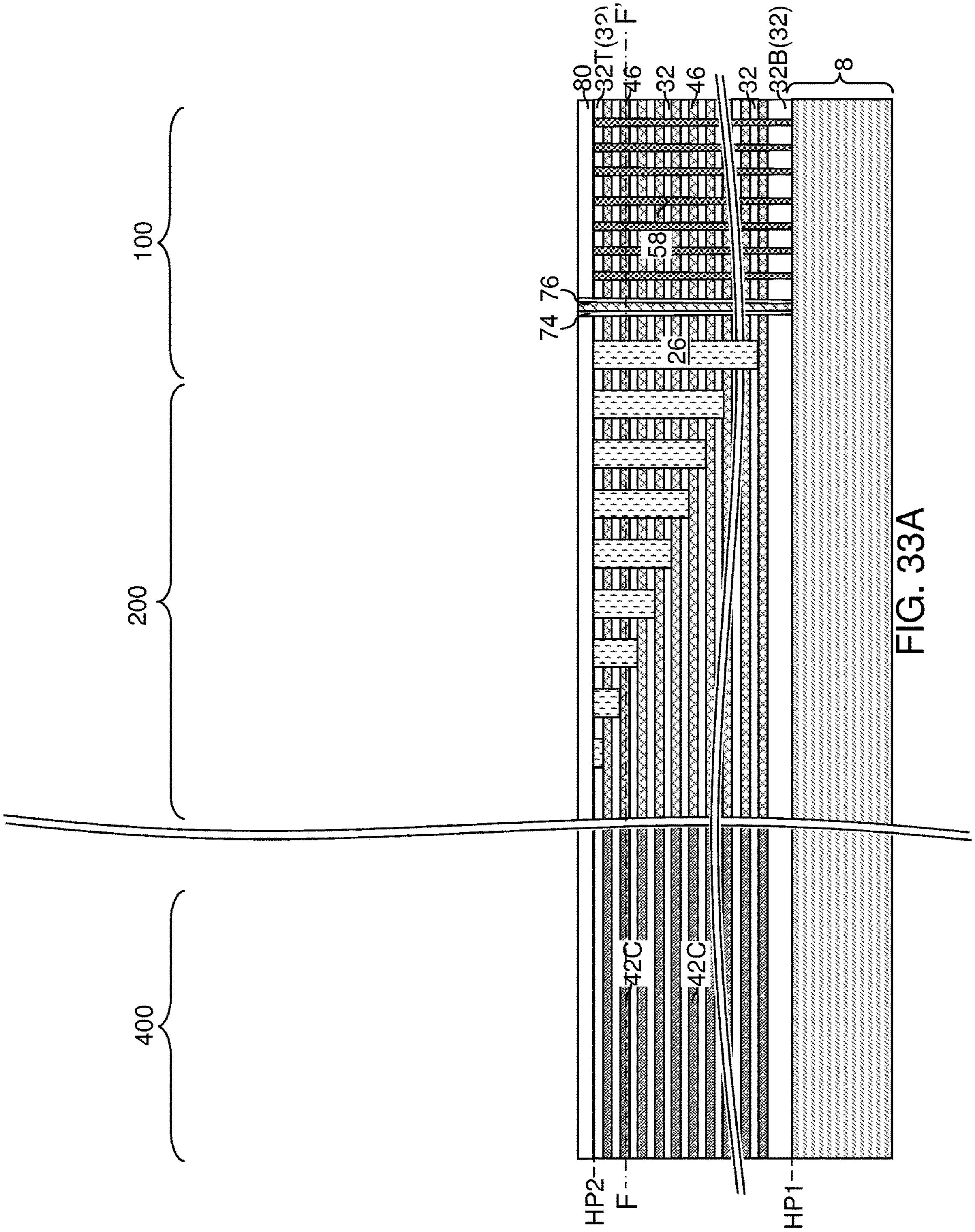
FIG. 33A is a vertical cross-sectional view of the second exemplary structure after formation of a backside trench fill structure according to the second embodiment of the present disclosure.
Figure 33B:
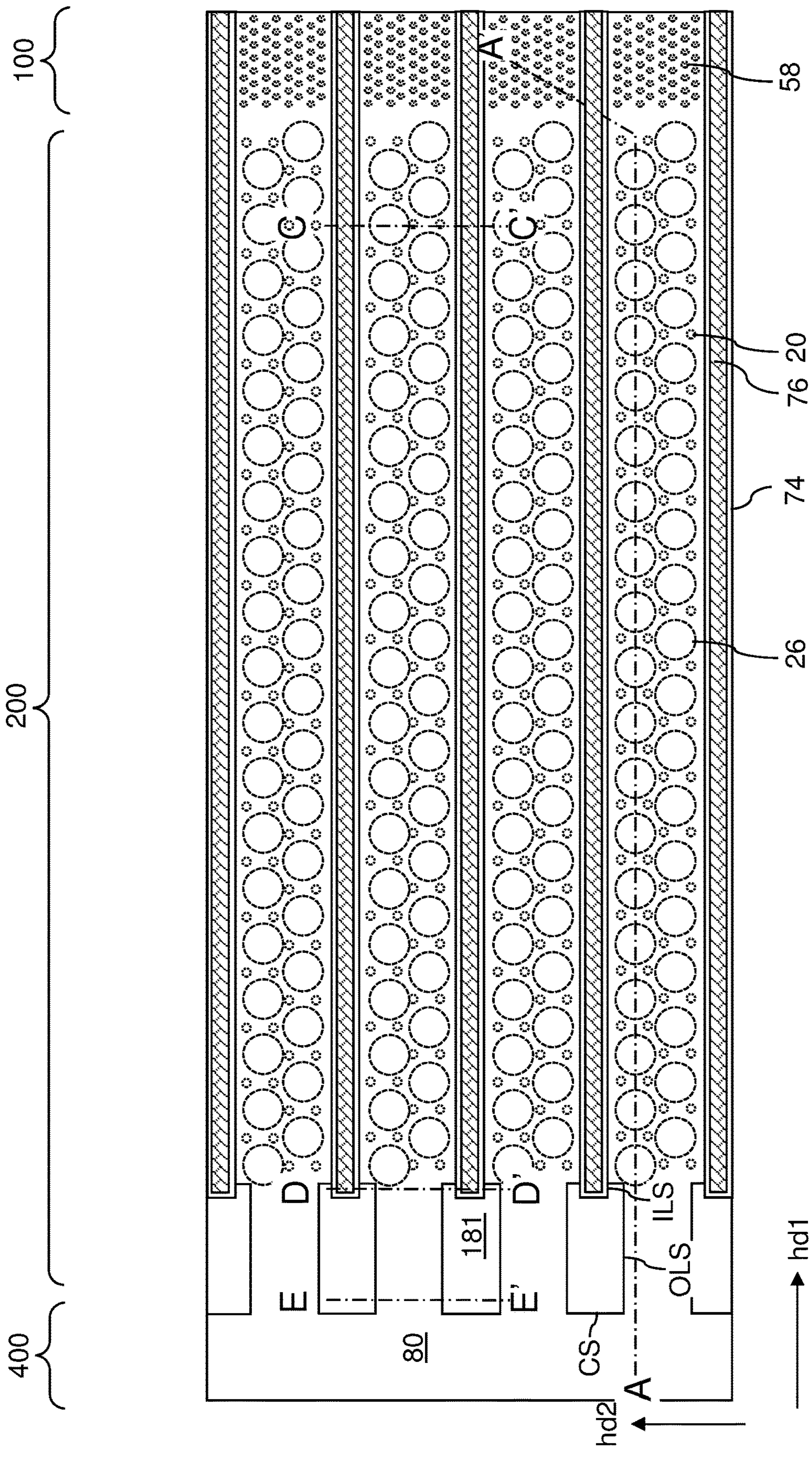
FIG. 33B is a top-down view of the second exemplary structure of FIG. 33A. The hinged vertical plane A-A' is a plane of the vertical cross-sectional view of FIG. 33A.
Figure 33E:
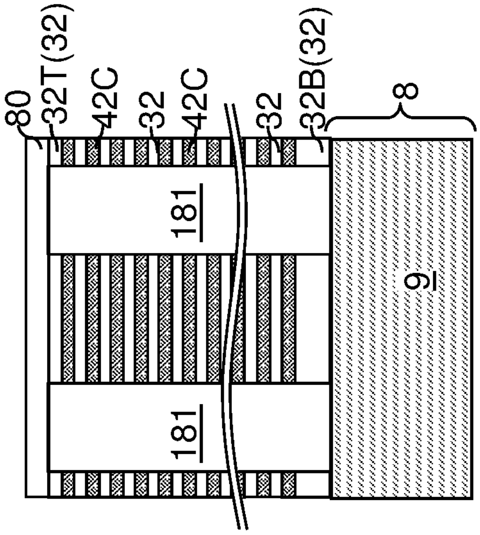
FIG. 33E is a vertical cross-sectional view of the second exemplary structure along the vertical plane E-E' of FIG. 33B.
Figure 33D:
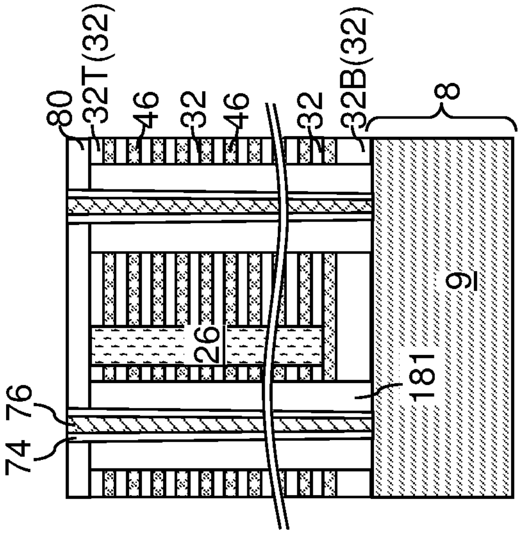
FIG. 33D is a vertical cross-sectional view of the second exemplary structure along the vertical plane D-D' of FIG. 33B.
Figure 33C:
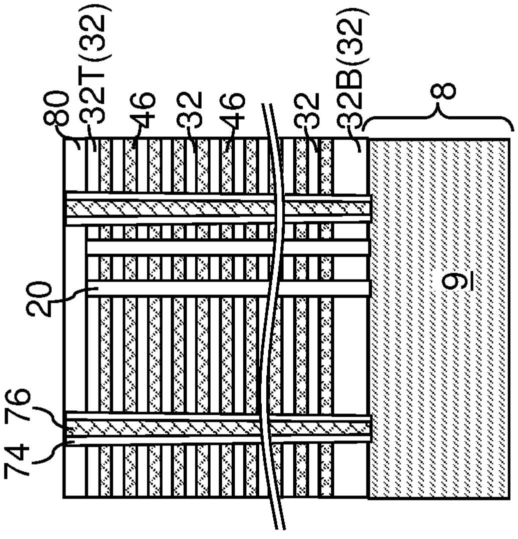
FIG. 33C is a vertical cross-sectional view of the second exemplary structure along the vertical plane C-C' of FIG. 33B.
Figure 33F:
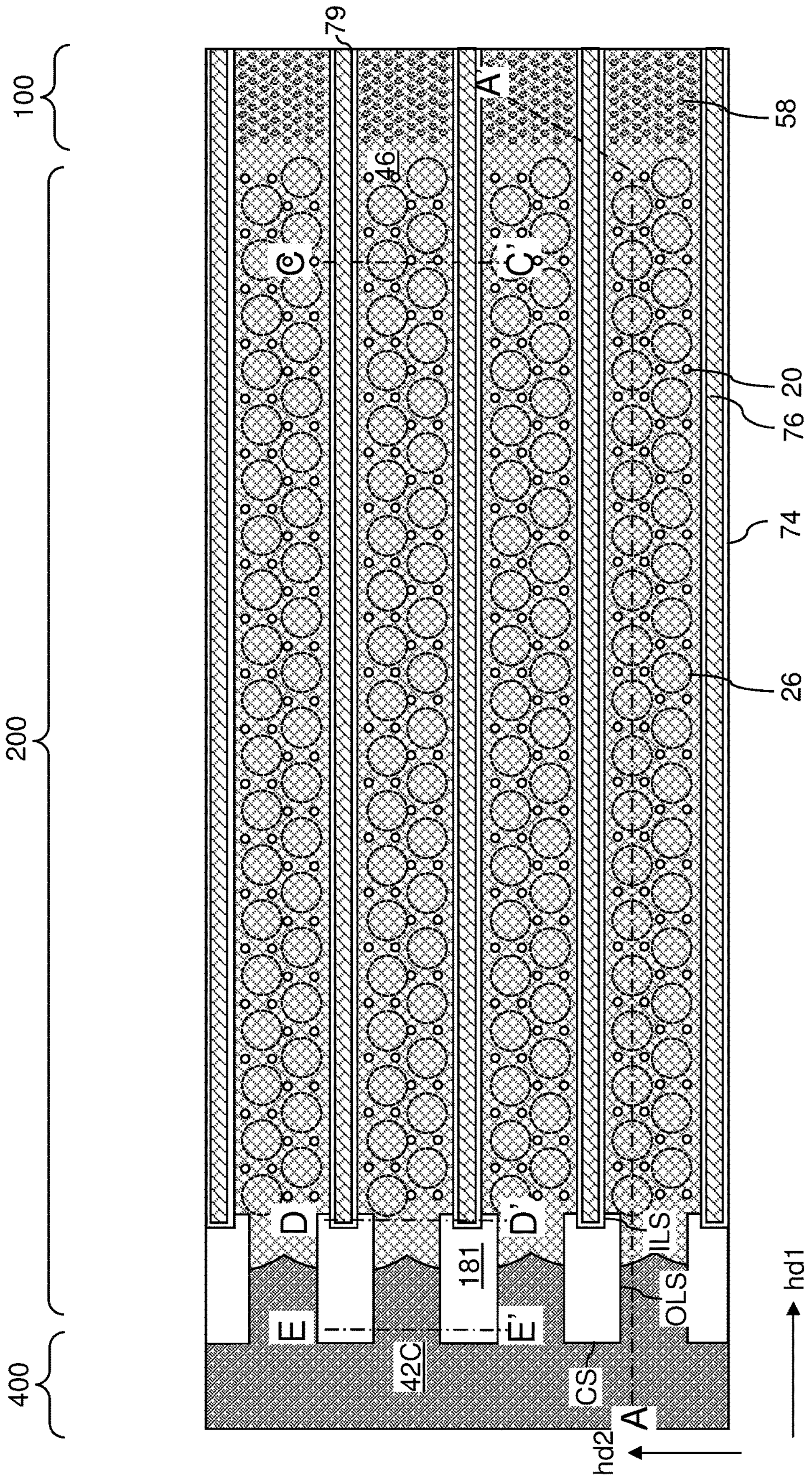
FIG. 33F is a horizontal cross-sectional view of the second exemplary structure along the horizontal plane F-F' of FIG. 33A.

The above described strip portions SP (e.g., memory blocks) of the vertically alternating sequence (32, 42) can be laterally spaced apart from each other by combination of a backside trench 79 and at least one dielectric etch stop structure 181, as shown in FIG. 30B. It is noted that an additional contact region 200 may be provided at an opposite side of the memory array region 100, and each backside trench 79 may be adjoined to a pair of two dielectric etch stop structures 181, each located at a distal end of a respective contact region 200.

The dielectric etch stop structures 181 can be located outside a respective one of the backside trenches 79, and is in contact with an end portion of the respective one of the backside trenches 179. Each of the dielectric etch stop structures 181 comprises a respective pair of dielectric sidewalls that are located within and are coincident with a pair of lengthwise sidewalls of the respective one of the backside trenches 79. The dielectric sidewalls of the dielectric etch stop structures 181 laterally extend along the first horizontal direction hd1 and vertically extend at least from the first horizontal plane HP1 and at least to the second horizontal plane HP2.

In one embodiment shown in FIG. 30B, each of the dielectric etch stop structures 181 comprises: a respective pair of inner lengthwise sidewalls ILS that are parallel to the first horizontal direction hd1 and having a first lateral spacing therebetween; a respective pair of outer lengthwise sidewalls OLS that are parallel to the first horizontal direction hd1 and having a second lateral spacing therebetween, the second lateral spacing being greater than the first lateral spacing; and a respective connection sidewall CS that connects the respective pair of outer lengthwise sidewalls OLS. In one embodiment, for each of the dielectric etch stop structures 181, the pair of dielectric sidewalls comprises a pair of inner lengthwise sidewalls ILS. In one embodiment, each of the dielectric etch stop structure 181 is located outside the respective one of the backside trenches 79; and each of the backside trenches 79 may have a uniform width throughout.

Referring to FIGS. 31A-31E, the processing steps described with reference to FIGS. 11A-11E can be performed to remove portions of the sacrificial material layers 42 that are proximal to the backside trenches 79 and to form backside recesses 43. The plurality of backside recesses 43 are laterally spaced apart from each other by a combination of a backside trench 79 and a dielectric etch stop structure 181. Generally, the length of the dielectric etch stop structures 181 along the first horizontal direction hd1 is greater than the etch distance of the isotropic etch process that forms the backside recesses 43. As such, each portion of the dielectric etch stop structure 181 located on an end portion of a respective backside trench 79 is laterally contacted by a remaining portion of each of the sacrificial material layers 42. Thus, neighboring pairs of backside recesses 43 located at a same vertical level are laterally spaced apart by a combination of a respective backside trenches 79 and a respective dielectric etch stop structure 181.

Unetched remaining portions of the sacrificial material layers 42 may remain in the connection region 400. The remaining portions of the sacrificial material layers 42 comprise dielectric material layers, and may be hereafter referred to as dielectric connection plates 42C. Each dielectric connection plate 42C can laterally contact each of the vertically-extending portions of the dielectric etch stop structure 181.

Generally, backside cavities are present within volumes of the backside trenches 79. Backside recesses 43 can be formed by performing an isotropic etch process that removes portions of the sacrificial material layers 42 that are proximal to the backside cavities selective to materials of the insulating layers 32 and the dielectric etch stop structures 181. Remaining portions of the sacrificial material layers 42 after the isotropic etch process comprise dielectric connection plates 42C that contact the dielectric etch stop structures 181.

Referring to FIGS. 32A-32F, a backside blocking dielectric layer can be optionally deposited in the backside recesses 43 and the backside trenches 79 and over the contact-level dielectric layer 80, as described above with respect to FIGS. 12A-12F of the first embodiment. A backside cavity is present within the portion of each backside trench 79 that is not filled with the backside blocking dielectric layer. The electrically conductive strips 46 are then formed in the backside cavities as described above.

The dielectric etch stop structures 181 can be located outside a respective one of the backside trenches 79. Each dielectric etch stop structure 181 comprises a respective pair of dielectric sidewalls that are located within a pair of lengthwise sidewalls of the respective backside trenches 79 (and thus, laterally extend along the first horizontal direction hd1). Such dielectric sidewalls of the portions of the dielectric etch stop structure 81 can vertically extend at least from the first horizontal plane HP1 and at least to the second horizontal plane HP2.

Generally, the dielectric etch stop structures 181 can be formed before formation of the backside trenches 79, and the backside trenches 79 can be formed such that each remaining portion of the dielectric etch stop structures 181 is located outside a respective backside trench 79. The dielectric etch stop structures 181 vertically extends at least from a first horizontal plane HP1 including a bottommost surfaces of the vertically alternating sequence of the insulating layers 32 and composite layers (46, 42C) and at least to a second horizontal plane HP2 including a topmost surface of the vertically alternating sequence {32, (46, 42C)}. Each dielectric etch stop structure 181 comprises a respective pair of dielectric sidewalls that are located within a respective one of the backside trenches 79.

In one embodiment, each dielectric etch stop structure 181 comprises a respective pair of dielectric sidewalls that are located within, are in direct contact with and overlap with a pair of lengthwise sidewalls of the respective one of the backside trenches 79. Such dielectric sidewalls of the dielectric etch stop structures 181 laterally extend along the first horizontal direction hd1 and vertically extend at least from the first horizontal plane HP1 and at least to the second horizontal plane HP2.

Each dielectric etch stop structure 181 located within a respective backside trench 79 comprises: a respective pair of inner lengthwise sidewalls ILS that are parallel to the first horizontal direction hd1 and having a first lateral spacing therebetween; a respective pair of outer lengthwise sidewalls OLS that are parallel to the first horizontal direction hd1 and having a second lateral spacing therebetween, the second lateral spacing being greater than the first lateral spacing; and a respective connection sidewall CS that connects the respective pair of outer lengthwise sidewalls OLS and contacting each of the dielectric connection plates 42C within the alternating stack (32, 42). In one embodiment, for each dielectric etch stop structure 181 located directly on a respective backside trench 79, a pair of dielectric sidewalls of the dielectric etch stop structure 181 comprises a pair of inner lengthwise sidewalls ILS that coincide with lengthwise sidewalls of the respective backside trench 79.

Referring to FIGS. 33A-33F, the processing steps described with reference to FIGS. 13A-13E may be performed to form backside trench fill structures (74, 76) in the backside trenches 79. Each of the backside trench fill structures (74, 76) may vertically extend at least from a first horizontal plane HP1 including bottommost surfaces of the alternating stacks {32, (46, 42C)} and at least to a second horizontal plane HP2 including topmost surfaces of the alternating stacks {32, (46, 42C)}. The dielectric etch stop structures 181 can be located outside a respective one of the backside trenches 79. Each of the dielectric etch stop structures 181 comprises a respective pair of dielectric sidewalls that are located within a pair of lengthwise sidewalls of the respective one of the backside trenches 79.

Figure 34:
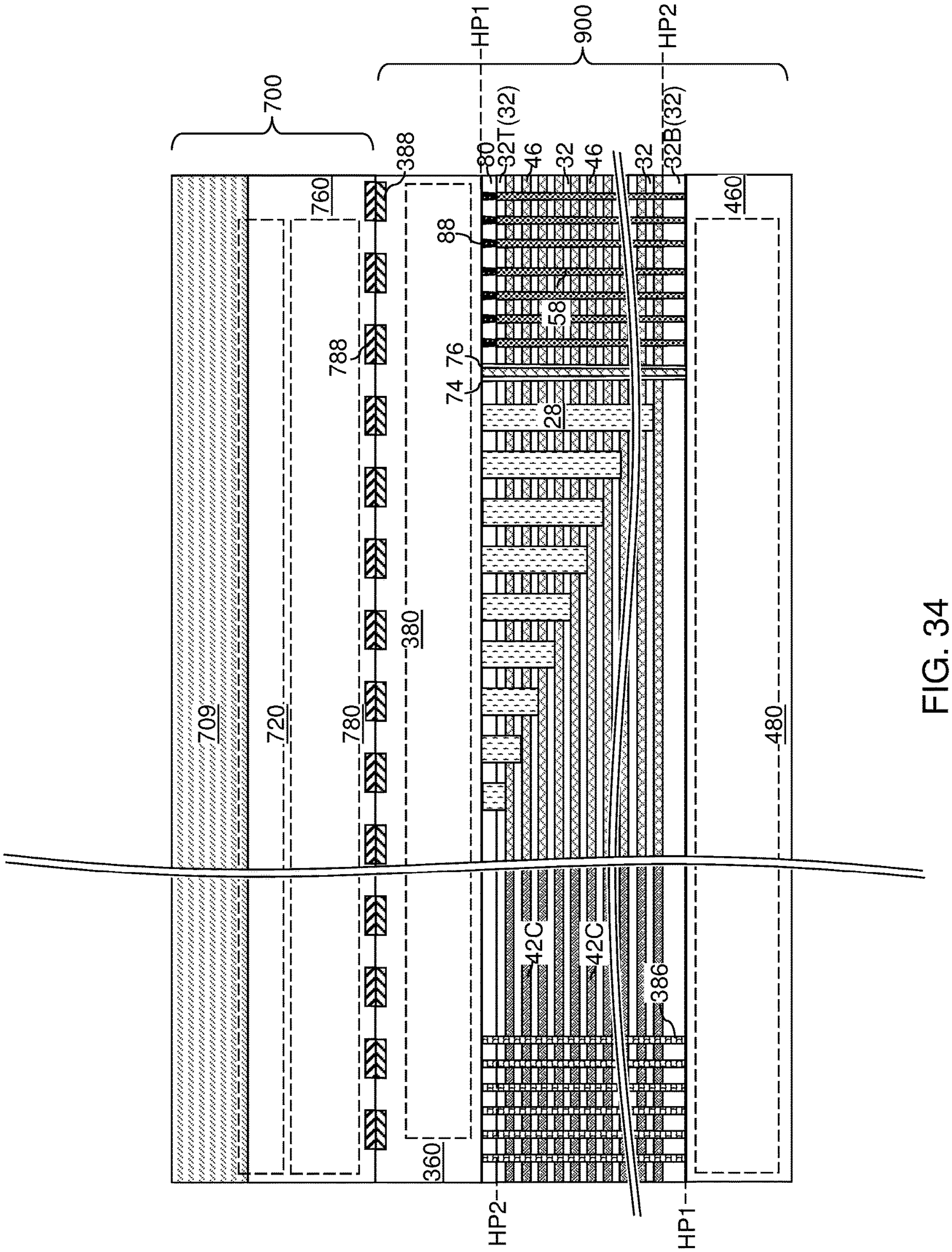
FIG. 34 is a vertical cross-sectional view of the second exemplary structure after formation of drain contact via structures, upper metal interconnect structures, and memory-side bonding pads, and bonding with a logic die according to the second embodiment of the present disclosure.
Figure 35A:
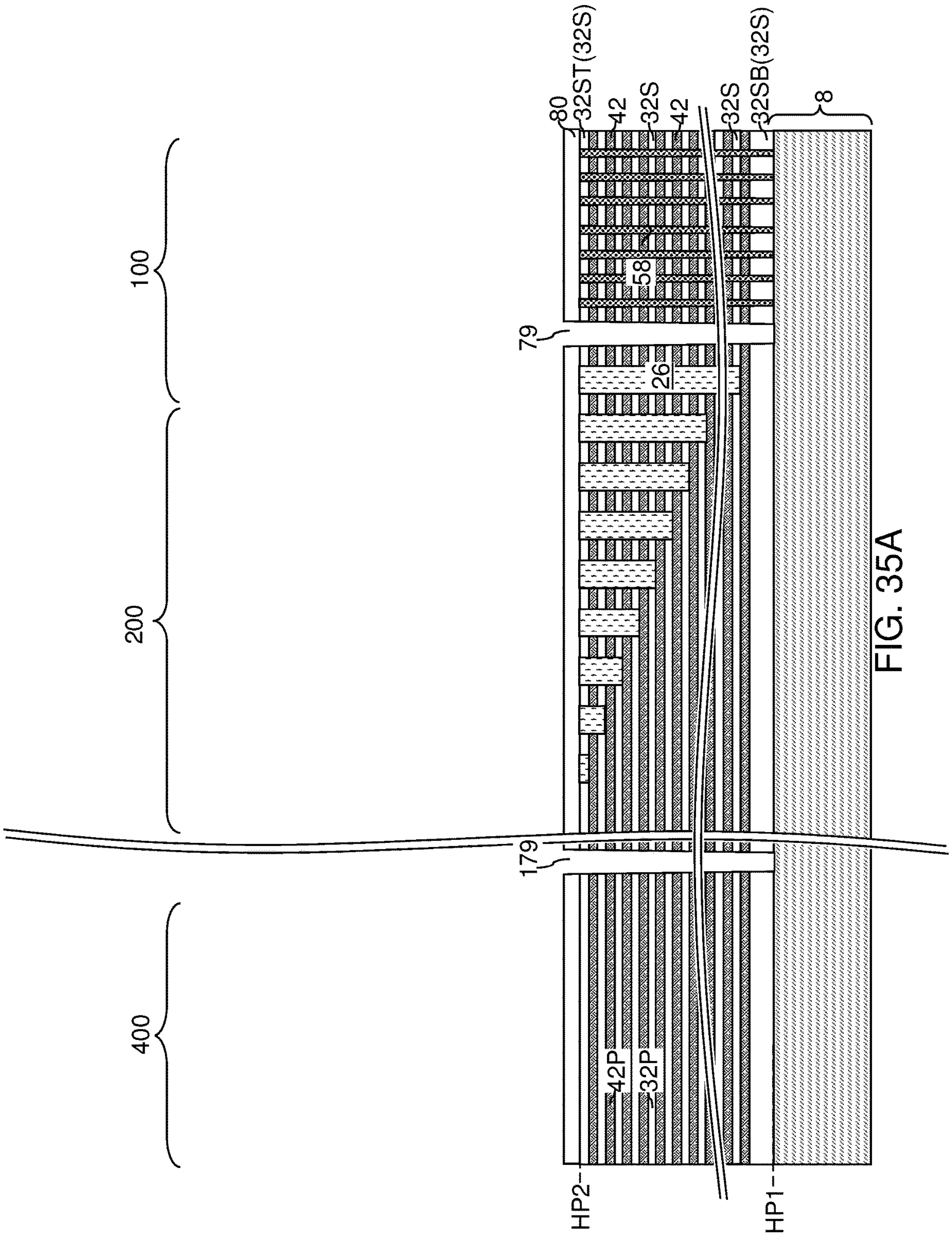
FIG. 35A is a vertical cross-sectional view of an alternative configuration of the second exemplary structure after formation of backside trenches according to the second embodiment of the present disclosure.
Figure 35B:
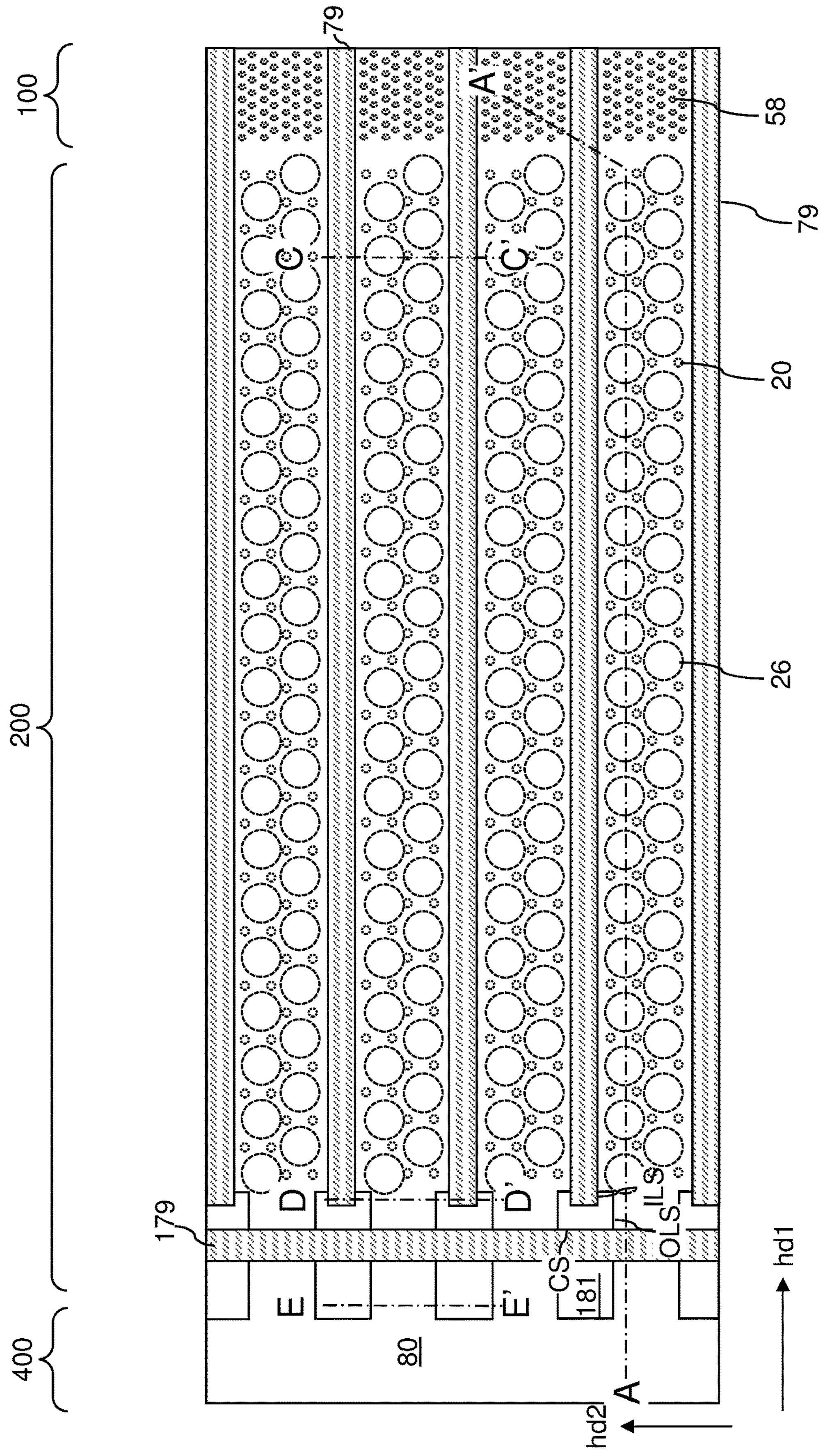
FIG. 35B is a top-down view of the second exemplary structure of FIG. 35A. The hinged vertical plane A-A' is a plane of the vertical cross-sectional view of FIG. 35A.
Figure 35C:
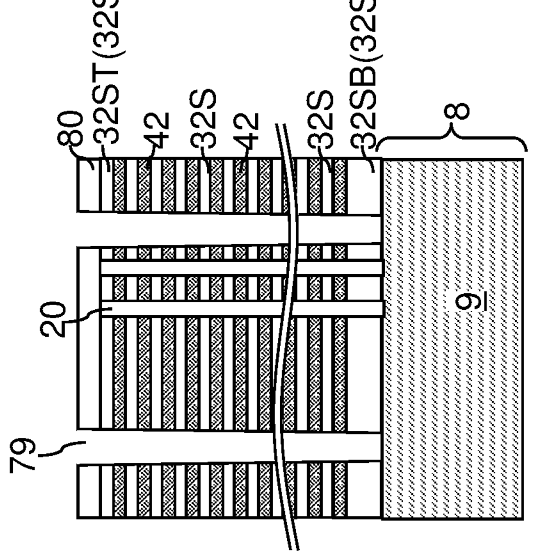
FIG. 35C is a vertical cross-sectional view of the second exemplary structure along the vertical plane C-C' of FIG. 35B.
Figure 35D:
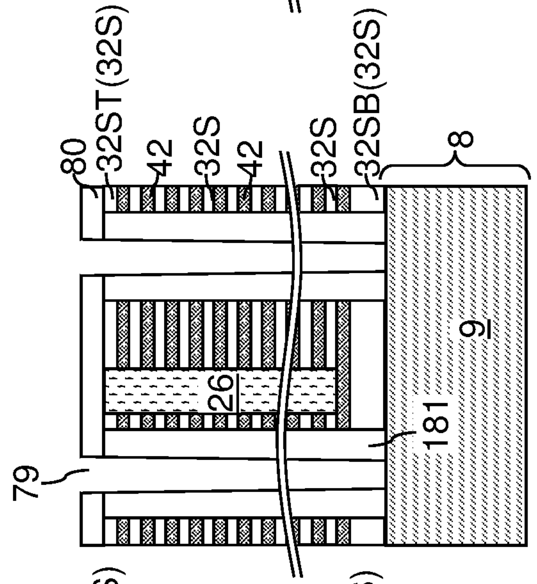
FIG. 35D is a vertical cross-sectional view of the second exemplary structure along the vertical plane D-D' of FIG. 35B.
Figure 35E:
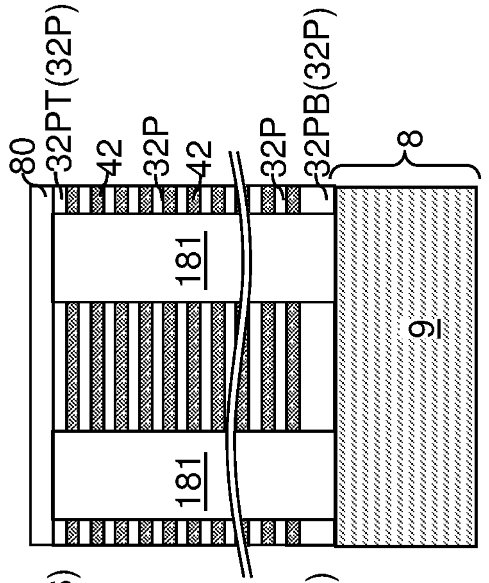
FIG. 35E is a vertical cross-sectional view of the second exemplary structure along the vertical plane E-E' of FIG. 35B.
Figure 36A:
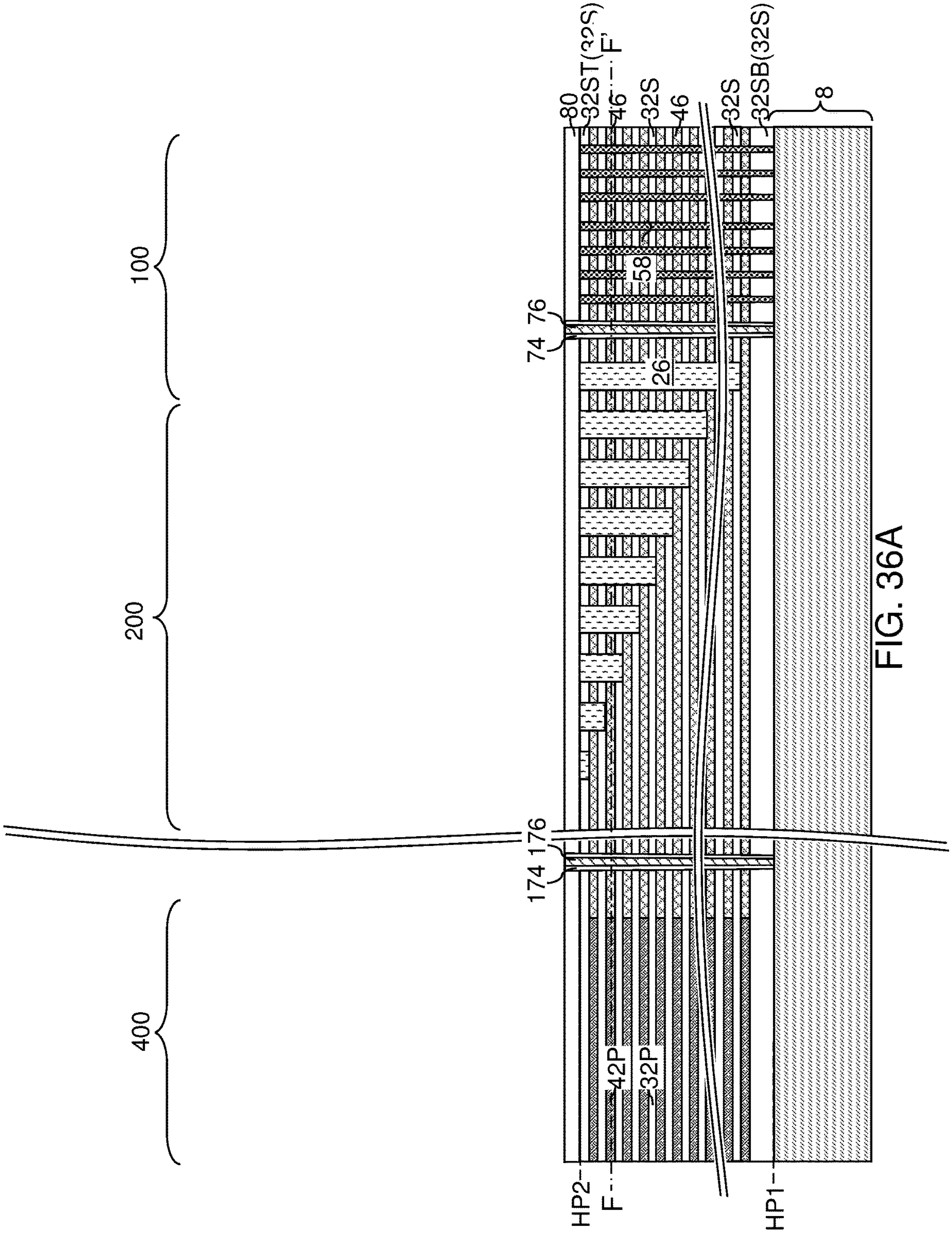
FIG. 36A is a vertical cross-sectional view of the alternative configuration of the second exemplary structure after formation of a backside trench fill structure according to the second embodiment of the present disclosure.
Figure 36B:
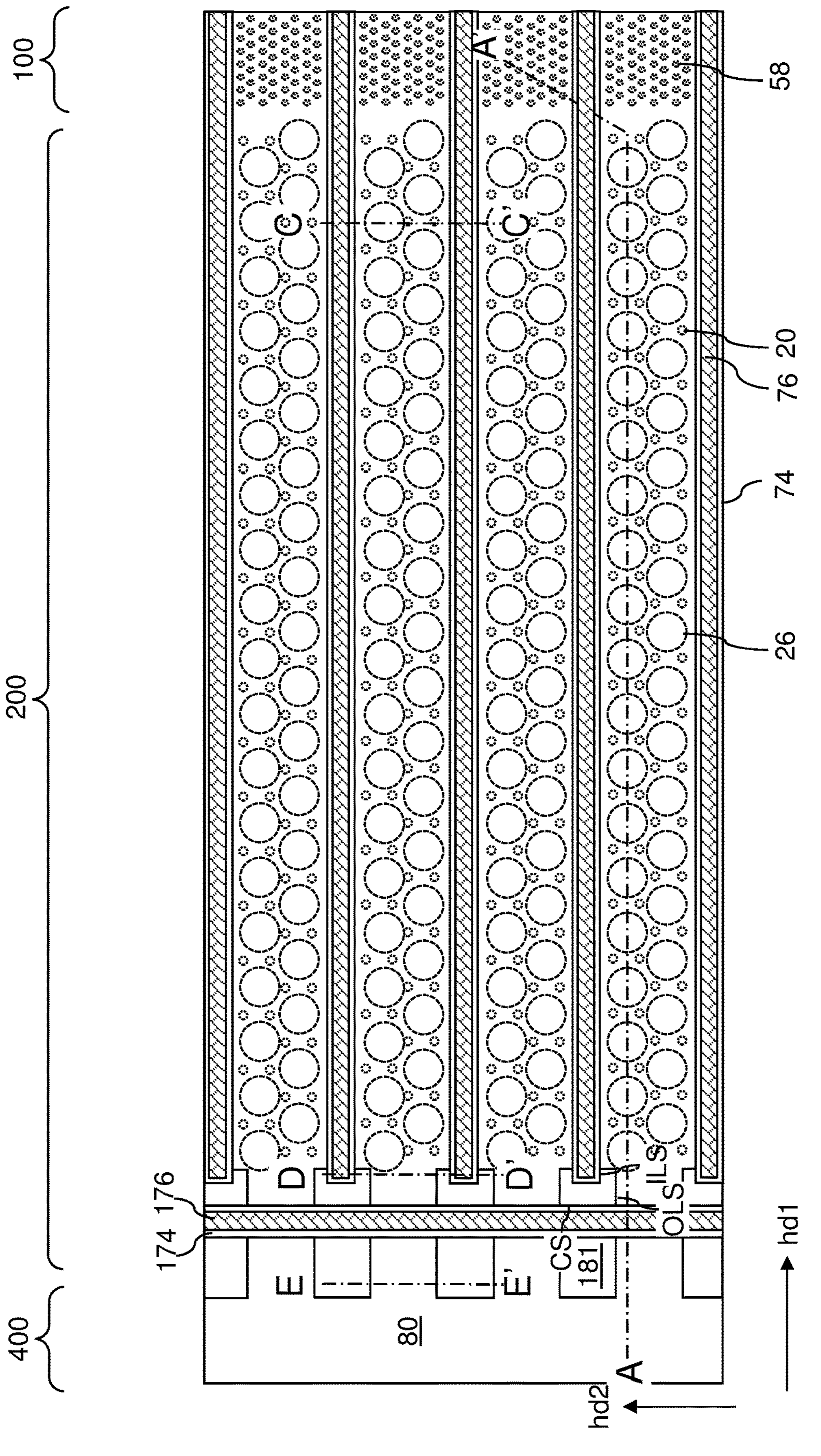
FIG. 36B is a top-down view of the second exemplary structure of FIG. 36A. The hinged vertical plane A-A' is a plane of the vertical cross-sectional view of FIG. 36A.
Figure 36C:
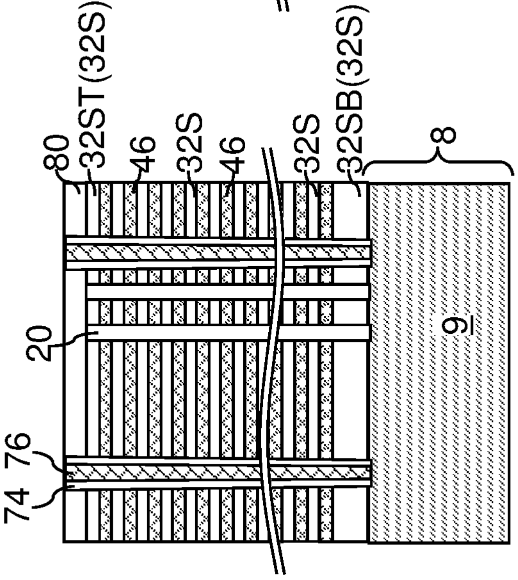
FIG. 36C is a vertical cross-sectional view of the second exemplary structure along the vertical plane C-C' of FIG. 36B.
Figure 36D:
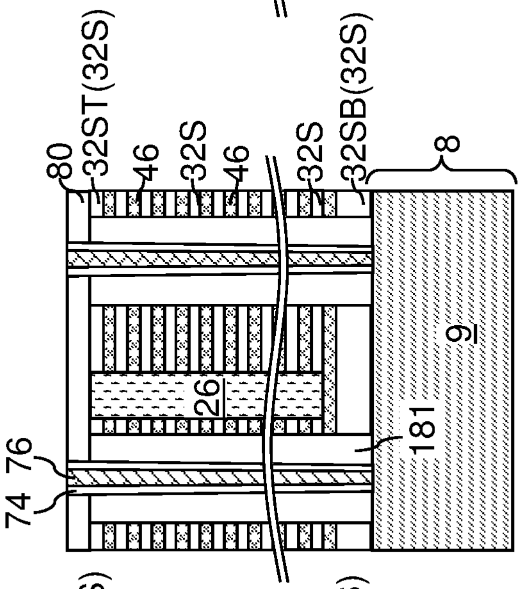
FIG. 36D is a vertical cross-sectional view of the second exemplary structure along the vertical plane D-D' of FIG. 36B.
Figure 36E:
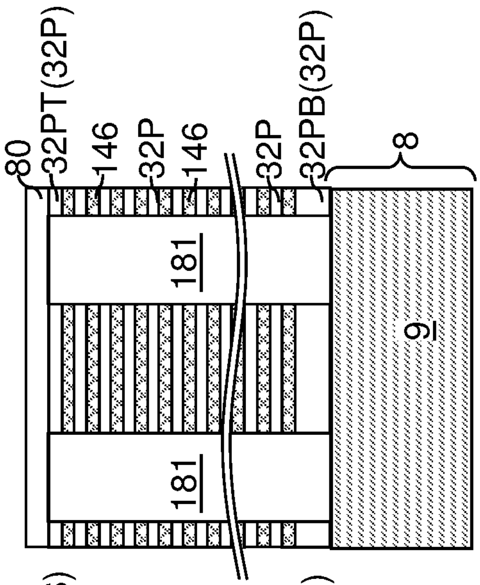
FIG. 36E is a vertical cross-sectional view of the second exemplary structure along the vertical plane E-E' of FIG. 36B.
Figure 36F:
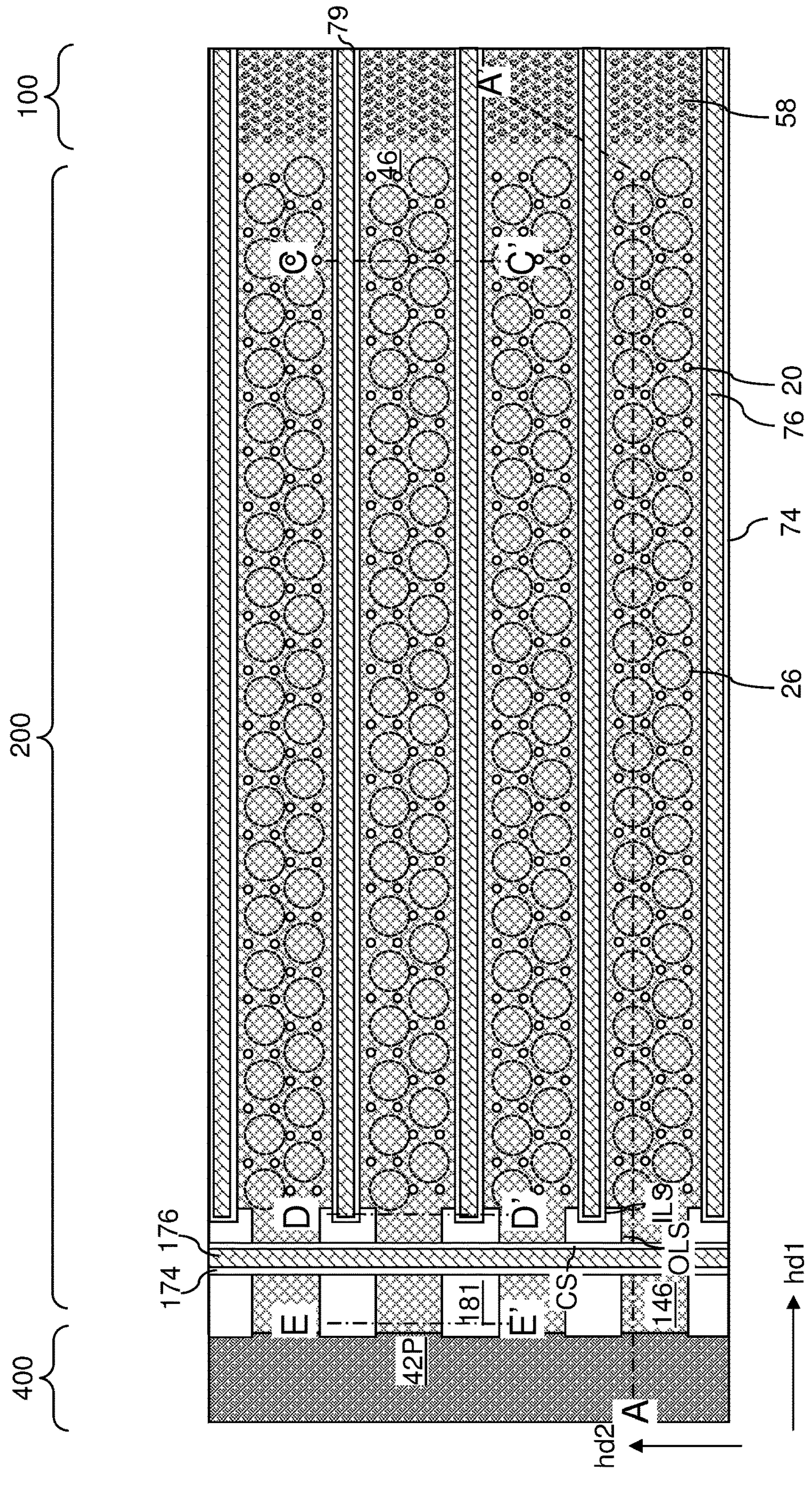
FIG. 36F is a horizontal cross-sectional view of the second exemplary structure along the horizontal plane F-F' of FIG. 36A.

Referring to FIG. 34, the processing steps described with reference to FIGS. 14A-21 may be performed to provide a second exemplary structure.

Referring collectively to FIGS. 1-34 and according to various embodiments of the present disclosure, a three-dimensional memory device is provided, which comprises: an alternating stack {32, (46, 42C)} of insulating layers 32 and composite layers (46, 42C) that alternate along a vertical direction, wherein each of the composite layers (46, 42C) comprises a combination of a dielectric connection plate 42C and a plurality of electrically conductive strips 46 that laterally extend along a first horizontal direction hd1, are laterally spaced apart along a second horizontal direction hd2 by backside trenches 79 that laterally extend along the first horizontal direction hd1, and have a respective sidewall adjoined to a respective sidewall surface segment of the dielectric connection plate 42C, wherein end portions of the backside trenches 79 are laterally bounded by the dielectric connection plates 42C of the composite layers (46, 42C);

arrays of memory openings 49 vertically extending through the alternating stack; memory opening fill structures 58 located in the memory openings, wherein each of the memory opening fill structures 58 comprises a vertical semiconductor channel 60 and a respective vertical stack of memory elements (e.g., portions of the memory film 50) located at levels of the electrically conductive strips 46; backside trench fill structures (74, 76) located in the backside trenches 79 and vertically extending at least from a first horizontal plane HP1 including bottommost surfaces of the alternating stacks {32, (46, 42C)} and at least to a second horizontal plane HP2 including topmost surfaces of the alternating stacks {32, (46, 42C)}; and dielectric etch stop structures (81, 181) located within, or outside, a respective one of the backside trenches 79, wherein each of the dielectric etch stop structures (81, 181) comprises a respective pair of dielectric sidewalls that are located within a pair of lengthwise sidewalls of the respective one of the backside trenches 79, wherein the dielectric sidewalls of the dielectric etch stop structures (81, 181) laterally extend along the first horizontal direction hd1 and vertically extend at least from the first horizontal plane HP1 and at least to the second horizontal plane HP2.

In one embodiment, each of the electrically conductive strips 46 has a respective lateral extent along the second horizontal direction hd2 that is not greater than a lateral spacing between a pair of most proximal pair of the backside trenches 79.

In one embodiment, the lateral extent of each of the electrically conductive strips 46 is the same as the lateral spacing between the pair of most proximal pair of the backside trenches 79 throughout an entirety of each of the electrically conductive strips 46 (for example, as illustrated in the first exemplary structure).

In one embodiment, the lateral extent of each of the electrically conductive strips 46 is the same as the lateral spacing between the pair of most proximal pair of the backside trenches 79 within a first portion of each of the electrically conductive strips 46 that is distal from dielectric connection plate 42C that is contacted by a respective electrically conductive strip 46; and the lateral extent of each of the electrically conductive strips 46 is less than the lateral spacing between the pair of most proximal pair of backside trenches 79 among the backside trenches 79 within a second portion of each of the electrically conductive strips 46 that is proximal to the dielectric connection plate 42C that is contacted by the respective electrically conductive strip 46 (for example, as illustrated in the second exemplary structure).

In one embodiment, each of the dielectric etch stop structures (81, 181) comprises: a respective pair of inner lengthwise sidewalls ILS that are parallel to the first horizontal direction hd1 and having a first lateral spacing therebetween; a respective pair of outer lengthwise sidewalls OLS that are parallel to the first horizontal direction hd1 and having a second lateral spacing therebetween, the second lateral spacing being greater than the first lateral spacing; and a respective connection sidewall CS that connects the respective pair of outer lengthwise sidewalls OLS and contacting each of the dielectric connection plates 42C within the alternating stack {32, (46, 42C)}.

In one embodiment, for each of the dielectric etch stop structures 81, the pair of dielectric sidewalls comprises a pair of outer lengthwise sidewalls OLS (for example, as illustrated in the first exemplary structure).

In one embodiment, for each of the dielectric etch stop structures 181, the pair of dielectric sidewalls comprises a pair of inner lengthwise sidewalls ILS (for example, as illustrated in the second exemplary structure).

In one embodiment, each of the dielectric etch stop structures 81 is located within the respective one of the backside trenches 79; and each of the backside trench fill structures (74, 76) has a first portion having a same width as a respective one of the backside trenches 79 and a second portion having a lesser width than the respective one of the backside trenches 79.

In one embodiment, each of the dielectric etch stop structure 181 is located outside the respective one of the backside trenches 79; and each of the backside trench fill structures (74, 76) has a uniform width throughout, the uniform width being the same as a width of a respective backside trench 79.

In one embodiment, the three-dimensional memory device comprises: upper metal interconnect structures 380 overlying the alternating stack {32, (46, 42C)} and embedded within upper dielectric material layers 360; memory-side bonding pads 388 electrically connected to the upper metal interconnect structures 380 and embedded within the upper dielectric material layers 360; and a logic die 700 comprising logic-side semiconductor devices 720 and logic-side bonding pads 788 electrically connected to the logic-side semiconductor devices 720 through logic-side metal interconnect structures 780, wherein the logic-side bonding pads 788 are bonded to the memory-side bonding pads 388. In one embodiment, the logic-side semiconductor devices 720 comprise a control circuitry configured to control operation of the vertical stack of memory elements.

In one embodiment, the three-dimensional memory device also comprises connection via structures 386 vertically extending through the dielectric connection plates 42C within the alternating stack {32, (46, 42C)} and providing electrical connection to the upper metal interconnect structures 380.

In one embodiment, the three-dimensional memory device also comprises laterally insulated contact via structures (84, 86) vertically extending through a respective subset of the alternating stack located between a respective neighboring pair of backside trenches 79 and contacting a respective one of the electrically conductive strips 46S. The laterally insulated contact via structures (84, 86) are located in a contact region 200 which lacks a staircase (e.g., vertically stepped surfaces) in the alternating stacks. In one embodiment, the alternating stacks are located in different memory blocks which are electrically isolated from each other by the backside trenches and the dielectric etch stop structures.

Referring to FIGS. 35A-35E, an alternative configuration of the second exemplary structure can be derived from the second exemplary structure illustrated in FIGS. 30A-30E by forming an additional trench in addition to the backside trenches 79. The additional trench is herein referred to as an isolation trench 179. The isolation trench 179 can be formed concurrently with formation of the backside trenches 79 by modifying the pattern of openings in the photoresist layer that is employed as an etch mask during an anisotropic etch process employed to form the backside trenches 79. The isolation trench 179 laterally extends along the second horizontal direction hd2, and cuts through each of the dielectric etch stop structures 181. In one embodiment, each of the dielectric etch stop structures 181 as formed at the processing steps of FIGS. 27A-27E can be divided into two rows of dielectric etch stop structures 181. Each row of dielectric etch stop structures 181 can be arranged along the second horizontal direction hd2, and the two rows of dielectric etch stop structures 181 can be laterally spaced from each other along the first horizontal direction hd1 by the isolation trench 179. In one embodiment, the isolation trench 179 may have a pair of straight lengthwise sidewalls that laterally extend along the second horizontal direction hd2, and laterally spaced apart from each other along the first horizontal direction hd1.

The isolation trench 179 does not contact or overlap with the backside trenches 79. This reduces or prevents punch through by the trenches (79, 179) into the substrate 8. The lack of punch through reduces or prevents a short circuit between the contact via structure 76 to be formed in the trenches and metal interconnect structures 480 located below the alternating stack. In contrast, if the isolation trench 179 does contact or overlap with the backside trenches 79, then the etch rate at the overlap areas (i.e., at the corners where trenches 79 and 179 meet) is higher than in the straight (i.e., non-overlap) portions of the trenches (79, 179). The higher etch rate at the overlap areas may cause a punch through into the substrate 8, which may result in a short circuit between the contact via structures 76 and the lower metal interconnect structures 480.

Patterned portions of the insulating layers 32 that are located in the connection region 400 are herein referred to as insulating plates 32P. Patterned portions of the sacrificial material layers 42 that are located in the connection region 400 are herein referred to as dielectric material plates 42P. A vertically alternating sequence of the insulating plates 32P and the dielectric material plates 42P can be formed in the connection region 400.

Referring to FIGS. 36A-36F, the processing steps described with reference to FIGS. 31A-31E can be performed to form backside recesses 43 around the backside trenches 79 and around the isolation trenches 179. All portions of the sacrificial material layers 42 that are located in the memory array region 100 or are located in the contact region 200 and more proximal to the memory array region 100 than the isolation trench 179 can be removed during the isotropic etch process that forms the backside recesses 43. Further, additional backside recesses 43 can be formed upon removal of portions of the sacrificial material layers 42 that are proximal to the isolation trench 179 and located in the connection region 400. Sidewalls of the dielectric material plates 42P that are physically exposed to the isolation trench 179 may be laterally recessed farther away from the memory array region 100 along the first horizontal direction hd1 than sidewalls of the insulating plates 32P that are physically exposed to the isolation trench 179.

Subsequently, the processing steps described with reference to FIGS. 32A-32F can be performed to form backside blocking dielectric layers and to form electrically conductive strips 46. A subset of the electrically conductive strips 46 can be formed in the backside recesses that are laterally bounded by the backside trenches 79 and the isolation trench 79. Further, additional electrically conductive strips can be formed within additional backside recesses formed by lateral recessing of the dielectric material plates 42P.

Subsequently, the processing steps described with reference to FIGS. 13A-13E may be performed to form backside trench fill structures (74, 76) in the backside trenches 79 and to form an isolation trench fill structure (174, 176) in the isolation trench 179. Each of the backside trench fill structures (74, 76) may vertically extend at least from a first horizontal plane HP1 including bottommost surfaces of the alternating stacks {32, (46, 42C)} and at least to a second horizontal plane HP2 including topmost surfaces of the alternating stacks {32, (46, 42C)}.

The isolation trench fill structure (174, 176) can comprise an isolation trench spacer 174 that is formed concurrently with formation of the insulating spacers 74 and has a same material composition and the same thickness as the insulating spacers 74. In one embodiment, the isolation trench spacer 174 may comprise lengthwise sidewalls that laterally extend along the second horizontal direction hd2 and laterally spaced apart along the first horizontal direction hd1. Generally, for any element having lateral extents along at least two different horizontal directions, a lengthwise direction and a widthwise direction can be defined such that the lengthwise direction has a greater lateral extent than the widthwise direction.

The isolation trench fill structure (174, 176) may also comprise a conductive isolation trench fill structure 176 having a same material composition as the backside contact via structures 76. The isolation trench spacer 174 comprises a dielectric material and provides electrical isolation between the conductive isolation trench fill structures 176 and elements located around the isolation trench spacer 174, and between elements located around the isolation trench spacer 174. As such, the isolation trench spacer 174 is also referred to as a dielectric isolation structure 174.

The dielectric etch stop structures 181 can be located outside a respective one of the backside trenches 79. A first subset of the dielectric etch stop structures 181 comprises a respective pair of dielectric sidewalls that are located within a pair of lengthwise sidewalls of the respective one of the backside trenches 79. A second subset of the dielectric etch stop structures 181 contacts the vertically alternating sequence of insulating plates 32P and dielectric material plates 42P.

Each of the electrically conductive strips 46 may have a sidewall that is in direct contact with the dielectric isolation structure 174. The dielectric isolation structure 174 comprises lengthwise sidewalls that laterally extend along the second horizontal direction hd2. Each insulating plate 32P in the vertically alternating sequence of insulating plates 32P and dielectric material plates 42P may be in contact with the dielectric isolation structure 174. Each dielectric material plate 42P in the vertically alternating sequence of insulating plates 32P and dielectric material plates 42P may be laterally spaced from the dielectric isolation structure 174 by a respective electrically conductive strip 46 having a greater lateral extent along the second horizontal direction hd2 than along the first horizontal direction hd1.

Figure 37A:
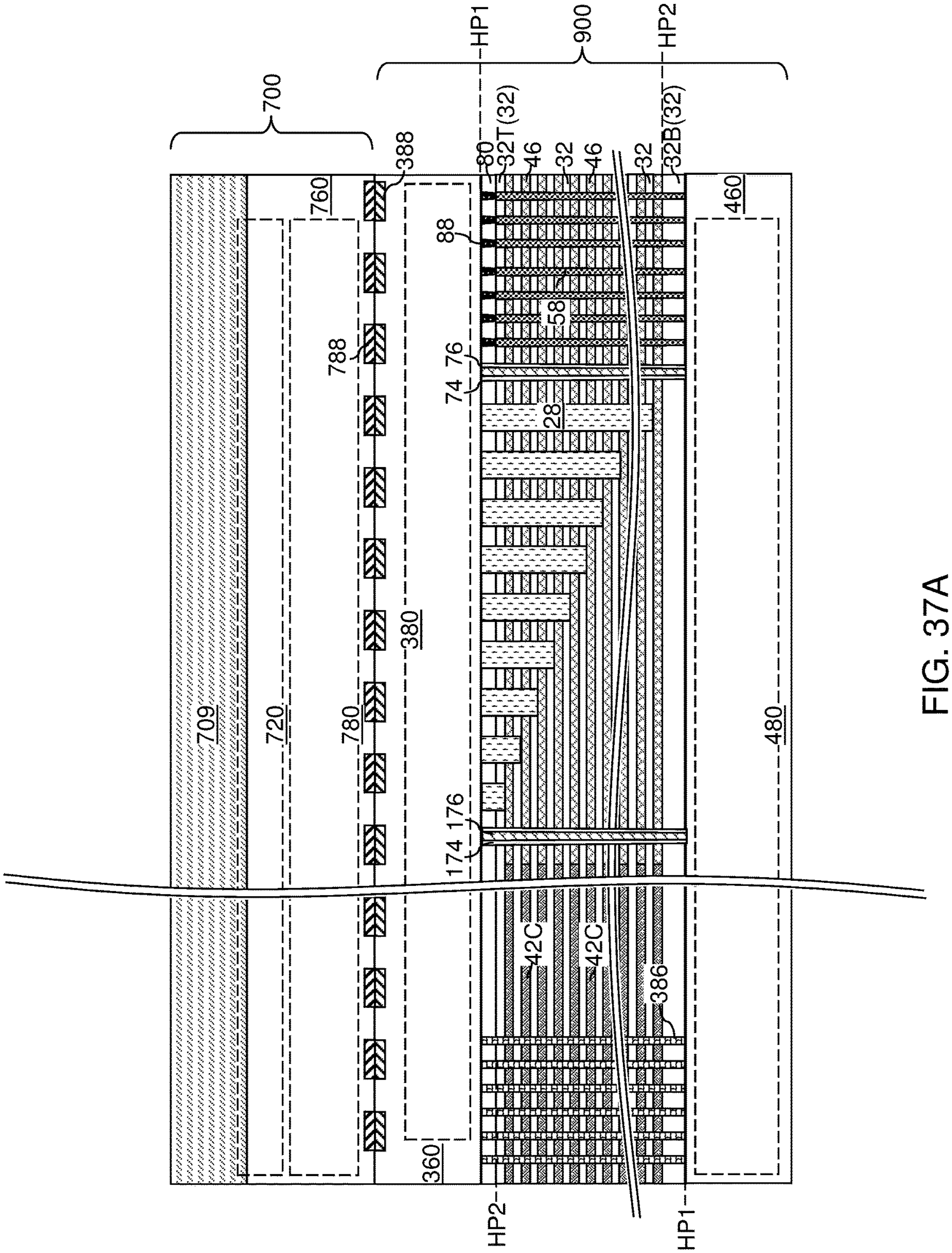
FIG. 37A is a vertical cross-sectional view of the alternative configuration of the second exemplary structure after formation of drain contact via structures, upper metal interconnect structures, and memory-side bonding pads, and bonding with a logic die according to the second embodiment of the present disclosure.

Referring to FIG. 37A, the processing steps described with reference to FIGS. 14A-21 may be performed to provide an alternative configuration of the second exemplary structure.

Figure 37B:
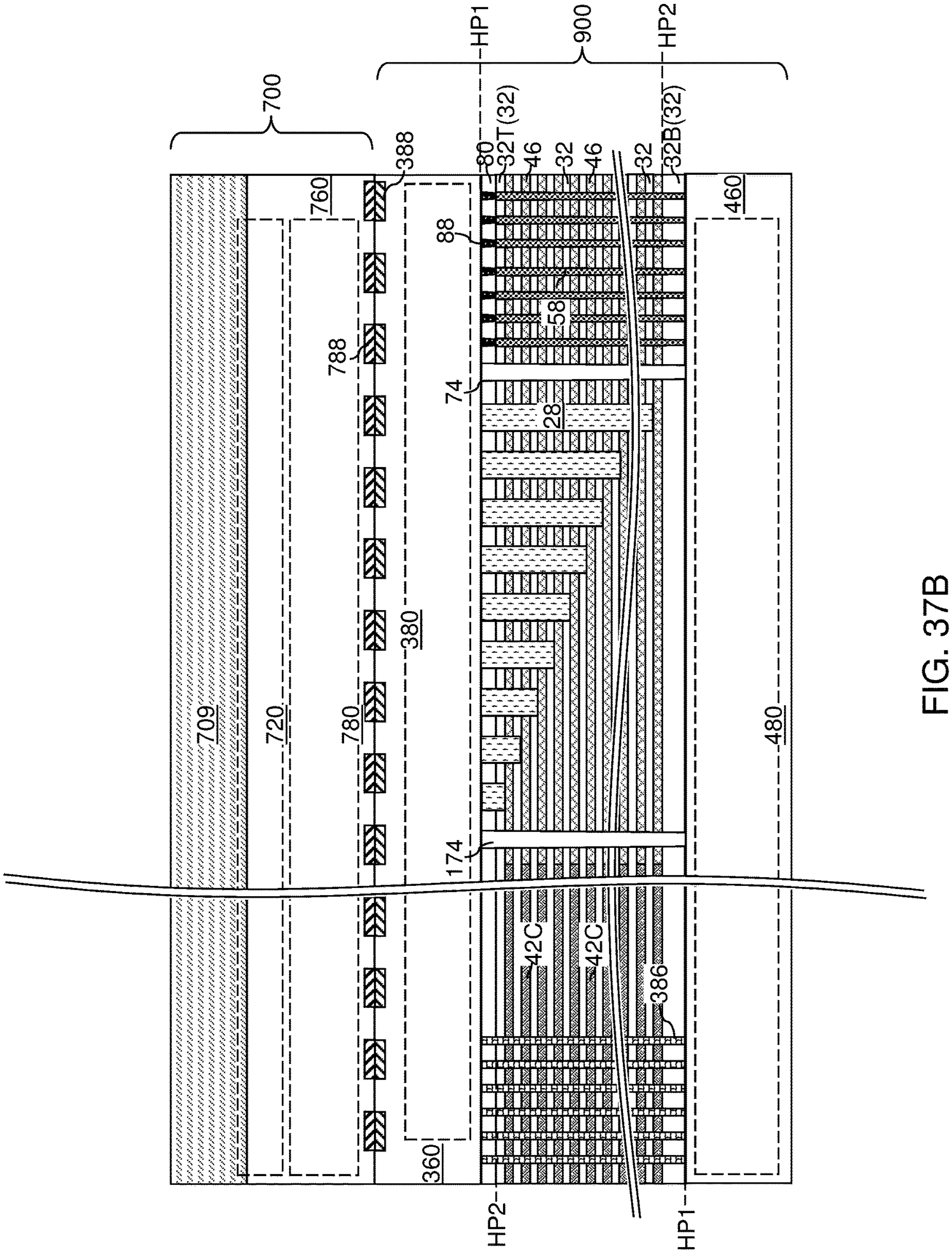
FIG. 37B is a vertical cross-sectional view an additional alternative configuration of the second exemplary structure according to the second embodiment of the present disclosure.

Referring to FIG. 37B, an additional alternative configuration of the second exemplary structure can be derived from the configuration of the second exemplary structure illustrated in FIG. 37A by employing only insulating spacers 74 to fill the backside trenches 79 and by employing only an isolation trench spacer 174 to fill the isolation trench 179. In this case, the isolation trench 179 may be entirely filled with an insulating material, i.e., a dielectric material, of the isolation trench spacer 174, which is a dielectric isolation structure 174. Each of the electrically conductive strips 46 may have a sidewall that is in direct contact with the dielectric isolation structure 174. The dielectric isolation structure 174 comprises lengthwise sidewalls that laterally extend along the second horizontal direction hd2. Each insulating plate 32P in the vertically alternating sequence of insulating plates 32P and dielectric material plates 42P may be in contact with the dielectric isolation structure 174. Each dielectric material plate 42P in the vertically alternating sequence of insulating plates 32P and dielectric material plates 42P may be laterally spaced from the dielectric isolation structure 174 by a respective electrically conductive strip 46 having a greater lateral extent along the second horizontal direction hd2 than along the first horizontal direction hd1.

Figure 38A:
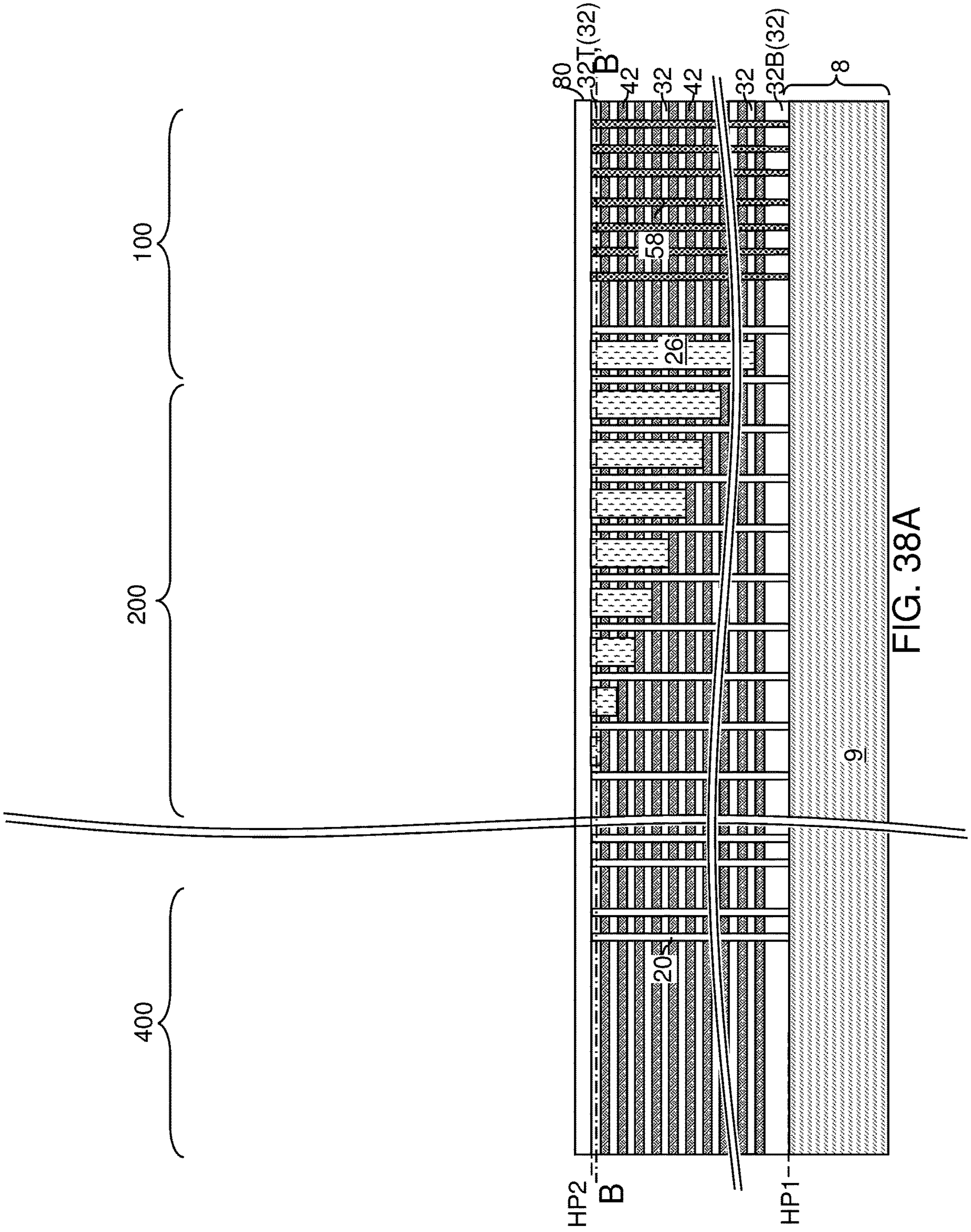
FIG. 38A is a vertical cross-sectional view of a third exemplary structure after formation of memory opening fill structures, and support pillar structures according to a third embodiment of the present disclosure.
Figure 38B:
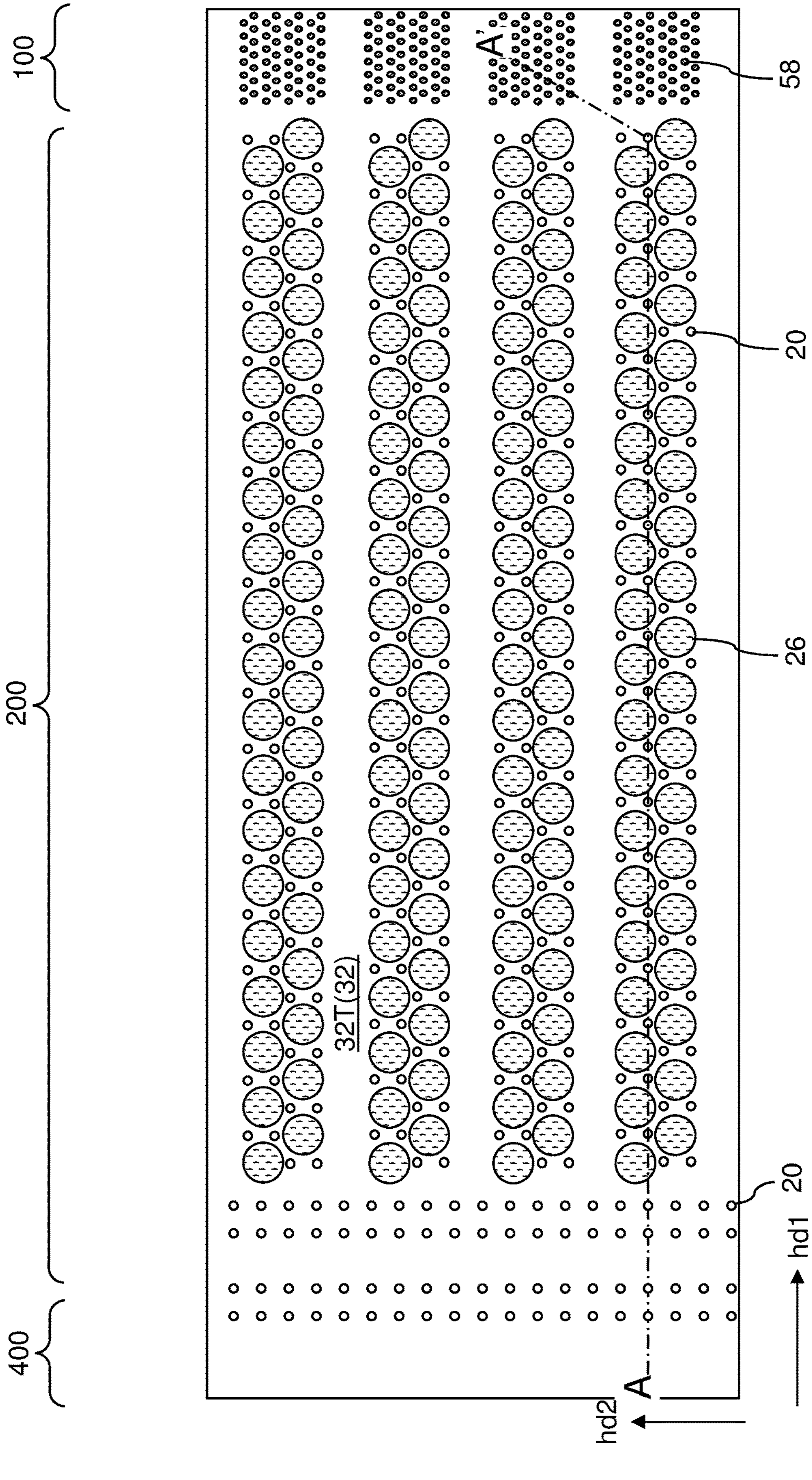

Referring to FIGS. 38A and 38B, a third exemplary structure according to a third embodiment of the present disclosure may be derived from the first exemplary structure after the processing steps of FIG. 7E. Some of the support pillar structures 20 are shown in FIG. 38A. It should be noted that additional support pillar structures 20 may be located under the in-process layer contact assemblies 26, as shown in FIG. 7E.

Figure 39A:
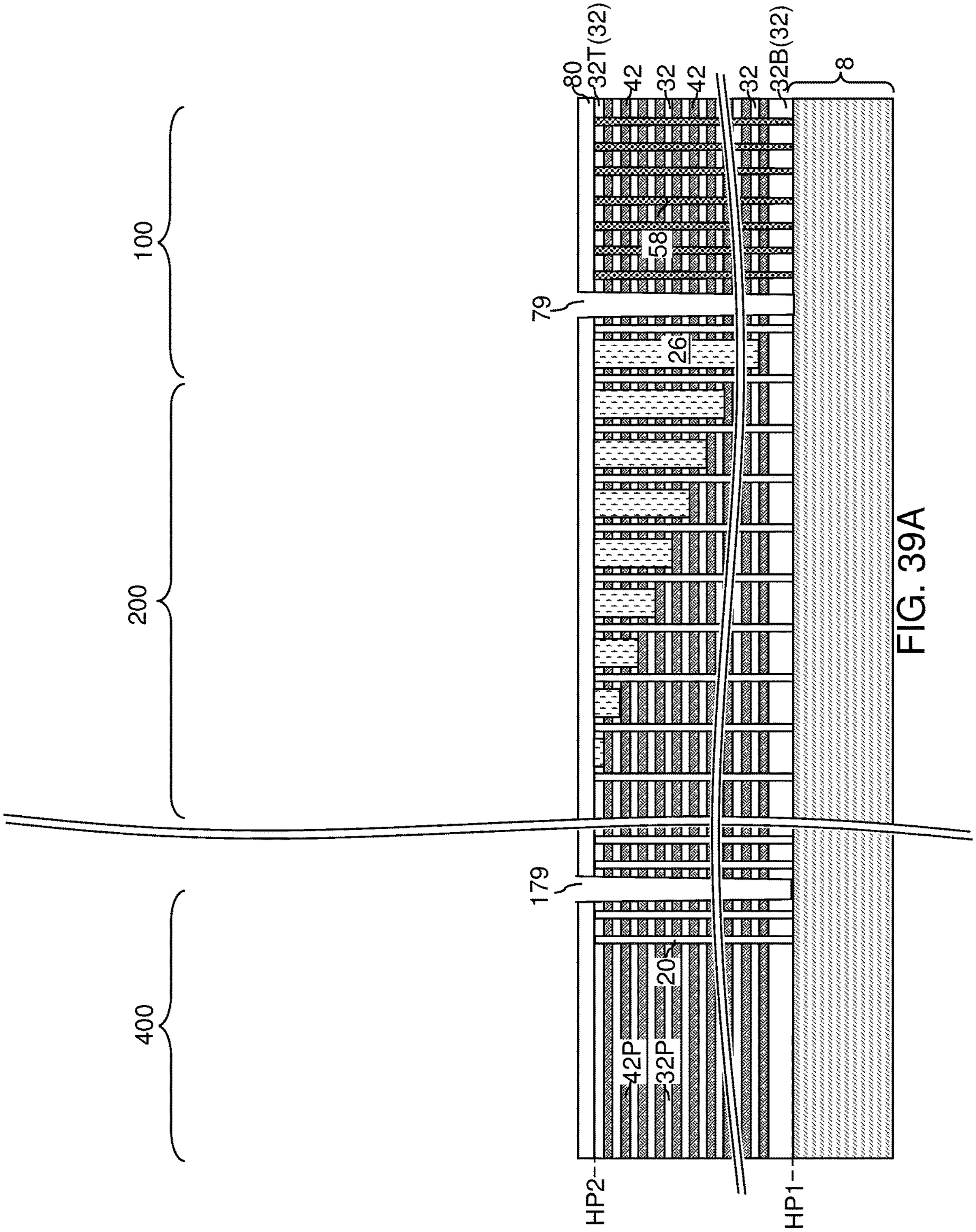
Figure 39B:
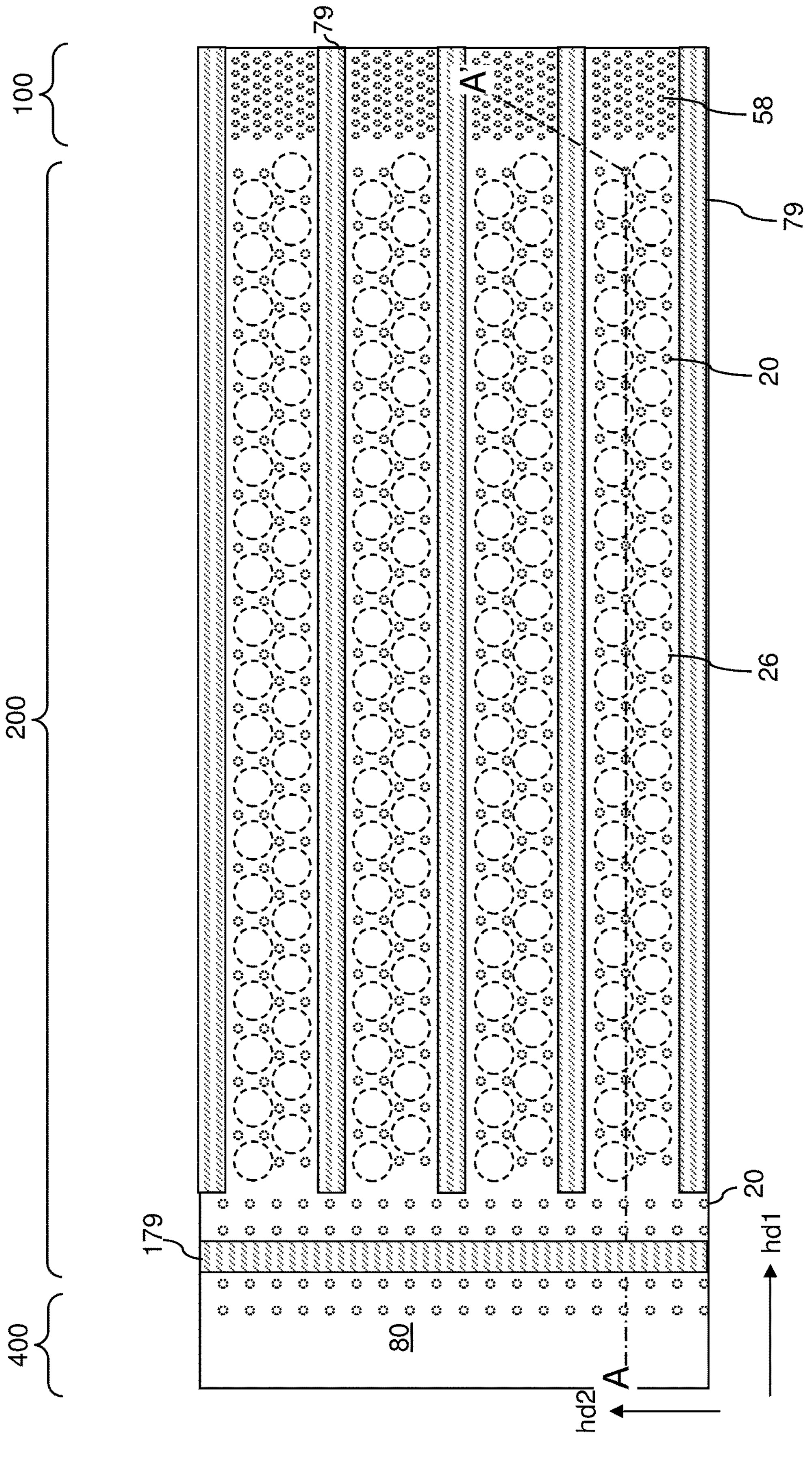

Referring to FIGS. 39A and 39B, the processing steps described with reference to FIGS. 35A-35E can be subsequently performed to form backside trenches 79 and an isolation trench 179. The pattern of the backside trenches 79 and the isolation trench 179 may be substantially the same as described with reference to FIGS. 35A-35E. Specifically, each backside trench 79 may laterally extend along the first horizontal direction hd1 between neighboring arrays of memory opening fill structures 58 and between neighboring arrays of in-process layer contact assemblies 26, and may have a respective end portion in proximity to the boundary between the contact region 200 and the connection region 400. The isolation trench 179 is laterally spaced from the backside trenches 79 along the first horizontal direction hd1, and laterally extends along the second horizontal direction hd2. In one embodiment, the isolation trench 179 is located within an area that is free of the support pillar structures 20. At least one row of support pillar structures 20 may be present on either side of the isolation trench 179.

Figure 40A:
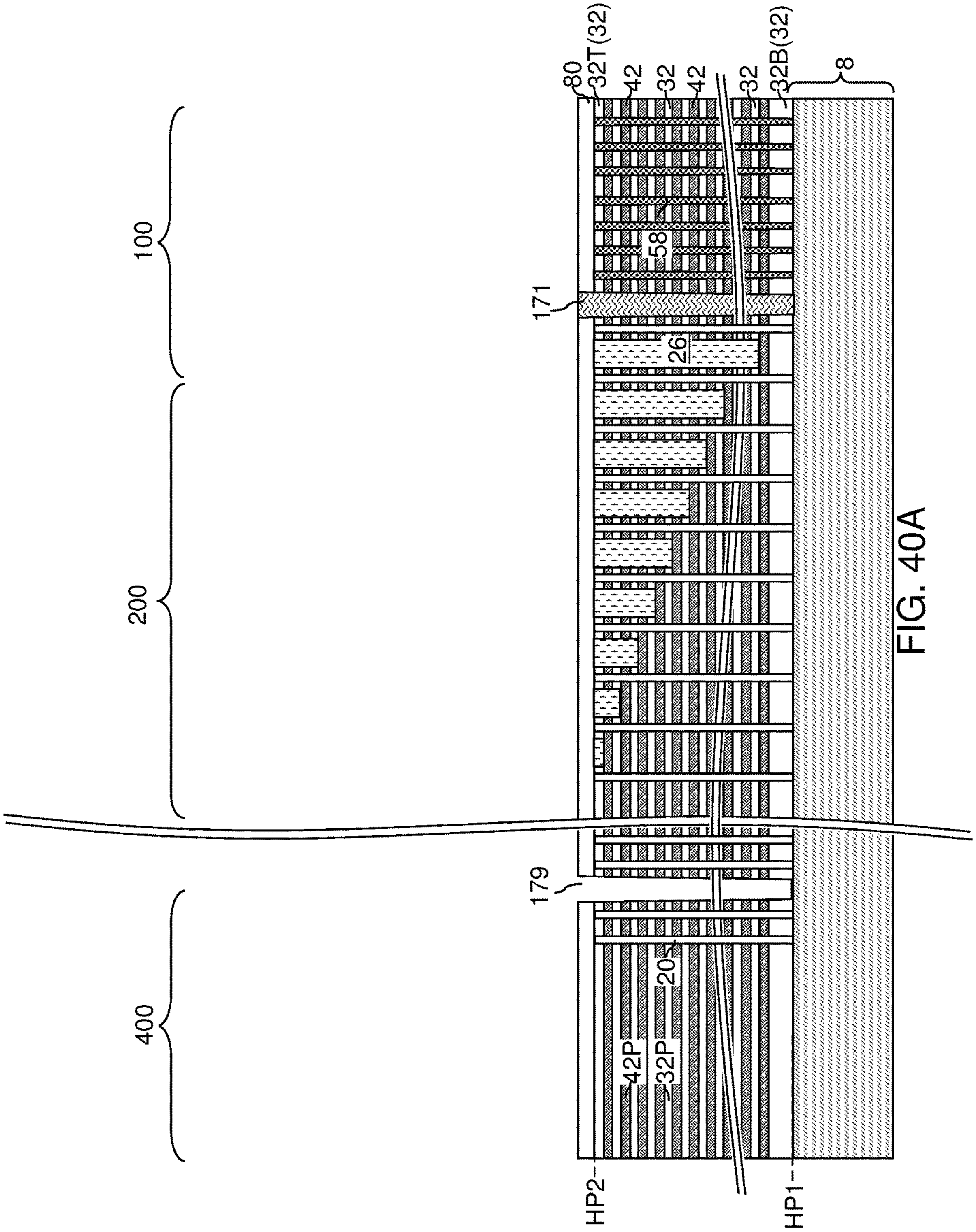
Figure 40B:
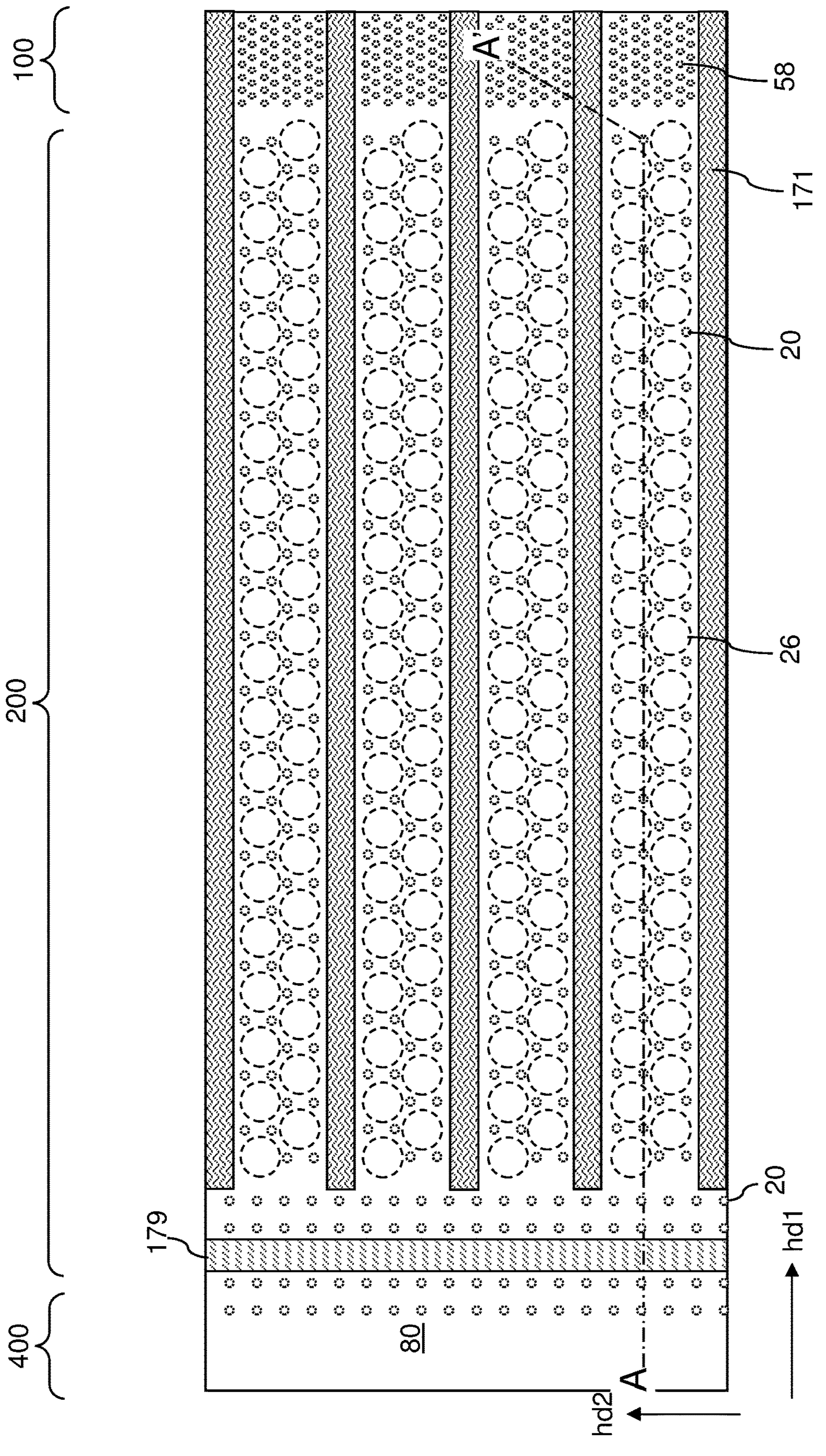

Referring to FIGS. 40A and 40B, a sacrificial fill material can be deposited in the backside trenches 79 and the isolation trench 179. Excess portions of the sacrificial fill material can be removed from above the horizontal plane including the top surface of the contact-level dielectric layer 80. Each remaining portion of the sacrificial fill material located within a respective backside trench 79 comprises a sacrificial backside trench fill structure 171. The sacrificial backside trench fill structures 171 may comprise a semiconductor material (such as amorphous silicon), a carbon-based material (such as spin on carbon), organosilicate glass, a polymer material, or combinations thereof.

A photoresist layer (not shown) can be applied over the contact-level dielectric layer 80 and the sacrificial backside trench fill structures 171, and can be lithographically patterned to form an elongated opening overlying the entire area of the isolation trench 179. The portion of the sacrificial fill material that remains in the isolation trench 179 can be removed by performing an etch process or an ashing process. The sacrificial fill material can be removed from inside the isolation trench 179. The photoresist layer can be subsequently removed, for example, by ashing. Thus, the backside trenches 79 are filled with the sacrificial backside trench fill structures 171, and the isolation trench 179 is not filled with any fill material.

Figure 41A:
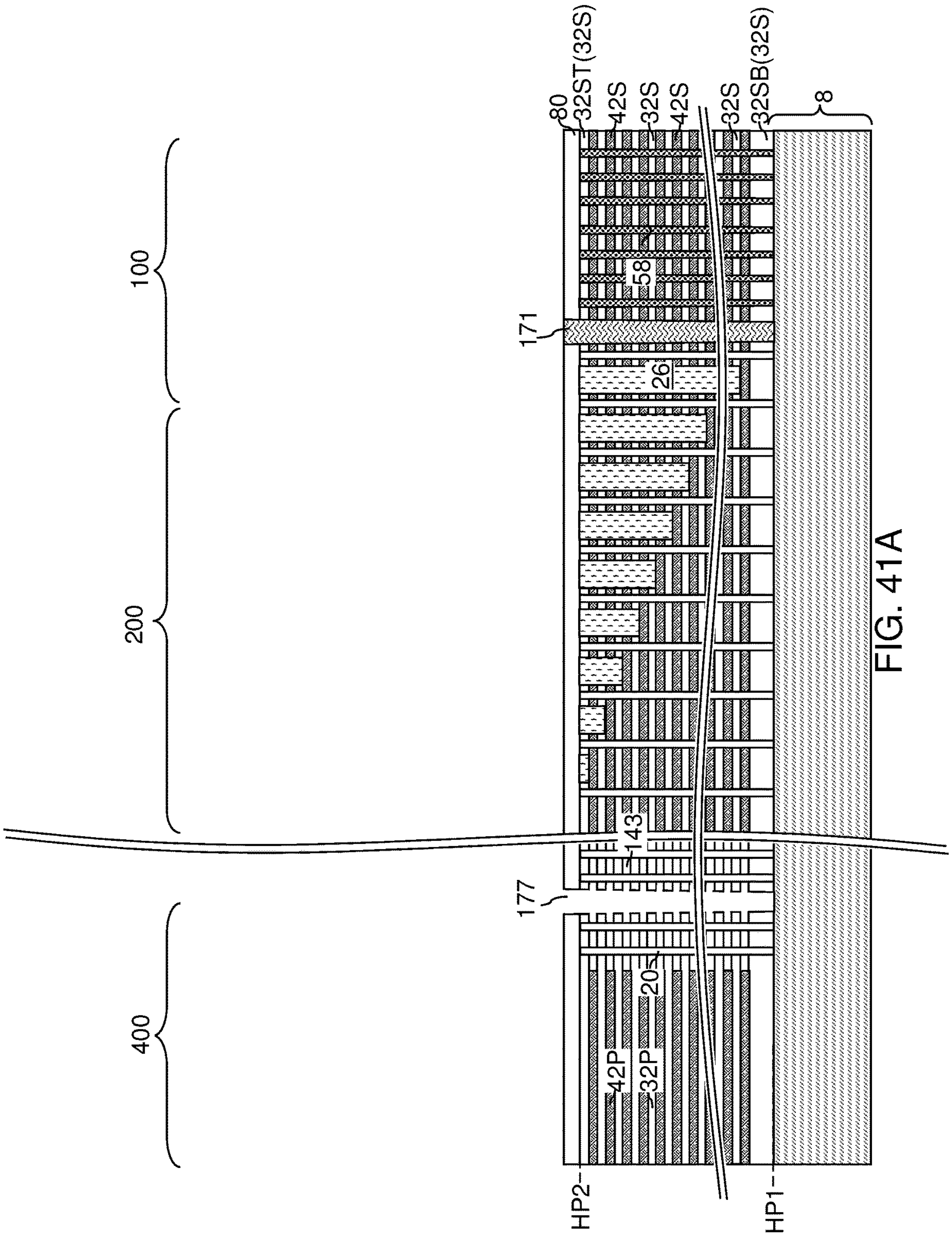
Figure 41B:
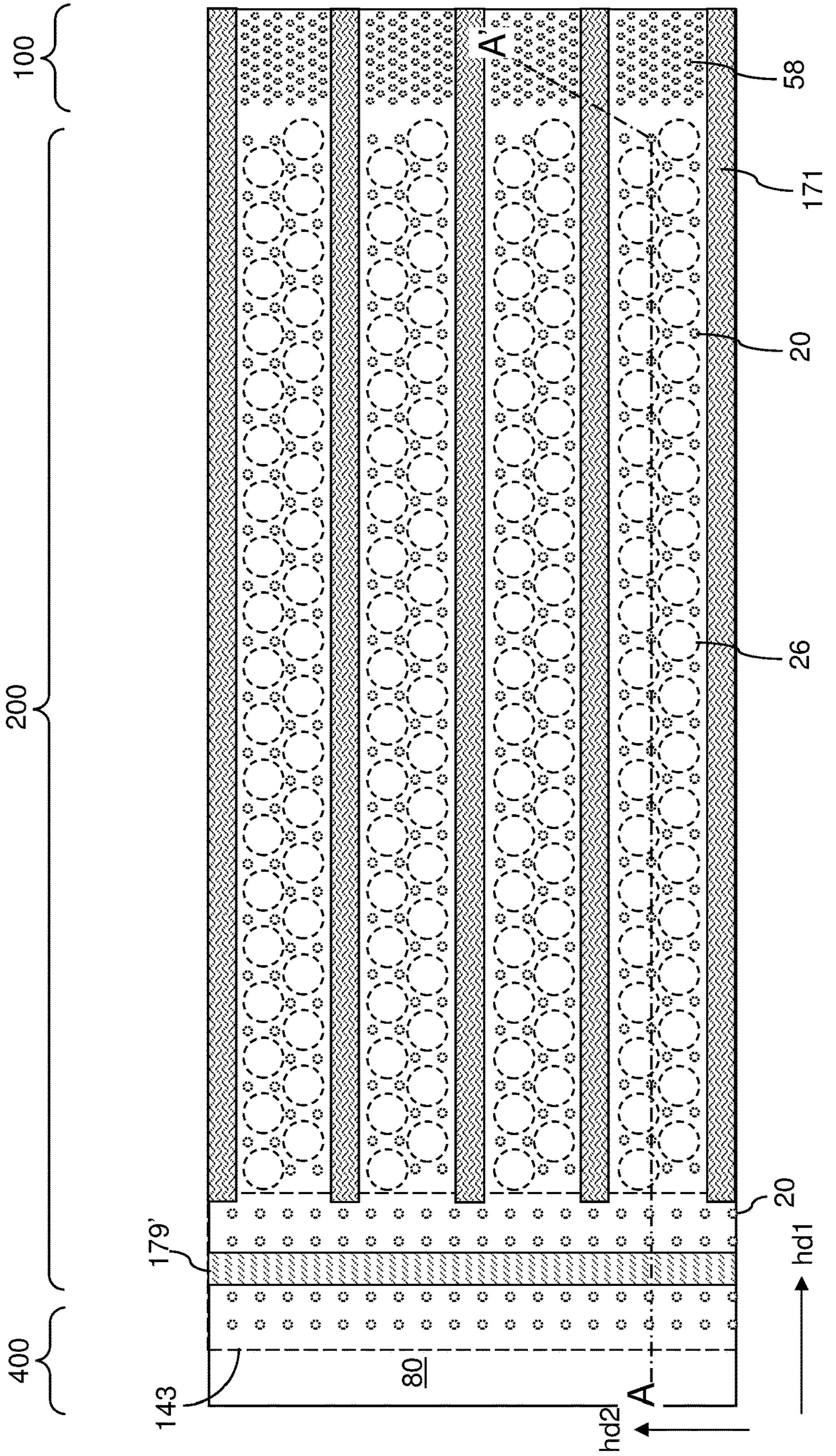

Referring to FIGS. 41A and 41B, an isotropic etch process can be performed to etch the material of the sacrificial material layers 42 selective to materials of the insulating layers 32, the sacrificial backside trench fill structures 171, and the support pillar structures 20. Isolation recesses 143 are formed in volumes from which the material of the sacrificial material layers 42 are etched. An isolation cavity 177 can be formed, which comprises the volume of the isolation trench 179 as formed at the processing steps of FIGS. 39A and 39B and the volumes of the isolation recesses 143 as formed by the isotropic etch process. Generally, the isolation cavity 177 can be formed by laterally expanding the isolation trench 179.

In one embodiment, the duration of the isotropic etch process can be selected such that the lateral recess distance of the sidewalls of the sacrificial material layers 42 is greater than the lateral spacing between the isolation trench 179 and the backside trenches 79. In this case, surface segments of the sacrificial backside trench fill structures 171 can be physically exposed to the isolation cavity 177 at each level of the sacrificial material layers 42 upon competition of the isotropic etch process. Each patterned portion of the sacrificial material layers 42 located between a respective neighboring pair of sacrificial backside trench fill structures 171 constitutes a sacrificial material strip 42S. The sacrificial material strips 42S are laterally spaced apart from each other by the sacrificial backside trench fill structures 171. Each portion of the insulating layers 32 located between neighboring pairs of sacrificial backside trench fill structures 171 constitutes an insulating strip 32S. The insulating strips 32S located at a same level are laterally interconnected with each other by a portion of a respective insulating layer 32 that is adjacent to, and/or is exposed to, the isolation cavity 177. Topmost insulating strips 32ST comprise portions of the topmost insulating layer 32T, and bottommost insulating strips 32SB comprise portions of the bottommost insulating layer 32B.

Alternating stacks (32S, 42S) of insulating strips 32S and sacrificial material strips 42S are formed between neighboring pairs of sacrificial backside trench fill structures 171. The insulating strips 32S are portions of the insulating layers 32 that are located between a respective neighboring pair of backside trenches 79. The sacrificial material strips 42S are discrete remaining portions of the sacrificial material layers 42. Each of the sacrificial material strips 42S is laterally spaced apart from all other sacrificial material strips 42S located at a same level by a combination of the backside trenches 79 and the isolation cavity 177. The isolation cavity 177 may be a finned cavity including the isolation recesses 143 as fin-shaped voids of the finned cavity. Surface segments of the support pillar structures 20 may be exposed to the isolation recesses 143 of the isolation cavity 177. A vertically alternating sequence of insulating plates 32P and dielectric material plates 42P can also be provided in the connection region 400 and/or in the contact region 200 adjacent to the connection region 400. The vertically alternating sequence of insulating plates 32P and dielectric material plates 42P is laterally spaced apart from the alternating stacks (32S, 42S) along the first horizontal direction hd1.

Figure 42A:
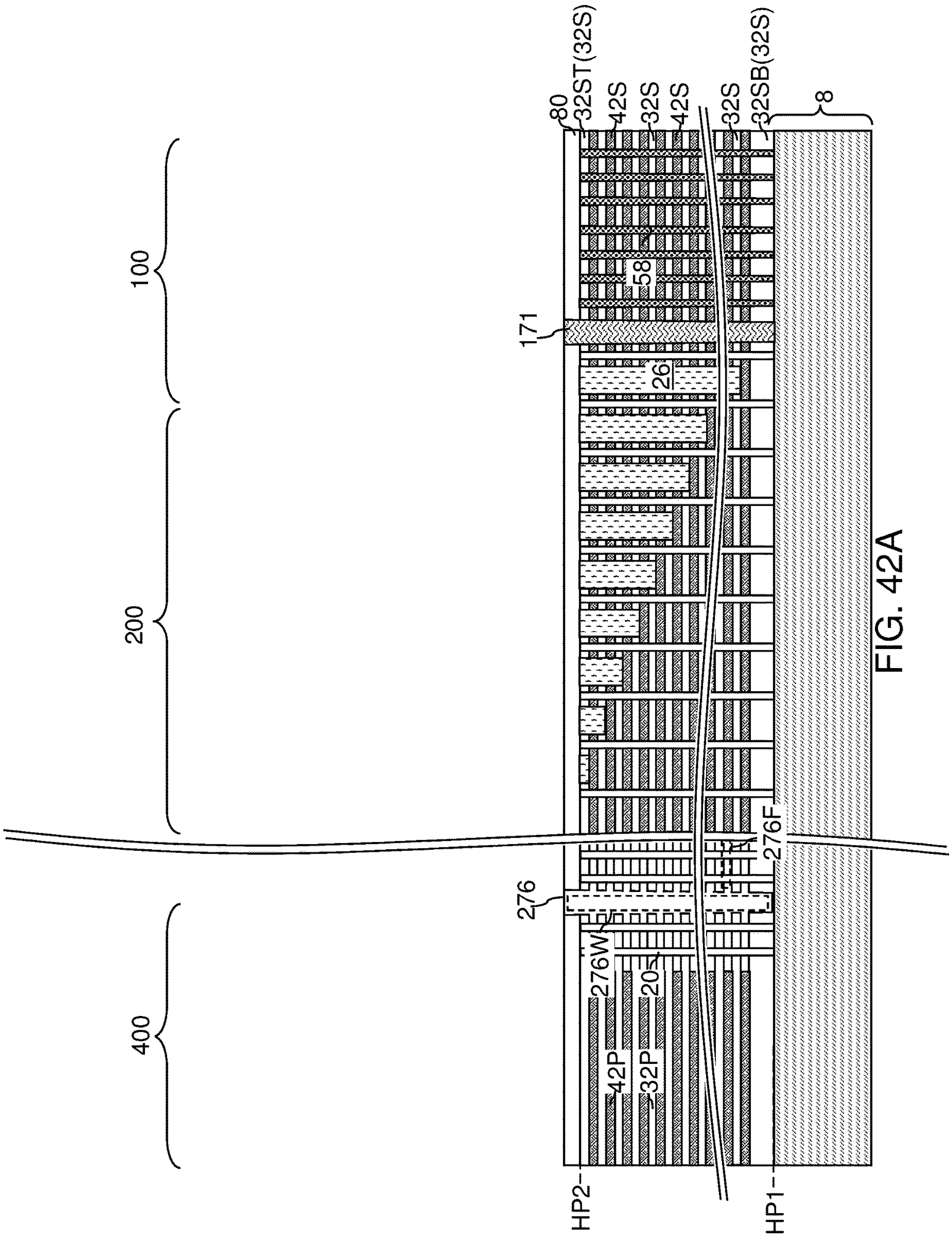
Figure 42B:
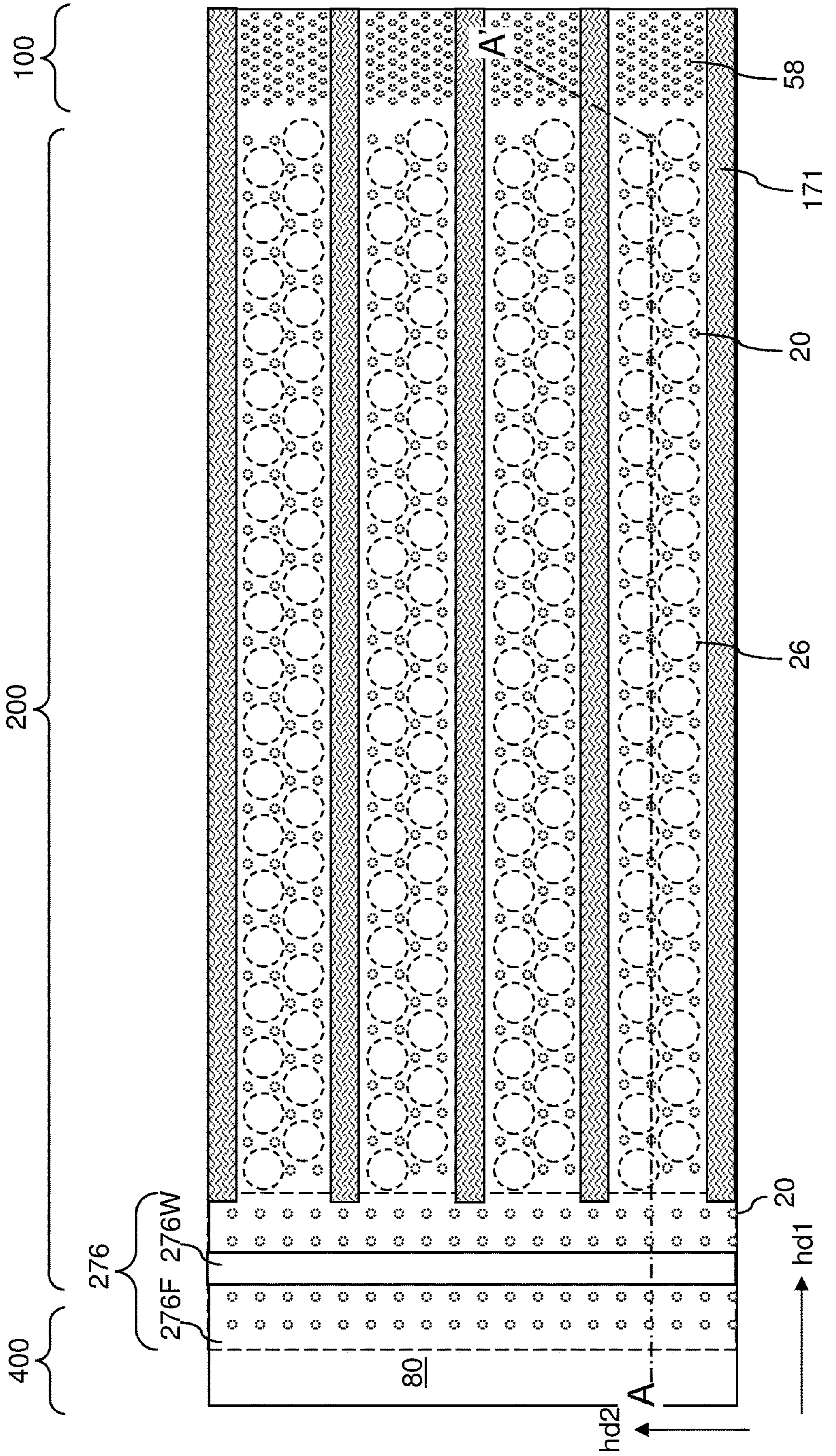

Referring to FIGS. 42A and 42B, a dielectric fill material, such as silicon oxide, can be deposited in the isolation cavity 177 by a conformal deposition process, such as a chemical vapor deposition process. Excess portions of the dielectric fill material can be removed from above the horizontal plane including the top surface of the contact-level dielectric layer 80 by performing a recess etch process. The remaining portion of the dielectric fill material that fills the isolation cavity 177 comprises a dielectric isolation structure 276, which is a finned dielectric isolation structure 276 including dielectric fin portions 276F located at levels of the sacrificial material strips 42S.

Generally, the dielectric isolation structure 276 may be formed by deposition of a dielectric material in the isolation cavity 177. The dielectric isolation structure 276 comprises a dielectric wall portion 276W laterally extending along the second horizontal direction hd2 and laterally spaced from the backside trenches 79, and dielectric fin portions 276F laterally protruding along the first horizontal direction hd1 from the dielectric wall portion 276W. The dielectric wall portion 276W is the portion of the dielectric isolation structure 276 that does not have any areal overlap with the insulating strips 32S or with the insulating plates 32P in a plan view (such as a top-down view), and the dielectric fin portions 276F do have an areal overlap with the insulating strips 32S or with the insulating plates 32P in a plan view.

Each interface between the alternating stacks (32S, 42S) and the dielectric isolation structure 276 vertically extends from a first horizontal plane HP1 including bottommost surfaces of the alternating stacks (32S, 42S) to a second horizontal plane HP2 including topmost surfaces of the alternating stacks (32S, 42S). Each interface between the alternating stacks (32S, 42S) and the dielectric isolation structure 276 may have an undulating vertical cross-sectional profile along a direction that is perpendicular to the second horizontal direction hd2.

In one embodiment, the dielectric isolation structure 276 comprises a dielectric wall portion 276W laterally extending along the second horizontal direction hd2 and laterally spaced from the backside trenches 79, and dielectric fin portions 276F laterally protruding along the first horizontal direction hd1 from the dielectric wall portion 276W. In one embodiment, the dielectric fin portions 276F are located at levels of the sacrificial material strips 42S. In one embodiment, each of the dielectric fin portions 276F has a respective lateral dimension along the first horizontal direction hd1 that is greater than a lateral dimension of the dielectric wall portion 276W along the first horizontal direction hd1.

In one embodiment, a lateral distance along the first horizontal direction hd1 between the dielectric wall portion 276W and one of the backside trenches 79 is less than a lateral distance along the first horizontal direction hd1 between the dielectric wall portion 276W and one of the sacrificial material strips 42S. In one embodiment, all interfaces between the insulating strips 32S and the dielectric isolation structure 276 are located within sidewall surface segments of the dielectric wall portion 276W. In one embodiment, support pillar structures 20 can vertically extend through a respective subset of the dielectric fin portions 276F, and can vertically extend from a first horizontal plane HP1 including bottommost surfaces of the alternating stacks (32S, 42S) to a second horizontal plane HP2 including topmost surfaces of the alternating stacks (32S, 42S).

Figure 43A:
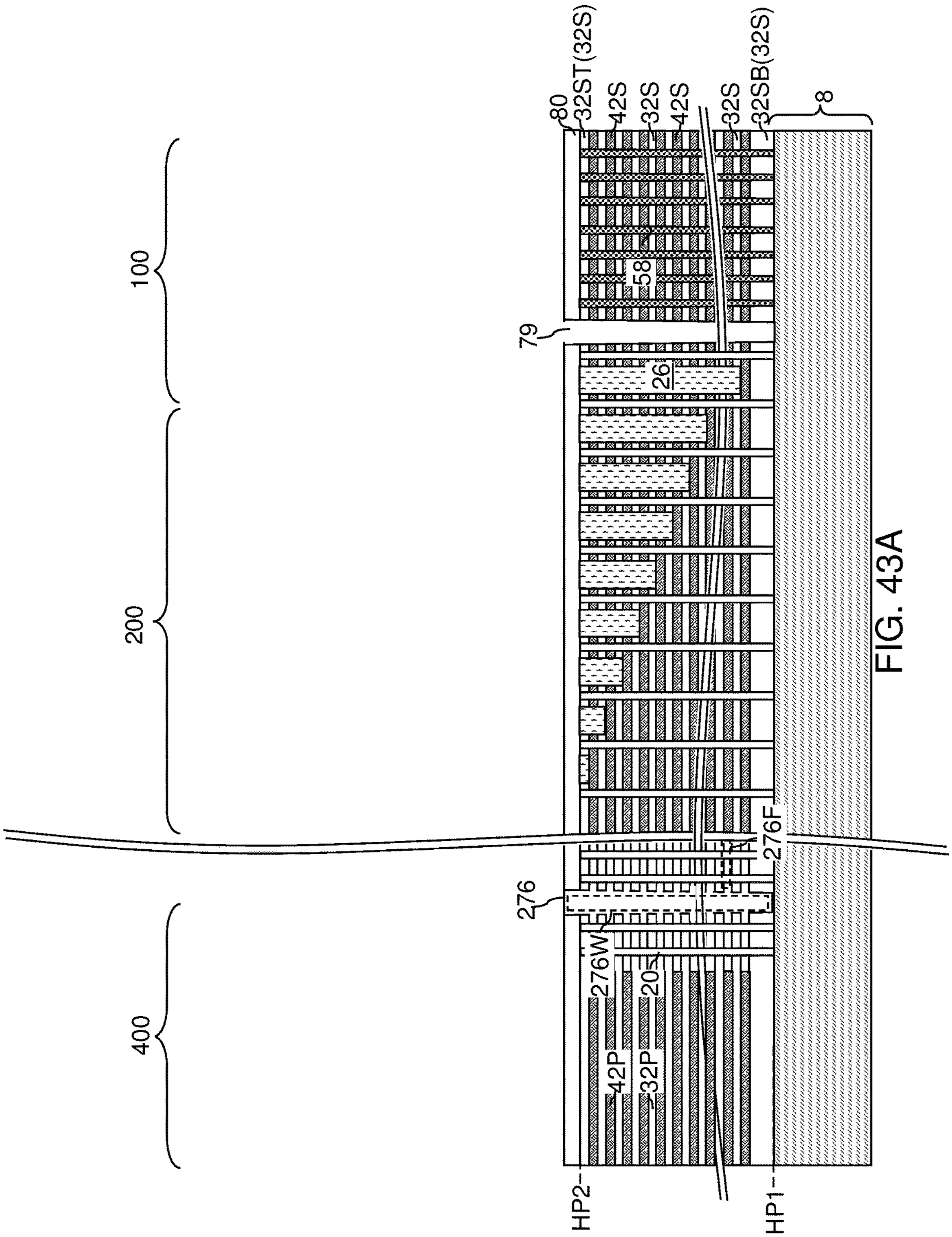
Figure 43B:
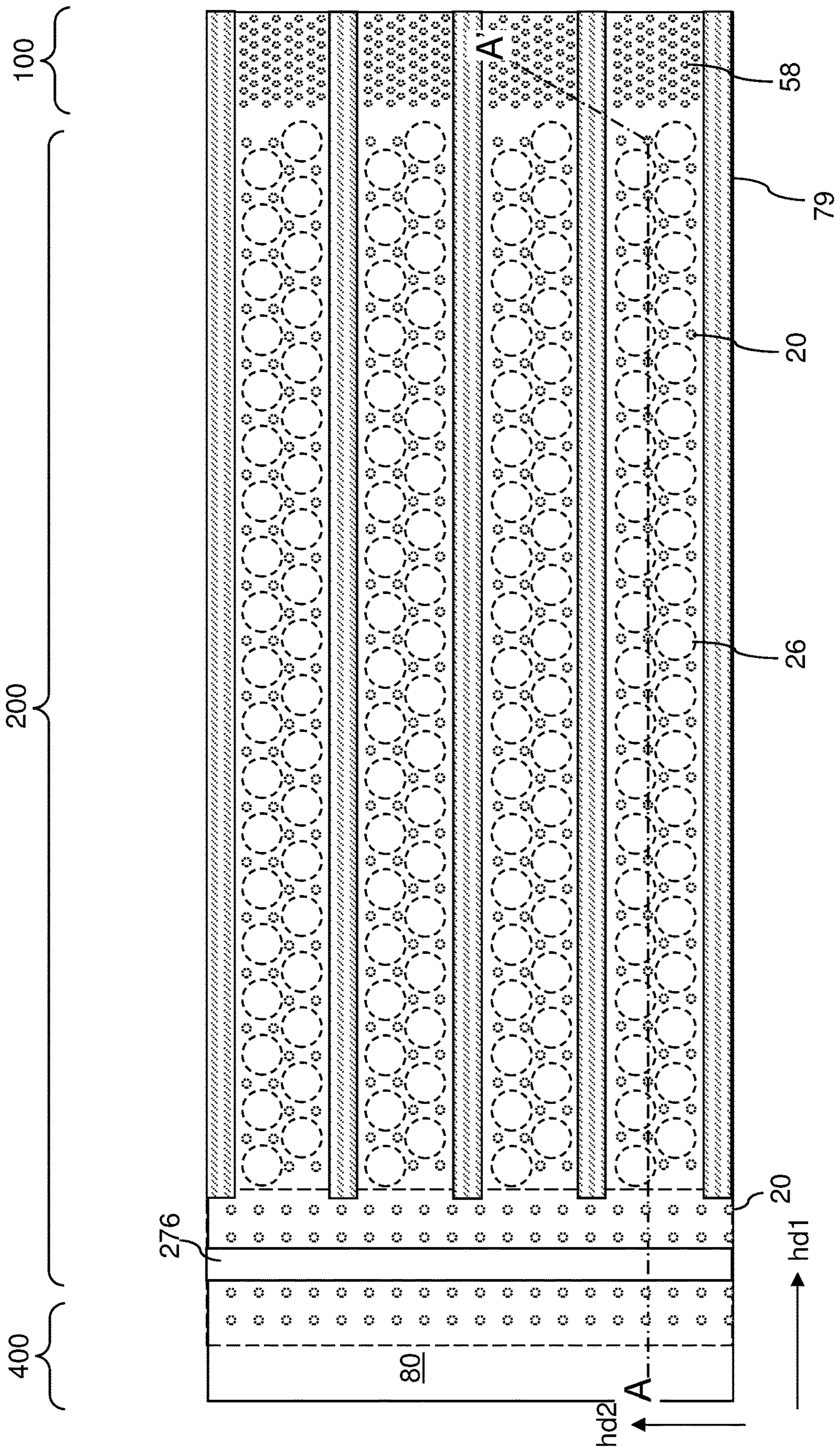

Referring to FIGS. 43A and 43B, the sacrificial backside trench fill structures 171 can be removed from inside the backside trenches 79. For example, a selective etch process or an ashing process may be performed to remove the sacrificial backside trench fill structures 171 selective to materials of the insulating strips 32S, the sacrificial material strips 42S, and the dielectric isolation structure 276.

Referring to FIGS. 44A and 44B, the processing steps described with reference to FIGS. 11A-11E can be performed to remove the sacrificial material strips 42S selective to materials of the insulating strips 32S and the dielectric isolation structure 276. Sidewalls of the dielectric isolation structure 276 can be physically exposed at each level of the backside recesses 43.

Referring to FIGS. 45A-45C, the processing steps described with reference to FIGS. 12A-12F can be performed to form optional backside blocking dielectric layers and electrically conductive strips 46 in the backside recesses 43. Thus, the sacrificial material strips 42S are replaced with electrically conductive strips 46, to form alternating stacks (32S, 46) of a respective subset of the insulating strips 32S and a respective subset of the electrically conductive strips 46.

The insulating strips 32S and electrically conductive strips 46 within each alternating stack (32S, 46) alternate along a vertical direction. Each of the alternating stacks (32S, 46) laterally extends along a first horizontal direction hd1, and the alternating stacks (32S, 46) in adjacent memory blocks are laterally spaced apart from each other along a second horizontal direction hd2 by backside trenches 79. Arrays of memory openings 49 vertically extend through a respective alternating stack (32S, 46). Memory opening fill structures 58 can be located in the memory openings 49. Each of the memory opening fill structures 58 comprises a respective vertical stack of memory elements located at levels of the electrically conductive strips 46 and a vertical semiconductor channel 60.

A vertically alternating sequence of insulating plates 32P and dielectric material plates 42P can be provided, which is laterally spaced apart from the alternating stacks (32S, 46) along the first horizontal direction hd1. Each of the insulating plates 32P is located at a same level as, has a same thickness as, and has a same material composition as, a respective subset of the insulating strips 32S within the alternating stacks (32S, 46). A dielectric isolation structure 276 laterally contacts each of the insulating strips 32S within the alternating stacks (32S, 46) and each insulating plate 32P and each dielectric material plate 42P within the vertically alternating sequence and laterally extending along the second horizontal direction hd2.

In one embodiment, each of the backside trenches 79 is filled with a respective backside trench fill structure (74, 76) having a respective pair of lengthwise sidewalls that laterally extend along the first horizontal direction hd1. In one embodiment, each of the lengthwise sidewalls of the backside trench fill structures (74, 76) comprises a respective surface segment that is in direct contact with the dielectric isolation structure 276.

Referring to FIGS. 46A and 46B, additional conductive via structures (88, 386) can be formed. The additional conductive via structures (88, 386) may comprise, for example, drain contact via structures 88 that are formed through the contact-level dielectric layer 80 directly on a top surface of a respective one of the drain regions 63, and connection via structures 386 that may be formed through the vertically alternating sequence of insulating plates 32P and dielectric material plates 42P.

Referring to FIG. 47, the processing steps described with reference to FIGS. 11A-21 may be performed to provide the third exemplary structure illustrated in FIG. 47.

Referring to FIGS. 48A and 48B, a fourth exemplary structure according to a fourth embodiment of the present disclosure can be derived from the third exemplary structure illustrated in FIGS. 40A and 40B by forming a patterned photoresist layer 377 over the contact-level dielectric layer 80. An opening in the photoresist layer 377 may have an area that includes the entire area of the isolation trench 179. The edges of the photoresist layer around the opening in the photoresist layer may be laterally offset outward from the top periphery of the isolation trench 179 by a lateral offset distance that is greater than the lateral offset distance between the isolation trench 179 and the backside trenches 79. In one embodiment, a straight edge of the photoresist layer 377 (which extends along the second horizontal direction hd2) may straddle the end portion of each of the backside trenches 79.

Referring to FIGS. 49A and 49B, at least one isotropic etch process may be performed to recess the material of the insulating layers 32 and to recess the material of the sacrificial material layers 42 underneath the opening in the photoresist layer 377 selective to the sacrificial backside trench fill structures 171 located in the backside trenches 79. The materials of the insulating layers 32 and the sacrificial material layers 42 may be recessed simultaneously employing a single isotropic etch process, or may be recessed sequentially employing a first isotropic etch process that recesses the material of the sacrificial material layers 42 selective to the material of the insulating layers 32, and a second isotropic etch process that recesses the material of the insulating layers 32 selective to the material of the sacrificial material layers 42. For example, if the insulating layers 32 comprise silicon oxide and the sacrificial material layers 42 comprise silicon nitride, the first isotropic etch process may comprise a wet etch process employing hot phosphoric acid, and the second isotropic etch process may comprise a wet etch process employing dilute hydrofluoric acid. The second isotropic etch process may be performed after or prior to the first isotropic etch process. The duration of the first isotropic etch process and the duration of the second isotropic etch process may be selected such that sidewalls of the sacrificial material layers 42 are laterally recessed more than, less than, or by the same lateral recess distance as, the sidewalls of the insulating material layers 32. An isolation cavity 177 is formed in the volume of the isolation trench 179 and volumes of voids formed by the first isotropic etch process and the second isotropic etch process.

In one embodiment, the lateral recess distance of the sidewalls of the sacrificial material layers 42 is greater than the lateral spacing between the isolation trench 179 and the backside trenches 79. In this case, surface segments of the sacrificial backside trench fill structures 171 can be physically exposed to the isolation cavity 177 at each level of the sacrificial material layers 42 upon competition of the isotropic etch processes. Each patterned portion of the sacrificial material layers 42 located between a respective neighboring pair of sacrificial backside trench fill structures 171 constitutes a sacrificial material strip 42S. The sacrificial material strips 42S are laterally spaced apart from each other by the sacrificial backside trench fill structures 171.

In one embodiment, the lateral recess distance of the sidewalls of the insulating layers 32 is greater than the lateral spacing between the isolation trench 179 and the backside trenches 79. In this case, surface segments of the sacrificial backside trench fill structures 171 can be physically exposed to the isolation cavity 177 at each level of the insulating layers 32 upon competition of the isotropic etch processes. Each patterned portion of the insulating layers 32 located between a respective neighboring pair of sacrificial backside trench fill structures 171 constitutes an insulating strip 32S. The insulating strips 32S are laterally spaced apart from each other by the sacrificial backside trench fill structures 171. Topmost insulating strips 32ST comprise portions of the topmost insulating layer 32T, and bottommost insulating strips 32SB comprise portions of the bottommost insulating layer 32B.

Alternating stacks (32S, 42S) of insulating strips 32S and sacrificial material strips 42S are formed in each memory block between neighboring pairs of sacrificial backside trench fill structures 171. The insulating strips 32S are portions of the insulating layers 32 that are located between a respective neighboring pair of backside trenches 79. The sacrificial material strips 42S are discrete remaining portions of the sacrificial material layers 42. Each of the sacrificial material strips 42S is laterally spaced apart from all other sacrificial material strips 42S located at a same level by a combination of the backside trenches 79 and the isolation cavity 177. The insulating strips 32S are discrete remaining portions of the insulating layers 32. Each of the insulating strips 32S is laterally spaced apart from all other insulating strips 32S located at a same level by a combination of the backside trenches 79 and the isolation cavity 177. The isolation cavity 177 may have straight sidewalls that vertically extend from the first horizontal plane HP1 to the second horizontal plane HP2, or may be a finned cavity including fin-shaped voids at the levels of the sacrificial material strips 42S or at the levels of the insulating strips 32S. The photoresist layer 377 can be subsequently removed, for example, by ashing.

Referring to FIGS. 50A and 50B, a dielectric fill material, such as silicon oxide can be deposited in the isolation cavity 177 by a conformal deposition process such as a chemical vapor deposition process. Excess portions of the dielectric fill material can be removed from above the horizontal plane including the top surface of the contact-level dielectric layer 80 by performing a recess etch process. The remaining portion of the dielectric fill material that fills the isolation cavity 177 comprises a dielectric isolation structure 376, which may or may not be a finned dielectric isolation structure 376 including dielectric fin located at levels of the sacrificial material strips 42S or at levels of the insulating strips 32S.

Generally, the dielectric isolation structure 376 may be formed by deposition of a dielectric material in the isolation cavity 177. The dielectric isolation structure 376 comprises a dielectric wall portion 376W laterally extending along the second horizontal direction hd2 and laterally spaced from the backside trenches 79, and dielectric fin portions 376F laterally protruding along the first horizontal direction hd1 from the dielectric wall portion 376W. The dielectric wall portion 376W is the portion of the dielectric isolation structure 376 that does not have any areal overlap with the insulating strips 32S or with the insulating plates 32P in a plan view (such as a top-down view), and the dielectric fin portions 376F do not have an areal overlap with the insulating strips 32S or with the insulating plates 32P in a plan view (such as a top-down view).

Each interface between the alternating stacks (32S, 42S) and the dielectric isolation structure 376 vertically extends from a first horizontal plane HP1 including bottommost surfaces of the alternating stacks (32S, 42S) to a second horizontal plane HP2 including topmost surfaces of the alternating stacks (32S, 42S). Each interface between the alternating stacks (32S, 42S) and the dielectric isolation structure 376 may have an undulating vertical cross-sectional profile along a direction that is perpendicular to the second horizontal direction hd2.

In one embodiment, the dielectric isolation structure 376 comprises a dielectric wall portion 376W laterally extending along the second horizontal direction hd2 and laterally spaced from the backside trenches 79, and may or may not comprise dielectric fin portions 376F laterally protruding along the first horizontal direction hd1 from the dielectric wall portion 376W. In one embodiment, the dielectric fin portions 376F may be located at levels of the sacrificial material strips 42S. Alternatively, the dielectric fin portions 376F may be located at levels of the insulating strips 32S. In one embodiment, each of the dielectric fin portions 376F has a respective lateral dimension along the first horizontal direction hd1 that is less than a lateral dimension of the dielectric wall portion 376W along the first horizontal direction hd1.

In one embodiment, a lateral distance along the first horizontal direction hd1 between the dielectric wall portion 376W and one of the backside trenches 79 is less than a lateral distance along the first horizontal direction hd1 between the dielectric wall portion 376W and the sacrificial material strips 42S, and/or a lateral distance along the first horizontal direction hd1 between the dielectric wall portion 376W and the insulting strips 32S. In one embodiment, support pillar structures 20 may be removed within volumes in which the dielectric isolation structure 376.

Referring to FIGS. 51A and 51B, the sacrificial backside trench fill structures 171 can be removed from inside the backside trenches 79. For example, a selective etch process or an ashing process may be performed to remove the sacrificial backside trench fill structures 171 selective to materials of the insulating strips 32S, the sacrificial material strips 42S, and the dielectric isolation structure 376.

Referring to FIGS. 52A-52C, each of the backside trenches 79 is filled with a respective backside trench fill structure (74, 76) having a respective pair of lengthwise sidewalls that laterally extend along the first horizontal direction hd1. In one embodiment, each of the lengthwise sidewalls of the backside trench fill structures (74, 76) comprises a respective surface segment that is in direct contact with the dielectric isolation structure 376.

Referring to FIGS. 53A and 53B, additional conductive via structures (88, 386) can be formed. The additional conductive via structures (88, 386) may comprise, for example, drain contact via structures 88 that are formed through the contact-level dielectric layer 80 directly on a top surface of a respective one of the drain regions 63, and connection via structures 386 that may be formed through the vertically alternating sequence of insulating plates 32P and dielectric material plates 42P.

Referring to FIG. 54, the processing steps described with reference to FIGS. 11A-21 may be performed to provide the fourth exemplary structure illustrated in FIG. 54. The dielectric fin portions 376F may be located at the levels of the electrically conductive strips 46 and the dielectric material plates 42P, and may contact each of the electrically conductive strips 46 and the dielectric material plates 42P. Alternatively, the dielectric fin portions 376F may be located at the levels of the insulating strips 32S and the insulating plates 32P, and may contact each of the insulating strips 32S and the insulating plates 32P.

Referring collectively to FIGS. 35A-54 and related drawings and according to various embodiments of the present disclosure, a three-dimensional memory device is provided, which comprises: alternating stacks (32S, 46) of insulating strips 32S and electrically conductive strips 46 that alternate along a vertical direction, wherein each of the alternating stacks (32S, 46) laterally extends along a first horizontal direction hd1, and the alternating stacks (32S, 46) are laterally spaced apart from each other along a second horizontal direction hd2 by backside trenches 79; arrays of memory openings 49 vertically extending through the alternating stacks (32S, 46); memory opening fill structures 58 located in the memory openings 49, wherein each of the memory opening fill structures 58 comprises vertical semiconductor channel 60 and a respective vertical stack of memory elements located at levels of the electrically conductive strips 46; a vertically alternating sequence of insulating plates 32P and dielectric material plates 42P that is laterally spaced apart from the alternating stacks (32S, 46) along the first horizontal direction hd1, wherein each of the insulating plates 32P is located at a same level as, has a same thickness as, and has a same material composition as, a respective subset of the insulating strips 32S within the alternating stacks (32S, 46); and a dielectric isolation structure (174, 276, 376) laterally contacting each of the insulating strips 32S within the alternating stacks (32S, 46) and each insulating plate and each dielectric material plate 42P within the vertically alternating sequence and laterally extending along the second horizontal direction hd2.

In one embodiment, each of the backside trenches 79 is filled with a respective backside trench fill structure (74, 76) having a respective pair of lengthwise sidewalls that laterally extend along the first horizontal direction hd1.

In one embodiment, each of the lengthwise sidewalls of the backside trench fill structures (74, 76) comprises a respective surface segment that is in direct contact with the dielectric isolation structure (174, 276, 376).

In one embodiment, each interface between the alternating stacks (32S, 46) and the dielectric isolation structure (174, 276, 376) vertically extends from a first horizontal plane HP1 including bottommost surfaces of the alternating stacks (32S, 46) to a second horizontal plane HP2 including topmost surfaces of the alternating stacks (32S, 46).

In one embodiment, each interface between the alternating stacks (32S, 46) and the dielectric isolation structure (174, 276, 376) has an undulating vertical cross-sectional profile along a direction that is perpendicular to the second horizontal direction hd2.

In one embodiment, the dielectric isolation structure (174, 276, 376) comprises: a dielectric wall portion (276W, 376W) laterally extending along the second horizontal direction hd2 and laterally spaced from the backside trenches 79; and dielectric fin portions (276F, 376F) laterally protruding along the first horizontal direction hd1 from the dielectric wall portion (276W, 376W).

In one embodiment, the dielectric fin portions (276F, 376F) are located at levels of the electrically conductive strips 46, or at levels of the insulating strips 32S.

In one embodiment, each of the dielectric fin portions (276F, 376F) has a respective lateral dimension along the first horizontal direction hd1 that is greater than a lateral dimension of the dielectric wall portion (276W, 376W) along the first horizontal direction hd1.

In one embodiment, a lateral distance along the first horizontal direction hd1 between the dielectric wall portion (276W. 376W) and one of the backside trenches 79 is less than a lateral distance along the first horizontal direction hd1 between the dielectric wall portion (276W, 376W) and one of the electrically conductive strips 46.

In one embodiment, all interfaces between the insulating strips 32S and the dielectric isolation structure (174, 276, 376) are located within sidewall surface segments of the dielectric wall portion (276W, 376W).

In one embodiment, the three-dimensional memory device comprises support pillar structures 20 vertically extending through a respective subset of the dielectric fin portions (276F, 376F) and vertically extending from a first horizontal plane HP1 including bottommost surfaces of the alternating stacks (32S, 46) to a second horizontal plane HP2 including topmost surfaces of the alternating stacks (32S, 46).

In one embodiment, the three-dimensional memory device comprises: upper metal interconnect structures 380 overlying the alternating stack (32S, 46) and embedded within upper dielectric material layers 360; memory-side bonding pads 388 electrically connected to the upper metal interconnect structures 380 and embedded within the upper dielectric material layers 360; and a logic die 700 comprising logic-side semiconductor devices 720 and logic-side bonding pads 788 electrically connected to the logic-side semiconductor devices 720 through logic-side metal interconnect structures 780, wherein the logic-side bonding pads 788 are bonded to the memory-side bonding pads 388.

In one embodiment, the three-dimensional memory device also comprises connection via structures 386 vertically extending through the vertically alternating sequence and providing electrical connection to the upper metal interconnect structures 380.

In one embodiment, the three-dimensional memory device also comprises laterally insulated contact via structures (84, 86) vertically extending through a respective subset of the electrically conductive strips located between a respective neighboring pair of backside trenches 79 and contacting a respective one of the electrically conductive strips 46S. The laterally insulated contact via structures (84, 86) are located in a contact region which lacks a staircase in the alternating stacks of insulating strips and electrically conductive strips. The alternating stacks of insulating strips and electrically conductive strips are located in different memory blocks which are electrically isolated from each other by the backside trenches and the dielectric isolation structure.

The various embodiments of the present disclosure can be employed to form a three-dimensional memory device in which contact via structures 86 are employed to provide electrical contact to each of the electrically conductive strips 46 while avoiding formation of any trench that intersects with backside trenches 79. Generally, two trenches that intersect with each other cause a deeper bottom recess at the intersection region. The intersection region is prone to formation of downward-protruding conductive structures and subsequent electrical shorts. The various embodiments of the present disclosure employs dielectric etch stop structures (81, 181) or dielectric isolation structure (174, 276, 376) to prevent electrical connection between word lines in laterally adjacent memory blocks while avoiding intersection of trenches during manufacturing processing steps, thereby increasing the yield and product reliability.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word “comprise” or “include” contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

wherein each of the electrically conductive strips has a respective lateral extent along the second horizontal direction that is not greater than a lateral spacing between a pair of most proximal pair of the backside trenches; and wherein the lateral extent of each of the electrically conductive strips is the same as the lateral spacing between the pair of most proximal pair of the backside trenches throughout an entirety of each of the electrically conductive strips.

2. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

wherein:

each of the electrically conductive strips has a respective lateral extent along the second horizontal direction that is not greater than a lateral spacing between a pair of most proximal pair of the backside trenches;

the lateral extent of each of the electrically conductive strips is the same as the lateral spacing between the pair of most proximal pair of the backside trenches within a first portion of each of the electrically conductive strips that is distal from dielectric connection plate that is contacted by a respective electrically conductive strip; and the lateral extent of each of the electrically conductive strips is less than the lateral spacing between the pair of most proximal pair of backside trenches among the backside trenches within a second portion of each of the electrically conductive strips that is proximal to the dielectric connection plate that is contacted by the respective electrically conductive strip.

3. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

wherein each of the dielectric etch stop structures comprises:

a respective pair of inner lengthwise sidewalls that are parallel to the first horizontal direction and having a first lateral spacing therebetween;

a respective pair of outer lengthwise sidewalls that are parallel to the first horizontal direction and having a second lateral spacing therebetween, the second lateral spacing being greater than the first lateral spacing; and a respective connection sidewall that connects the respective pair of outer lengthwise sidewalls and contacting each of the dielectric connection plates within the alternating stack.

4. The three-dimensional memory device of claim 3, wherein, for each of the dielectric etch stop structures, the pair of dielectric sidewalls comprises a pair of the outer lengthwise sidewalls.

5. The three-dimensional memory device of claim 3, wherein, for each of the dielectric etch stop structures, the pair of dielectric sidewalls comprises a pair of the inner lengthwise sidewalls.

6. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

wherein:

each of the dielectric etch stop structures is located within the respective one of the backside trenches; and each of the backside trench fill structures has a first portion having a same width as a respective one of the backside trenches and a second portion having a lesser width than the respective one of the backside trenches.

7. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks; and dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

wherein:

each of the dielectric etch stop structure is located outside the respective one of the backside trenches; and each of the backside trench fill structures has a uniform width throughout, the uniform width being the same as a width of a respective backside trench.

8. A three-dimensional memory device, comprising:

an alternating stack of insulating layers and composite layers that alternate along a vertical direction, wherein each of the composite layers comprises a combination of a dielectric connection plate and a plurality of electrically conductive strips that laterally extend along a first horizontal direction, are laterally spaced apart along a second horizontal direction by backside trenches that laterally extend along the first horizontal direction, and have a respective sidewall adjoined to a respective sidewall surface segment of the dielectric connection plate, wherein end portions of the backside trenches are laterally bounded by the dielectric connection plates of the composite layers;

arrays of memory openings vertically extending through the alternating stack;

memory opening fill structures located in the memory openings, wherein each of the memory opening fill structures comprises a vertical semiconductor channel and a respective vertical stack of memory elements located at levels of the electrically conductive strips;

backside trench fill structures located in the backside trenches and vertically extending at least from a first horizontal plane including bottommost surfaces of the alternating stacks and at least to a second horizontal plane including topmost surfaces of the alternating stacks;

dielectric etch stop structures located within or outside a respective one of the backside trenches, wherein each of the dielectric etch stop structures comprises a respective pair of dielectric sidewalls that are located within a pair of lengthwise sidewalls of the respective one of the backside trenches, wherein the dielectric sidewalls of the dielectric etch stop structures laterally extend along the first horizontal direction and vertically extend at least from the first horizontal plane and at least to the second horizontal plane;

upper metal interconnect structures overlying the alternating stack and embedded within upper dielectric material layers;

memory-side bonding pads electrically connected to the upper metal interconnect structures and embedded within the upper dielectric material layers; and a logic die comprising logic-side semiconductor devices and logic-side bonding pads electrically connected to the logic-side semiconductor devices through logic-side metal interconnect structures, wherein the logic-side bonding pads are bonded to the memory-side bonding pads.

9. The three-dimensional memory device of claim 7, wherein the alternating stacks are located in different memory blocks which are electrically isolated from each other by the backside trenches and the dielectric etch stop structures.

10. The three-dimensional memory device of claim 8, further comprising laterally insulated contact via structures vertically extending through a respective subset of the alternating stack located between a respective neighboring pair of backside trenches and contacting a respective one of the electrically conductive strips.

11. The three-dimensional memory device of claim 10, wherein the laterally insulated contact via structures are located in a contact region which lacks a staircase in the alternating stacks.

12. The three-dimensional memory device of claim 8, further comprising connection via structures vertically extending through the dielectric connection plates within the alternating stack and electrically connected to a respective one of the upper metal interconnect structures.

* * * * *